(12) United States Patent
Akiyama et al.

(10) Patent No.: US 11,044,387 B2
(45) Date of Patent: Jun. 22, 2021

(54) STACKED IMAGING DEVICE AND SOLID-STATE IMAGING APPARATUS

(71) Applicant: SONY SEMICONDUCTOR SOLUTIONS CORPORATION, Kanagawa (JP)

(72) Inventors: Kentaro Akiyama, Kanagawa (JP); Tomohiro Yamazaki, Kumamoto (JP); Shintarou Hirata, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/489,083

(22) PCT Filed: Mar. 7, 2018

(86) PCT No.: PCT/JP2018/008771
§ 371 (c)(1),
(2) Date: Aug. 27, 2019

(87) PCT Pub. No.: WO2018/173754
PCT Pub. Date: Sep. 27, 2018

(65) Prior Publication Data
US 2020/0076999 A1    Mar. 5, 2020

(30) Foreign Application Priority Data

Mar. 24, 2017  (JP) .............................. JP2017-059470

(51) Int. Cl.
| | | |
|---|---|---|
| H04N 5/225 | (2006.01) | |
| G02B 5/30 | (2006.01) | |
| H01L 27/146 | (2006.01) | |
| H04N 5/355 | (2011.01) | |
| H04N 9/04 | (2006.01) | |

(52) U.S. Cl.
CPC ......... *H04N 5/2254* (2013.01); *G02B 5/3058* (2013.01); *H01L 27/14603* (2013.01);
(Continued)

(58) Field of Classification Search
CPC ............... H04N 5/2254; H04N 5/3559; H04N 9/04559; H04N 9/04557; H04N 5/374;
(Continued)

(56) References Cited

U.S. PATENT DOCUMENTS

2009/0278048 A1*  11/2009  Choe ................. H01L 27/14652
                                                                250/339.05
2010/0282945 A1*  11/2010  Yokogawa ........ H01L 27/14625
                                                                250/208.1
(Continued)

FOREIGN PATENT DOCUMENTS

| CN | 101577287 A | 11/2009 |
|---|---|---|
| CN | 101887900 A | 11/2010 |

(Continued)

OTHER PUBLICATIONS

International Search Report and Written Opinion of PCT Application No. PCT/JP2018/008771, dated Jun. 5, 2018, 10 pages of ISRWO.

*Primary Examiner* — Yogesh K Aggarwal
(74) *Attorney, Agent, or Firm* — Chip Law Group

(57) ABSTRACT

A stacked imaging device includes a polarizer and a plurality of photoelectric conversion units that is stacked, and the polarizer and the plurality of photoelectric conversion units are stacked, with the polarizer being disposed closer to the light incident side than the plurality of photoelectric conversion units.

14 Claims, 120 Drawing Sheets

(52) U.S. Cl.
CPC ..... *H01L 27/14638* (2013.01); *H04N 5/3559* (2013.01); *H04N 9/04559* (2018.08)

(58) Field of Classification Search
CPC .............. H04N 9/04563; G02B 5/3058; H01L 27/14638; H01L 27/14603; H01L 27/14647; H01L 27/14621; H01L 27/1464; H01L 27/14665
USPC ................ 348/335, 340, 345, 348, 350, 352
See application file for complete search history.

(56) References Cited

U.S. PATENT DOCUMENTS

| | | | |
|---|---|---|---|
| 2011/0310282 A1* | 12/2011 | Toda | H01L 31/022466 348/308 |
| 2013/0188023 A1* | 7/2013 | Kuang | H04N 13/218 348/49 |
| 2015/0349008 A1 | 12/2015 | Yamaguchi | |

FOREIGN PATENT DOCUMENTS

| | | | |
|---|---|---|---|
| CN | 102290424 A | | 12/2011 |
| CN | 104904013 A | | 9/2015 |
| EP | 2117047 A1 | | 11/2009 |
| EP | 2252069 A2 | | 11/2010 |
| EP | 2398054 A2 | | 12/2011 |
| JP | 2009-272620 A | | 11/2009 |
| JP | 2010-256138 A | | 11/2010 |
| JP | 2010-263158 A | | 11/2010 |
| JP | 2012-004443 A | | 1/2012 |
| JP | 2014-232761 A | | 12/2014 |
| JP | 2014232761 A | * | 12/2014 |
| JP | 2017-055085 A | | 3/2017 |
| KR | 10-2009-0117437 A | | 11/2009 |
| KR | 10-2010-0122058 A | | 11/2010 |
| KR | 10-2011-0138159 A | | 12/2011 |
| KR | 10-2015-0106400 A | | 9/2015 |
| TW | 201106470 A | | 2/2011 |
| TW | 201210004 A | | 3/2012 |
| WO | 2014/112279 A1 | | 7/2014 |

* cited by examiner

FIG. 3
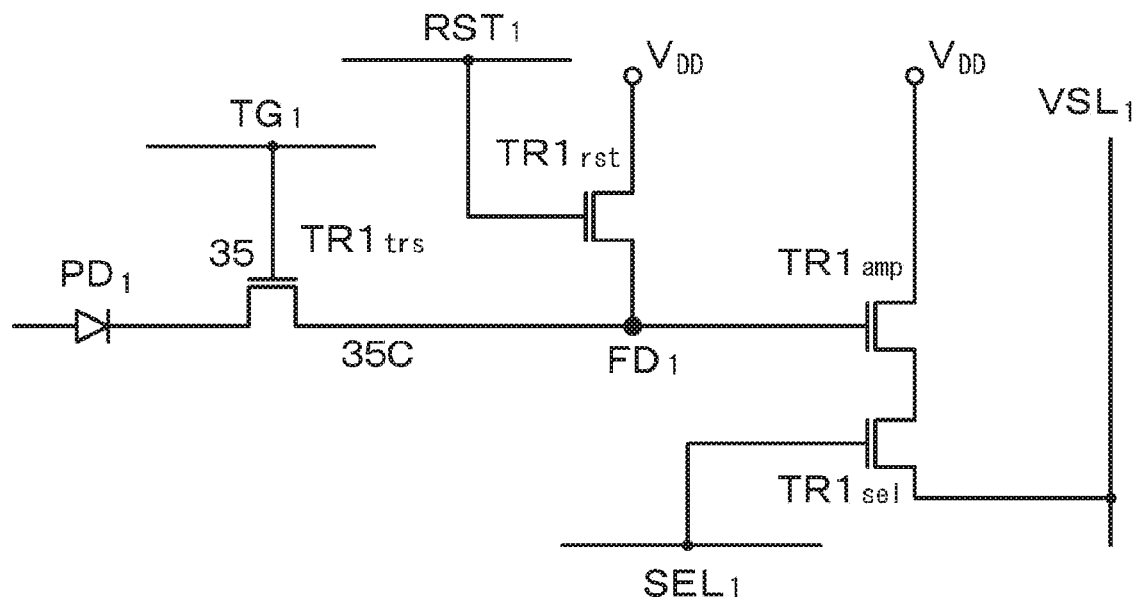
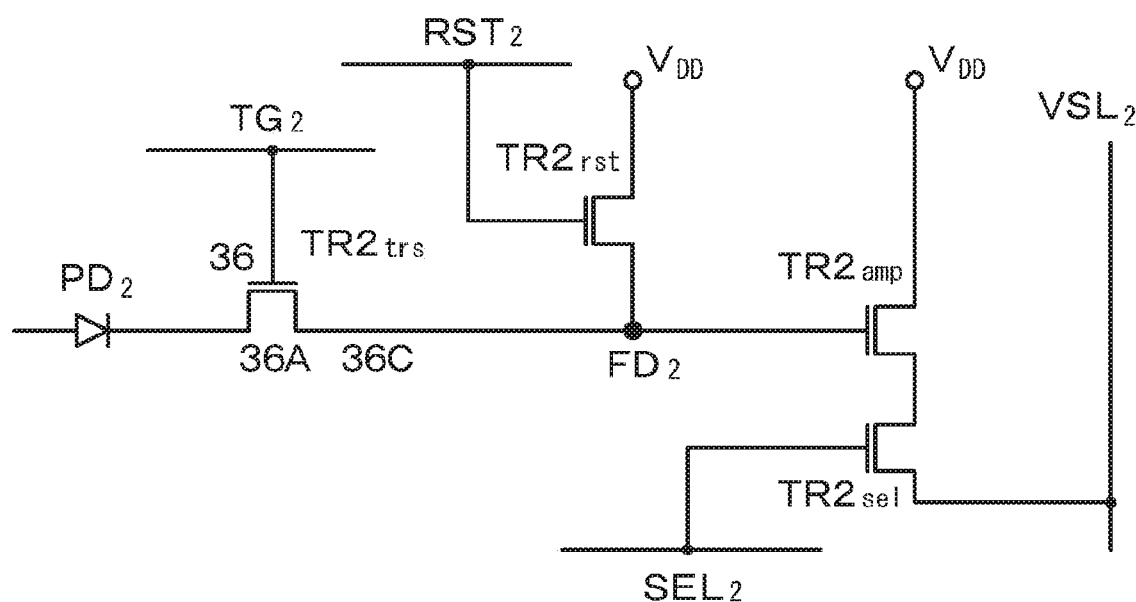

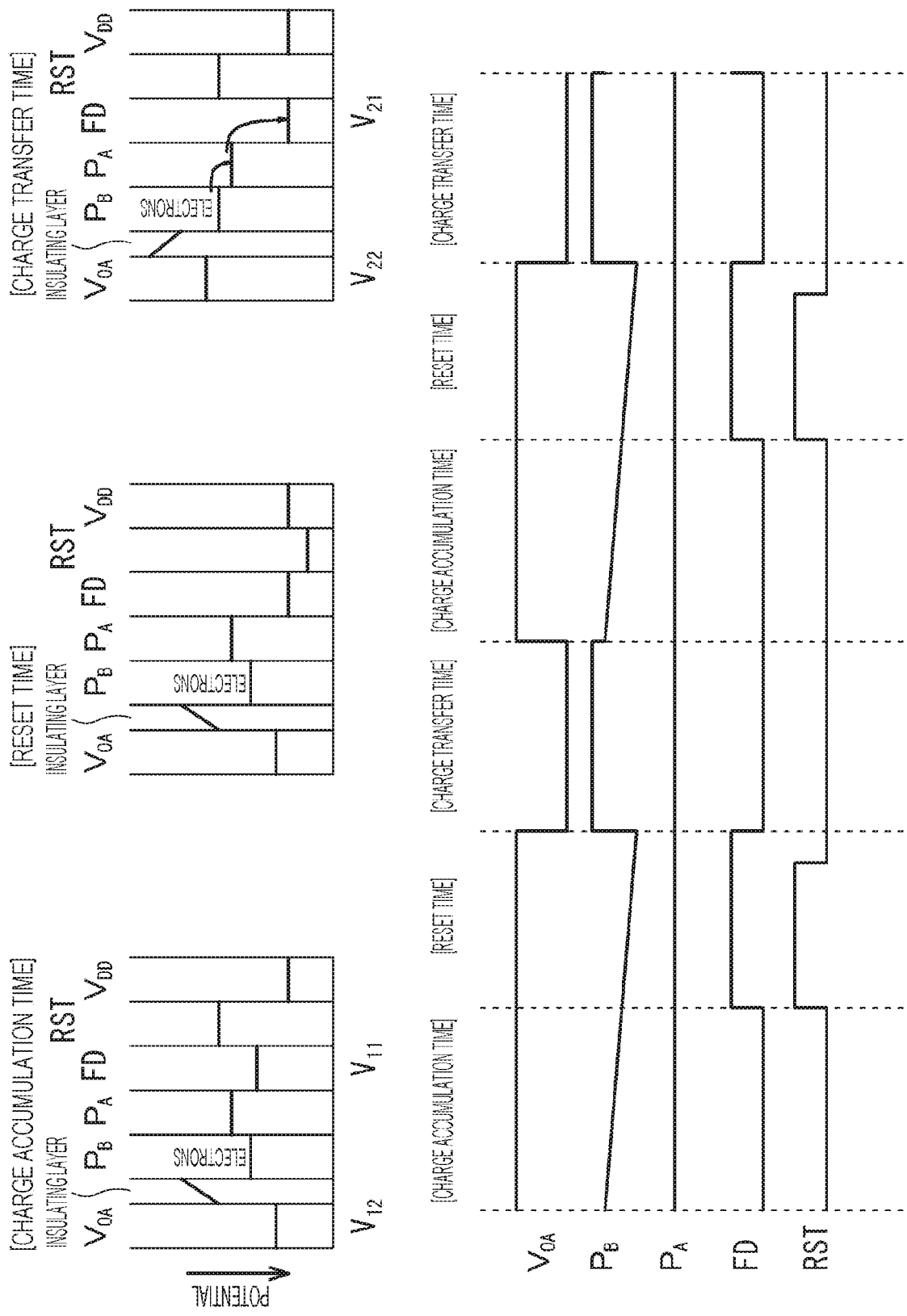

CHARGE STORAGE ELECTRODE SIDE

STACKED IMAGING DEVICE AND SOLID-STATE IMAGING APPARATUS

CROSS REFERENCE TO RELATED APPLICATIONS

This application is a U.S. National Phase of International Patent Application No. PCT/JP2018/008771 filed on Mar. 7, 2018, which claims priority benefit of Japanese Patent Application No. JP 2017-059470 filed in the Japan Patent Office on Mar. 24, 2017. Each of the above-referenced applications is hereby incorporated herein by reference in its entirety.

TECHNICAL FIELD

The present disclosure relates to a stacked imaging device and a solid-state imaging apparatus.

BACKGROUND ART

A solid-state imaging apparatus including a plurality of imaging devices provided with wire grid polarizers (WGPs) is known from Japanese Patent Application Laid-Open No. 2015-041793, for example. The imaging devices may be formed with charge coupled devices (CCDs) or complementary metal oxide semiconductor (CMOS) image sensors, for example. The wire grid polarizers have a line-and-space structure. The extending direction of the line-and-space structure is referred to as the "first direction", and the direction of repetition of line portions (a direction orthogonal to the first direction) is referred to as the "second direction", for the sake of convenience.

Here, an imaging apparatus disclosed in Japanese Patent Application Laid-Open No. 2015-041793 includes:

a first imaging surface 2 including a photoelectric conversion film capable of performing photoelectric conversion on incident light and transmitting part of the incident light;

a second imaging surface 3 including a photoelectric conversion layer that performs photoelectric conversion on the incident light transmitted through the first imaging surface; and a polarization filter 4 that is disposed between the two imaging surfaces 2 and 3, and extracts polarization information from the incident light transmitted through the first imaging surface 2.

As shown in a conceptual diagram in FIG. 120, in a case where the wire grid formation pitch $P_0$ is significantly smaller than the wavelength $\lambda_0$ of incident electromagnetic waves, the electromagnetic waves vibrating in a plane parallel to the extending direction (the first direction) of the wire grid is selectively reflected or absorbed by the wire grid. Here, the distance between a line portion and another line portion (the distance between and the length of space portions in the second direction) is set as the wire grid formation pitch $P_0$. As shown in FIG. 120, the electromagnetic waves (light) that reach the wire grid polarizer contain a longitudinal polarization component and a transverse polarization component, but the electromagnetic waves that has passed through the wire grid polarizer contains a longitudinal polarization component as dominant linear polarized light. With attention being drawn to the visible light wavelength band here, in a case where the wire grid formation pitch $P_0$ is significantly smaller than the effective wavelength $\lambda_{eff}$ of the electromagnetic waves entering the wire grid polarizer, a component polarized in a plane parallel to the first direction is reflected or absorbed at the surface of the wire grid. When electromagnetic waves having a polarization component polarized in a plane parallel to the second direction enters the wire grid, on the other hand, the electric field transmitted in the surface of the wire grid is transmitted (is emitted) from the back surface of the wire grid while maintaining the same wavelength and the same polarization orientation as the incident wavelength. Here, when the average refractive index obtained on the basis of the substance existing in the space portions is represented by $n_{ave}$, the effective wavelength $\lambda_{eff}$ is represented by $(\lambda_0/n_{ave})$. The average refractive index $n_{ave}$ is a value obtained by adding the product of the refractive index and the volume of the substance present in the space portions and dividing the sum by the volume of the space portions. In a case where the value of the wavelength $\lambda_0$ is constant, the smaller the value of $n_{ave}$, the greater the value of the effective wavelength $\lambda_{eff}$. Accordingly, the value of the formation pitch $P_0$ can be increased. Further, the greater the value of $n_{ave}$, the lower the transmittance in the wire grid polarizer, and the lower the extinction ratio.

An imaging device using an organic semiconductor material for its photoelectric conversion layer can photoelectrically convert a specific color (wavelength band). Because of such characteristics, in a case where such imaging devices are used in a solid-state imaging apparatus, it is then possible to obtain a structure (a stacked imaging device) in which sub pixels are stacked, which is not possible in a conventional solid-state imaging apparatus in which an on-chip color filter layer (OCCF) and an imaging device constitute a sub pixel, and sub pixels are two-dimensionally arranged (see Japanese Patent Application Laid-Open No. 2011-138927, for example). Furthermore, there is an advantage that any false color does not appear, since demosaicing is not required. In the description below, an imaging device that is disposed on or above a semiconductor substrate and includes a photoelectric conversion unit may be referred to as a "first-type imaging device" for convenience, the photoelectric conversion units forming a first-type imaging device may be referred to as "first-type photoelectric conversion units" for convenience, the imaging devices disposed in a semiconductor substrate may be referred to as "second-type imaging devices" for convenience, and the photoelectric conversion units forming a second-type imaging device may be referred to as "second-type photoelectric conversion units" for convenience.

FIG. 121 shows an example configuration of a conventional stacked imaging device (a stacked solid-state imaging apparatus). In the example shown in FIG. 121, a third photoelectric conversion unit 331 and a second photoelectric conversion unit 321 that are the second-type photoelectric conversion units forming a third imaging device 330 and a second imaging device 320 that are second-type imaging devices are stacked and formed in a semiconductor substrate 370. Further, a first photoelectric conversion unit 311 that is a first-type photoelectric conversion unit is disposed above the semiconductor substrate 370 (specifically, above the second imaging device 320). Here, the first photoelectric conversion unit 311 includes a first electrode 311, a photoelectric conversion layer 313 including an organic material, and a second electrode 312, and forms a first imaging device 310 that is a first-type imaging device. The second photoelectric conversion unit 321 and the third photoelectric conversion unit 331 photoelectrically convert blue light and red light, respectively, for example, depending on a difference in absorption coefficient. Meanwhile, the first photoelectric conversion unit 311 photoelectrically converts green light, for example.

After temporarily stored in the second photoelectric conversion unit 321 and the third photoelectric conversion unit 331, the electric charges generated through the photoelectric conversion in the second photoelectric conversion unit 321 and the third photoelectric conversion unit 331 are transferred to a second floating diffusion layer $FD_2$ and a third floating diffusion layer $FD_3$ by a vertical transistor (shown as a gate portion 322) and a transfer transistor (shown as a gate portion 332), respectively, and are further output to an external readout circuit (not shown). These transistors and the floating diffusion layers $FD_2$ and $FD_3$ are also formed in the semiconductor substrate 370.

The electric charges generated through the photoelectric conversion in the first photoelectric conversion unit 311 are stored in a first floating diffusion layer $FD_1$ formed in the semiconductor substrate 370, via a contact hole portion 361 and a wiring layer 362. The first photoelectric conversion unit 311 is also connected to a gate portion 318 of an amplification transistor that converts a charge amount into a voltage, via the contact hole portion 361 and the wiring layer 362. Then, the first floating diffusion layer $FD_1$ forms part of a reset transistor (shown as a gate portion 317). Reference numeral 371 indicates a device separation region, reference numeral 372 indicates an oxide film formed on the surface of the semiconductor substrate 370, reference numerals 376 and 381 indicate interlayer insulating layers, reference numeral 383 indicates an insulating layer, and reference numeral 390 indicates an on-chip microlens.

CITATION LIST

Patent Document

Patent Document 1: Japanese Patent Application Laid-Open No. 2015-041793
Patent Document 2: Japanese Patent Application Laid-Open No. 2011-138927

SUMMARY OF THE INVENTION

Problems to be Solved by the Invention

Meanwhile, in the imaging apparatus disclosed in Japanese Patent Application Laid-Open No. 2015-041793, the polarization filter 4 is disposed between the two imaging surfaces 2 and 3, and therefore, it is not possible to improve sensitivity to light transmitted through the polarization filter 4. In other words, since the imaging signal in the visible light region disappears, it is difficult to achieve sensitivity improvement accompanied by color information and polarization information, depending on objects. Further, in a case where sensitivity to light transmitted through the polarization filter 4 is improved by increasing the thickness of the photoelectric conversion layer forming the second imaging surface 3, it is not possible to separate the wavelength band of the light to be photoelectrically converted, or the photoelectric conversion layer is a single layer. Therefore, the photoelectric conversion layer needs to be planarly divided with a filter or the like, and the sensitivity per unit area becomes lower. Because of this, in a case where both polarization information and image information is acquired, color reproducibility for the image information becomes poorer. On the other hand, in the conventional stacked imaging device (the stacked solid-state imaging apparatus) shown in FIG. 121, the electric charges generated through photoelectric conversion in the second photoelectric conversion unit 321 and the third photoelectric conversion unit 331 are temporarily stored in the second photoelectric conversion unit 321 and the third photoelectric conversion unit 331, and are then transferred to the second floating diffusion layer $FD_2$ and the third floating diffusion layer $FD_3$. Thus, the second photoelectric conversion unit 321 and the third photoelectric conversion unit 331 can be fully depleted. However, the electric charges generated through photoelectric conversion in the first photoelectric conversion unit 311 are stored directly into the first floating diffusion layer $FD_1$. Therefore, it is difficult to fully deplete the first photoelectric conversion unit 311. Then, as a result of the above, kTC noise might become larger, random noise might be aggravated, and imaging quality might be degraded.

Therefore, the present disclosure aims to provide a stacked imaging device and a solid-state imaging apparatus that have a configuration and a structure capable of achieving both sensitivity improvement and spectral improvement, and further achieving both acquisition of high-precision polarization information and excellent imaging characteristics.

Solutions to Problems

A stacked imaging device of the present disclosure for achieving the above object includes
a polarizer, and a plurality of photoelectric conversion units that is stacked, and
the polarizer and the plurality of photoelectric conversion units are stacked, with the polarizer being disposed closer to the light incident side than the plurality of photoelectric conversion units.

A solid-state imaging apparatus according to a first embodiment of the present disclosure for achieving the above object is a solid-state imaging apparatus in which stacked imaging devices are arranged in a two-dimensional matrix,
each stacked imaging device includes a polarizer, and a plurality of photoelectric conversion units that is stacked, and
the polarizer and the plurality of photoelectric conversion units that constitute each stacked imaging device are stacked, with the polarizer being disposed closer to the light incident side than the plurality of photoelectric conversion units.

A solid-state imaging apparatus according to a second embodiment of the present disclosure for achieving the above object is
a solid-state imaging apparatus in which imaging device units are arranged in a two-dimensional matrix, each imaging device unit being formed with four stacked imaging devices arranged in a 2×2 array, the four stacked imaging devices being a first stacked imaging device, a second stacked imaging device, a third stacked imaging device, and a fourth stacked imaging device, and
each imaging device unit further includes a polarizer at least on the light incident side of the fourth stacked imaging device.

Effects of the Invention

Stacked imaging devices of the present disclosure, and solid-state imaging apparatuses according to the first and second embodiments of the present disclosure each include a polarizer and a plurality of photoelectric conversion units that is stacked, the polarizer being disposed on the light incident side of the stacked imaging device. Accordingly, it is possible to expand and use the wavelength band of light to increase luminance, while acquiring polarization information about all the wavelength regions. Thus, it is possible to achieve higher sensitivity and spectral improvement. As a result, it is possible to achieve both high-precision polarization information acquisition and excellent imaging characteristics. Note that the advantageous effect described in this specification is merely an example, and the advantageous effects of the present technology are not limited to the example and may also include additional effects.

BRIEF DESCRIPTION OF DRAWINGS

FIG. 3 is an equivalent circuit diagram of the stacked imaging device of Example 1.

FIG. 12 is a schematic partial perspective view of a wire grid polarizer forming a stacked imaging device of the present disclosure, an imaging device of the present disclosure, or the like.

FIGS. 14A and 14B are schematic partial end views of modifications of a wire grid polarizer forming a stacked imaging device of the present disclosure, an imaging device of the present disclosure, or the like.

FIG. 15 is a schematic partial plan view of a modification of a wire grid polarizer forming a stacked imaging device of the present disclosure, an imaging device of the present disclosure, or the like.

FIG. 23 is a schematic partial cross-sectional view of a stacked imaging device of Example 3, an imaging device of the present disclosure, or the like.

FIG. 24 is an equivalent circuit diagram of a stacked imaging device of Example 3, an imaging device of the present disclosure, or the like.

FIG. 25 is an equivalent circuit diagram of a stacked imaging device of Example 3, an imaging device of the present disclosure, or the like.

FIG. 26 is a schematic layout diagram of transistors forming a first electrode, a charge storage electrode, and a control unit that constitute a stacked imaging device of Example 3, an imaging device of the present disclosure, or the like.

FIG. 27 is a diagram schematically showing the states of the potential at respective portions in an operation of a stacked imaging device of Example 3, an imaging device of the present disclosure, or the like.

FIG. 29 is a schematic layout diagram of a first electrode and a charge storage electrode that constitute a stacked imaging device of Example 3, an imaging device of the present disclosure, or the like.

FIG. 30 is a schematic perspective view of a first electrode, a charge storage electrode, a second electrode, and a contact hole portion that constitute a stacked imaging device of Example 3, an imaging device of the present disclosure, or the like.

FIG. 31 is an equivalent circuit diagram of a modification of a stacked imaging device of Example 3, an imaging device of the present disclosure, or the like.

FIG. 33 is a schematic partial cross-sectional view of a stacked imaging device of Example 4, an imaging device of the present disclosure, or the like.

FIG. 34 is a schematic partial cross-sectional view of a stacked imaging device of Example 5, an imaging device of the present disclosure, or the like.

FIG. 35 is a schematic partial cross-sectional view of a modification of a stacked imaging device of Example 5, an imaging device of the present disclosure, or the like.

FIG. 36 is a schematic partial cross-sectional view of another modification of a stacked imaging device of Example 5, an imaging device of the present disclosure, or the like.

FIG. 37 is a schematic partial cross-sectional view of yet another modification of a stacked imaging device of Example 5, an imaging device of the present disclosure, or the like.

FIG. 38 is a schematic partial cross-sectional view of part of a stacked imaging device of Example 6, an imaging device of the present disclosure, or the like.

FIG. 39 is an equivalent circuit diagram of a stacked imaging device of Example 6, an imaging device of the present disclosure, or the like.

FIG. 40 is an equivalent circuit diagram of a stacked imaging device of Example 6, an imaging device of the present disclosure, or the like.

FIG. 41 is a schematic layout diagram of transistors forming a first electrode, a transfer control electrode, a charge storage electrode, and a control unit that constitute a stacked imaging device of Example 6, an imaging device of the present disclosure, or the like.

FIG. 42 is a diagram schematically showing the states of the potential at respective portions in an operation of a stacked imaging device of Example 6, an imaging device of the present disclosure, or the like.

FIG. 43 is a diagram schematically showing the states of the potential at respective portions in another operation of a stacked imaging device of Example 6, an imaging device of the present disclosure, or the like.

FIG. 44 is a schematic layout diagram of a first electrode, a transfer control electrode, and a charge storage electrode that constitute a stacked imaging device of Example 6, an imaging device of the present disclosure, or the like.

FIG. 45 is a schematic perspective view of a first electrode, a transfer control electrode, a charge storage electrode, a second electrode, and a contact hole portion that constitute a stacked imaging device of Example 6, an imaging device of the present disclosure, or the like.

FIG. 46 is a schematic layout diagram of transistors forming a first electrode, a transfer control electrode, a charge storage electrode, and a control unit that constitute a modification of a stacked imaging device of Example 6, an imaging device of the present disclosure, or the like.

FIG. 47 is a schematic partial cross-sectional view of part of a stacked imaging device of Example 7, an imaging device of the present disclosure, or the like.

FIG. 48 is a schematic layout diagram of a first electrode, a charge storage electrode, and a charge emission electrode that constitute a stacked imaging device of Example 7, an imaging device of the present disclosure, or the like.

FIG. 49 is a schematic perspective view of a first electrode, a charge storage electrode, a charge emission electrode, a second electrode, and a contact hole portion that constitute a stacked imaging device of Example 7, an imaging device of the present disclosure, or the like.

FIG. 50 is a schematic partial cross-sectional view of part of a stacked imaging device of Example 8, an imaging device of the present disclosure, or the like.

FIG. 51 is an equivalent circuit diagram of a stacked imaging device of Example 8, an imaging device of the present disclosure, or the like.

FIG. 52 is an equivalent circuit diagram of a stacked imaging device of Example 8, an imaging device of the present disclosure, or the like.

FIG. 53 is a schematic layout diagram of transistors forming a first electrode, a charge storage electrode, and a control unit that constitute a stacked imaging device of Example 8, an imaging device of the present disclosure, or the like.

FIG. 54 is a diagram schematically showing the states of the potential at respective portions in an operation of a stacked imaging device of Example 8, an imaging device of the present disclosure, or the like.

FIG. 55 is a diagram schematically showing the states of the potential at respective portions in another operation (at a time of transfer) of a stacked imaging device of Example 8, an imaging device of the present disclosure, or the like.

FIG. 56 is a schematic layout diagram of a first electrode and a charge storage electrode that constitute a stacked imaging device of Example 8, an imaging device of the present disclosure, or the like.

FIG. 57 is a schematic perspective view of a first electrode, a charge storage electrode, a second electrode, and a contact hole portion that constitute a stacked imaging device of Example 8, an imaging device of the present disclosure, or the like.

FIG. 58 is a schematic layout diagram of a first electrode and a charge storage electrode that constitute a modification of a stacked imaging device of Example 8, an imaging device of the present disclosure, or the like.

FIG. 59 is a schematic partial cross-sectional view of a stacked imaging device of Example 9, an imaging device of the present disclosure, or the like.

FIG. 60 is a schematic partial cross-sectional view showing an enlarged view of the portion in which a charge storage electrode, a photoelectric conversion layer, and a second electrode are stacked in a stacked imaging device of Example 9, an imaging device of the present disclosure, or the like.

FIG. 61 is a schematic layout diagram of transistors forming a first electrode, a charge storage electrode, and a control unit that constitute a modification of a stacked imaging device of Example 9, an imaging device of the present disclosure, or the like.

FIG. 62 is a schematic partial cross-sectional view showing an enlarged view of the portion in which a charge storage electrode, a photoelectric conversion layer, and a second electrode are stacked in a stacked imaging device of Example 10, an imaging device of the present disclosure, or the like.

FIG. 63 is a schematic partial cross-sectional view of a stacked imaging device of Example 11, an imaging device of the present disclosure, or the like.

FIG. 64 is a schematic partial cross-sectional view of a stacked imaging device of Example 12 and Example 13, an imaging device of the present disclosure, or the like.

FIG. 67 is a schematic layout diagram of transistors forming a first electrode, a charge storage electrode, and a control unit that constitute a stacked imaging device of Example 13, an imaging device of the present disclosure, or the like.

FIG. 68 is a schematic layout diagram of a first electrode and a charge storage electrode that constitute a modification of a stacked imaging device of Example 13, an imaging device of the present disclosure, or the like.

FIG. 69 is a schematic partial cross-sectional view of a stacked imaging device of Example 14 and Example 13, an imaging device of the present disclosure, or the like.

FIG. 86 is a schematic partial cross-sectional view of another modification of a stacked imaging device of Example 3, an imaging device of the present disclosure, or the like.

FIG. 87 is a schematic partial cross-sectional view of yet another modification of a stacked imaging device of Example 3, an imaging device of the present disclosure, or the like.

FIGS. 88A, 88B, and 88C are schematic partial cross-sectional views that are enlarged views of first electrode portions in yet another modification of a stacked imaging device of Example 3, an imaging device of the present disclosure, or the like.

FIG. 89 is a schematic partial cross-sectional view that is an enlarged view of a charge emission electrode portion and the like in another modification of a stacked imaging device of Example 7, an imaging device of the present disclosure, or the like.

FIG. 90 is a schematic partial cross-sectional view of yet another modification of a stacked imaging device of Example 3, an imaging device of the present disclosure, or the like.

FIG. 91 is a schematic partial cross-sectional view of yet another modification of a stacked imaging device of Example 3, an imaging device of the present disclosure, or the like.

FIG. 92 is a schematic partial cross-sectional view of yet another modification of a stacked imaging device of Example 3, an imaging device of the present disclosure, or the like.

FIG. 93 is a schematic partial cross-sectional view of another modification of a stacked imaging device of Example 6, an imaging device of the present disclosure, or the like.

FIG. 94 is a schematic partial cross-sectional view of yet another modification of a stacked imaging device of Example 3, an imaging device of the present disclosure, or the like.

FIG. 95 is a schematic partial cross-sectional view of yet another modification of a stacked imaging device of Example 3, an imaging device of the present disclosure, or the like.

FIG. 96 is a schematic partial cross-sectional view of yet another modification of a stacked imaging device of Example 6, an imaging device of the present disclosure, or the like.

FIG. 97 is a schematic partial cross-sectional view showing an enlarged view of the portion in which a charge storage electrode, a photoelectric conversion layer, and a second electrode are stacked in a modification of a stacked imaging device of Example 9, an imaging device of the present disclosure, or the like.

FIG. 98 is a schematic partial cross-sectional view showing an enlarged view of the portion in which a charge storage electrode, a photoelectric conversion layer, and a second electrode are stacked in a modification of a stacked imaging device of Example 10, an imaging device of the present disclosure, or the like.

Figures 101, 102:
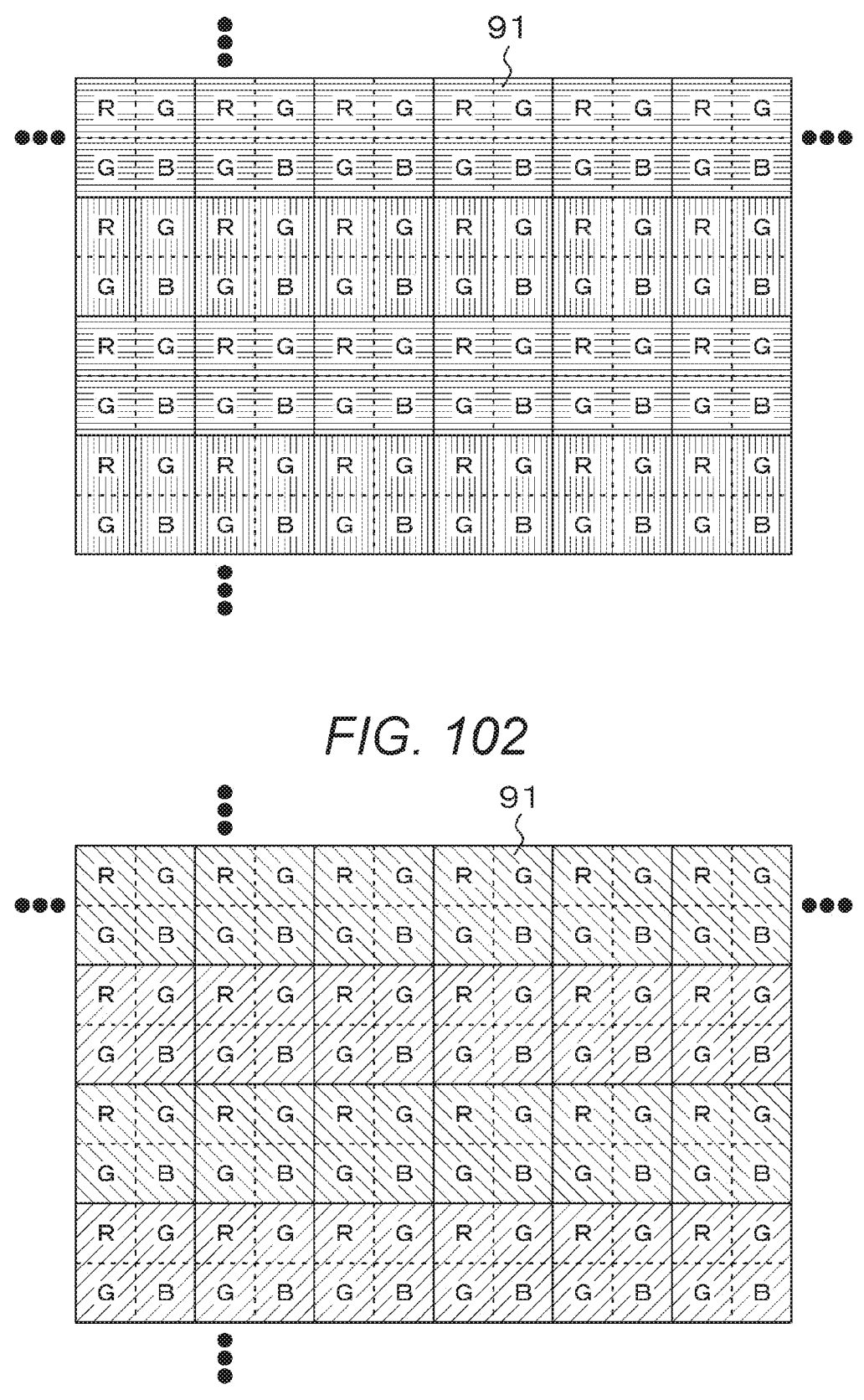

FIG. 101 is a planar layout diagram of a stacked imaging device, an imaging device of the present disclosure, or the like that has a Bayer array.

FIG. 102 is a planar layout diagram of a modification of a stacked imaging device, an imaging device of the present disclosure, or the like that has a Bayer array.

Figure 106:
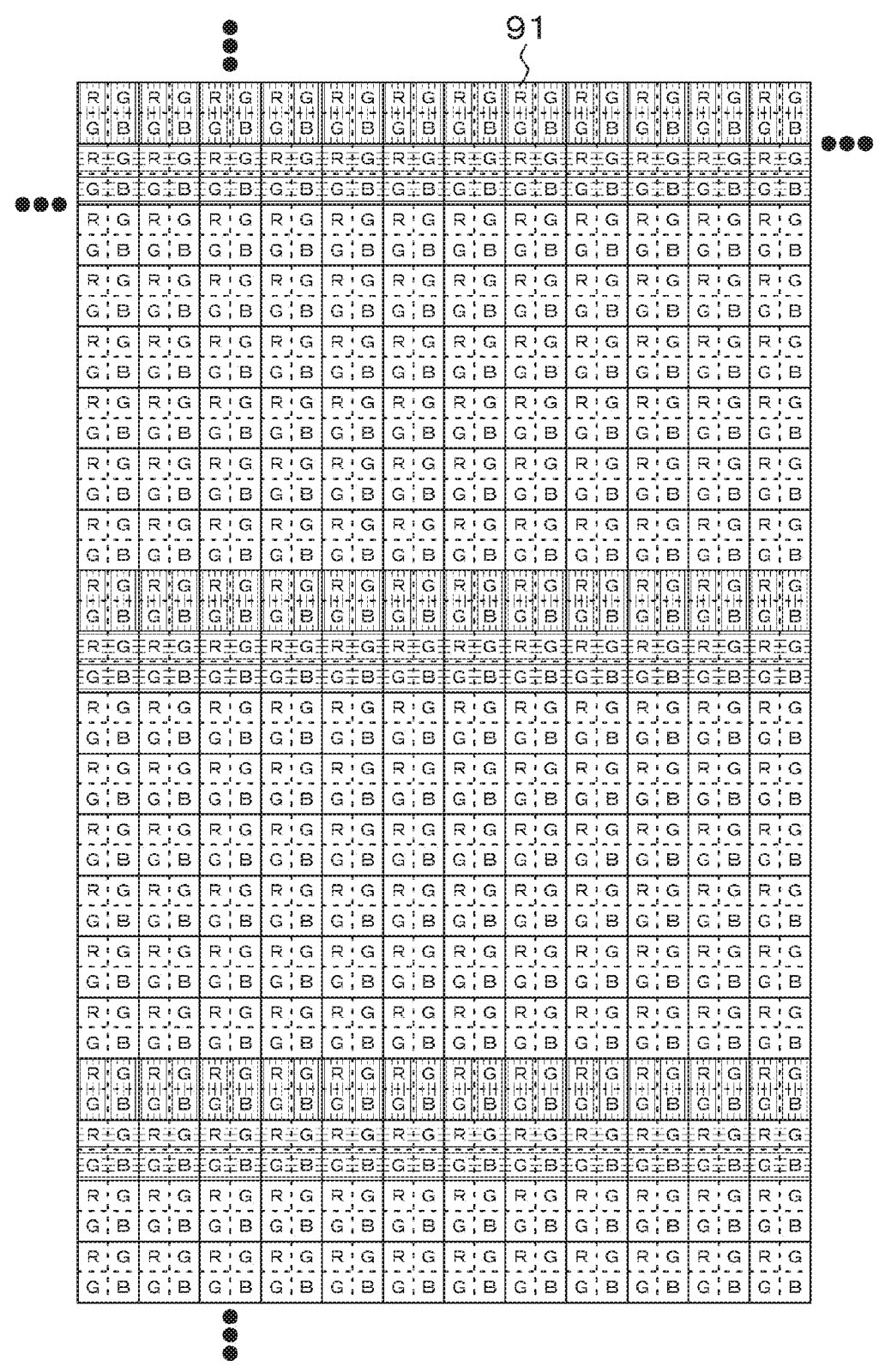

FIG. 106 is a planar layout diagram of a modification of a stacked imaging device, an imaging device of the present disclosure, or the like that has a Bayer array.

Figure 107:
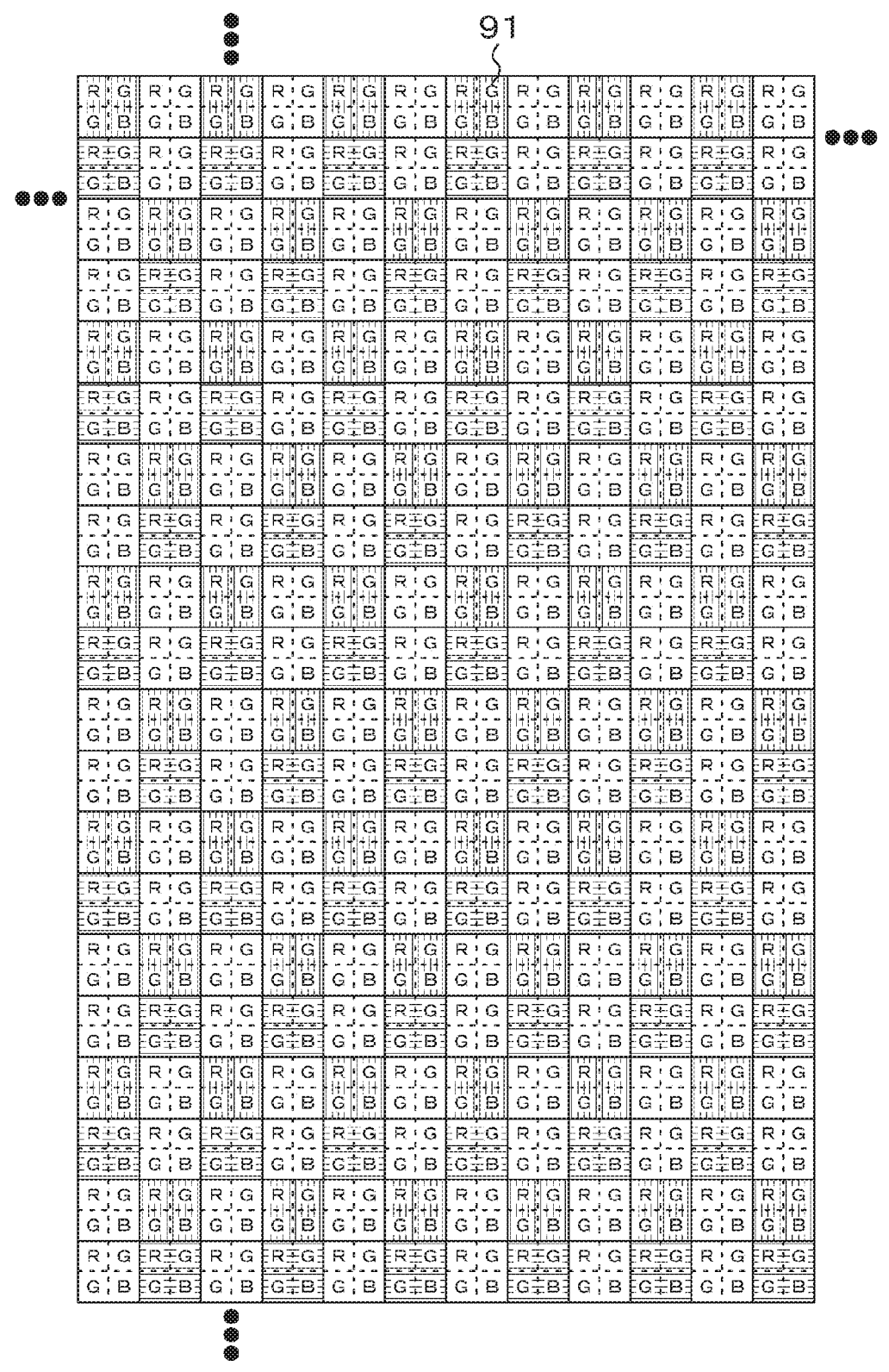

FIG. 107 is a planar layout diagram of a modification of a stacked imaging device, an imaging device of the present disclosure, or the like that has a Bayer array.

Figure 108:
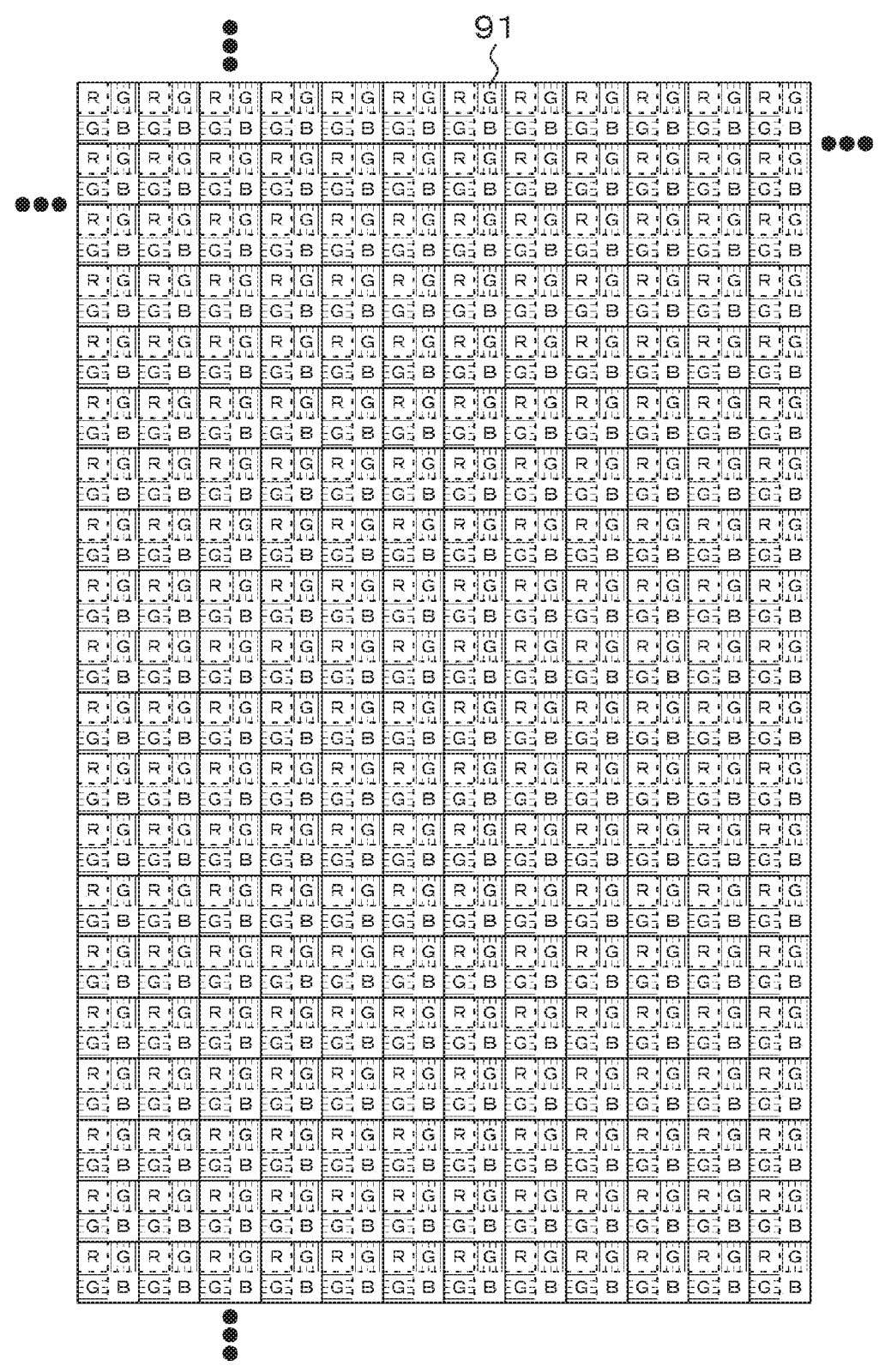

FIG. 108 is a planar layout diagram of a modification of a stacked imaging device, an imaging device of the present disclosure, or the like that has a Bayer array.

Figure 109:
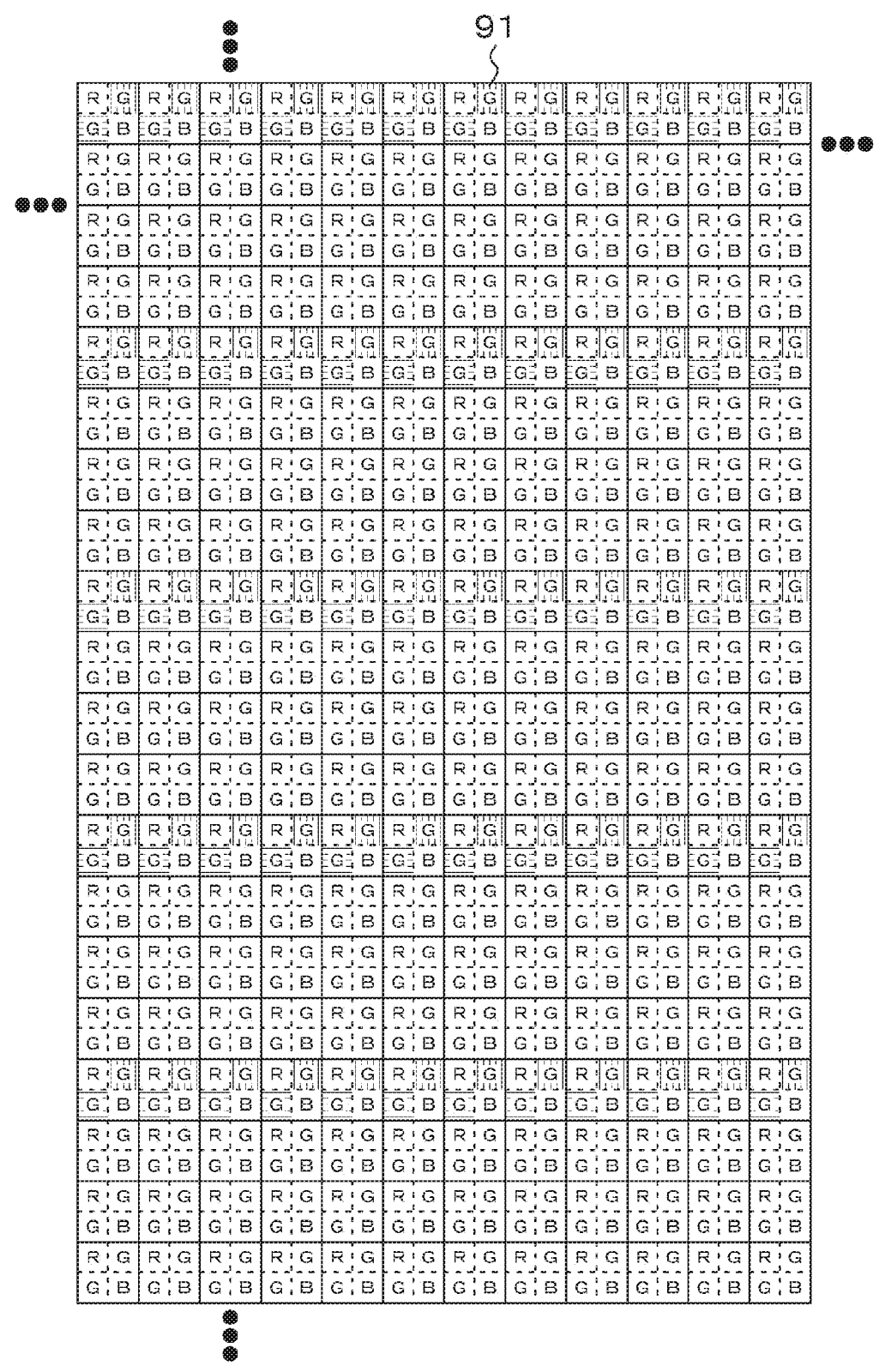

FIG. 109 is a planar layout diagram of a modification of a stacked imaging device, an imaging device of the present disclosure, or the like that has a Bayer array.

Figure 110:
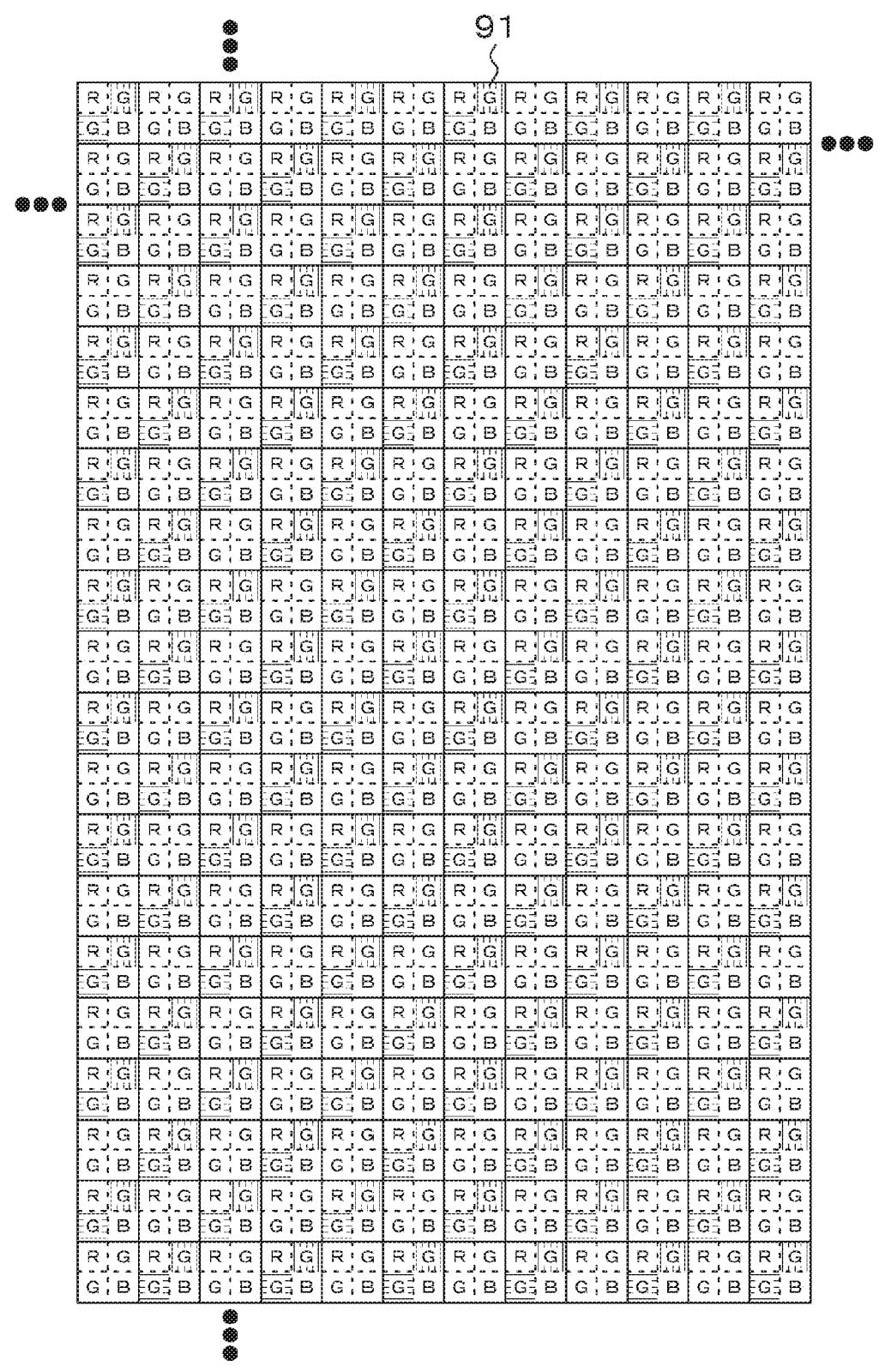

FIG. 110 is a planar layout diagram of a modification of a stacked imaging device, an imaging device of the present disclosure, or the like that has a Bayer array.

FIG. 119 is a schematic partial perspective view of a modification of a wire grid polarizer forming a stacked imaging device of the present disclosure, an imaging device of the present disclosure, or the like.

FIG. 120 is a conceptual diagram for explaining light and the like passing through a wire grid polarizer.

FIG. 121 is a conceptual diagram of a conventional stacked imaging device (a stacked solid-state imaging apparatus).

MODE FOR CARRYING OUT THE INVENTION

Figure 1:
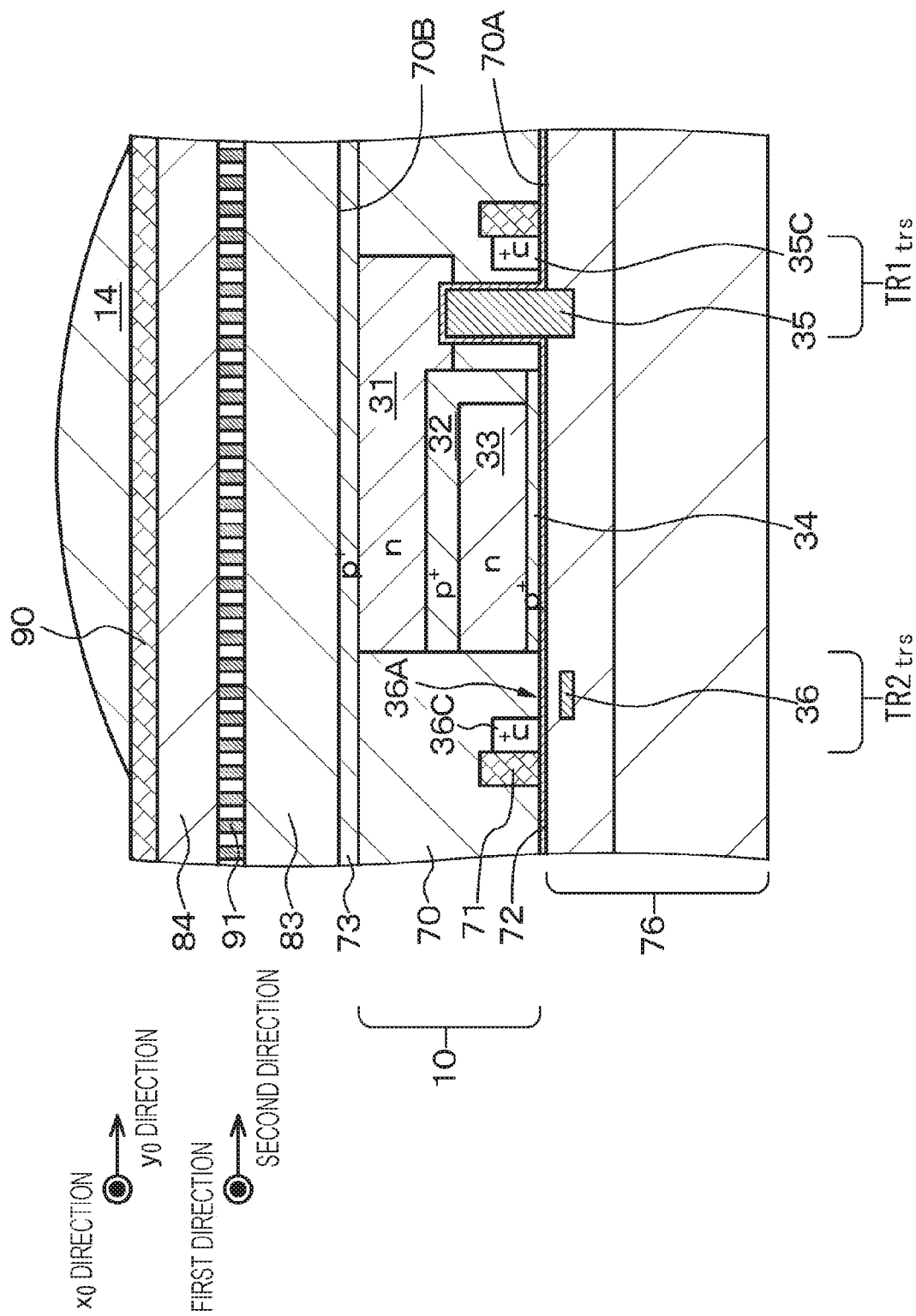
FIG. 1 is a schematic partial cross-sectional view of a stacked imaging device of Example 1.

The following is a description of the present disclosure based on embodiments, with reference to the drawings. However, the present disclosure is not limited to the embodiments, and the various numerical values and materials mentioned in the embodiments are merely examples. Note that explanation will be made in the following order.

1. General description of stacked imaging devices of the present disclosure, imaging devices or the like of the present disclosure, and solid-state imaging apparatuses according to first and second embodiments of the present disclosure 2. Example 1 (a stacked imaging device of the present disclosure, and solid-state imaging apparatuses according to the first and second embodiments of the present disclosure)

3. Example 2 (a modification of a solid-state imaging apparatus of Example 1)

4. Example 3 (modifications of Examples 1 and 2, and imaging devices or the like of the present disclosure)

5. Example 4 (a modification of Example 3)

6. Example 5 (modifications of Examples 3 and 4)

7. Example 6 (modifications of Examples 3 to 5, and an imaging device including a transfer control electrode)

8. Example 7 (modifications of Examples 3 to 6, and an imaging device including a charge emission electrode)

9. Example 8 (modifications of Examples 3 to 7, and an imaging device including a plurality of charge storage electrode segments)

14. Example 9 (imaging devices of first and sixth configurations)

15. Example 10 (imaging devices of second and sixth configurations of the present disclosure)

16. Example 11 (an imaging device of a third configuration)

17. Example 12 (an imaging device of a fourth configuration)

18. Example 13 (an imaging device of a fifth configuration)

19. Example 14 (an imaging device of the sixth configuration)

20. Example 15 (solid-state imaging apparatuses of the first and second configurations)

21. Example 16 (a modification of Example 15)

22. Example 17 (an example application to a moving object)

23. Example 18 (an example application to a moving object)

24. Example 19 (an example application to an in-vivo information acquisition system>

25. Other aspects

<General Description of Stacked Imaging Devices of the Present Disclosure, Imaging Devices or the Like of the Present Disclosure, and Solid-State Imaging Apparatuses According to First and Second Embodiments of the Present Disclosure>

In each solid-state imaging apparatus according to first and second embodiments of the present disclosure, stacked imaging devices are arranged in a two-dimensional matrix. Here, one array direction of the stacked imaging devices is called the "$x_0$ direction", and the other array direction is called the "$y_0$ direction", for the sake of convenience. The $x_0$ direction and the $y_0$ direction are preferably orthogonal to each other.

In a stacked imaging device of the present disclosure, at least one photoelectric conversion unit of a plurality of photoelectric conversion units that is stacked may include a first electrode, a photoelectric conversion layer, and a second electrode that are stacked, and further include a charge storage electrode that is disposed at a distance from the first electrode and is positioned to face the photoelectric conversion layer via an insulating layer. Note that such a stacked imaging device of the present disclosure is also referred to as a "stacked imaging device including a charge storage electrode", for convenience. Further, such a photoelectric conversion unit is also referred to as "the photoelectric conversion unit including the charge storage electrode", for convenience.

Such a stacked imaging device including such a charge storage electrode is an imaging device that is capable of preventing a decrease in imaging quality, and aims to achieve both high-precision polarization information acquisition and excellent imaging characteristics. Furthermore, in such a stacked imaging device including a charge storage electrode, the charge storage electrode is disposed at a distance from the first electrode, and is positioned to face the photoelectric conversion layer via an insulating layer. Accordingly, when light is emitted onto the photoelectric conversion unit, and photoelectric conversion is performed in the photoelectric conversion unit, electric charges can be stored in the photoelectric conversion unit. Accordingly, at the start of exposure, the charge storage portion can be fully depleted, and the electric charges can be erased. As a result, it is possible to reduce or prevent a phenomenon in which the kTC noise becomes larger, the random noise is aggravated, and the imaging quality is lowered. Thus, it is possible to achieve both high-precision polarization information acquisition and excellent imaging characteristics.

Note that an imaging device may also include a charge storage electrode and a polarizer. In other words, this imaging device includes a polarizer and a photoelectric conversion unit that are stacked, and the photoelectric conversion unit includes a first electrode, a photoelectric conversion layer, and a second electrode that are stacked, and further includes a charge storage electrode that is disposed at a distance from the first electrode and is positioned to face the photoelectric conversion layer via an insulating layer. Such an imaging device is also referred to as an "imaging device in the present disclosure", for convenience. Further, a stacked imaging device including the charge storage electrode and an imaging device in the present disclosure are also collectively referred to as an "imaging device or the like of the present disclosure".

In an imaging device or the like of the present disclosure, the first electrode may extend in an opening formed in the insulating layer, and be connected to the photoelectric conversion layer. Alternatively, the photoelectric conversion layer may extend in an opening formed in the insulating layer and be connected to the first electrode.

In this case, the edge portion of the top surface of the first electrode may be covered with the insulating layer, the first electrode may be exposed through the bottom surface of the opening, and, where the surface of the insulating layer in contact with the top surface of the first electrode is a first surface, and the surface of the insulating layer in contact with the portion of the photoelectric conversion layer facing the charge storage electrode is a second surface, a side surface of the opening may be a slope spreading from the first surface toward the second surface, and further, the side surface of the opening having the slope spreading from the first surface toward the second surface may be located on the charge storage electrode side. Note that this includes an embodiment in which another layer is formed between the photoelectric conversion layer and the first electrode (for example, an embodiment in which a material layer suitable for charge accumulation is formed between the photoelectric conversion layer and the first electrode).

Further, in an imaging device or the like of the present disclosure including the above preferred embodiment, a control unit that is disposed in the semiconductor substrate, and includes a drive circuit may be further provided, the first electrode and the charge storage electrode may be connected to the drive circuit, in a charge accumulation period, the drive circuit may apply a potential $V_{11}$ to the first electrode, and a potential $V_{12}$ to the charge storage electrode, to accumulate electric charges in the photoelectric conversion layer, and, in a charge transfer period, the drive circuit may apply a potential $V_{21}$ to the first electrode, and a potential $V_{22}$ to the charge storage electrode, to read the electric charges accumulated in the photoelectric conversion layer into the control unit via the first electrode. However, in a case where the potential of the first electrode is higher than the potential of the second electrode, $V_{12} \geq V_{11}$, and $V_{22} < V_{21}$, and, in a case where the potential of the first electrode is lower than the potential of the second electrode, $V_{12} \leq V_{11}$, and $V_{22} > V_{21}$.

An imaging device or the like of the present disclosure including the various preferred embodiments described above may further include a transfer control electrode (a charge transfer electrode) that is provided between the first electrode and the charge storage electrode, is disposed at a distance from the first electrode and the charge storage electrode, and is positioned to face the photoelectric conversion layer via the insulating layer. An imaging device or the like of the present disclosure of such a form is also referred to as an "imaging device or the like of the present disclosure including a transfer control electrode", for convenience. Then, in an imaging device or the like of the present disclosure including a transfer control electrode, a control unit that is disposed in the semiconductor substrate and includes a drive circuit may be further provided, the first electrode, the charge storage electrode, and the transfer control electrode may be connected to the drive circuit, in a charge accumulation period, the drive circuit may apply a potential $V_{11}$ to the first electrode, a potential $V_{12}$ to the charge storage electrode, and a potential $V_{13}$ to the transfer control electrode, to accumulate electric charges in the photoelectric conversion layer, and, in a charge transfer period, the drive circuit may apply a potential $V_{21}$ to the first electrode, a potential $V_{22}$ to the charge storage electrode, and a potential $V_{23}$ to the transfer control electrode, to read the electric charges accumulated in the photoelectric conversion layer into the control unit via the first electrode. However, in a case where the potential of the first electrode is higher than the potential of the second electrode, $V_{12} > V_{13}$, and $V_{22} \leq V_{23} \leq V_{21}$, and, in a case where the potential of the first electrode is lower than the potential of the second electrode, $V_{12} < V_{13}$, and $V_{22} \geq V_{23} \geq V_{21}$.

An imaging device or the like of the present disclosure including the various preferred embodiments described above may further include a charge emission electrode that is connected to the photoelectric conversion layer, and is disposed at a distance from the first electrode and the charge storage electrode. An imaging device or the like of the present disclosure of such a form is also referred to as an "imaging device or the like of the present disclosure including a charge emission electrode", for convenience. Further, in an imaging device or the like of the present disclosure including a charge emission electrode, the charge emission electrode may be disposed to surround the first electrode and the charge storage electrode (in other words, like a frame). The charge emission electrode may be shared (made common) among a plurality of imaging devices. Further, in this case, the photoelectric conversion layer may extend in a second opening formed in the insulating layer, and be connected to the charge emission electrode, the edge portion of the top surface of the charge emission electrode may be covered with the insulating layer, the charge emission electrode may be exposed through the bottom surface of the second opening, and a side surface of the second opening may be a slope spreading from a third surface toward a second surface, the third surface being the surface of the insulating layer in contact with the top surface of the charge emission electrode, the second surface being the surface of the insulating layer in contact with the portion of the photoelectric conversion layer facing the charge storage electrode.

Furthermore, in an imaging device or the like of the present disclosure including a charge emission electrode, a control unit that is disposed in the semiconductor substrate and includes a drive circuit may be further provided, the first electrode, the charge storage electrode, and the charge emission electrode may be connected to the drive circuit, in a charge accumulation period, the drive circuit may apply a potential $V_{11}$ to the first electrode, a potential $V_{12}$ to the charge storage electrode, and a potential $V_{14}$ to the charge emission electrode, to accumulate electric charges in the photoelectric conversion layer, and, in a charge transfer period, the drive circuit may apply a potential $V_{21}$ to the first electrode, a potential $V_{22}$ to the charge storage electrode, and a potential $V_{24}$ to the charge emission electrode, to read the electric charges accumulated in the photoelectric conversion layer into the control unit via the first electrode. However, in a case where the potential of the first electrode is higher than the potential of the second electrode, $V_{14} > V_{11}$, and $V_{24} < V_{21}$, and, in a case where the potential of the first electrode is lower than the potential of the second electrode, $V_{14} < V_{11}$, and $V_{24} > V_{21}$.

Further, in the various preferred embodiments described above in an imaging device or the like of the present disclosure, the charge storage electrode may be formed with a plurality of charge storage electrode segments. An imaging device or the like of the present disclosure of such a form is also referred to as an "imaging device or the like of the present disclosure including a plurality of charge storage electrode segments", for convenience. The number of charge storage electrode segments is two or larger. Further, in an imaging device or the like of the present disclosure including a plurality of charge storage electrode segments, in a case where a different potential is applied to each of N charge storage electrode segments, in a case where the potential of the first electrode is higher than the potential of the second electrode, the potential to be applied to the charge storage electrode segment (the first photoelectric conversion unit segment) located closest to the first electrode may be higher than the potential to be applied to the charge storage electrode segment (the Nth photoelectric conversion unit segment) located farthest from the first electrode in a charge transfer period, and, in a case where the potential of the first electrode is lower than the potential of the second electrode, the potential to be applied to the charge storage electrode segment (the first photoelectric conversion unit segment) located closest to the first electrode may be lower than the potential to be applied to the charge storage electrode segment (the Nth photoelectric conversion unit segment) located farthest from the first electrode in a charge transfer period.

Further, in a stacked imaging device of the present disclosure including the various preferred embodiments described above (including an imaging device or the like of the present disclosure), the polarizer may be formed with four polarizer segments arranged in a 2×2 array, the four polarizer segments being a first polarizer segment, a second polarizer segment, a third polarizer segment, and a fourth polarizer segment (in other words, two polarizer segments are arranged in the $x_0$ direction, and two polarizer segments are arranged in the $y_0$ direction), the polarization orientation in which light is to be transmitted by the first polarizer segment may be α degrees, the polarization orientation in which light is to be transmitted by the second polarizer segment may be (α+45) degrees, the polarization orientation in which light is to be transmitted by the third polarizer segment may be (α+90) degrees, and the polarization orientation in which light is to be transmitted by the fourth polarizer segment may be (α+135) degrees.

Further, in a stacked imaging device of the present disclosure including the above preferred embodiments (including an imaging device or the like of the present disclosure), a plurality of photoelectric conversion units may be formed with a photoelectric conversion unit having sensitivity to white light, and a photoelectric conversion unit having sensitivity to near-infrared light. Note that, when the photoelectric conversion unit on the light incident side is called the "upper photoelectric conversion unit", and the photoelectric conversion unit located below the upper photoelectric conversion unit is called the "lower photoelectric conversion unit", the upper photoelectric conversion unit may be formed with a photoelectric conversion unit having sensitivity to white light while the lower photoelectric conversion unit is formed with a photoelectric conversion unit having sensitivity to near-infrared light, or the upper photoelectric conversion unit may be formed with a photoelectric conversion unit having sensitivity to near-infrared light while the lower photoelectric conversion unit is formed with a photoelectric conversion unit having sensitivity to white light.

Alternatively, in a stacked imaging device of the present disclosure including the above preferred embodiments (including an imaging device or the like of the present disclosure), a plurality of photoelectric conversion units may be formed with a photoelectric conversion unit having sensitivity to red light, green light, or blue light, and a photoelectric conversion unit having sensitivity to near-infrared light. Here, the upper photoelectric conversion unit may be formed with a photoelectric conversion unit having sensitivity to red light, green light, or blue light while the lower photoelectric conversion unit is formed with a photoelectric conversion unit having sensitivity to near-infrared light, or the upper photoelectric conversion unit may be formed with a photoelectric conversion unit having sensitivity to near-infrared light while the lower photoelectric conversion unit is formed with a photoelectric conversion unit having sensitivity to red light, green light, or blue light. Further, in such a configuration, a color filter layer (a wavelength selecting means) may be disposed closer to the light incident side than the polarizer. Alternatively, in such a configuration, a color filter layer (a wavelength selecting means) is appropriately selected, so that the photoelectric conversion unit having sensitivity to red light, green light, or blue light can be formed by stacking at least two kinds of photoelectric conversion units selected from a group including a red-light photoelectric conversion unit having sensitivity to red light, a green-light photoelectric conversion unit having sensitivity to green light, and a blue-light photoelectric conversion unit having sensitivity to blue light.

The color filter layer (wavelength selecting means) may be a filter layer that transmits not only red, green, and blue, but also specific wavelengths of cyan, magenta, yellow, and the like in some cases, for example. The color filter layer is not necessarily formed with an organic material-based color filter layer using an organic compound such as a pigment or a dye, but may be formed with photonic crystal, a wavelength selection element using plasmon (a color filter layer having a conductor grid structure provided with a grid-like hole structure in a conductive thin film; see Japanese Patent Application Laid-Open No. 2008-177191, for example), or a thin film including an inorganic material such as amorphous silicon.

In a solid-state imaging apparatus according to the second embodiment of the present disclosure, in each imaging device unit, a first stacked imaging device includes a photoelectric conversion unit having sensitivity to red light, and a photoelectric conversion unit having sensitivity to near-infrared light, a second stacked imaging device includes a photoelectric conversion unit having sensitivity to green light, and a photoelectric conversion unit having sensitivity to near-infrared light, a third stacked imaging device includes a photoelectric conversion unit having sensitivity to blue light, and a photoelectric conversion unit having sensitivity to near-infrared light, and the first stacked imaging device, the second stacked imaging device, and the third stacked imaging device do not include any polarizer. Then, in this case, the fourth stacked imaging device may include a photoelectric conversion unit having sensitivity to white light, and a photoelectric conversion unit having sensitivity to near-infrared light.

Alternatively, in a solid-state imaging apparatus according to the second embodiment of the present disclosure, each imaging device unit may further include polarizers on the light incident sides of the first stacked imaging device, the second stacked imaging device, and the third stacked imaging device. The polarizers provided in the first stacked imaging device, the second stacked imaging device, the third stacked imaging device, and the fourth stacked imaging device may have the same polarization orientation. Furthermore, in this case, the polarization orientations of the polarizers differ between adjacent imaging device units.

Alternatively, in a solid-state imaging apparatus according to the second embodiment of the present disclosure, the first stacked imaging device may include a photoelectric conversion unit having sensitivity to red light, and a photoelectric conversion unit having sensitivity to near-infrared light, the second stacked imaging device may include a photoelectric conversion unit having sensitivity to green light, and a photoelectric conversion unit having sensitivity to near-infrared light, the third stacked imaging device may include a photoelectric conversion unit having sensitivity to blue light, and a photoelectric conversion unit having sensitivity to near-infrared light, an imaging device unit group may be formed with the four imaging device units of the first imaging device unit, the second imaging device unit, the third imaging device unit, and the fourth imaging device unit, which are arranged in a 2×2 array (two imaging device units arranged in the $x_0$ direction, and two imaging device units arranged in the $y_0$ direction), the polarization orientation in which light is to be transmitted by the first polarizer included in the first imaging device unit may be a degrees, the polarization orientation in which light is to be transmitted by the second polarizer included in the second imaging device unit may be $(\alpha+45)$ degrees, the polarization orientation in which light is to be transmitted by the third polarizer included in the third imaging device unit may be $(\alpha+90)$ degrees, and the polarization orientation in which light is to be transmitted by the fourth polarizer included in the fourth imaging device unit may be $(\alpha+135)$ degrees.

Alternatively, in a solid-state imaging apparatus according to the second embodiment of the present disclosure, the first stacked imaging device may include a photoelectric conversion unit having sensitivity to red light, and a photoelectric conversion unit having sensitivity to near-infrared light, the second stacked imaging device may include a photoelectric conversion unit having sensitivity to green light, and a photoelectric conversion unit having sensitivity to near-infrared light, the third stacked imaging device may include a photoelectric conversion unit having sensitivity to blue light, and a photoelectric conversion unit having sensitivity to near-infrared light, the fourth stacked imaging device may include a photoelectric conversion unit having sensitivity to white light, and a photoelectric conversion unit having sensitivity to near-infrared light, the polarizer disposed on the light incident side of the fourth stacked imaging device may be formed with four polarizer segments arranged in a 2×2 array (two polarizer segments arranged in the $x_0$ direction, and two polarizer segments arranged in the $y_0$ direction), the four polarizer segments being a 4-1st polarizer, a 4-2nd polarizer, a 4-3rd polarizer, and a 4-4th polarizer, the polarization orientation in which light is to be transmitted by the 4-1st polarizer may be $\alpha$ degrees, the polarization orientation in which light is to be transmitted by the 4-2nd polarizer may be $(\alpha+45)$ degrees, the polarization orientation in which light is to be transmitted by the 4-3rd polarizer may be $(\alpha+90)$ degrees, and the polarization orientation in which light is to be transmitted by the 4-4th polarizer may be $(\alpha+135)$ degrees.

Further, in such a configuration, each imaging device unit may further include a polarizer on the respective light incident sides of the first stacked imaging device, the second stacked imaging device, and the third stacked imaging device, the polarizer disposed on the light incident side of the first stacked imaging device may be formed with four polarizer segments arranged in a 2×2 array (in other words, two polarizer segments arranged in the $x_0$ direction, and two polarizer segments arranged in the $y_0$ direction), the four polarizer segments being a 1-1st polarizer, a 1-2nd polarizer, a 1-3rd polarizer, and a 1-4th polarizer, the polarization orientation in which light is to be transmitted by the 1-1st polarizer may be $\beta$ degrees, the polarization orientation in which light is to be transmitted by the 1-2nd polarizer may be $(\beta+45)$ degrees, the polarization orientation in which light is to be transmitted by the 1-3rd polarizer may be $(\alpha+90)$ degrees, the polarization orientation in which light is to be transmitted by the 1-4th polarizer may be $(\beta+135)$ degrees, the polarizer disposed on the light incident side of the second stacked imaging device may be formed with four polarizer segments arranged in a 2×2 array (in other words, two polarizer segments arranged in the $x_0$ direction, and two polarizer segments arranged in the $y_0$ direction), the four polarizer segments being a 2-1st polarizer, a 2-2nd polarizer, a 2-3rd polarizer, and a 2-4th polarizer, the polarization orientation in which light is to be transmitted by the 2-1st polarizer may be $\gamma$ degrees, the polarization orientation in which light is to be transmitted by the 2-2nd polarizer may be $(\gamma+45)$ degrees, the polarization orientation in which light is to be transmitted by the 2-3rd polarizer may be $(\gamma+90)$ degrees, the polarization orientation in which light is to be transmitted by the 2-4th polarizer may be $(\gamma+135)$ degrees, the polarizer disposed on the light incident side of the third stacked imaging device may be formed with four polarizer segments arranged in a 2×2 array (in other words, two polarizer segments arranged in the $x_0$ direction, and two polarizer segments arranged in the $y_0$ direction), the four polarizer segments being a 3-1st polarizer, a 3-2nd polarizer, a 3-3rd polarizer, and a 3-4th polarizer, the polarization orientation in which light is to be transmitted by the 3-1st polarizer may be $\delta$ degrees, the polarization orientation in which light is to be transmitted by the 3-2nd polarizer may be $(\delta+45)$ degrees, the polarization orientation in which light is to be transmitted by the 3-3rd polarizer may be $(\delta+90)$ degrees, and the polarization orientation in which light is to be transmitted by the 3-4th polarizer may be $(\delta+135)$ degrees.

In a stacked imaging device of the present disclosure or a solid-state imaging apparatus according to the second embodiment of the present disclosure, an angle "0 degree" formed with the $y_0$ direction may be an example value of $\alpha$, $\beta$, $\gamma$, and $\delta$. Also, it is preferable to satisfy $\alpha=\beta=\gamma=\delta$, though not particularly limited to that.

A stacked imaging device of the present disclosure may further include a semiconductor substrate (including the concept of a semiconductor layer) such as a silicon semiconductor substrate, for example, and at least the upper photoelectric conversion unit is disposed above the semiconductor substrate. Alternatively, A stacked imaging device of the present disclosure may further include a semiconductor substrate such as a silicon semiconductor substrate, for example, and the upper photoelectric conversion unit and the lower photoelectric conversion unit may be formed on the semiconductor substrate. Likewise, an imaging device or the like of the present disclosure may further include a semiconductor substrate, and the upper photoelectric conversion unit may be disposed above the semiconductor substrate. A photoelectric conversion unit may have a stack structure formed with a first electrode, a photoelectric conversion layer, and a second electrode, and the first electrode and the second electrode may be connected to a drive circuit described later.

In a stacked imaging device of the present disclosure or an imaging device or the like of the present disclosure, the second electrode located on the light incident side may be shared by a plurality of imaging devices. That is, the second electrode can be a so-called solid electrode. The photoelectric conversion layer may be shared by a plurality of imaging devices. In other words, one photoelectric conversion layer may be formed for a plurality of imaging devices, or may be provided for each imaging device.

Further, in an imaging device or the like of the present disclosure including the various preferred embodiments described above, at least a floating diffusion layer and an amplification transistor that constitute the control unit may be disposed in the semiconductor substrate, and the first electrode may be connected to the floating diffusion layer and the gate portion of the amplification transistor. Furthermore, in this case, a reset transistor and a selection transistor that constitute the control unit may be further disposed in the semiconductor substrate, the floating diffusion layer may be connected to one source/drain region of the reset transistor, and one source/drain region of the amplification transistor may be connected to one source/drain region of the selection transistor, and the other source/drain region of the selection transistor may be connected to a signal line.

Further, in an imaging device or the like of the present disclosure including the various preferred embodiments described above, the size of the charge storage electrode may be larger than that of the first electrode. Where the area of the charge storage electrode is represented by $S_1'$, and the area of the first electrode is represented by $S_1$, it is preferable to satisfy $4 \leq S_1'/S_1$, though not limited to that.

Alternatively, modifications of an imaging device or the like of the present disclosure including the various preferred embodiments described above may include imaging devices of first through sixth configurations described below. Specifically, in imaging devices of the first through sixth configurations in imaging devices or the like of the present disclosure including the various preferable embodiments described above, the photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments in imaging devices of the first through third configurations, the charge storage electrode is formed with N charge storage electrode segments that are disposed at a distance from one another in imaging devices of the fourth and fifth configurations, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode.

Then, in an imaging device of the first configuration, the thicknesses of the insulating layer segments gradually vary from the first photoelectric conversion unit segment to the Nth photoelectric conversion unit segment. Further, in an imaging device of the second configuration, the thicknesses of the photoelectric conversion layer segments gradually vary from the first photoelectric conversion unit segment to the Nth photoelectric conversion unit segment. Further, in an imaging device of the third configuration, the material forming the insulating layer segment differs between adjacent photoelectric conversion unit segments. Further, in an imaging device of the fourth configuration, the material forming the charge storage electrode segment differs between adjacent photoelectric conversion unit segments. Further, in an imaging device of the fifth configuration, the areas of the charge storage electrode segments become gradually smaller from the first photoelectric conversion unit segment to the Nth photoelectric conversion unit segment. The areas may become smaller continuously or in a stepwise manner.

Alternatively, in an imaging device of the sixth configuration in an imaging device or the like of the present disclosure including the various preferred embodiments described above, the cross-sectional area of the stacked portion of the charge storage electrode, the insulating layer, and the photoelectric conversion layer taken along a Y-Z virtual plane varies depending on the distance from the first electrode, where the stacking direction of the charge storage electrode, the insulating layer, and the photoelectric conversion layer is the Z direction, and the direction away from the first electrode is the X direction. The change in the cross-sectional area may be continuous or stepwise.

In the imaging devices of the first and second configurations, the N photoelectric conversion layer segments are continuously arranged, the N insulating layer segments are also continuously arranged, and the N charge storage electrode segments are also continuously arranged. In the imaging devices of the third through fifth configurations, the N photoelectric conversion layer segments are continuously arranged. Further, in the imaging devices of the fourth and fifth configurations, the N insulating layer segments are continuously arranged. In the imaging device of the third configuration, on the other hand, the N insulating layer segments are provided for the respective photoelectric conversion unit segments in one-to-one correspondence. Further, in the imaging devices of the fourth and fifth configurations, and in the imaging device of the third configuration in some cases, N charge storage electrode segments are provided for the respective photoelectric conversion unit segments in one-to-one correspondence. In the imaging devices of the first through sixth configurations, the same potential is applied to all of the charge storage electrode segments. Alternatively, in the imaging devices of the fourth and fifth configurations, and in the imaging device of the third configuration in some cases, a different potential may be applied to each of the N charge storage electrode segments.

In imaging devices of the first through sixth configurations, and solid-state imaging apparatuses according to the first and second embodiments of the present disclosure in which the imaging devices are used, the thickness of each insulating layer segment is specified, the thickness of each photoelectric conversion layer segment is specified, the materials forming the insulating layer segments vary, the materials forming the charge storage electrode segments vary, the area of each charge storage electrode segment is specified, or the cross-sectional area of each stacked portion is specified. Accordingly, a kind of charge transfer gradient is formed, and thus, the electric charges generated through photoelectric conversion can be more easily and reliably transferred to the first electrode. Then, as a result, it is possible to prevent generation of a residual image and generation of a transfer residue.

In the imaging devices of the first through fifth configurations, a photoelectric conversion unit segment having a greater value as n is located farther away from the first electrode, and whether or not a photoelectric conversion unit segment is located far from the first electrode is determined on the basis of the X direction. Further, in the imaging device of the sixth configuration, the direction away from the first electrode is the X direction. However, the "X direction" is defined as follows. Specifically, a pixel region in which a plurality of imaging devices or stacked imaging devices is arranged is formed with a plurality of pixels arranged regularly in a two-dimensional array, or in the X direction and the Y direction. In a case where the planar shape of each pixel is a rectangular shape, the direction in which the side closest to the first electrode extends is set as the Y direction, and a direction orthogonal to the Y direction is set as the X direction. Alternatively, in a case where the planar shape of each pixel is a desired shape, a general direction including the line segment or the curved line closest to the first electrode is set as the Y direction, and a direction orthogonal to the Y direction is set as the X direction. Normally, the X direction is parallel to the $x_0$ direction or the $y_0$ direction, and the Y direction is parallel to the $y_0$ direction or the $x_0$ direction.

The following is a description of cases where the potential of the first electrode is higher than the potential of the second electrode in imaging devices of the first through sixth configurations. However, in a case where the potential of the first electrode is lower than the potential of the second electrode, the levels of the potentials are only required to be switched.

In an imaging device of the first configuration, the thicknesses of the insulating layer segments gradually vary from the first photoelectric conversion unit segment to the Nth photoelectric conversion unit segment. However, the thicknesses of the insulating layer segments may gradually become greater or smaller. A kind of charge transfer gradient is formed by this variation.

In a case where the electric charges to be accumulated are electrons, a configuration in which the thicknesses of the insulating layer segments become gradually greater is only required to be adopted. In a case where the electric charges to be accumulated are holes, a configuration in which the thicknesses of the insulating layer segments become gradually smaller is only required to be adopted. Then, in these cases, when $|V_{12}| \geq |V_{11}|$ in a charge accumulation period, the nth photoelectric conversion unit segment can store more electric charges than the (n+1)th photoelectric conversion unit segment, and a strong electric field is applied so that electric charges can be reliably prevented from flowing from the first photoelectric conversion unit segment toward the first electrode. Further, when $|V_{22}| < |V_{21}|$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the second configuration, the thicknesses of the photoelectric conversion layer segments gradually vary from the first photoelectric conversion unit segment to the Nth photoelectric conversion unit segment. However, the thicknesses of the photoelectric conversion layer segments may gradually become greater or smaller. A kind of charge transfer gradient is formed by this variation.

In a case where the electric charges to be accumulated are electrons, a configuration in which the thicknesses of the photoelectric conversion layer segments become gradually greater is only required to be adopted. In a case where the electric charges to be accumulated are holes, a configuration in which the thicknesses of the photoelectric conversion layer segments become gradually smaller is only required to be adopted. Then, when $V_{12} \geq V_{11}$ in a charge accumulation period in a case where the thicknesses of the photoelectric conversion layer segments become gradually greater, or when $V_{12} \leq V_{11}$ in a charge accumulation period in a case where the thicknesses of the photoelectric conversion layer segments become gradually smaller, a stronger electric field is applied to the nth photoelectric conversion unit segment than to the (n+1)th photoelectric conversion unit segment, so that the flow of electric charges from the first photoelectric conversion unit segment toward the first electrode can be prevented without fail. Then, when $V_{22} < V_{21}$ in a charge transfer period in a case where the thicknesses of the photoelectric conversion layer segments become gradually greater, or when $V_{22} > V_{21}$ in a charge transfer period in a case where the thicknesses of the photoelectric conversion layer segments become gradually smaller, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the third configuration, the material forming the insulating layer segment differ between adjacent photoelectric conversion unit segments, and because of this, a kind of charge transfer gradient is formed. However, the values of the relative dielectric constants of the materials forming the insulating layer segments preferably become gradually smaller from the first photoelectric conversion unit segment to the Nth photoelectric conversion unit segment. Then, as such a configuration is adopted, when $V_{12} \geq V_{11}$ in a charge accumulation period, the nth photoelectric conversion unit segment can store more electric charges than the (n+1) the photoelectric conversion unit segment. Further, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the fourth configuration, the material forming the charge storage electrode segment differ between adjacent photoelectric conversion unit segments, and because of this, a kind of charge transfer gradient is formed. However, the values of the work functions of the materials forming the insulating layer segments preferably become gradually greater from the first photoelectric conversion unit segment to the Nth photoelectric conversion unit segment. Then, as such a configuration is adopted, it is possible to form a potential gradient that is advantageous for signal charge transfer, regardless of whether the voltage is positive or negative.

In an imaging device of the fifth configuration, the areas of the charge storage electrode segments become gradually smaller from the first photoelectric conversion unit segment to the Nth photoelectric conversion unit segment, and because of this, a kind of charge transfer gradient is formed. Accordingly, when $V_{12} \geq V_{11}$ in a charge accumulation period, the nth photoelectric conversion unit segment can store more electric charges than the (n+1)th photoelectric conversion unit segment. Further, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the sixth configuration, the cross-sectional area of the stacked portion varies depending on the distance from the first electrode, and because of this, a kind of charge transfer gradient is formed. Specifically, in a configuration in which the thicknesses of cross-sections of the stacked portion are made uniform while the width of a cross-section of the stacked portion is smaller at a position farther away from the first electrode, when $V_{12} \geq V_{11}$ in a charge accumulation period, a region closer to the first electrode can accumulate more electric charges than a region farther away from the first electrode, as in the above described imaging device of the fifth configuration. Accordingly, when $V_{22} < V_{21}$ in a charge transfer period, it is possible to reliably secure the flow of electric charges from a region closer to the first electrode toward the first electrode, and the flow of electric charges from a farther region toward a closer region. On the other hand, in a configuration in which the widths of cross-sections of the stacked portion are made uniform while the thicknesses of cross-sections of the stacked portion, or specifically, the thicknesses of the insulating layer segments, are gradually increased, when $V_{12} \geq V_{11}$ in a charge accumulation period, a region closer to the first electrode can accumulate more electric charges than a region farther away from the first electrode, and a stronger electric field is applied to the closer region. Thus, it is possible to reliably prevent the flow of electric charges from the region closer to the first electrode toward the first electrode, as in the above described imaging device of the first configuration. Later, when $V_{22} < V_{21}$ in a charge transfer period, it is possible to reliably secure the flow of electric charges from a region closer to the first electrode toward the first electrode, and the flow of electric charges from a farther region toward a closer region. Further, in a configuration in which the thicknesses of the photoelectric conversion layer segments are gradually increased, when $V_{12} \geq V_{11}$ in a charge accumulation period, a stronger electric field is applied to a region closer to the first electrode than to a region farther away from the first electrode, and it is possible to reliably prevent the flow of electric charges from the region closer to the first electrode toward the first electrode, as in the above described imaging device of the second configuration. Later, when $V_{22} < V_{21}$ in a charge transfer period, it is possible to reliably secure the flow of electric charges from a region closer to the first electrode toward the first electrode, and the flow of electric charges from a farther region toward a closer region.

Another modification of a solid-state imaging apparatus according to the first or second embodiment of the present disclosure may be a solid-state imaging apparatus that includes a plurality of imaging devices of any of the first through sixth configurations, an imaging device block is formed with a plurality of imaging devices, and a first electrode is shared among the plurality of imaging devices constituting the imaging device block. A solid-state imaging apparatus having such a configuration is referred to as a "solid-state imaging apparatus of the first configuration", for convenience. Alternatively, another modification of a solid-state imaging apparatus according to the first or second embodiment of the present disclosure may be a solid-state imaging apparatus that includes a plurality of stacked imaging devices including at least one imaging device of any of the first through sixth configurations, an imaging device block is formed with a plurality of stacked imaging devices, and a first electrode is shared among the plurality of stacked imaging devices constituting the imaging device block. A solid-state imaging apparatus having such a configuration is referred to as a "solid-state imaging apparatus of the second configuration", for convenience. Then, in a case where a first electrode is shared among the plurality of imaging devices constituting an imaging device block as above, the configuration and the structure in the pixel region in which a plurality of imaging devices is arranged can be simplified and miniaturized.

In solid-state imaging apparatuses of the first and second configurations, one floating diffusion layer is provided for a plurality of imaging devices (or one imaging device block). Here, the plurality of imaging devices provided for one floating diffusion layer may be formed with a plurality of imaging devices of the first type described later, or may be formed with at least one imaging device of the first type and one or more imaging devices of the second type described later. The timing of a charge transfer period is then appropriately controlled, so that the plurality of imaging devices can share the one floating diffusion layer. The plurality of imaging devices is operated in conjunction with one another, and are connected as an imaging device block to the drive circuit described later. In other words, a plurality of imaging devices constituting an imaging device block is connected to one drive circuit. However, charge storage electrode control is performed for each imaging device. Further, a plurality of imaging devices can share one contact hole portion. As for the layout relationship between the first electrode being shared among a plurality of imaging devices and the charge storage electrodes of the respective imaging devices, the first electrode may be disposed adjacent to the charge storage electrodes of the respective imaging devices in some cases. Alternatively, the first electrode is disposed adjacent to the charge storage electrode of one of the plurality of imaging devices, and is not adjacent to the charge storage electrodes of the plurality of remaining imaging devices. In such a case, electric charges are transferred from the plurality of remaining imaging devices to the first electrode via the one of the plurality of imaging devices. To ensure electric charge transfer from each imaging device to the first electrode, the distance (called the "distance A", for convenience) between a charge storage electrode of an imaging device or and a charge storage electrode of another imaging device is preferably longer than the distance (called the "distance B", for convenience) between the first electrode and the charge storage electrode in the imaging device adjacent to the first electrode. Further, the value of the distance A is preferably greater for an imaging device located farther away from the first electrode.

Furthermore, in an imaging device or the like of the present disclosure including the various preferred embodiments described above, light may enter from the second electrode side, and a light blocking layer may be formed on a light incident side closer to the second electrode. Alternatively, light may enter from the second electrode side, while light does not enter the first electrode (or the first electrode and the transfer control electrode in some cases). Then, in this case, a light blocking layer may be formed on a light incident side closer to the second electrode and above the first electrode (or the first electrode and the transfer control electrode in some cases). Alternatively, an on-chip microlens may be provided above the charge storage electrode and the second electrode, and light that enters the on-chip microlens may be gathered to the charge storage electrode. Here, the light blocking layer may be disposed above the surface of the second electrode on the light incident side, or may be disposed on the surface of the second electrode on the light incident side. In some cases, the light blocking layer may be formed in the second electrode. Examples of the material that forms the light blocking layer include chromium (Cr), copper (Cu), aluminum (Al), tungsten (W), and resin (polyimide resin, for example) that does not transmit light.

Specific examples of imaging devices or the like of the present disclosure include: an imaging device (referred to as a "blue-light imaging device of the first type", for convenience) that includes a photoelectric conversion layer (referred to as a "blue-light photoelectric conversion layer of the first type", for convenience) that absorbs blue light (light of 425 nm to 495 nm), and has sensitivity to blue light; an imaging device (referred to as a "green-light imaging device of the first type", for convenience) that includes a photoelectric conversion layer (referred to as a "green-light photoelectric conversion layer of the first type", for convenience) that absorbs green light (light of 495 nm to 570 nm), and has sensitivity to green light; and an imaging device (referred to as a "red-light imaging device of the first type", for convenience) that includes a photoelectric conversion layer (referred to as a "red-light photoelectric conversion layer of the first type", for convenience) that absorbs red light (light of 620 nm to 750 nm), and has sensitivity to red light. Further, of conventional imaging devices not including any charge storage electrode, an imaging device having sensitivity to blue light is referred to as a "blue-light imaging device of the second type", for convenience, an imaging device having sensitivity to green light is referred to as a "green-light imaging device of the second type", for convenience, an imaging device having sensitivity to red light is referred to as a "red-light imaging device of the second type", for convenience, a photoelectric conversion layer forming a blue-light imaging device of the second type is referred to as a "blue-light photoelectric conversion layer of the second type", for convenience, a photoelectric conversion layer forming a green-light imaging device of the second type is referred to as a "green-light photoelectric conversion layer of the second type", for convenience, and a photoelectric conversion layer forming a red-light imaging device of the second type is referred to as a "red-light photoelectric conversion layer of the second type", for convenience. A photoelectric conversion layer having sensitivity to white light has sensitivity to light of 425 nm to 750 nm, for example.

Specific examples of stacked imaging devices each including a charge storage electrode include:

[A] a configuration and a structure in which a blue-light photoelectric conversion unit of the first type, a green-light photoelectric conversion unit of the first type, and a red-light photoelectric conversion unit of the first type are stacked in a vertical direction, and the respective control units of a blue-light imaging device of the first type, a green-light imaging device of the first type, and a red-light imaging device of the first type are disposed in a semiconductor substrate;

[B] a configuration and a structure in which a blue-light photoelectric conversion unit of the first type and a green-light photoelectric conversion unit of the first type are stacked in a vertical direction, a red-light photoelectric conversion unit of the second type is disposed below these two photoelectric conversion units of the first type, and the respective control units of a blue-light imaging device of the first type, a green-light imaging device of the first type, and a red-light imaging device of the second type are disposed in a semiconductor substrate;

[C] a configuration and a structure in which a blue-light photoelectric conversion unit of the second type and a red-light photoelectric conversion unit of the second type are disposed below a green-light photoelectric conversion unit of the first type, and the respective control units of a green-light imaging device of the first type, a blue-light imaging device of the second type, and a red-light imaging device of the second type are disposed in a semiconductor substrate; and

[D] a configuration and a structure in which a green-light photoelectric conversion unit of the second type and a red-light photoelectric conversion unit of the second type are disposed below a blue-light photoelectric conversion unit of the first type, and the respective control units of a blue-light imaging device of the first type, a green-light imaging device of the second type, and a red-light imaging device of the second type are disposed in a semiconductor substrate. The arrangement sequence of the photoelectric conversion units of these imaging devices in a vertical direction is preferably as follows: a blue-light photoelectric conversion unit, a green-light photoelectric conversion unit, and a red-light photoelectric conversion unit from the light incident direction, or a green-light photoelectric conversion unit, a blue-light photoelectric conversion unit, and a red-light photoelectric conversion unit from the light incident direction. This is because light of a shorter wavelength is more efficiently absorbed on the incident surface side. Since red has the longest wavelength among the three colors, it is preferable to dispose a red-light photoelectric conversion unit in the lowermost layer when viewed from the light incidence face.

A stack structure formed with these imaging devices forms one pixel. Further, a near-infrared light photoelectric conversion unit (or an infrared-light photoelectric conversion unit) of the first type may be included. Here, the photoelectric conversion layer of the infrared-light photoelectric conversion unit of the first type includes an organic material, for example, and is preferably disposed in the lowermost layer of a stack structure of imaging devices of the first type, and above imaging devices of the second type. Alternatively, a near-infrared light photoelectric conversion unit (or an infrared-light photoelectric conversion unit) of the second type may be disposed below a photoelectric conversion unit of the first type.

In an imaging device of the first type, the first electrode is formed on an interlayer insulating layer provided on the semiconductor substrate, for example. An imaging device formed on the semiconductor substrate may be of a back-illuminated type or of a front-illuminated type.

In a case where a photoelectric conversion layer includes an organic material, the photoelectric conversion layer may have one of the following four forms:

(1) formed with a p-type organic semiconductor;

(2) formed with an n-type organic semiconductor:

(3) formed with a stack structure of a p-type organic semiconductor layer and an n-type organic semiconductor layer, formed with a stack structure of a p-type organic semiconductor layer, a mixed layer (a bulk heterostructure) of a p-type organic semiconductor and an n-type organic semiconductor, and an n-type organic semiconductor layer, formed with a stack structure of a p-type organic semiconductor layer, and a mixed layer (a bulk heterostructure) of a p-type organic semiconductor and an n-type organic semiconductor, or formed with a stack structure of an n-type organic semiconductor layer, and a mixed layer (a bulk heterostructure) of a p-type organic semiconductor and an n-type organic semiconductor;

and (4) formed with a mixture (a bulk heterostructure) of a p-type organic semiconductor and an n-type organic semiconductor.

However, the stacking order may be changed as appropriate in each configuration.

Examples of p-type organic semiconductors include naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes having a heterocyclic compound as a ligand, polythiophene derivatives, polybenzothiadiazole derivatives, and polyfluorene derivatives. Examples of n-type organic semiconductors include fullerenes, fullerene derivatives (fullerenes (higher-order fullerenes) such as C60, C70, and C74, and endohedral fullerenes, for example) or fullerene derivatives (fullerene fluorides, PCBM fullerene compounds, and fullerene multimers, for example), organic semiconductors with greater (deeper) HOMO and LUMO than p-type organic semiconductors, and transparent inorganic metal oxides. Specific examples of n-type organic semiconductors include heterocyclic compounds containing nitrogen atom, oxygen atom, and sulfur atom, such as pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, imidazole derivatives, benzoimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, organic molecules containing polyfluorene derivatives or the like as part of the molecular backbone, organometallic complexes, and subphthalocyanine derivatives. Examples of groups contained in fullerene derivatives include: halogen atom; a linear, branched, or cyclic alkyl group or phenyl group; a group containing a linear or fused aromatic compound; a group containing a halide; a partial fluoroalkyl group; a perfluoroalkyl group; a silyl alkyl group; a silyl alkoxy group; an aryl silyl group; an aryl sulfanyl group; an alkyl sulfanyl group; an aryl sulfonyl group; an alkyl sulfonyl group; an aryl sulfide group: an alkyl sulfide group; an amino group; an alkylamino group; an arylamino group; a hydroxy group; an alkoxy group; an acylamino group: an acyloxy group; a carbonyl group; a carboxy group; a carboxoamide group; a carboalkoxy group; an acyl group; a sulfonyl group; a cyano group; a nitro group; a group containing chalcogenide; a phosphine group; a phosphonate group; and derivatives of these materials. The thickness of a photoelectric conversion layer formed with an organic material (also referred to as an "organic photoelectric conversion layer" in some cases) is not limited to any particular value, but may be $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m, or even more preferably $1\times10^{-7}$ m to $1.8\times10^{-7}$ m, for example. Note that organic semiconductors are often classified into the p-type and the n-type. The p-type means that holes can be easily transported, and the n-type means that electrons can be easily transported. Unlike an inorganic semiconductor, an organic semiconductor is not interpreted as containing holes or electrons as majority carriers for thermal excitation.

Alternatively, examples of the material forming an organic photoelectric conversion layer that photoelectrically converts green light include rhodamine dyes, merocyanine dyes, quinacridone derivatives, and subphthalocyanine dyes (subphthalocyanine derivatives). Examples of the material forming an organic photoelectric conversion layer that photoelectrically converts blue light include coumaric acid dyes, tris-8-hydroxyquinolyl aluminum (Alq3), and merocyanine dyes. Examples of the material forming an organic photoelectric conversion layer that photoelectrically converts red light include phthalocyanine dyes and a subphthalocyanine pigments (subphthalocyanine derivatives).

Alternatively, examples of an inorganic material forming a photoelectric conversion layer include crystalline silicon, amorphous silicon, microcrystalline silicon, crystalline selenium, amorphous selenium, and compound semiconductors such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, which are chalcopyrite compounds, GaAs, InP, AlGaAs, InGaP, AlGaInP, and InGaAsP, which are III-V compounds, and further, CdSe, CdS, In$_2$Se$_3$, In$_2$S$_3$, Bi$_2$Se$_3$, Bi$_2$S$_3$, ZnSe, ZnS, PbSe, and PbS. In addition to that, it is also possible to use quantum dots including these materials for a photoelectric conversion layer.

Alternatively, a photoelectric conversion layer may have a stack structure formed with a lower semiconductor layer and an upper photoelectric conversion layer. As the lower semiconductor layer is provided, recoupling at the time of charge accumulation can be prevented, the efficiency of transfer of the electric charges stored in the photoelectric conversion layer to the first electrode can be increased, and generation of dark current can be prevented. The material forming the upper photoelectric conversion layer is only required to be selected as appropriate from the above various materials that can form a photoelectric conversion layer. On the other hand, the material forming the lower semiconductor layer is preferably a material that has a great value of bandgap energy (3.0 eV or greater as the value of bandgap energy, for example), and also has a higher mobility than the material forming the photoelectric conversion layer. Specific examples thereof include oxide semiconductor materials such as IGZO; transition metal dichalcogenides; silicon carbide; diamond; graphene; carbon nanotubes; and organic semiconductor materials such as condensed polycyclic hydrocarbon compounds and condensed heterocyclic compounds. Alternatively, in a case where the electric charges to be accumulated are holes, the material forming the lower semiconductor layer may be a material having a smaller ionization potential than the ionization potential of the material forming the photoelectric conversion layer. In a case where the electric charges to be accumulated are electrons, the material forming the lower semiconductor layer may be a material having a higher electron affinity than the electron affinity of the material forming the photoelectric conversion layer. Alternatively, the impurity concentration in the material forming the lower semiconductor layer is preferably equal to or lower than $1\times10^{18}$ cm$^{-3}$. The lower semiconductor layer may have a single-layer structure or a multilayer structure. Further, the material forming a lower semiconductor layer located above a charge storage electrode may differ from the material forming a lower semiconductor layer located above a first electrode.

A single-panel color solid-state imaging apparatus can be formed with a solid-state imaging apparatus according to the first or second embodiment of the present disclosure, or a solid-state imaging apparatus of the first or second configuration.

In a solid-state imaging apparatus of the second configuration that differs from a solid-state imaging apparatus including Bayer-array imaging devices (in other words, blue, green, and red color separation is not performed with color filter layers), imaging devices having sensitivity to light of a plurality of kinds of wavelengths are stacked in the light incident direction in the same pixel, to form one pixel. Thus, sensitivity can be increased, and the pixel density per unit volume can also be increased. Further, an organic material has a high absorption coefficient. Accordingly, the thickness of an organic photoelectric conversion layer can be made smaller than that of a conventional Si-based photoelectric conversion layer. Thus, light leakage from adjacent pixels, and restrictions on light incident angle are reduced. Furthermore, in a conventional Si-based imaging device, false color occurs because an interpolation process is performed among pixels of three colors to create color signals. In a solid-state imaging apparatus of the second configuration, on the other hand, generation of false color is reduced. Since an organic photoelectric conversion layer also functions as a color filter layer, color separation is possible without any color filter layer.

Meanwhile, in s solid-state imaging apparatus of the first configuration, the use of a color filter layer can alleviate the requirement for the spectral characteristics of blue, green, and red, and achieves a high mass productivity. Examples of the array of imaging devices in a solid-state imaging apparatus of the first configuration include not only a Bayer array but also an interlined array, a G-striped RB-checkered array, a G-striped RB-completely-checkered array, a checkered complementary color array, a striped array, an obliquely striped array, a primary color difference array, a field color difference sequence array, a frame color difference sequence array, a MOS-type array, an improved MOS-type array, a frame interleaved array, and a field interleaved array. Here, one pixel (or a sub pixel) is formed with one imaging device.

A pixel region in which a plurality of stacked imaging devices of the present disclosure or imaging devices or the like of the present disclosure (hereinafter, these devices will be sometimes collectively referred to as "stacked imaging devices or the like of the present disclosure" or simply as "stacked imaging devices or the like") is arranged is formed with a plurality of pixels regularly arranged in a two-dimensional array. The pixel region includes an effective pixel region that actually receives light, amplifies signal charges generated through photoelectric conversion, and reads the signal charges into the drive circuit, and a black reference pixel region for outputting optical black that serves as the reference for black levels. The black reference pixel region is normally located in the outer periphery of the effective pixel region.

In an imaging device or the like of the present disclosure including the various preferred embodiments and configurations described above, light is received, photoelectric conversion occurs in the photoelectric conversion layer, and carriers are separated into holes and electrons. The electrode from which holes are extracted is then set as the anode, and the electrode from which electrons are extracted is set as the cathode. The first electrode may form the anode while the second electrode forms the cathode in some embodiments and conversely, the first electrode may form the cathode while the second electrode forms the anode in some embodiments.

The first electrode, the charge storage electrode, the transfer control electrode, the charge emission electrode, and the second electrode may include a transparent conductive material. The first electrode, the charge storage electrode, the transfer control electrode, and the charge emission electrode may be collectively referred to as the "first electrode and the like". Alternatively, in a case where imaging devices or the like of the present disclosure are arranged in a plane like a Bayer array, for example, the second electrode may include a transparent conductive material, and the first electrode may include a metallic material. In this case, specifically, the second electrode located on the light incident side may include a transparent conductive material, and the first electrode and the like may include Al—Nd (an alloy of aluminum and neodymium) or ASC (an alloy of aluminum, samarium, and copper). The electrode including a transparent conductive material may be referred to as the "transparent electrode". Here, the bandgap energy of the transparent conductive material is preferably 2.5 eV or higher, or more preferably, 3.1 eV or higher. Examples of the transparent conductive material forming the transparent electrode include conductive metal oxides. Specifically, these examples include indium oxide, indium-tin oxides (including ITO, indium tin oxide, Sn-doped $In_2O_3$, crystalline ITO, and amorphous ITO), indium-zinc oxides (IZO, indium zinc oxide) in which indium is added as a dopant to zinc oxide, indium gallium oxides (IGO) in which indium is added as a dopant to gallium oxide, indium-gallium-zinc oxides (IGZO, In—$GaZnO_4$) in which indium and gallium are added as a dopant to zinc oxide, indium-tin-zinc oxides (ITZO) in which indium and tin are added as a dopant to zinc oxide, IFO (F-doped $In_2O_3$), tin oxide ($SnO_2$), ATO (Sb-doped $SnO_2$), FTO (F-doped $SnO_2$), zinc oxides (including ZnO doped with other elements), aluminum-zinc oxides (AZO) in which aluminum is added as a dopant to zinc oxide, gallium-zinc oxides (GZO) in which gallium is added as a dopant to zinc oxide, titanium oxide ($TiO_2$), niobium-titanium oxide (TNO) in which niobium is added as a dopant to titanium oxide, antimony oxide, spinel-type oxides, and oxides each having a $YbFe_2O_4$ structure. Alternatively, the transparent electrode may have a base layer including gallium oxide, titanium oxide, niobium oxide, nickel oxide, or the like. The thickness of the transparent electrode may be $2\times10^{-8}$ m to $2\times10^{-7}$ m, or preferably, $3\times10^{-8}$ m to $1\times10^{-7}$ m. In a case where the first electrode is required to be transparent, the charge emission electrode preferably also includes a transparent conductive material, from the viewpoint of simplification of the manufacturing process.

Alternatively, in a case where transparency is not required, the conductive material forming the anode having a function as the electrode for extracting holes is preferably a conductive material having a high work function ($\varphi$=4.5 eV to 5.5 eV, for example), and specific examples of the conductive material include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). On the other hand, the conductive material forming the cathode having a function as the electrode for extracting electrons is preferably a conductive material having a low work function ($\varphi$=3.5 eV to 4.5 eV, for example), and specific examples of the conductive material include alkali metals (such as Li, Na, and K, for example) and fluorides or oxides thereof, alkaline-earth metals (such as Mg and Ca, for example) and fluorides or oxides thereof, aluminum (Al), zinc (Zn), tin (Sn), thallium (Tl), sodium-potassium alloys, aluminum-lithium alloys, magnesium-silver alloys, and rare earth metals such as indium and ytterbium or alloys thereof. Alternatively, examples of the material forming the anode or the cathode include metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), molybdenum (Mo), alloys containing these metallic elements, conductive particles including these metals, conductive particles containing an alloy of these metals, polysilicon containing impurities, carbon-based materials, oxide semiconductors, carbon nanotubes, and conductive materials such as graphene. The anode or the cathode may also be formed with a stack structure containing these elements. Further, the material forming the anode or the cathode may be an organic material (conductive polymer) such as poly(3,4-ethylenedioxythiophene)/polystyrene sulfonate (PEDOT/PSS). Alternatively, any of these conductive materials may be mixed with a binder (polymer), to form a paste or ink, and the paste or ink may be then cured to be used as an electrode.

The film formation method for forming the first electrode and the like, and the second electrode (the anode and the cathode) may be a dry method or a wet method. Examples of dry methods include physical vapor deposition methods (PVD methods) and chemical vapor deposition methods (CVD methods). Examples of film formation methods using the principles of PVD methods include a vacuum vapor deposition method using resistance heating or high frequency heating, an EB (electron beam) vapor deposition method, various sputtering methods (a magnetron sputtering method, an RF-DC coupled bias sputtering method, an ECR sputtering method, a facing target sputtering method, and a radio-frequency sputtering method), an ion plating method, a laser ablation method, a molecular beam epitaxy method, and a laser transfer method. Further, examples of CVD methods include a plasma CVD method, a thermal CVD method, a metalorganic (MO) CVD method, and an optical CVD method. Meanwhile, examples of wet methods include an electrolytic plating method, an electroless plating method, a spin coating method, an inkjet method, a spray coating method, a stamp method, a microcontact printing method, a flexographic printing method, an offset printing method, a gravure printing method, and a dip method. Examples of patterning methods include a shadow mask technique, laser transfer, chemical etching such as photolithography, and physical etching using ultraviolet light, laser, and the like. The planarization technique for the first electrode and the like, and the second electrode may be a laser planarization method, a reflow method, a chemical mechanical polishing (CMP) method, or the like.

Examples of materials forming the insulating layer (including the lower insulating layer and the upper insulating layer) include not only inorganic materials that are typically metal oxide high-dielectric insulating materials such as: silicon oxide materials; silicon nitride (SiNy); and aluminum oxide ($Al_2O_3$), but also organic insulating materials (organic polymers) that are typically straight-chain hydrocarbons having a functional group capable of binding to a control electrode at one end, such as: polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), and octadecyltrichlorosilane (OTS); novolac-type phenolic resins; fluorocarbon resins; octadecanethiol; and dodecylisocyanate. Combinations of these materials may also be used. Examples of silicon oxide materials include silicon oxide ($SiO_x$), BPSG, PSG, BSG, AsSG, PbSG, silicon oxynitride (SiON), spin-on glass (SOG), and low-dielectric-constant insulating materials (polyarylethers, cycloperfluorocarbon polymers, benzocyclobutene, cyclic fluorine resin, polytetrafluoroethylene, fluorinated aryl ether, fluorinated polyimide, amorphous carbon, and organic SOG, for example). Materials forming the various interlayer insulating layers and insulating material films is only required to be selected from these materials as appropriate.

The configurations and the structures of the floating diffusion layer, the amplification transistor, the reset transistor, and the selection transistor that constitute the control unit may be similar to the configurations and the structures of a conventional floating diffusion layer, a conventional amplification transistor, a conventional reset transistor, and a conventional selection transistor. The drive circuit may also have a known configuration and structure.

The first electrode is connected to the floating diffusion layer and the gate portion of the amplification transistor, but a contact hole portion is only required to be formed to connect the first electrode to the floating diffusion layer and the gate portion of the amplification transistor. Examples of the material forming the contact hole portion include polysilicon doped with impurities, high-melting-point metals such as tungsten, Ti, Pt, Pd, Cu, TiW, TiN, TiNW, $WSi_2$, $MoSi_2$, metal silicides, and stack structures formed with these materials (Ti/TiN/W, for example).

A first carrier blocking layer may be provided between the organic photoelectric conversion layer and the first electrode, or a second carrier blocking layer may be provided between the organic photoelectric conversion layer and the second electrode. Further, a first charge injection layer may be provided between the first carrier blocking layer and the first electrode, or a second charge injection layer may be provided between the second carrier blocking layer and the second electrode. For example, the material forming an electron injection layer may be an alkali metal such as lithium (Li), sodium (Na), or potassium (K), a fluoride or oxide of such an alkali metal, an alkaline-earth metal such as magnesium (Mg) or calcium (Ca), or a fluoride or oxide of such an alkaline-earth metal.

Examples of film formation methods for forming the various organic layers include dry film formation methods and wet film formation methods. Examples of dry film formation methods include resistance heating or radio-frequency heating, a vacuum vapor deposition method using electron beam heating, a flash vapor deposition method, a plasma vapor deposition method, an EB vapor deposition method, various sputtering methods (a bipolar sputtering method, a direct-current sputtering method, a direct-current magnetron sputtering method, a radio-frequency sputtering method, a magnetron sputtering method, an RF-DC coupled bias sputtering method, an ECR sputtering method, a facing target sputtering method, a radio-frequency sputtering method, and an ion beam sputtering method), a direct current (DC) method, an RF method, a multiple cathode method, an activation reaction method, an electric field deposition method, various ion plating methods such as a radio-frequency ion plating method and a reactive ion plating method, a laser ablation method, a molecular beam epitaxy method, a laser transfer method, and a molecular beam epitaxy method (MBE method). Further, examples of CVD methods include a plasma CVD method, a thermal CVD method, a MOCVD method, and an optical CVD method. Meanwhile, specific examples of wet methods include various printing methods such as: a spin coating method; an immersion method; a casting method; a microcontact printing method; a drop casting method; a screen printing method; an inkjet printing method; an offset printing method; a gravure printing method; and a flexographic printing method, and various coating methods such as: a stamp method; a spray method; an air doctor coating method; a blade coating method; a rod coating method; a knife coating method; a squeeze coating method; a reverse roll coating method; a transfer roll coating method; a gravure coating method; a kiss coating method; a cast coating method; a spray coating method; a slit orifice coating method; and a calendar coating method. In a coating method, non-polar or low-polarity organic solvent such as toluene, chloroform, hexane, or ethanol may be used as the solvent, for example. Examples of patterning methods include a shadow mask technique, laser transfer, chemical etching such as photolithography, and physical etching using ultraviolet light, laser, and the like. The planarization technique for the various organic layers may be a laser planarization method, a reflow method, or the like.

Two types or more of the imaging devices of the first through sixth configurations described above may be combined as desired.

As described above, in stacked imaging devices or the like of the present disclosure or a solid-state imaging apparatus, on-chip microlenses and light blocking layers may be provided as needed, and drive circuits and wiring lines for driving the stacked imaging devices or the like of the present disclosure are provided. If necessary, a shutter for controlling light entering a stacked imaging device or the like of the present disclosure may be provided, and a solid-state imaging apparatus may include an optical cut filter, depending on its purpose.

Further, in solid-state imaging apparatuses of the first and second configurations, one on-chip microlens may be disposed above one stacked imaging device or the like of the present disclosure. Alternatively, an imaging device block may be formed with two stacked imaging devices or the like of the present disclosure, and one on-chip microlens may be disposed above the imaging device block.

For example, in a case where a solid-state imaging apparatus and a readout integrated circuit (ROIC) are stacked, a drive substrate on which the readout integrated circuit and a connecting portion including copper (Cu) are formed, and an imaging device on which a connecting portion is formed are stacked on each other so that the connecting portions are brought into contact with each other, and the connecting portions are joined to each other. In this manner, the solid-state imaging apparatus and the readout integrated circuit can be stacked, and the connecting portions can be joined to each other with solder bumps or the like.

Meanwhile, in a method of driving a solid-state imaging apparatus according to the first or second embodiment of the present disclosure may be a method of driving a solid-state imaging apparatus by repeating the following steps:

in all the imaging devices or the like, the electric charges in the first electrodes are simultaneously released out of the system, while electric charges are accumulated in the photoelectric conversion layers; after that, in all the imaging devices or the like, the electric charges accumulated in the photoelectric conversion layers are simultaneously transferred to the first electrodes; and after the transfer is completed, the electric charges transferred to the first electrode are sequentially read out in each of the imaging devices or the like.

In such a method of driving a solid-state imaging apparatus, each imaging device has a structure in which light that has entered from the second electrode side does not enter the first electrode, and the electric charges in the first electrodes are released out of the system while electric charges are accumulated in the photoelectric conversion layers in all the imaging devices. Thus, the first electrodes can be reliably reset at the same time in all the imaging devices. After that, the electric charges accumulated in the photoelectric conversion layers are simultaneously transferred to the first electrodes in all the imaging devices, and, after the transfer is completed, the electric charges transferred to the first electrode are sequentially read out in each imaging device. Because of this, a so-called global shutter function can be easily achieved.

Stacked imaging devices or the like of the present disclosure may be CCD devices, CMOS image sensors, contact image sensors (CIS), or signal-amplifying image sensors of a charge modulation device (CMD) type. A solid-state imaging apparatus of the first or second embodiment of the present disclosure, or a solid-state imaging apparatus of the first or second configuration can form a digital still camera, a digital video camera, a camcorder, a surveillance camera, a camera to be mounted in a vehicle (an in-vehicle camera), a smartphone camera, a game user interface camera, a biometric authentication camera, or the like, for example. Then, such a solid-state imaging apparatus can further be an imaging apparatus capable of simultaneously acquiring polarization information, as well as performing regular imaging. The imaging apparatus may also be an imaging apparatus that captures a stereoscopic image.

In stacked imaging devices or the like of the present disclosure, and solid-state imaging apparatuses of the first and second embodiments of the present disclosure, the polarizer is preferably formed with a wire grid polarizer having a line-and-space structure.

The line portions of the wire grid polarizer are formed with a stack structure in which a light reflection layer including a first conductive material, an insulating film, and a light absorption layer including a second conductive material are stacked in this order from the opposite side from the light incident side. Here, such a polarizer can be manufactured on the basis of the following steps, for example.

(A) After the photoelectric conversion unit is formed, for example, a light reflection layer forming layer that includes a first conductive material and is electrically connected to a substrate or the photoelectric conversion unit is formed on or above the photoelectric conversion unit.

(B) An insulating film forming layer is then formed on the light reflection layer forming layer, and a light absorption layer forming layer that includes a second conductive material and has at least a portion in contact with the light reflection layer forming layer is formed on the insulating film forming layer.

(C) Patterning is then performed on the light absorption layer forming layer, the insulating film forming layer, and the light reflection layer forming layer, so that a wire grid polarizer in which a plurality of strip-shaped line portions formed with a light reflection layer, an insulating film, and a light absorption layer are arranged in parallel at a distance from one another. Note that, in step (B), the light absorption layer forming layer including the second conductive material is disposed, with the light reflection layer forming layer being set at a predetermined potential via the substrate or the photoelectric conversion unit, and in step (C), the patterning is performed on the light absorption layer forming layer, the insulating film forming layer, and the light reflection layer forming layer, with the light reflection layer forming layer being set at a predetermined potential via the substrate or the photoelectric conversion unit.

Further, Ti, TiN, or a stack structure of Ti/TiN may be formed as the base layer of the light reflection layer, so that roughness of the light reflection layer forming layer and the light reflection layer can be reduced.

The light reflection layer (the light reflection layer forming layer) may include a metallic material, an alloy material, or a semiconductor material, and the light absorption layer may include a metallic material, an alloy material, or a semiconductor material. Specifically, examples of the inorganic material forming the light reflection layer (the light reflection layer forming layer) include metallic materials such as aluminum (Al), silver (Ag), gold (Au), copper (Cu), platinum (Pt), molybdenum (Mo), chromium (Cr), titanium (Ti), nickel (Ni), tungsten (W), iron (Fe), silicon (Si), germanium (Ge), and tellurium (Te), alloy material containing these metals, and semiconductor materials.

Meanwhile, the material forming the light absorption layer (the light absorption layer forming layer) may be a metallic material, an alloy material, or a semiconductor material whose extinction coefficient k is not zero, or has a light absorbing function. Specific examples of such materials include metallic materials such as aluminum (Al), silver (Ag), gold (Au), copper (Cu), molybdenum (Mo), chromium (Cr), titanium (Ti), nickel (Ni), tungsten (W), iron (Fe), silicon (Si), germanium (Ge), tellurium (Te), and tin (Sn), alloy materials containing these metals, and semiconductor materials. The examples also include silicide-based materials such as $FeSi_2$ (especially $\beta$-$FeSi_2$), $MgSi_2$, $NiSi_2$, $BaSi_2$, $CrSi_2$, and $CoSi_2$. Particularly, aluminum, an alloy thereof, or a semiconductor material containing $\beta$-$FeSi_2$, germanium, or tellurium is used as the material forming the light absorption layer (the light absorption layer forming layer), so that a high contrast (a high extinction ratio) can be obtained in the visible light range. Note that, to give polarization characteristics to a wavelength band other than the visible light range, such as the infrared band, for example, silver (Ag), copper (Cu), gold (Au), or the like is preferably used as the material forming the light absorption layer (the light absorption layer forming layer). This is because the resonant wavelengths of these metals are in the neighborhood of the infrared band.

The light reflection layer forming layer and the light absorption layer forming layer can be formed by known methods such as various chemical vapor deposition methods (CVD methods), coating methods, various physical vapor deposition methods (PVD methods) including sputtering methods and vacuum vapor deposition methods, sol-gel methods, plating methods, MOCVD methods, and MBE methods. Meanwhile, examples of patterning methods for the light reflection layer forming layer and the light absorption layer forming layer include combinations of a lithography technique and an etching technique (for example, anisotropic dry etching techniques using carbon tetrafluoride gas, sulfur hexafluoride gas, trifluoromethane gas, xenon difluoride gas, or the like, or physical etching techniques), a so-called liftoff technique, and a so-called self-aligned double patterning technique using a sidewall as a mask. Further, examples of lithography techniques include photolithography techniques (lithography techniques using a g-line or an i-line of a high-pressure mercury lamp, a KrF excimer laser, an ArF excimer laser, an EUV, or the like as the light source, immersion lithography techniques using these light sources, electron beam lithography techniques, and X-ray lithography). Alternatively, the light reflection layer and the light absorption layer may also be formed by a microfabrication technique using an ultrashort time pulse laser such as a femtosecond laser, or by a nanoimprint method.

The material forming the insulating film (the insulating film forming layer) is an insulating material that is transparent to incident light and does not have light absorption characteristics. Specific examples of such materials include $SiO_X$ materials (materials each forming a silicon-based oxide film) such as $SiO_2$, non-doped silicate glass (NSG), borophosphosilicate glass (BPSG), PSG, BSG, PbSG, AsSG, SbSG, and spin-on glass (SOG), SiN, SiON, SiOC, SiOF, SiCN, low-dielectric-constant insulating materials (fluorocarbon, cycloperfluorocarbon polymer, benzocyclobutene, cyclic fluorocarbon resin, polytetrafluoroethylene, amorphous tetrafluoroethylene, polyarylether, fluorinated arylether, fluorinated polyimide, organic SOG, parylene, fluorinated fullerene, and amorphous carbon, for example), polyimide resin, fluorine resin, Silk (trademark of The Dow Chemical Co.; a coating low-dielectric-constant interlayer insulating film material), and Flare (trademark of Honeywell Electronic Materials Co.; a polyallylether (PAE) material). One or a combination of these materials may be used as appropriate. The insulating film forming layer may be formed by known methods such as various CVD methods, coating methods, various PVD methods including sputtering methods and vacuum vapor deposition methods, various printing methods such as screen printing methods, and sol-gel methods. The insulating film is formed to function as the base layer of the light absorption layer, adjusts the phase of polarized light reflected by the light absorption layer and polarized light transmitted through the light absorption layer and reflected by the light reflection layer, improve the extinction ratio and the transmittance by virtue of an interference effect, and thus, reduce the reflectance. Therefore, the insulating film preferably has a thickness such that the phase in one reciprocation is shifted by a half wavelength. However, since the light absorption layer has a light absorbing effect, reflected light is absorbed. Accordingly, even if the thickness of the insulating film is not optimized as described above, the extinction ratio can be improved. Therefore, in practice, the thickness of the insulating film is determined on the basis of the balance between the desired polarization characteristics and the actual manufacturing process, and may be $1 \times 10^{-9}$ m to $1 \times 10^{-7}$ m, or more preferably, $1 \times 10^{-8}$ m to $8 \times 10^{-8}$ m, for example. Further, the refractive index of the insulating film is preferably higher than 1.0 and not higher than 2.5, though not limited to this range.

Meanwhile, the extending direction (first direction) of the strip-shaped light reflection layer may coincide with the polarization orientation in which light extinction is to be conducted, and the repeating direction (second direction) of the strip-shaped light reflection layer may coincides with the polarization orientation in which light is to be transmitted. In other words, the light reflection layer has a function as a polarizer. The light reflection layer attenuates polarization waves (TE waves/S waves, or TM waves/P waves) having an electric field component in a direction parallel to the extending direction of the light reflection layer, of light that has entered the wire grid polarizer, and transmits polarization waves (TE waves/S waves, or TM waves/P waves, whichever are not attenuated) having an electric field component in a direction (the repeating direction of the strip-shaped light reflection layer) orthogonal to the extending direction of the light reflection layer. The extending direction of the light reflection layer is the light absorption axis of the wire grid polarizer, and the direction orthogonal to the extending direction (second direction) of the light reflection layer is the light transmission axis of the wire grid polarizer. The second direction may also be parallel to the $x_0$ direction or the $y_0$ direction.

Light enters from the light absorption layer. The wire grid polarizer then utilizes four actions that are light transmission, reflection, interference, and selective light absorption of polarization waves by virtue of optical anisotropy, to attenuate polarization waves (TE waves/S waves, or TM waves/P waves) having an electric field component parallel to the first direction, and transmit polarization waves (TE waves/S waves, or TM waves/P waves, whichever are not attenuated) having an electric field component parallel to the second direction. In other words, polarization waves of one type (TE waves, for example) are attenuated by the selective light absorbing action of the polarization waves by virtue of the optical anisotropy of the light absorption layer. The strip-shaped light reflection layer functions as a polarizer, and reflects polarization waves of one type (TE waves, for example) transmitted through the light absorption layer and the insulating film. At this time, if the insulating film is designed so that the phase of polarization waves of one type (TE waves, for example) transmitted through the light absorption layer and reflected by the light reflection layer is shifted by half a wavelength, the polarization waves of one type (TE waves, for example) reflected by the light reflection layer and the polarization waves of one type (TE waves, for example) reflected by the light absorption layer cancel each other due to interference, and thus, are attenuated. In this manner, polarization waves of one type (TE waves, for example) can be selectively attenuated. However, as described above, even if the thickness of the insulating film is not optimized, the extinction ratio can be improved. Therefore, in practice, the thickness of the insulating film is only required to be determined on the basis of the balance between desired polarization characteristics and the actual manufacturing process, as described above.

The length of the line-and-space structure in the first direction may be the same as the first-direction length of the photoelectric conversion region, which is the region that substantially performs photoelectric conversion in a stacked imaging device or the like of the present disclosure. Alternatively, the length of the line-and-space structure in the first direction may be the same as the length of the stacked imaging device or the like of the present disclosure, or may be an integral multiple of the length of the stacked imaging device or the like of the present disclosure in the first direction.

In a polarizer including the various preferred embodiments and configurations described above, a protective film may be formed on the wire grid polarizer, and the space portions of the wire grid polarizer may be void spaces. In other words, the upper side of the space portions may be covered with a protective film, and the space portions may be filled at least with air. Such a polarizer is referred to as a "polarizer of the first configuration", for convenience. As the space portions of the wire grid polarizer are formed as void spaces as described above, the value of the average refractive index $n_{ave}$ can be made smaller. As a result, it is possible to improve the transmittance and the extinction ratio in the wire grid polarizer. Further, as the value of the formation pitch $P_0$ can be increased, the manufacturing yield of wire grid polarizers can be improved. Furthermore, as a protective film is formed on the wire grid polarizer, it is possible to provide stacked imaging devices or the like of the present disclosure and a solid-state imaging apparatus having high reliability.

In a polarizer of the first configuration, a second protective film may be formed between the wire grid polarizer and the protective film, and the relationship, $n_1 > n_2$, may be established, where $n_1$ represents the refractive index of the material forming the protective film, and $n_2$ represents the refractive index of the material forming the second protective film. By satisfying $n_1 > n_2$, the value of the average refractive index $n_{ave}$ can be reliably reduced.

Here, the protective film preferably includes SiN, and the second protective film preferably includes $SiO_2$ or SiON.

In a polarizer of the first configuration including the various preferred embodiments and configurations described above, a third protective film may be formed on the side surfaces of the line portions facing the space portions of the wire grid polarizer. In other words, the space portions are filled with air, and the third protective film is further present in the space portions. Here, the material forming the third protective film is preferably a material having a refractive index of 2 or lower and an extinction coefficient close to zero, and examples of such materials include insulating materials such as $SiO_2$ including $TEOS-SiO_2$, SiON, SiN, SiC, SiOC, and SiCN, metal oxides such as aluminum oxides ($AlO_x$), hafnium oxides ($HfO_x$), zirconium oxides ($ZrO_x$), and tantalum oxides ($TaO_x$). Alternatively, the examples may include perfluorodecyltrichlorosilane and octadecyltrichlorosilane. The third protective film can be formed by various known processes such as various CVD methods, coating methods, various PVD methods including sputtering methods and vacuum vapor deposition methods, and sol-gel methods, but it is more preferable to adopt a so-called monolayer growth method (an atomic layer doposition method or an ALD method), or an HDP-CVD method (high-density plasma chemical vapor deposition method). It is possible to form a thin third protective film conformally on the wire grid polarizer by an ALD method, but, from the viewpoint of formation of a thinner third protective film on side surfaces of the line portions, it is more preferable to adopt an HDP-CVD method. Alternatively, if the space portions are filled with the material forming the third protective film, and gaps, holes, voids, or the like are formed in the third protective film, the refractive index of the entire third protective film can be lowered.

When the metallic material or the alloy material (hereinafter sometimes referred to as the "metallic material or the like") forming the wire grid polarizer comes into contact with outside air, the corrosion resistance of the metallic material or the like is degraded by adhesion of moisture and organic matter from outside air, and there is a possibility that the long-term reliability of the stacked imaging device or the like of the present disclosure will become lower. Particularly, when moisture adheres to the line portions of a structure formed with the metallic material or the like, an insulating material, and the metallic material or the like, the moisture containing $CO_2$ and $O_2$ dissolved therein functions as an electrolyte, and there is a possibility that a local battery will be formed between the two kinds of metals. Then, when such a phenomenon occurs, a reduction reaction such as hydrogen generation proceeds on the cathode (positive electrode) side, and an oxidation reaction proceeds on the anode (negative electrode side), leading to anomalous deposition of the metallic material or the like, or to a change in the shape of the wire grid polarizer. Then, as a result, there is a possibility that the originally expected performance of the wire grid polarizer and the stacked imaging device or the like of the present disclosure will be degraded. For example, in a case where aluminum (Al) is used as the light reflection layer, there is a possibility that anomalous deposition of aluminum as shown in the reaction formulas shown below will occur. However, if the protective film is formed, and if the third protective film is formed, the occurrence of such a problem can be reliably avoided.

$$Al \rightarrow Al^{3+} + 3e^-$$

$$Al^{3+} + 3OH^- \rightarrow Al(OH)_3$$

Further, in a polarizer including the various preferred embodiments and configurations described above, a frame unit that surrounds a wire grid polarizer may be provided, the frame unit may be joined the line portions of the wire grid polarizer, and the frame unit may have the same structure as the line portions of the wire grid polarizer. Such a polarizer is referred to as a "polarizer of the second configuration", for convenience.

As described above, the frame unit is joined to the line portions of the wire grid polarizer, and the frame unit has the same structure as the line portions of the wire grid polarizer. With this arrangement, it is possible to solve the problem that peeling from the photoelectric conversion unit occurs in the outer peripheral portions of the wire grid polarizer corresponding to the four corners of a stacked imaging device or the like of the present disclosure, the problem that a difference is generated between the structure of the outer peripheral portions of the wire grid polarizer and the structure of the central portion of the wire grid polarizer, and the problem that light that has entered the outer peripheral portions of the wire grid polarizer easily leaks into adjacent stacked imaging devices or the like of the present disclosure having different polarization directions. As a result, a stacked imaging device or the like of the present disclosure and a solid-state imaging apparatus having high reliability can be provided.

In some cases, a groove portion (a kind of device separation region) that extends from one surface of the substrate to the other surface and further to a portion below the wire grid polarizer, and has an insulating material or a light blocking material buried therein may be formed in an edge portion of a stacked imaging device or the like of the present disclosure. The insulating material may be the material forming insulating film (the insulating film forming layer) and the interlayer insulating layer, and the light blocking material may be the material forming the light blocking portion described later. As such a groove portion is formed, it is possible to prevent a decrease in sensitivity, generation of polarization crosstalk, and a decrease in extinction ratio.

Further, in a polarizer including the various preferred embodiments and configurations described above, an extension portion of the light reflection layer may be electrically connected to the substrate or the photoelectric conversion unit. As an extension portion of the light reflection layer is electrically connected to the substrate or the photoelectric conversion unit as described above, it is possible to reliably avoid the problem that the light reflection layer forming layer and the light absorption layer forming layer are electrically charged at the time of formation of the wire grid polarizer, a kind of electric discharge is caused, and, as a result, the wire grid polarizer and the photoelectric conversion unit are damaged. In some cases, an insulating film may be formed on the entire top surface of the light reflection layer, and the light absorption layer may be formed on the entire top surface of the insulating film. In such a configuration, the entire regions of the light absorption layer and the light reflection layer are electrically connected to the substrate or the photoelectric conversion unit, and thus, the occurrence of electric discharge can be reliably prevented. Alternatively, in some cases, the insulating film may be omitted, and the light reflection layer and the light absorption layer may be stacked in this order from the opposite side from the light incident side.

The region in which the substrate or the photoelectric conversion unit is electrically connected to the extension portion of the light reflection layer (or the light reflection layer forming layer) may be located in the imaging region, may be located in an optically black pixel region (OPB) provided in the outer periphery of the imaging region, or may be located in a peripheral region provided outside the imaging region. Note that, in a case where the region in which the substrate or the photoelectric conversion unit is electrically connected to the extension portion of the light reflection layer (or the light reflection layer forming layer) is located in the imaging region or in the optically black pixel region (OPB), such a region may be provided for each stacked imaging device or the like of the present disclosure, may be provided at one position for a plurality of stacked imaging devices or the like of the present disclosure, may be provided at one position for all the stacked imaging devices of the like of the present disclosure, or may be provided at one position or at a plurality of positions for one stacked imaging device or the like of the present disclosure. Further, in a case where such a region is located in the peripheral region, such a region may be provided at one position or at a plurality of positions.

A light blocking portion may be formed in a region between a stacked imaging device or the like and a stacked imaging device or the like of the present disclosure, and an extension portion of the light reflection layer may be in contact with the light blocking portion. Here, the length of the extension portion of the light reflection layer in contact with the light blocking portion may be the same as the length of the photoelectric conversion region (the length of a side of the photoelectric conversion region) that is the region for substantially performing photoelectric conversion in a stacked imaging device or the like of the present disclosure, or may be a length between a half the length of the photoelectric conversion region and the length of the photoelectric conversion region. As such a form is adopted, it is possible to prevent the occurrence of color mixing from adjacent stacked imaging devices or the like of the present disclosure. Further, the region in which the light reflection layer forming layer is in contact with the light absorption layer forming layer may be a region between a stacked imaging device or the like and a stacked imaging device or the like of the present disclosure, and may be at least one position among the four corners of a stacked imaging device or the like of the present disclosure. A light blocking portion may also be formed in the peripheral region, and the extension portion of the light reflection layer may be in contact with the light blocking portion. The light blocking portion may include chromium (Cr), copper (Cu), aluminum (Al), or tungsten (W), for example, to more effectively prevent light leakage (polarization crosstalk) to an adjacent stacked imaging device or the like of the present disclosure. Here, the length of the extension portion of the light reflection layer in contact with the light blocking portion may be inherently any appropriate length.

In the peripheral region, formation of a wire grid polarizer is not necessary. The peripheral region is preferably occupied by the same structure as the frame unit. The frame unit or the peripheral region may be provided with a line-and-space pattern like a wire grid polarizer, unless the frame unit or the peripheral region functions as a wire grid polarizer. In other words, the wire grid formation pitch $P_0$ may be sufficiently larger than the effective wavelength of incident electromagnetic waves.

A wire grid polarizer may be disposed above an on-chip microlens (OCL), or an on-chip microlens (OCL) may be disposed above a wire grid polarizer. The stacked imaging device or the like of the present disclosure in the former case is referred to as the "imaging device A of the present disclosure", for convenience, and the stacked imaging device or the like the like of the present disclosure in the latter case is referred to as the "imaging device B of the present disclosure", for convenience.

In the imaging device A of the present disclosure, a planarizing layer including a transparent resin (an acrylic resin, for example), and a base insulating material layer including an inorganic material such as a silicon oxide film that functions as the foundation of the process in the wire grid polarizer manufacturing process may be formed in this order from the on-chip microlens side, between the on-chip microlens (located on the lower side) and the wire grid polarizer (located on the upper side). Further, in the imaging device A of the present disclosure including these preferable configurations, a wavelength selecting means (specifically, a known color filter layer, for example) may be disposed below the on-chip microlens.

Meanwhile, in the imaging device B of the present disclosure, a wavelength selecting means (specifically, a known color filter layer, for example) may be disposed between the wire grid polarizer (located on the lower side) and the on-chip microlens (located on the upper side). As such a configuration is adopted, it is possible to optimize the wire grid polarizer independently in the wavelength band of light transmitted in each wire grid polarizer, and achieve a lower reflectance in the entire visible light range. A planarizing layer may be formed between the wire grid polarizer and the wavelength selecting means, and a base insulating material layer including an inorganic material such as a silicon oxide film that functions as the base of the process in the wire grid polarizer manufacturing process may be formed under the wire grid polarizer.

In the imaging device A of the present disclosure, the upper photoelectric conversion layer that generates electric current on the basis of incident light, the on-chip microlens, the planarizing layer, the base insulating material layer, the light blocking portion, the color filter layer, wiring lines (a wiring layer), and various interlayer insulating layers may be sequentially stacked. Further, in the imaging device B of the present disclosure, on the other hand, the upper photoelectric conversion layer that generates electric current on the basis of incident light, the base insulating material layer, the light blocking portion, wiring lines (a wiring layer), and various interlayer insulating layers may be sequentially stacked. The photoelectric conversion unit to which the extension portion of the light reflection layer and the light reflection layer forming layer are electrically connected is the light blocking portion or wiring lines (a wiring layer), for example. For example, a high-concentration impurity region, a metal layer, an alloy layer, a wiring layer, or the like is only required to be formed at the portion of the substrate to which the extension portion of the light reflection layer and the light reflection layer forming layer are electrically connected.

All of the stacked imaging devices or the like of the present disclosure that constitute a solid-state imaging apparatus of the present disclosure may include a wire grid polarizer, and some of the stacked imaging devices or the like of the present disclosure may include a wire grid polarizer. An imaging device unit formed with a plurality of stacked imaging devices or the like of the present disclosure has a Bayer array, and one imaging device unit (one pixel) may be formed with four stacked imaging devices or the like of the present disclosure. However, the array in an imaging device unit is not necessarily a Bayer array, but may be an interlined array, a G-striped RB-checkered array, a G-striped RB-completely-checkered array, a checkered complementary color array, a striped array, an obliquely striped array, a primary color difference array, a field color difference sequence array, a frame color difference sequence array, a MOS-type array, an improved MOS-type array, a frame interleaved array, a field interleaved array, or the like . . . For example, in the case of a Bayer array, a red color filter layer, a green color filter layer, and a blue color filter layer are disposed in each of three sub pixel regions among 2×2 sub pixel regions. Any color filter layer is not disposed in the remaining one sub pixel region in which a green color filter layer should be disposed originally, and a wire grid polarizer may be disposed in the remaining one sub pixel region (a white sub pixel region). Alternatively, in the case of a Bayer array, a red color filter layer, a green color filter layer, and a blue color filter layer are disposed in each of three sub pixel regions among 2×2 sub pixel regions, and a green color filter layer and a wire grid polarizer may be disposed in the remaining one sub pixel region. In a case where the purpose is neither color separation nor spectroscopy, or in a case where a stacked imaging device or the like of the present disclosure is an imaging device having sensitivity to a specific wavelength, a filter might be unnecessary. Further, in a sub pixel region in which any color filter layer (a wavelength selecting means) is not disposed, a transparent resin layer, instead of a color filter layer, may be formed to ensure flatness with the sub pixel regions in which color filter layers are disposed. In other words, a stacked imaging device or the like of the present disclosure may be formed with a combination of a red-light imaging device having red sensitivity, a green-light imaging device having green sensitivity, and a blue-light imaging device having blue sensitivity. Then, in addition to that, a stacked imaging device or the like of the present disclosure may be formed with a combination of an near-infrared light photoelectric conversion element having sensitivity to infrared rays and the above devices, or a solid-state imaging apparatus may be designed to obtain a combination of a single-color image and an image based on near-infrared rays.

EXAMPLE 1

Figure 4A:
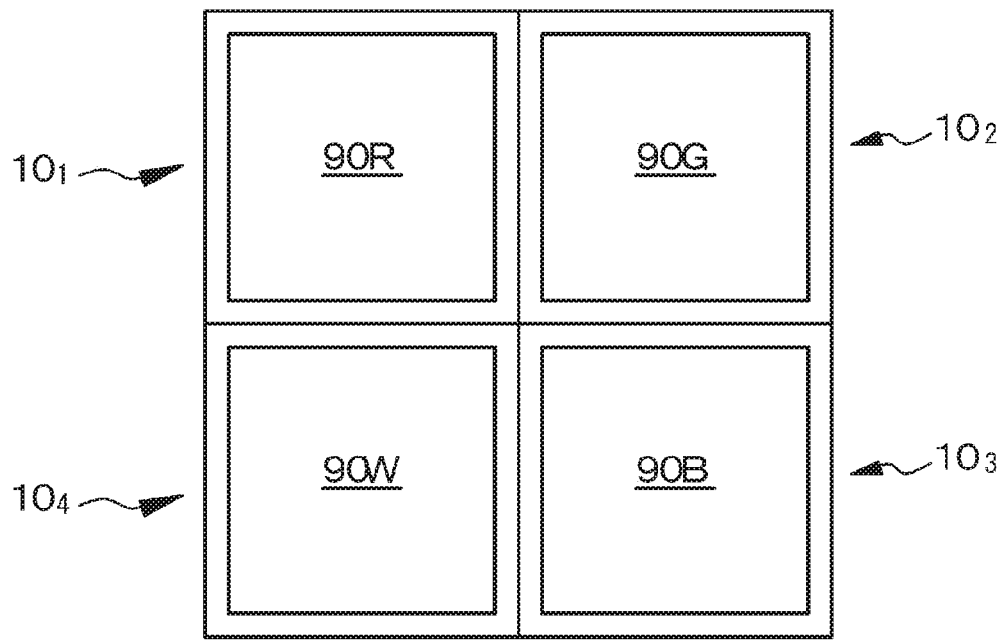
FIGS. 4A and 4B are a schematic layout diagram of color filter layers and the like that form a stacked imaging device for red light, a stacked imaging device for green light, a stacked imaging device for blue light, and a stacked imaging device for white light in Example 1, and a schematic layout diagram of polarizers, respectively.
Figure 4B:
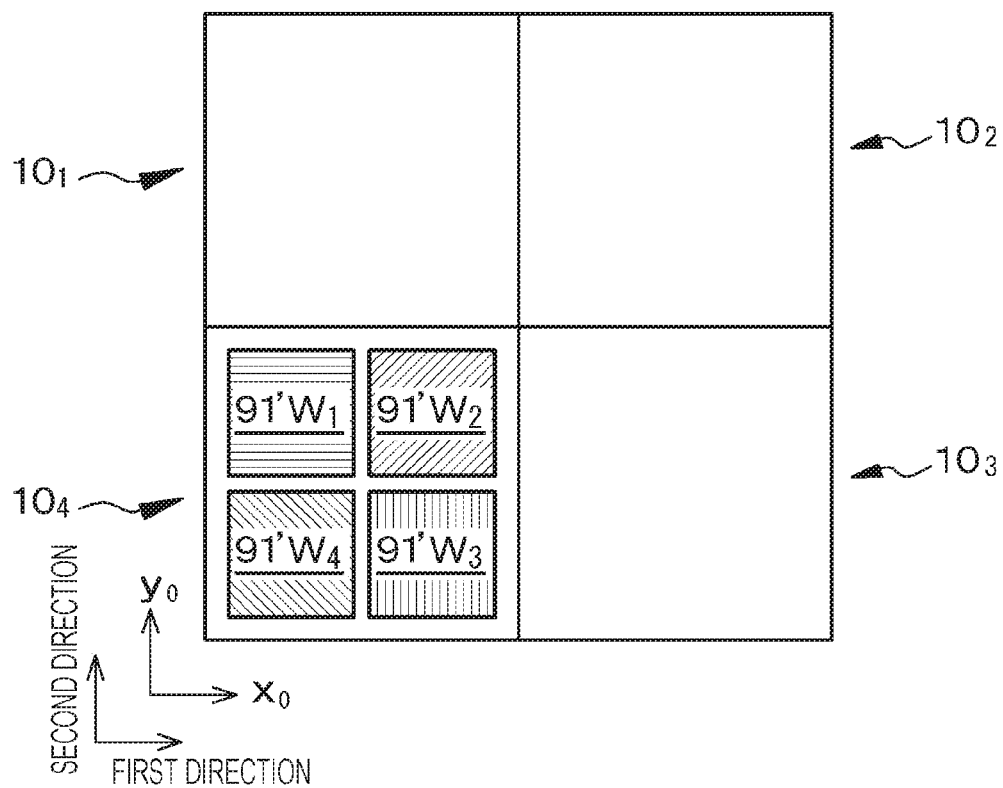
Figure 5A:
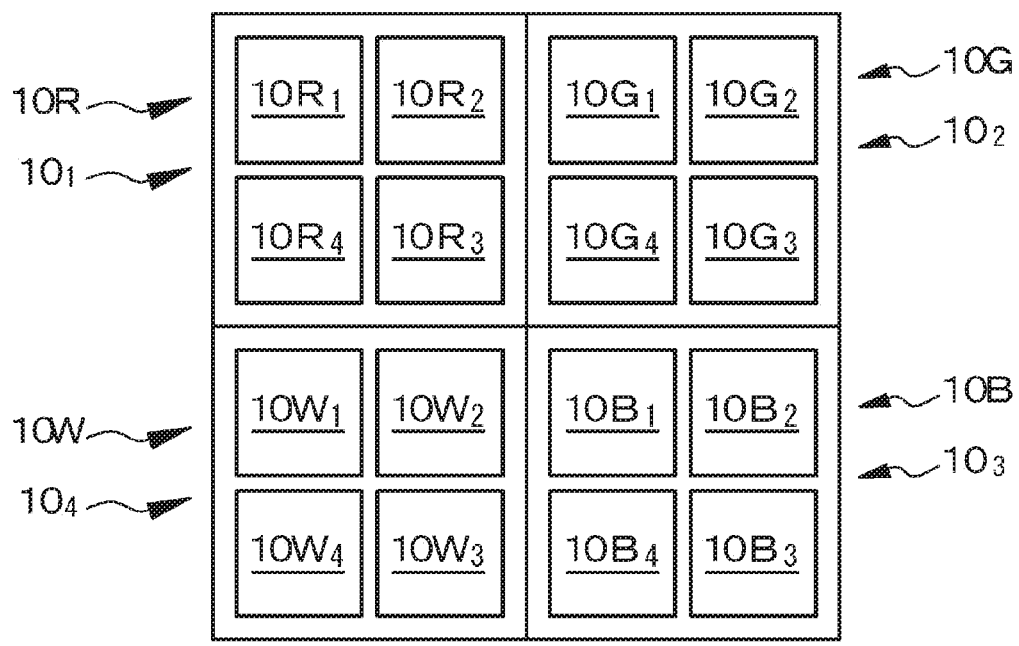
FIGS. 5A and 5B are a schematic layout diagram of upper photoelectric conversion units that form a stacked imaging device for red light, a stacked imaging device for green light, a stacked imaging device for blue light, and a stacked imaging device for white light in Example 1, and a schematic layout diagram of lower photoelectric conversion units, respectively.
Figure 5B:
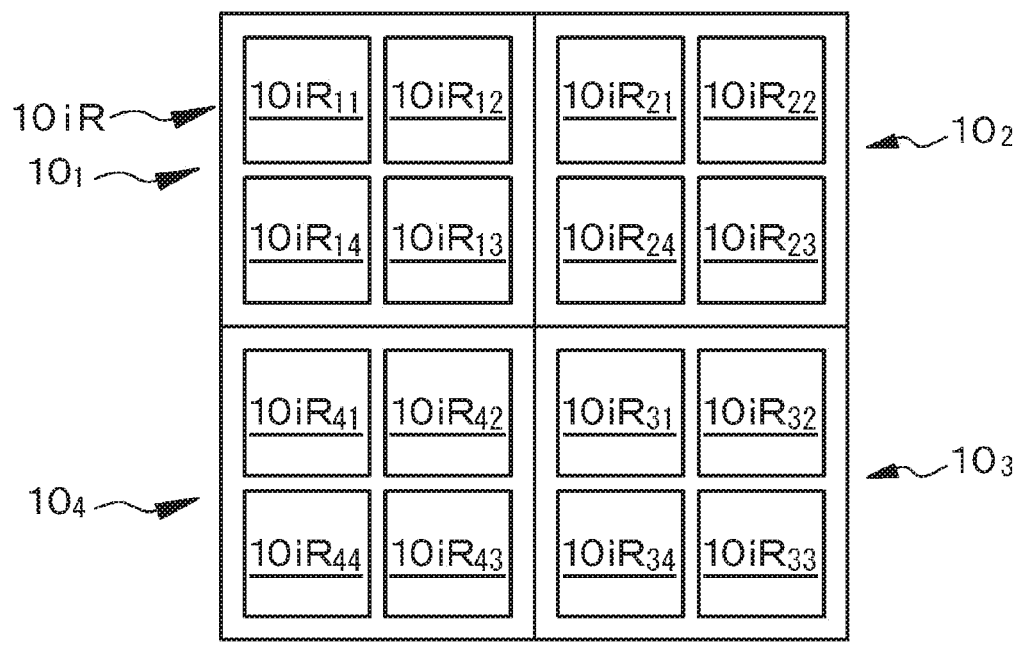
Figure 12:
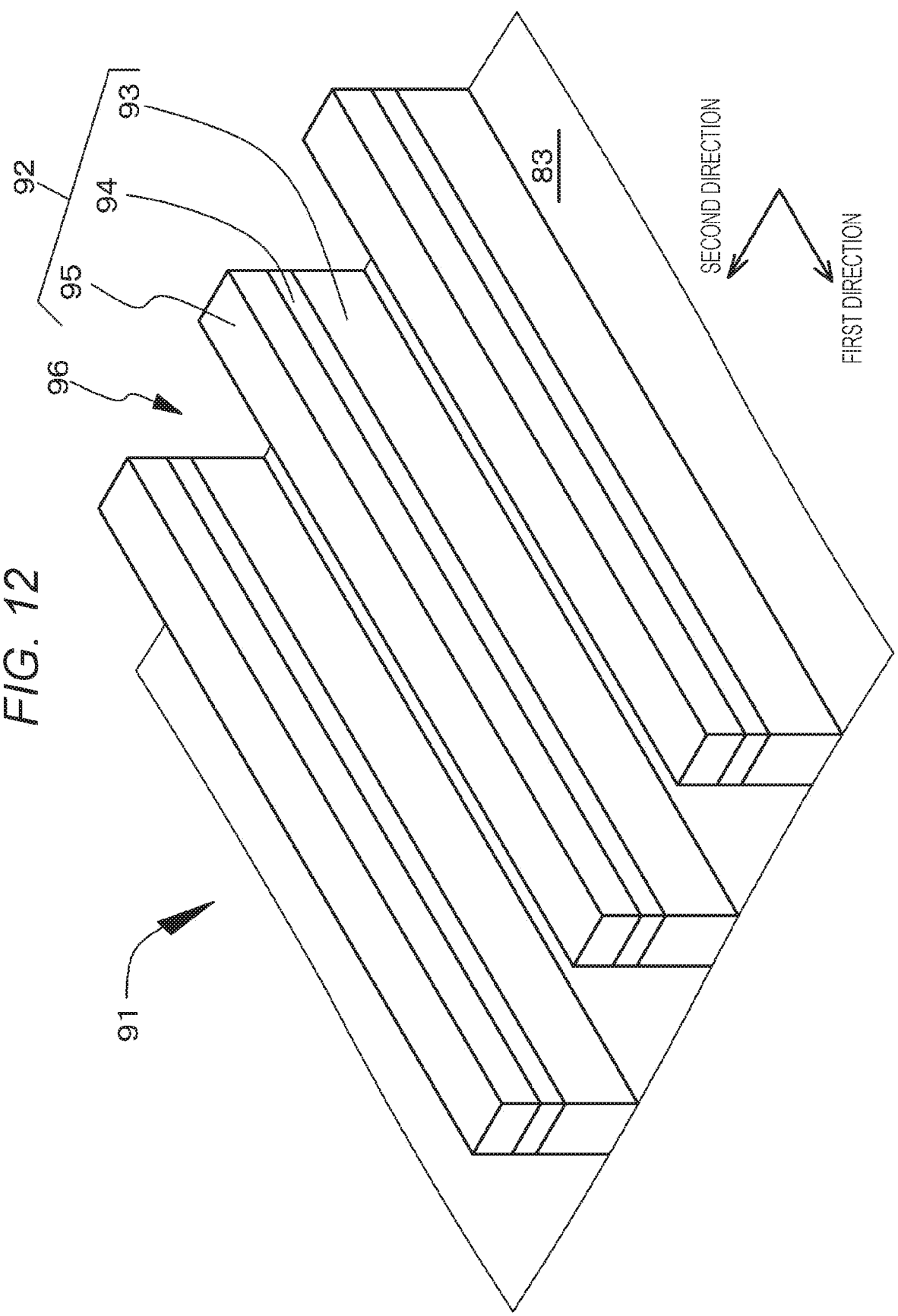
Figure 13A:
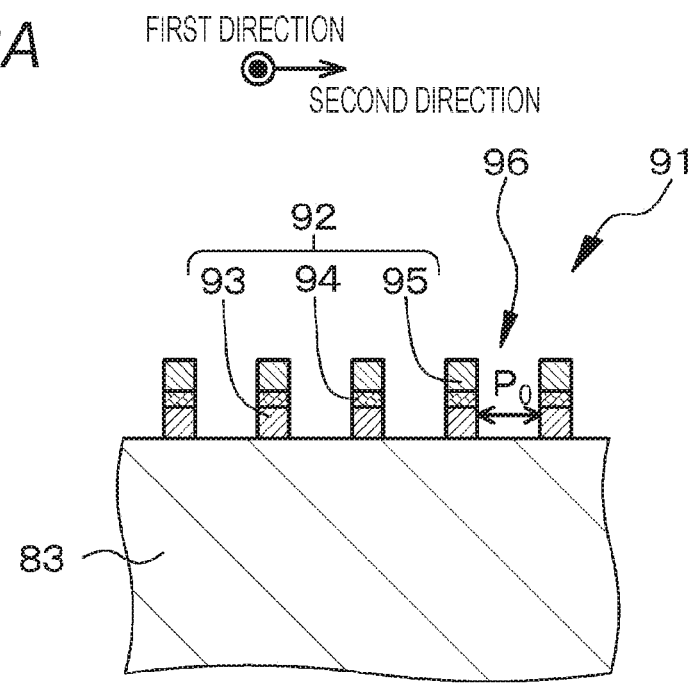
FIGS. 13A and 13B are schematic partial end views of a wire grid polarizer forming a stacked imaging device of the present disclosure, an imaging device of the present disclosure, or the like, and a modification thereof.

Example 1 relates to a stacked imaging device of the present disclosure and a solid-state imaging apparatus according to the first embodiment of the present disclosure. FIG. 1 shows a schematic partial cross-sectional view of a stacked imaging device of Example 1. FIG. 3 shows an equivalent circuit diagram of a stacked imaging device of Example 1. Further, FIG. 12 shows a schematic partial perspective view of a wire grid polarizer forming a stacked imaging device of Example 1, and FIG. 13A shows a schematic partial end view thereof. Furthermore, FIG. 4A shows a schematic layout diagram of color filter layers and the like that form a stacked imaging device for red light, a stacked imaging device for green light, a stacked imaging device for blue light, and a stacked imaging device for white light. FIG. 4B shows a schematic layout diagram of polarizers. FIG. 5A shows a schematic layout diagram of upper photoelectric conversion units. FIG. 5B shows a schematic layout diagram of lower photoelectric conversion units. Note that FIG. 1 shows only some of the transistors.

A stacked imaging device of Example 1 includes a polarizer 91 and a plurality of photoelectric conversion units 10 that is stacked. The polarizer 91 and the plurality of photoelectric conversion units 10 are stacked, with the polarizer 91 being disposed closer to the light incident side than the plurality of photoelectric conversion units 10.

Meanwhile, in a solid-state imaging apparatus of Example 1, stacked imaging devices are arranged in a two-dimensional matrix form in an $x_0$ direction and a $y_0$ direction, each stacked imaging device includes a polarizer 91 and a plurality of stacked photoelectric conversion units 10 that is stacked, and the polarizer 91 and the plurality of photoelectric conversion units 10 forming each stacked imaging device are stacked, with the polarizer 91 being disposed closer to the light incident side than the plurality of photoelectric conversion units 10. The $x_0$ direction is a so-called row direction or a so-called column direction, and the $y_0$ direction is the column direction or the row direction.

Alternatively, the solid-state imaging apparatus of Example 1 is formed by arranging imaging device units in a two-dimensional matrix form, each imaging device unit being formed with the four stacked imaging devices of a first stacked imaging device $10_1$, a second stacked imaging device $10_2$, a third stacked imaging device $10_3$, and a fourth stacked imaging device $10_4$ that are arranged in 2×2, and each imaging device unit includes a polarizer 91W at least on the light incident side of the fourth stacked imaging device $10_4$.

The solid-state imaging apparatus of Example 1 forms a digital still camera, a digital video camera, a camcorder, a surveillance camera, a camera to be mounted in a vehicle (an in-vehicle camera), a smartphone camera, a game user interface camera, a biometric authentication camera, or the like, for example.

Further, in Example 1, the plurality of photoelectric conversion units is formed with a photoelectric conversion unit 10W having sensitivity to white light, and a photoelectric conversion unit 10iR having sensitivity to near-infrared light. Here, the photoelectric conversion unit 10W forms an upper photoelectric conversion unit, and the photoelectric conversion unit 10iR forms a lower photoelectric conversion unit. A photoelectric conversion unit 10R having sensitivity to red light, a photoelectric conversion unit 10G having sensitivity to green light, and a photoelectric conversion unit 10B having sensitivity to blue light are formed at the same level as the photoelectric conversion unit 10W having sensitivity to white light. Further, while any polarizer is not disposed above the photoelectric conversion unit 10R having sensitivity to red light, the photoelectric conversion unit 10G having sensitivity to green light, and the photoelectric conversion unit 10B having sensitivity to blue light, the photoelectric conversion unit 10iR having sensitivity to near-infrared light is disposed below those photoelectric conversion units.

As color filter layers 90R, 90G, and 90B are provided, the photoelectric conversion unit 10R, the photoelectric conversion unit 10G, the photoelectric conversion unit 10B, and the photoelectric conversion unit 10W have the same configuration and structure, and are preferably formed with photoelectric conversion units capable of photoelectric conversion in the entire wavelength band of visible light. The photoelectric conversion unit 10iR also have the same configuration and structure. Near-infrared light passes through the color filter layers 90R, 90G, and 90B. Although not particularly limited, the photoelectric conversion units 10R, 10G, 10B, and 10W is only required to be formed with an organic photoelectric conversion material or silicon layers of about 3 μm in thickness, for example, and the photoelectric conversion unit 10iR is only required to be formed with an organic photoelectric conversion material or a silicon layer of about 4 μm in thickness, for example. Modifications of Example 1, Example 2, and modifications of Example 2, which will be described later, may have structures similar to the above.

Further, in a stacked imaging device of Example 1, a polarizer 91W includes four polarizer segments: a first polarizer segment $91'W_1$, a second polarizer segment $91'W_2$, a third polarizer segment $91'W_3$, and a fourth polarizer segment $91'W_4$ that are arranged in a 2×2 array. In other words, of these four polarizer segments, two polarizer segments are arranged in the $x_0$ direction, and two polarizer segments are arranged in the $y_0$ direction. Then, the polarization orientation in which light is to be transmitted by the first polarizer segment $91'W_1$ is a degrees, the polarization orientation in which light is to be transmitted by the second polarizer segment $91'W_2$ is ($\alpha$+45) degrees, the polarization orientation in which light is to be transmitted by the third polarizer segment $91'W_3$ is ($\alpha$+90) degrees, and the polarization orientation in which light is to be transmitted by the fourth polarizer segment $91'W_4$ is ($\alpha$+135) degrees. As for the value of a, the angle formed with respect to the $y_0$ direction is "0 degree". The polarizers are shaded with hatching lines, and the directions orthogonal to the extending directions of the hatching lines indicate the polarization orientations in which light is to be transmitted by the polarizers (or the polarizer segments).

Here, the stacked imaging device of Example 1 shown in FIG. 1 is a back-illuminated stacked imaging device. Specifically, in the example shown in FIGS. 4A, 4B, 5A, and 5B, the first stacked imaging device $10_1$ includes a red color filter layer 90R [see FIG. 4A], four upper photoelectric conversion units (red-light imaging devices $10R_1$, $10R_2$, $10R_3$, and $10R_4$) [see FIG. 5A] disposed below the red color filter layer 90R, and lower photoelectric conversion units [near-infrared light photoelectric conversion units $10iR_{11}$, $10iR_{12}$, $10R_{13}$, and $10iR_{14}$) [see FIG. 5B] disposed below the respective upper photoelectric conversion units.

The second stacked imaging device $10_2$ also includes a green color filter layer 90G [see FIG. 4A], four upper photoelectric conversion units (green-light imaging devices $10G_1$, $10G_2$, $10G_3$, and $10G_4$) disposed below the green color filter layer 90G, and lower photoelectric conversion units [near-infrared light photoelectric conversion units $10iR_{21}$, $10iR_{22}$, $10iR_{23}$, and $10iR_{24}$) disposed below the respective upper photoelectric conversion units.

Further, the third stacked imaging device $10_3$ includes a blue color filter layer 90B [see FIG. 4A], four upper photoelectric conversion units (blue-light imaging devices $10B_1$, $10B_2$, $10B_3$, and $10B_4$) disposed below the blue color filter layer 90B, and lower photoelectric conversion units [near-infrared light photoelectric conversion units $10iR_{31}$, $10iR_{32}$, $10iR_{33}$, and $10iR_{34}$) disposed below the respective upper photoelectric conversion units.

Furthermore, the fourth stacked imaging device $10_4$ includes a transparent resin layer 90W (see FIG. 4A), four polarizer segments $91'W_1$, $91'W_2$, $91'W_3$, and $91'W_4$ disposed below the transparent resin layer 90W, upper photoelectric conversion units (white-light imaging devices $10W_1$, $10W_2$, $10W_3$, and $10W_4$) disposed below the respective four polarizers, and lower photoelectric conversion units [near-infrared light photoelectric conversion units $10iR_{41}$, $10iR_{44}$, $10iR_{43}$, and $10iR_{44}$) disposed below the respective upper photoelectric conversion units.

In other words, the first stacked imaging device $10_1$ includes a photoelectric conversion unit having sensitivity to red light, and a photoelectric conversion unit having sensitivity to near-infrared light, the second stacked imaging device $10_2$ includes a photoelectric conversion unit having sensitivity to green light, and a photoelectric conversion unit having sensitivity to near-infrared light, the third stacked imaging device $10_3$ includes a photoelectric conversion unit having sensitivity to blue light, and a photoelectric conversion unit having sensitivity to near-infrared light, the fourth stacked imaging device $10_4$ includes a photoelectric conversion unit having sensitivity to white light, and a photoelectric conversion unit having sensitivity to near-infrared light, the polarizers provided on the light incident side of the fourth stacked imaging device $10_4$ are formed with the four polarizer segments of a 4-1st polarizer (polarizer segment) $91'W_1$, a 4-2nd polarizer (polarizer segment) $91'W_1$, a 4-3rd polarizer (polarizer segment) 91'W$_3$, and a 4-4th polarizer (polarizer segment) 91'W$_4$ that are arranged in a 2×2 array (that is, two polarizer segments are arranged in the x$_0$ direction, and two polarizer segments are arranged in the y$_0$ direction), the polarization orientation in which light is to be transmitted by the 4-1st polarizer (polarizer segment) 91'W$_1$ is α degrees, the polarization orientation in which light is to be transmitted by the 4-2nd polarizer (polarizer segment) 91'W$_2$ is (α+45) degrees, the polarization orientation in which light is to be transmitted by the 4-3rd polarizer (polarizer segment) 91'W$_3$ is (α+90) degrees, and the polarization orientation in which light is to be transmitted by the 4-4th polarizer (polarizer segment) 91'W$_4$ is (α+135) degrees.

An upper photoelectric conversion unit includes a photoelectric conversion layer that is an n-type semiconductor region 31 provided in a semiconductor substrate 70. The gate portion 35 of a transfer transistor TR1$_{trs}$, formed with a vertical transistor extends to the n-type semiconductor region 31, and is connected to a transfer gate line TG$_1$. Further, a first floating diffusion layer FD$_1$ is disposed in a region 35C near the gate portion 35 of the transfer transistor TR1$_{trs}$ in the semiconductor substrate 70. The electric charges stored in the n-type semiconductor region 31 are read out into the first floating diffusion layer FD$_1$ via a transfer channel formed along the gate portion 35.

In the upper photoelectric conversion unit, a reset transistor TR1$_{rst}$, an amplification transistor TR1$_{amp}$, and a selection transistor TR1$_{sel}$ that constitute a control unit of the upper layer photoelectric conversion unit are further disposed on a first surface side of the semiconductor substrate 70.

The reset transistor TR1$_{rst}$ includes a gate portion, a channel formation region, and source/drain regions. The gate portion of the reset transistor TR1$_{rst}$ is connected to a reset line RST$_1$, one of the source/drain regions of the reset transistor TR1$_{rst}$ is connected to a power supply V$_{DD}$, and the other one of the source/drain regions also serves as the first floating diffusion layer FD$_1$.

The amplification transistor TR1$_{amp}$ includes a gate portion, a channel formation region, and source/drain regions. The gate portion is connected to the other one of the source/drain regions (the first floating diffusion layer FD$_1$) of the reset transistor TR1$_{rst}$. The one of the source/drain regions is connected to the power supply V$_{DD}$.

The selection transistor TR1$_{sel}$ includes a gate portion, a channel formation region, and source/drain regions. The gate portion is connected to a selection line SEL$_1$. Further, one of the source/drain regions shares a region with the other one of the source/drain regions forming the amplification transistor TR1$_{amp}$, and the other one of the source/drain regions is connected to a signal line (a data output line) VSL$_1$.

A lower photoelectric conversion unit includes a photoelectric conversion layer that is an n-type semiconductor region 33 provided in the semiconductor substrate 70. The gate portion 36 of a transfer transistor TR2$_{trs}$ is connected to a transfer gate line TG$_2$. Further, a second floating diffusion layer FD$_2$ is disposed in a region 36C near the gate portion 36 of the transfer transistor TR2$_{trs}$ in the semiconductor substrate 70. The electric charges stored in the n-type semiconductor region 33 are read into the second floating diffusion layer FD$_2$ via a transfer channel 36A formed along the gate portion 36.

In the lower photoelectric conversion unit, a reset transistor TR2$_{rst}$, an amplification transistor TR2$_{amp}$, and a selection transistor TR2$_{sel}$ that constitute a control unit of the lower layer photoelectric conversion unit are further disposed on the first surface side of the semiconductor substrate 70.

The reset transistor TR2$_{rst}$ includes a gate portion, a channel formation region, and source/drain regions. The gate portion of the reset transistor TR2$_{rst}$ is connected to a reset line RST$_2$, one of the source/drain regions of the reset transistor TR2$_{rst}$ is connected to the power supply V$_{DD}$, and the other one of the source/drain regions also serves as the second floating diffusion layer FD$_2$.

The amplification transistor TR2$_{amp}$ includes a gate portion, a channel formation region, and source/drain regions. The gate portion is connected to the other one of the source/drain regions (the second floating diffusion layer FD$_2$) of the reset transistor TR2$_{rst}$. The one of the source/drain regions is connected to the power supply V$_{DD}$.

The selection transistor TR2$_{sel}$ includes a gate portion, a channel formation region, and source/drain regions. The gate portion is connected to a selection line SEL$_2$. Further, one of the source/drain regions shares a region with the other one of the source/drain regions forming the amplification transistor TR2$_{amp}$, and the other one of the source/drain regions is connected to a signal line (a data output line) VSL$_2$.

The reset lines RST$_1$ and RST$_2$, the selection lines SEL$_1$ and SEL$_2$, and the transfer gate lines TG$_1$ and TG$_2$ are connected to a vertical drive circuit 112 that forms a drive circuit, and the signal lines (data output lines) VSL$_1$ and VSL$_2$ are connected to a column signal processing circuit 113 that forms a drive circuit.

The series of operations such as charge accumulation, reset operation, and charge transfer in the upper photoelectric conversion unit and the lower photoelectric conversion unit is similar to the series of conventional operations such as charge accumulation, reset operation, and charge transfer, and therefore, detailed explanation thereof is not made herein.

A p$^+$-layer 34 is provided between the n-type semiconductor region 33 and the front surface 70A of the semiconductor substrate 70, to reduce generation of dark current. A p$^+$-layer 32 is formed between the n-type semiconductor region 31 and the n-type semiconductor region 33, and part of a side surface of the n-type semiconductor region 33 is surrounded by the p$^+$-layer 32. A p$^+$-layer 73 is formed on the side of the back surface 70B of the semiconductor substrate 70.

A lower insulating layer 83, the polarizer 91, an upper insulating layer 84, a color filter layer 90, and an on-chip microlens (OCL) 14 are formed on the p$^+$-layer 73.

Figure 11:
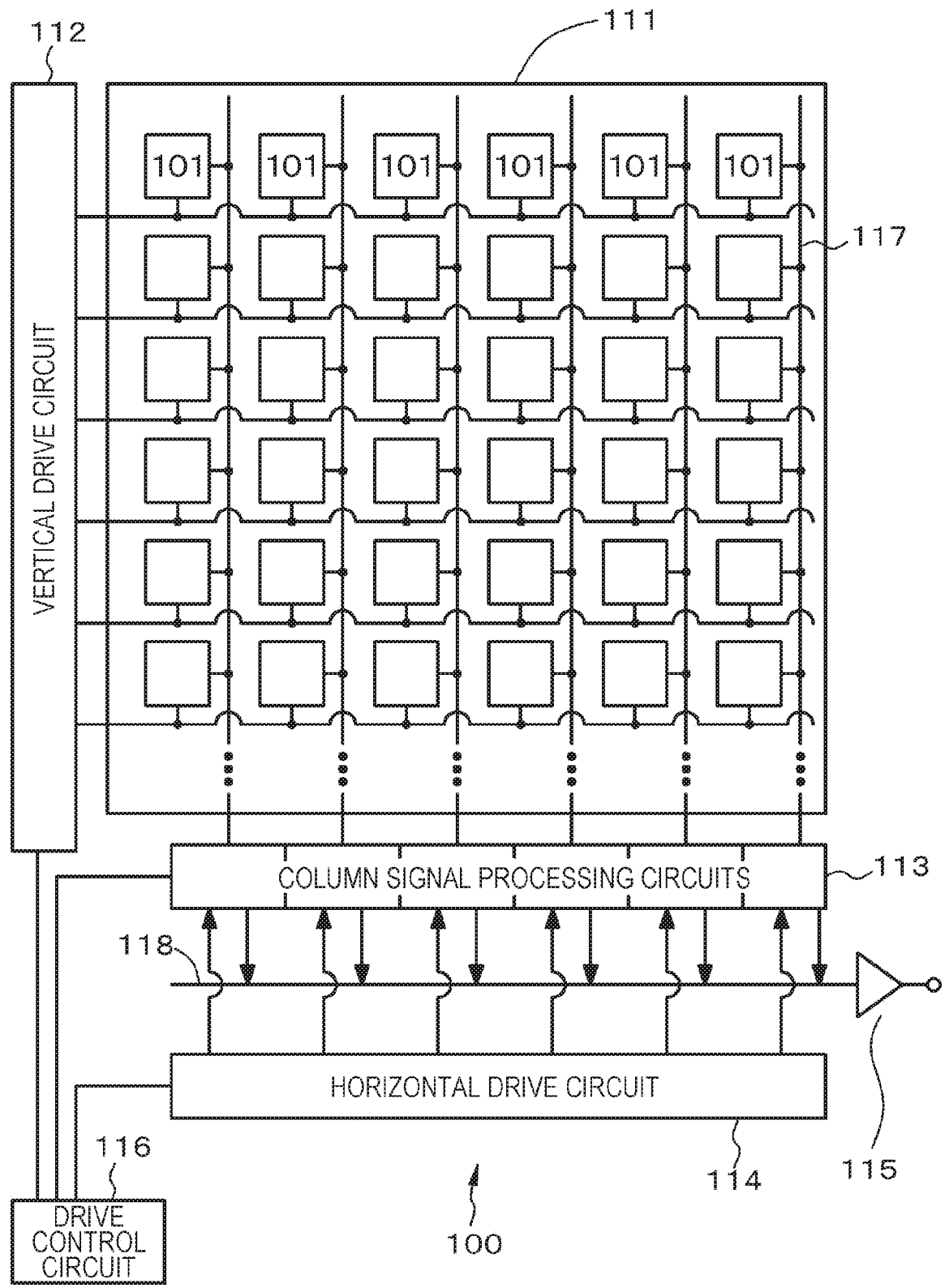
FIG. 11 is a conceptual diagram of a solid-state imaging apparatus of Example 1.

FIG. 11 is a conceptual diagram of a solid-state imaging apparatus of Example 1. A solid-state imaging apparatus 100 of Example 1 includes an imaging region 111 in which stacked imaging devices 101 are arranged in a two-dimensional array, the vertical drive circuit 112 as the drive circuit (a peripheral circuit) for the stacked imaging devices 101, the column signal processing circuits 113, a horizontal drive circuit 114, an output circuit 115, and a drive control circuit 116. These circuits may be formed with known circuits, or may of course be formed with other circuit configurations (various circuits that are used in conventional CCD imaging apparatuses or CMOS imaging apparatuses, for example). In FIG. 11, reference numeral "101" for the stacked imaging devices 101 is only shown in one row.

On the basis of a vertical synchronization signal, a horizontal synchronization signal, and a master clock, the drive control circuit 116 generates a clock signal and a control signal that serve as the references for operations of the vertical drive circuit 112, the column signal processing circuits 113, and the horizontal drive circuit 114. The generated clock signal and control signal are then input to the vertical drive circuit 112, the column signal processing circuits 113, and the horizontal drive circuit 114.

The vertical drive circuit 112 is formed with a shift register, for example, and selectively scans the respective stacked imaging devices 101 in the imaging region 111 sequentially in the vertical direction row by row. A pixel signal (an image signal) based on the current (signal) generated according to the amount of light received in each stacked imaging device $10_1$ is then sent to the column signal processing circuit 113 via a signal line (a data output line) 117 and a VSL.

The column signal processing circuits 113 are provided for the respective columns of the stacked imaging devices 101, for example, and perform signal processing such as noise removal and signal amplification on the image signals output from the stacked imaging devices 101 of one row in accordance with a signal from a black reference pixel (formed around an effective pixel region, though not shown) for each imaging device. Horizontal select switches (not shown) are provided between and connected to the output stages of the column signal processing circuits 113 and a horizontal signal line 118.

The horizontal drive circuit 114 is formed with a shift register, for example. The horizontal drive circuit 114 sequentially selects the respective column signal processing circuits 113 by sequentially outputting horizontal scan pulses, and causes the respective column signal processing circuits 113 to output signals to the horizontal signal line 118.

The output circuit 115 performs signal processing on signals sequentially supplied from the respective column signal processing circuits 113 through the horizontal signal line 118, and outputs the processed signals.

An imaging device or a stacked imaging device of Example 1 may be manufactured by the method described below, for example. Specifically, an SOI substrate is first prepared. A first silicon layer is then formed on the surface of the SOI substrate by an epitaxial growth method, and the p$^+$-layer 73 and the n-type semiconductor region 31 are formed in the first silicon layer. A second silicon layer is then formed on the first silicon layer by an epitaxial growth method, and a device separation region 71, an oxide film 72, the p$^+$-layer 32, the n-type semiconductor region 33, and the p$^+$-layer 34 are formed in the second silicon layer. Further, various transistors and the like that constitute the control unit of the imaging device are formed in the second silicon layer, and a wiring layer (not shown), an interlayer insulating layer 76, and various wiring lines are formed thereon. After that, the interlayer insulating layer 76 and a support substrate (not shown) are bonded to each other. After that, the SOI substrate is removed, to expose the first silicon layer. The surface of the second silicon layer corresponds to the front surface 70A of the semiconductor substrate 70, and the surface of the first silicon layer corresponds to the back surface 70B of the semiconductor substrate 70. Further, the first silicon layer and the second silicon layer are collectively referred to as the semiconductor substrate 70. The lower insulating layer 83, the polarizer 91, the upper insulating layer 84, the color filter layer 90, and the on-chip microlens 14 are then formed on the p$^+$-layer 73. In this manner, it is possible to obtain a stacked imaging device of Example 1.

The polarizer 91 is formed with a wire grid polarizer (hereinafter also referred to as the wire grid polarizer 91) having a line-and-space structure. A line portion is denoted by reference numeral 92, and a space portion is denoted by reference numeral 96.

Each line portion 92 of the wire grid polarizer 91 is formed with a stack structure in which a light reflection layer 93 including a first conductive material (specifically, aluminum (Al)), an insulating film 94 including SiO$_2$, and a light absorption layer 95 including a second conductive material (specifically, tungsten (W)) are stacked in this order from the opposite side (the photoelectric conversion unit side in Example 1) from the light incident side. The insulating film 94 is formed on the entire top surface of the light reflection layer 93, and the light absorption layer 95 is formed on the entire top surface of the insulating film 94. Specifically, the light reflection layer 93 is formed with a 150-nm thick aluminum (Al) layer, the insulating film 94 is formed with a 25- or 50-nm thick SiO$_2$ film, and the light absorption layer 95 is formed with a 25-nm thick tungsten (W) layer. The light reflection layer 93 has a function as a polarizer, attenuates polarization waves that are of light that has entered the wire grid polarizer 91 and has an electric field component in a direction parallel to the extending direction (a first direction) of the light reflection layer 93, and transmits polarization waves having an electric field component in a direction (a second direction) orthogonal to the extending direction of the light reflection layer 93. The first direction is the light absorption axis of the wire grid polarizer 91, and the second direction is the light transmission axis of the wire grid polarizer 91. Although a base film formed with Ti, TiN, or a Ti/TiN stack structure is formed between the photoelectric conversion unit (specifically, the lower insulating layer 83) and the light reflection layer 93, the base film is not shown in the drawings.

In a solid-state imaging apparatus of Example 1, the stacked imaging devices each have the light reflection layer 93, the insulating film 94, and the light absorption layer 95. The optically black pixel region (OPB) and the peripheral region (these regions are not shown) are occupied by a structure that is the same as a frame unit 98 (see FIG. 15, which will be explained later) formed with the light reflection layer 93, the insulating film 94, and the light absorption layer 95.

In Example 1, the wire grid polarizer 91 has the same size as each photoelectric conversion unit 10W having sensitivity to white light and each photoelectric conversion unit 10$i$R having sensitivity to near-infrared light. However, the wire grid polarizer 91 does not necessarily have such a size, and may be larger than a photoelectric conversion unit 10W and a photoelectric conversion unit 10$i$R.

Figure 100A:
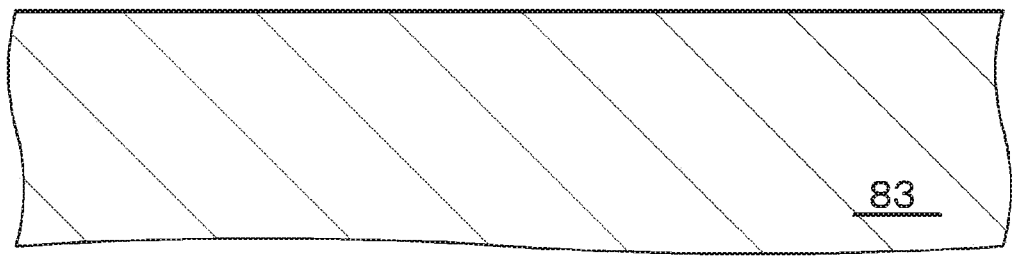
FIGS. 100A, 100B, 100C, and 100D are schematic partial end views of a lower insulating layer and the like for explaining a method of manufacturing polarizers forming a stacked imaging device or a solid-state imaging apparatus of Example 1.
Figure 100B:
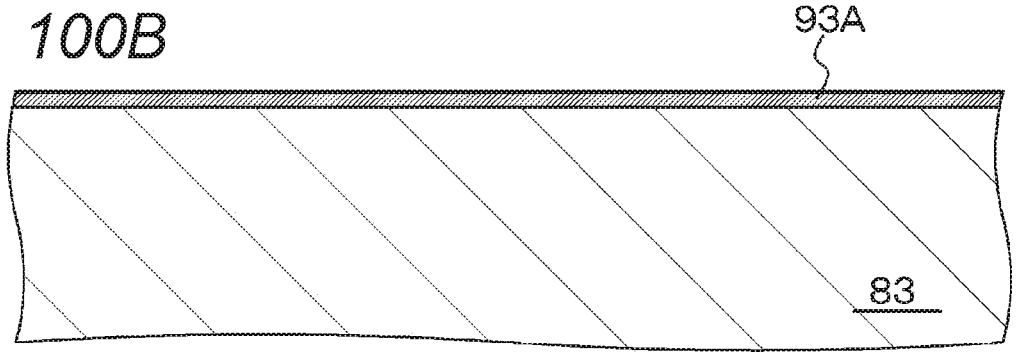
Figure 100C:
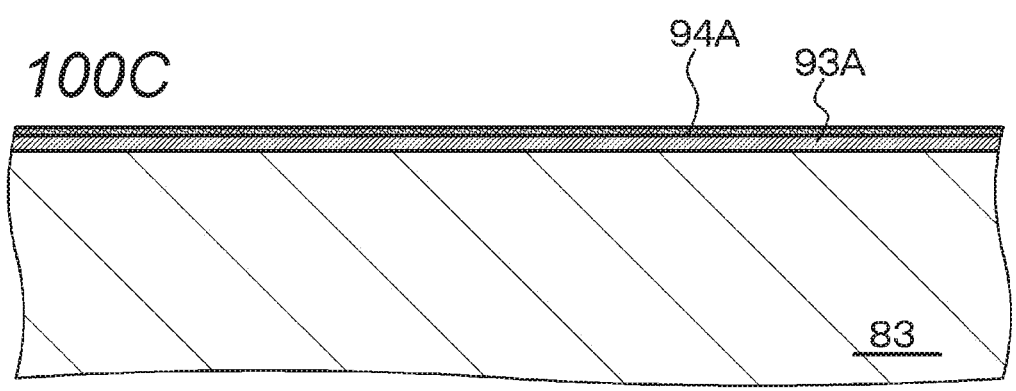
Figure 100D:
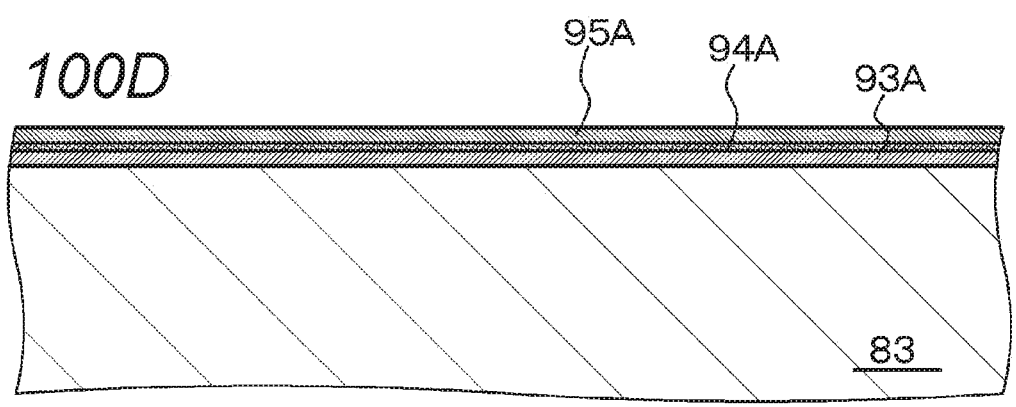

The polarizer 91 may be manufactured by the following method. Specifically, the base film (not shown) formed with Ti, TiN, or a Ti/TiN stack structure, and a light reflection layer forming layer 93A including the first conductive material (specifically, aluminum) are formed by a vacuum vapor deposition method on the lower insulating layer 83 (see FIGS. 100A and 100B). An insulating film forming layer 94A is then formed on the light reflection layer forming layer 93A, and a light absorption layer forming layer 95A including the second conductive material is formed on the insulating film forming layer 94A. Specifically, the insulating film forming layer 94A including SiO$_2$ is formed on the light reflection layer forming layer 93A by a CVD method (see FIG. 100C). The light absorption layer forming layer 95A including tungsten (W) is then formed on the insulating film forming layer 94A by a sputtering method. In this manner, the structure shown in FIG. 100D is obtained.

After that, patterning is performed on the light absorption layer forming layer 95A, the insulating film forming layer 94A, the light reflection layer forming layer 93A, and the base film by a lithography technique and a dry etching technique, to obtain the wire grid polarizer 91 having a line-and-space structure in which a plurality of strip-shaped line portions (stack structures) 92 each including the light reflection layer 93, the insulating film 94, and the light absorption layer 95 is arranged in parallel at a distance from one another. The upper insulating layer 84 is then only required to be formed by a CVD method, to cover the wire grid polarizer 91. The frame region is occupied by the frame unit 98 (see FIG. 15) formed with the light reflection layer 93, the insulating film 94, and the light absorption layer 95, and the optically black pixel region (OPB) and the peripheral region are occupied with stack structures having the same configuration as the frame unit 98.

In a stacked imaging device of Example 1, a polarizer is stacked while being located on the light incident side of a plurality of photoelectric conversion units. Accordingly, it is possible to expand and use the wavelength band of light to increase luminance, while acquiring polarization information about all the wavelength regions. Thus, it is possible to achieve higher sensitivity and spectral improvement. As a result, it is possible to achieve both high-precision polarization information acquisition and excellent imaging characteristics.

Furthermore, as a wire grid polarizer is integrally formed in an on-chip fashion above the upper photoelectric conversion unit, the thickness of the stacked imaging device can be reduced. As a result, it is possible to minimize mixing of polarized light (polarization crosstalk) into adjacent stacked imaging devices. Since the wire grid polarizer is an absorptive wire grid polarizer having a light absorption layer, the reflectance is low, and accordingly, the influence of stray light, flare, and the like on video images can be reduced.

Meanwhile, in a solid-state imaging apparatus of Example 1, a wire grid polarizer is provided, so that the solid-state imaging apparatus becomes capable of acquiring a captured image and polarization information at the same time. In other words, it is possible to provide the solid-state imaging apparatus with a polarization separation function that spatially polarizes and separates polarization information about incident light. Specifically, as a light intensity, a polarization component intensity, and a polarization direction can be obtained in each stacked imaging device, image data can be processed on the basis of the polarization information after imaging, for example. Desired processing is performed on an image portion obtained by imaging the sky or window glass, an image portion obtained by imaging a water surface, or the like, for example, so that the polarization component can be enhanced or reduced, the polarization component can be separated from the non-polarization component, image contrast can be improved, and unnecessary information can be deleted. Note that, specifically, such processing can be performed by specifying an imaging mode when imaging is performed with the solid-state imaging apparatus, for example. Further, the solid-state imaging apparatus can remove reflection on window glass, and can clarify the boundaries (contours) of a plurality of objects by adding the polarization information to the image information. Alternatively, it is possible to detect the condition of the road surface or detect an obstacle on the road surface. Furthermore, the solid-state imaging apparatus can be used or applied in various fields such as imaging of a pattern reflecting the birefringence of an object, measurement of a retardation distribution, acquisition of a polarizing microscope image, acquisition of the surface shape of an object, measurement of the surface property of an object, detection of a moving object (such as a vehicle), and weather observation like measurement of a cloud distribution. Further, the solid-state imaging apparatus may be a solid-state imaging apparatus that captures a stereoscopic image.

Furthermore, in a stacked imaging device of Example 1, a light photoelectric conversion unit for near-infrared light is disposed below a red-light imaging device, a green-light imaging device, and a blue-light imaging device. However, any polarizer is not provided but a color filter layer (a wavelength selecting means) is formed above the red-light imaging device, the green-light imaging device, and the blue-light imaging device. On the other hand, a photoelectric conversion unit for near-infrared light is disposed below a white-light imaging device, and a polarizer is disposed but any color filter layer (a wavelength selecting means) is not formed above the white-light imaging device. As such a structure is adopted, it is possible to prevent a decrease in luminance output due to wavelength separation among red light, green light, and blue light, acquire polarization information in the wavelength bands of red light, green light, and blue light without fail, and use color, luminance, and polarization information to the maximum. Further, as there is no loss of light in the color filter layer, it is possible to achieve the advantage of increasing the output including polarization information.

Figure 2:
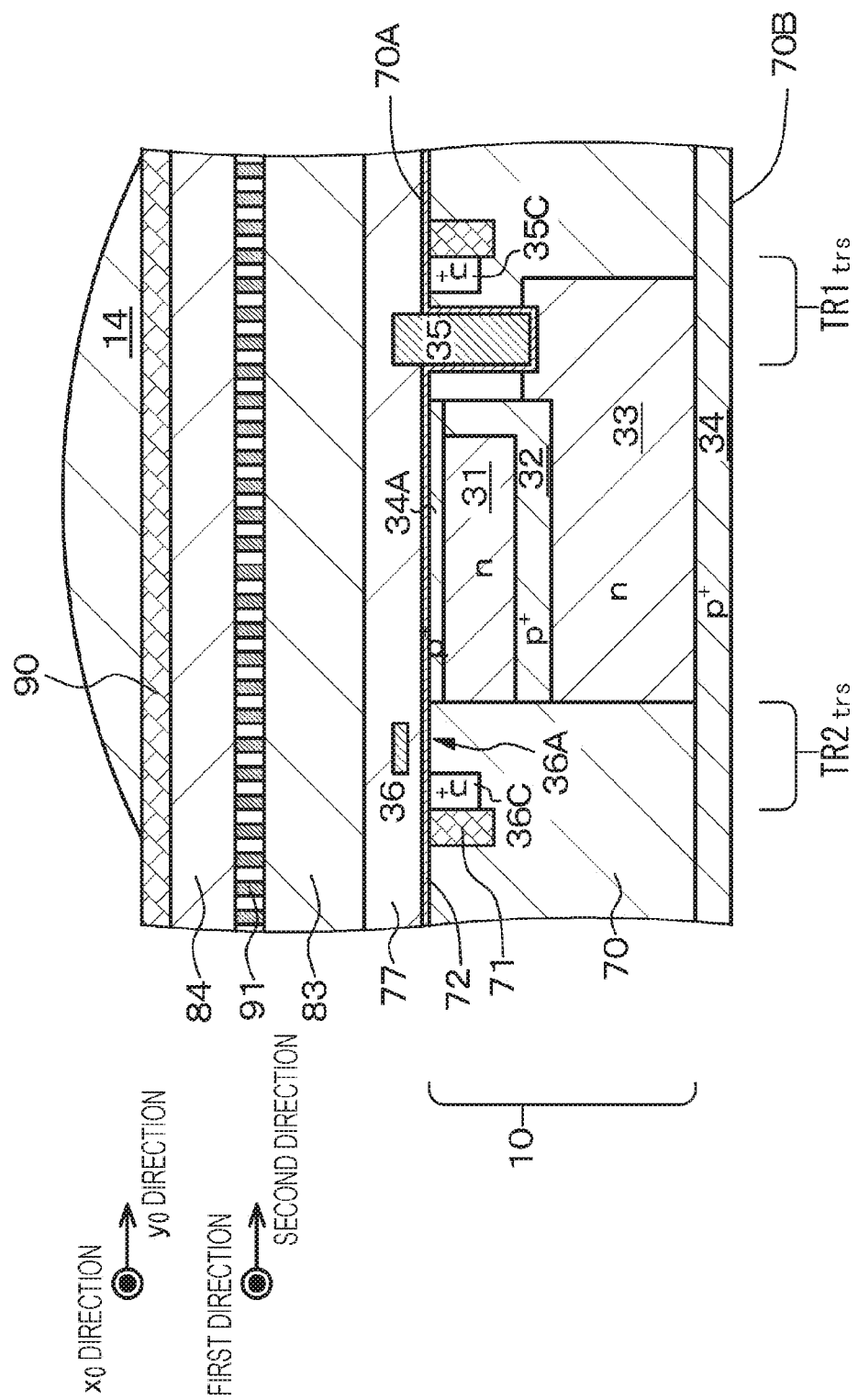
FIG. 2 is a schematic partial cross-sectional view of a modification of the stacked imaging device of Example 1.

A modification of a stacked imaging device of Example 1 shown in FIG. 2 is a front-illuminated stacked imaging device. Specifically, on the side of the front surface 70A of the semiconductor substrate 70, various transistors that constitute a control unit are provided. These transistors may have configurations and structures similar to those of the above described transistors. Further, an upper photoelectric conversion unit and a lower photoelectric conversion unit are provided in the semiconductor substrate 70, and these photoelectric conversion units may also have a configuration and a structure similar to the above. An interlayer insulating layer 77 is formed on the front surface 70A of the semiconductor substrate 70, and the lower insulating layer 83, the polarizer 91, the upper insulating layer 84, the color filter layer 90, and the on-chip microlens 14 are formed on the interlayer insulating layer 77. As described above, except for being of a front-illuminated type, the configuration and the structure of the modification of a stacked imaging device of Example 1 may be similar to the configurations and the structures of an imaging device and a stacked imaging device of Example 1 described above, and therefore, detailed explanation thereof is not made herein.

First Modification of a Stacked Imaging Device of Example 1

Figure 6A:
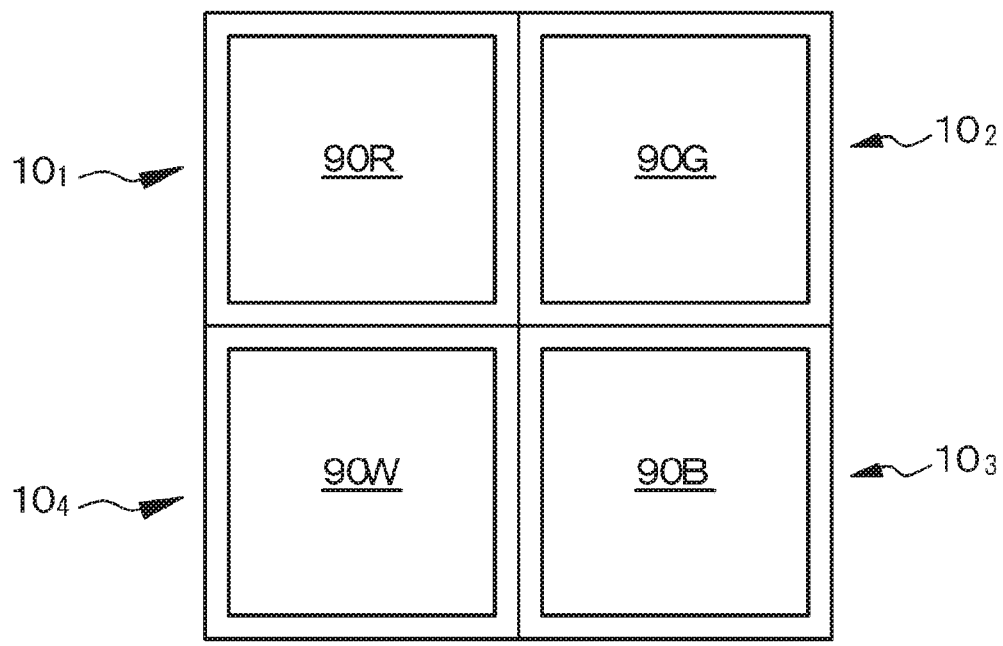
FIGS. 6A and 6B are a schematic layout diagram of color filter layers and the like that form a stacked imaging device for red light, a stacked imaging device for green light, a stacked imaging device for blue light, and a stacked imaging device for white light in a first modification of Example 1, and a schematic layout diagram of polarizers, respectively.
Figure 6B:
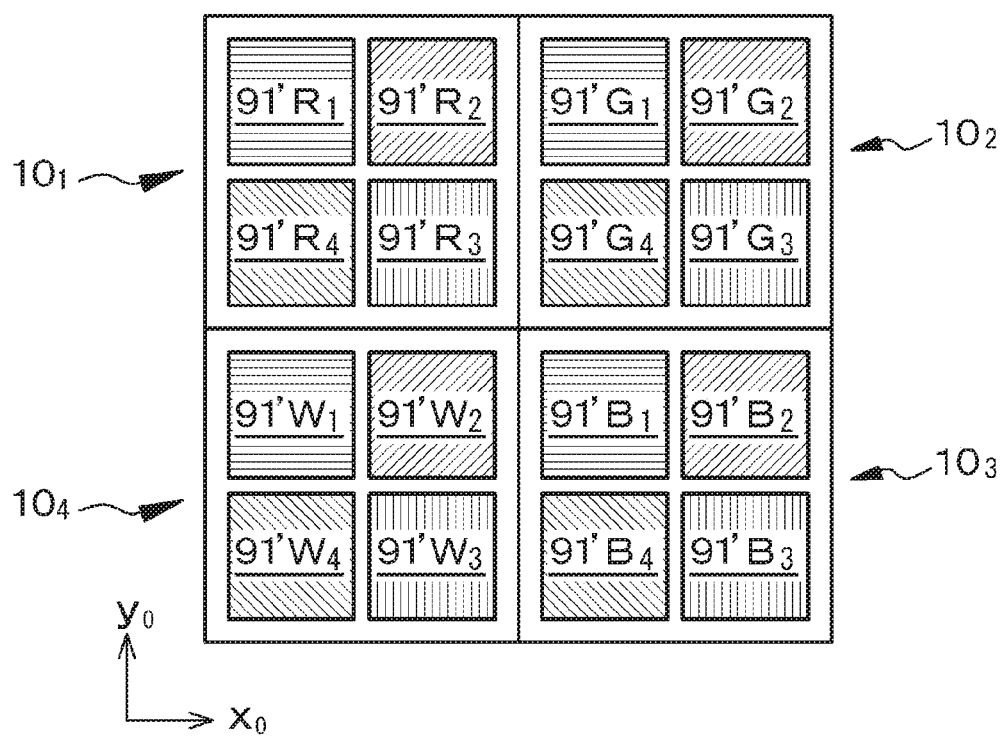

Alternatively, as a first modification of a stacked imaging device of Example 1, a schematic layout diagram of color filter layers and the like that form a stacked imaging device for red light, a stacked imaging device for green light, a stacked imaging device for blue light, and a stacked imaging device for white light is shown in FIG. 6A, and a schematic layout diagram of polarizers is shown in FIG. 6B. A plurality of photoelectric conversion units may include photoelectric conversion units having sensitivity to red light, green light, or blue light, and a photoelectric conversion unit having sensitivity to near-infrared light.

Specifically, the first stacked imaging device $10_1$ includes a red color filter layer 90R [see FIG. 6A], four polarizer segments $91'R_1$, $91'R_2$, $91'R_3$, and $91'R_4$ [see FIG. 6B] disposed below the red color filter layer 90R, upper photoelectric conversion units (red-light imaging devices $10R_1$, $10R_2$, $10R_3$, and $10R_4$) [see FIG. 5A] disposed below the respective four polarizer segments, and lower photoelectric conversion units [near-infrared light photoelectric conversion units $10iR_{11}$, $10iR_{12}$, $10iR_{13}$, and $10iR_{14}$] [see FIG. 5B] disposed below the respective upper photoelectric conversion units.

Likewise, the second stacked imaging device $10_2$ includes a green color filter layer 90G [see FIG. 6A], four polarizer segments $91'G_1$, $91'G_2$, $91'G_3$, and $91'G_4$ [see FIG. 6B] disposed below the green color filter layer 90G, upper photoelectric conversion units (green-light imaging devices $10G_1$, $10G_2$, $10G_3$, and $10G_4$) [see FIG. 5A] disposed below the respective four polarizer segments, and lower photoelectric conversion units [near-infrared light photoelectric conversion units $10iR_{21}$, $10iR_{22}$, $10iR_{23}$, and $10iR_{24}$] [see FIG. 5B] disposed below the respective upper photoelectric conversion units.

Further, the third stacked imaging device $10_3$ includes a blue color filter layer 90B [see FIG. 6A], four polarizer segments $91'B_1$, $91'B_2$, $91'B_3$, and $91'B_4$ [see FIG. 6B] disposed below the blue color filter layer 90B, upper photoelectric conversion units (blue-light imaging devices $10B_1$, $10B_2$, $10B_3$, and $10B_4$) [see FIG. 5A] disposed below the respective four polarizer segments, and lower photoelectric conversion units [near-infrared light photoelectric conversion units $10iR_{31}$, $10iR_{32}$, $10iR_{33}$, and $10iR_{34}$] [see FIG. 5B] disposed below the respective upper photoelectric conversion units.

Further, the fourth stacked imaging device $10_4$ includes a transparent resin layer 90W [see FIG. 6A], four polarizer segments $91'W_1$, $91'W_2$, $91'W_3$, and $91'W_4$ [see FIG. 6B] disposed below the transparent resin layer 90W, upper photoelectric conversion units (white-light imaging devices $10W_1$, $10W_2$, $10W_3$, and $10W_4$) [see FIG. 5A] disposed below the respective four polarizer segments, and lower photoelectric conversion units [near-infrared light photoelectric conversion units $10iR_{41}$, $10iR_{44}$, $10iR_{43}$, and $10iR_{44}$] [see FIG. 5B] disposed below the respective upper photoelectric conversion units.

Alternatively, or in other words, polarizers are further provided on the light incident side of each of the first stacked imaging device $10_1$, the second stacked imaging device $10_2$, and the third stacked imaging device $10_3$, the polarizer provided on the light incident side of the first stacked imaging device $10_1$ includes the four polarizer segments of a 1-1st polarizer (polarizer segment) $91'R_1$, a 1-2nd polarizer (polarizer segment) $91'R_2$, a 1-3rd polarizer (polarizer segment) $91'R_3$, and a 1-4th polarizer (polarizer segment) $91'R_4$ that are arranged in a 2×2 array (in other words, two polarizer segments are arranged in the $x_0$ direction, and two polarizer segments are arranged in the $y_0$ direction), the polarization orientation in which light is to be transmitted by the 1-1st polarizer (polarizer segment) $91'R_1$ is $\beta$ degrees, the polarization orientation in which light is to be transmitted by the 1-2nd polarizer (polarizer segment) $91'R_2$ is $(\beta+45)$ degrees, the polarization orientation in which light is to be transmitted by the 1-3rd polarizer (polarizer segment) $91'R_3$ is $(\alpha+90)$ degrees, and the polarization orientation in which light is to be transmitted by the 1-4th polarizer (polarizer segment) $91'R_4$ is $(\beta+135)$ degrees.

Likewise, the polarizer provided on the light incident side of the second stacked imaging device $10_2$ includes the four polarizer segments of a 2-1st polarizer (polarizer segment) $91'G_1$, a 2-2nd polarizer (polarizer segment) $91'G_2$, a 2-3rd polarizer (polarizer segment) $91'G_3$, and a 2-4th polarizer (polarizer segment) $91'G_4$ that are arranged in a 2×2 array (in other words, two polarizer segments are arranged in the $x_0$ direction, and two polarizer segments are arranged in the $y_0$ direction), the polarization orientation in which light is to be transmitted by the 2-1st polarizer (polarizer segment) $91'G_1$ is $\gamma$ degrees, the polarization orientation in which light is to be transmitted by the 2-2nd polarizer (polarizer segment) $91'G_2$ is $(\gamma+45)$ degrees, the polarization orientation in which light is to be transmitted by the 2-3rd polarizer (polarizer segment) $91'G_3$ is $(\gamma+90)$ degrees, and the polarization orientation in which light is to be transmitted by the 2-4th polarizer (polarizer segment) $91'G_4$ is $(\gamma+135)$ degrees.

Further, the polarizer provided on the light incident side of the third stacked imaging device $10_3$ includes the four polarizer segments of a 3-1st polarizer (polarizer segment) $91'B_1$, a 3-2nd polarizer (polarizer segment) $91'B_2$, a 3-3rd polarizer (polarizer segment) $91'B_3$, and a 3-4th polarizer (polarizer segment) $91'B_4$ that are arranged in a 2×2 array (in other words, two polarizer segments are arranged in the $x_0$ direction, and two polarizer segments are arranged in the $y_0$ direction), the polarization orientation in which light is to be transmitted by the 3-1st polarizer (polarizer segment) $91'B_1$ is $\delta$ degrees, the polarization orientation in which light is to be transmitted by the 3-2nd polarizer (polarizer segment) $91'B_2$ is $(\delta+45)$ degrees, the polarization orientation in which light is to be transmitted by the 3-3rd polarizer (polarizer segment) $91'B_3$ is $(\delta+90)$ degrees, and the polarization orientation in which light is to be transmitted by the 3-4th polarizer (polarizer segment) $91'B_4$ is $(\delta+135)$ degrees.

Here, $\beta=\gamma=\delta$, and, as for the values $\beta$, of $\gamma$, and $\delta$, the angle with respect to the $y_0$ direction is "0 degree".

Second Modification of a Stacked Imaging Device of Example 1

Figure 7A:
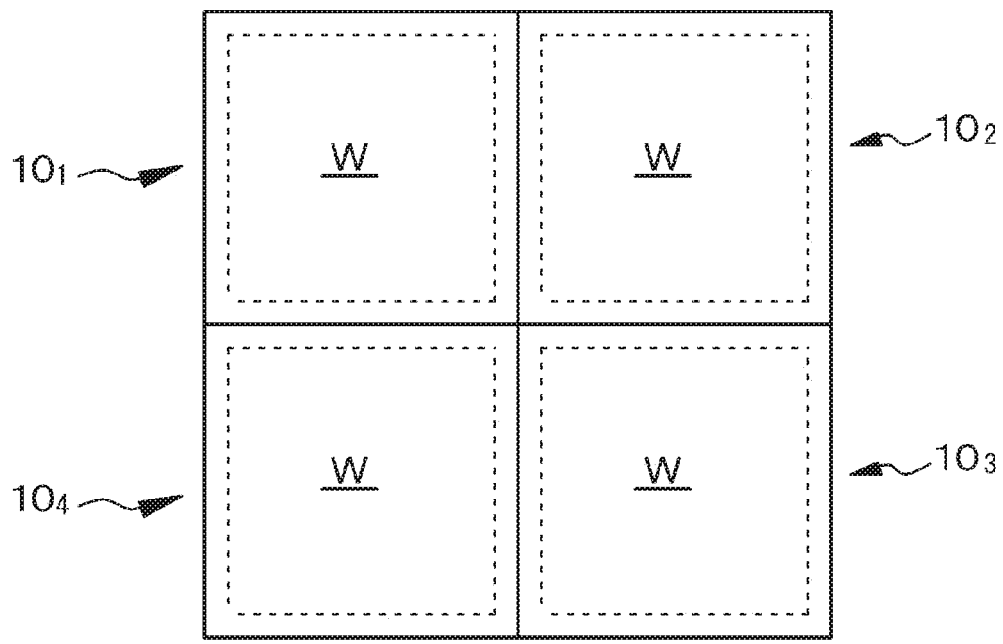
FIGS. 7A and 7B are a schematic layout diagram of regions or the like forming stacked imaging devices for white light in a second modification of Example 1, and a schematic layout diagram of polarizers, respectively.
Figure 7B:
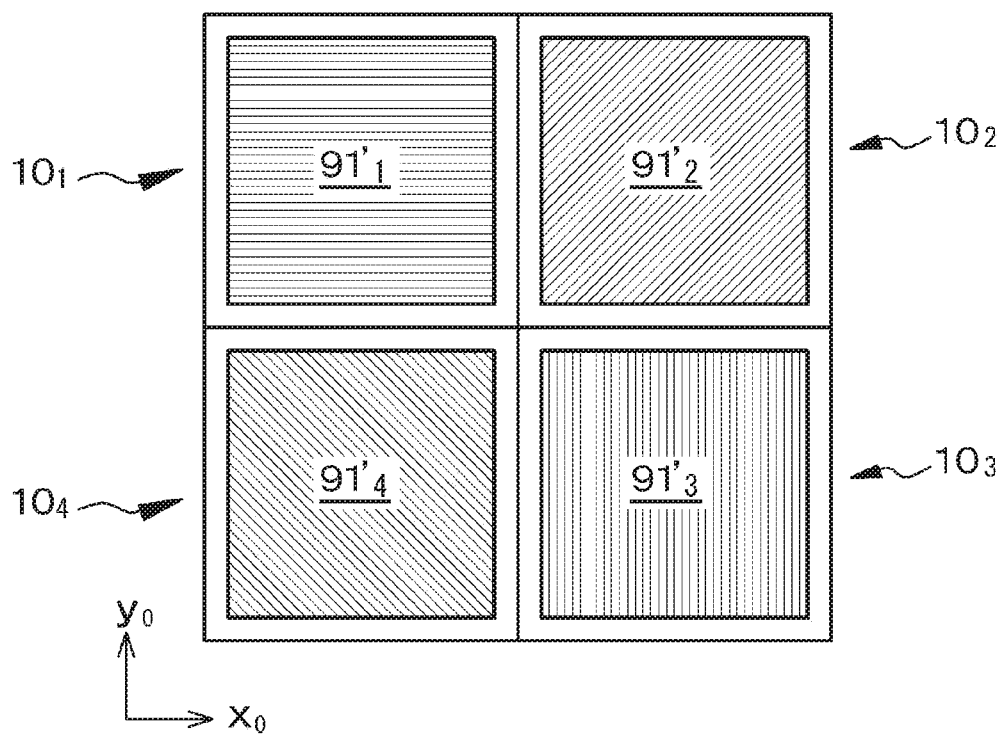
Figure 8A:
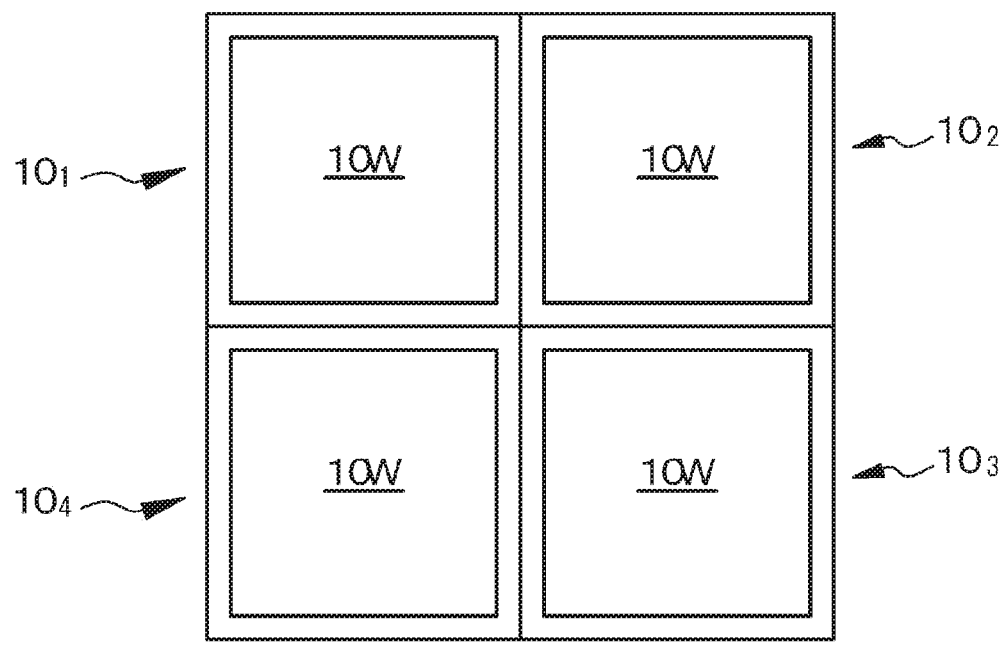
FIGS. 8A and 8B are a schematic layout diagram of upper photoelectric conversion units forming stacked imaging devices for white light in the second modification of Example 1, and a schematic layout diagram of lower photoelectric conversion units, respectively.
Figure 8B:
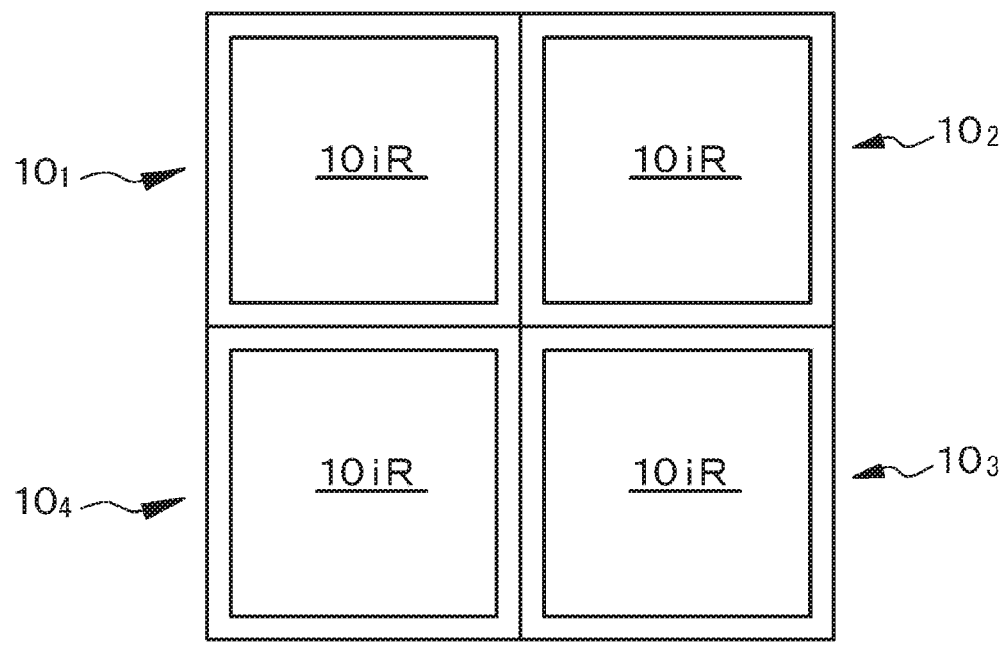
Figure 10A:
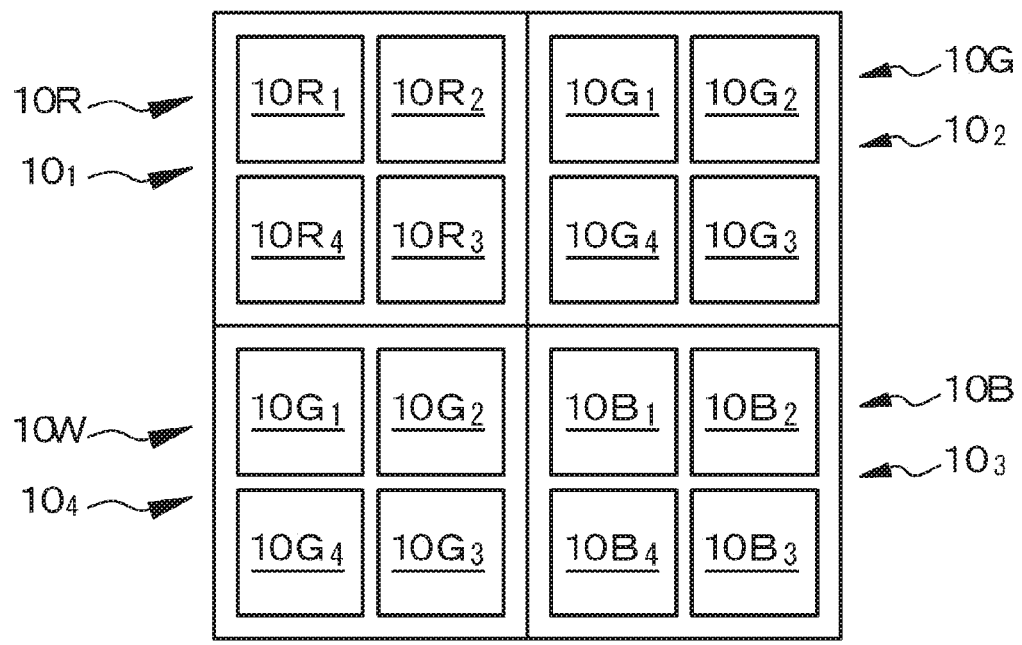
FIGS. 10A and 10B are a schematic layout diagram of upper photoelectric conversion units forming stacked imaging devices for white light in the third modification of Example 1, and a schematic layout diagram of lower photoelectric conversion units, respectively.
Figure 10B:
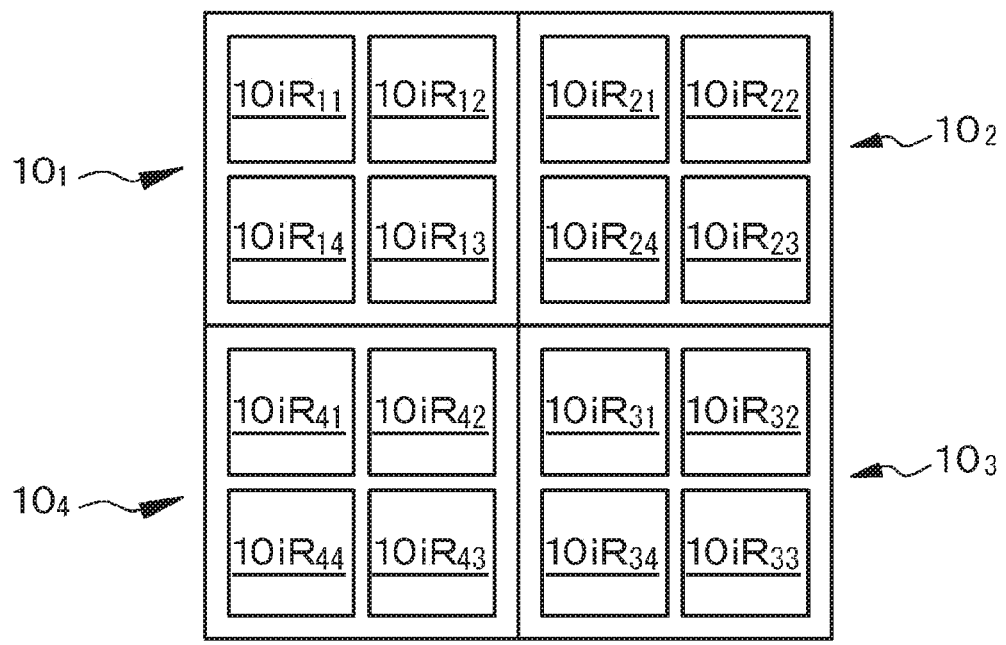

Further, a stacked imaging device that forms a single-color solid-state imaging apparatus may be a second modification of a stacked imaging device of Example 1. FIG. 7A shows a schematic layout diagram of regions W that form stacked imaging devices for white light that are arranged in a 2×2 array. FIG. 7B shows a schematic layout diagram of polarizers $91_1$, $91_2$, $91^3$, and $91^4$. FIG. 8A shows a schematic layout diagram of upper photoelectric conversion units 10W that form the stacked imaging devices for white light. FIG. 10B shows a schematic layout diagram of lower photoelectric conversion units 10iR. Specifically, the stacked imaging device includes the regions W (transparent resin layers 90W may be formed instead) that form the stacked imaging devices for white light [see FIG. 7A], the four polarizer segments $91'W_1$, $91'W_2$, $91'W_3$, and $91'W_4$ [see FIG. 7B] disposed below the respective regions W, the upper photoelectric conversion units (white-light imaging devices 10W) [see FIG. 8A] disposed below the four polarizer segments, and the lower photoelectric conversion units (near-infrared light photoelectric conversion units 10iR) [see FIG. 8B] disposed below the respective upper layer photoelectric conversion units.

Third Modification of a Stacked Imaging Device of Example 1

Figure 9A:
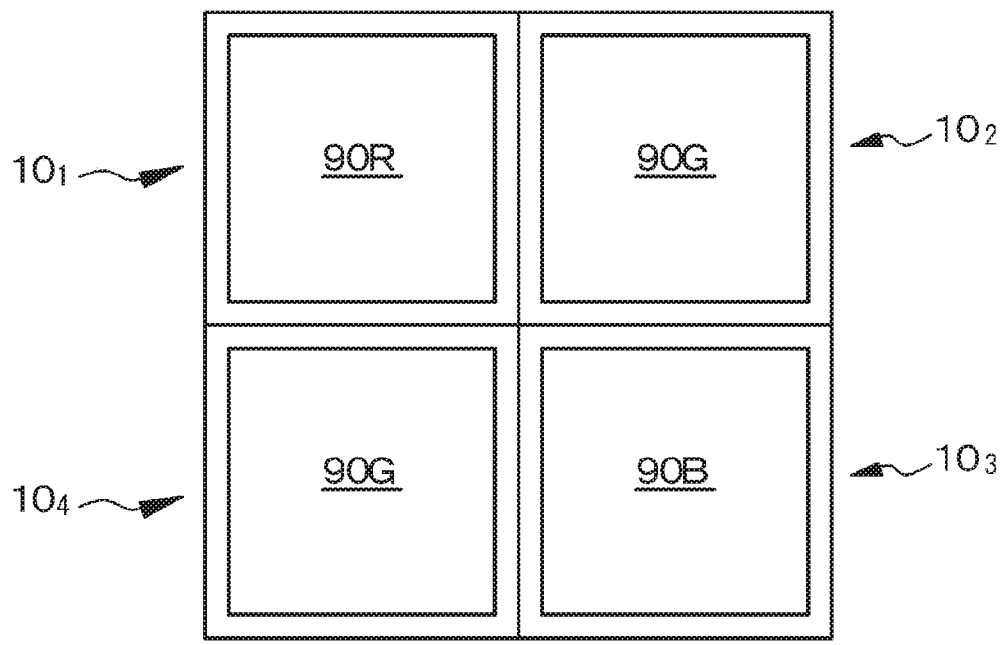
FIGS. 9A and 9B are a schematic layout diagram of regions or the like forming stacked imaging devices for white light in a third modification of Example 1, and a schematic layout diagram of polarizers, respectively.
Figure 9B:
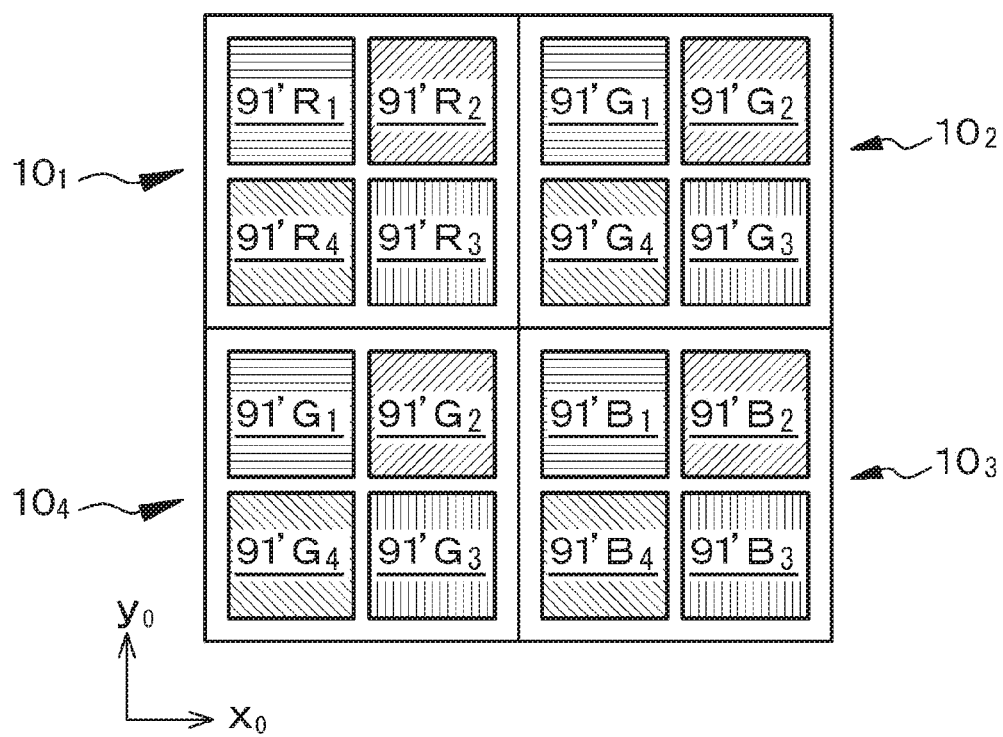

Further, a stacked imaging device that forms a solid-state imaging apparatus having a Bayer array may be a third modification of a stacked imaging device of Example 1. FIG. 9A shows a schematic layout diagram of color filter layers and the like that form a stacked imaging device for red light, a stacked imaging device for green light, and a stacked imaging device for blue light. FIG. 9B shows a schematic layout diagram of polarizers. FIG. 10A shows a schematic layout diagram of upper photoelectric conversion units that form the stacked imaging device for red light, the stacked imaging device for green light, and the stacked imaging device for blue light. FIG. 10B shows a schematic layout diagram of lower photoelectric conversion units. As shown in these drawings, the plurality of photoelectric conversion units may include photoelectric conversion units having sensitivity to red light, green light, or blue light, and a photoelectric conversion unit having sensitivity to near-infrared light.

Specifically, the first stacked imaging device $10_1$ includes a red color filter layer 90R [see FIG. 9A], four polarizer segments $91'R_1$, $91'R_2$, $91'R_3$, and $91'R_4$ [see FIG. 9B] disposed below the red color filter layer 90R, upper photoelectric conversion units (red-light imaging devices $10R_1$, $10R_2$, $10R_3$, and $10R_4$) [see FIG. 10A] disposed below the respective four polarizer segments, and lower photoelectric conversion units [near-infrared light photoelectric conversion units $10iR_{11}$, $10iR_{12}$, $10R_{13}$, and $10iR_{14}$] [see FIG. 10B] disposed below the respective upper photoelectric conversion units.

Likewise, the second stacked imaging device $10_2$ and the fourth stacked imaging device $10_4$ each include a green color filter layer 90G [see FIG. 9A], four polarizer segments $91'G_1$, $91'G_2$, $91'G_3$, and $91'G_4$ [see FIG. 9B] disposed below the corresponding green color filter layer 90G, upper photoelectric conversion units (green-light imaging devices $10G_1$, $10G_2$, $10G_3$, and $10G_4$) [see FIG. 10A] disposed below the respective four polarizer segments, and lower photoelectric conversion units [near-infrared light photoelectric conversion units $10iR_{21}$, $10iR_{22}$, $10iR_{23}$, and $10iR_{24}$, or $10iR_{41}$, $10iR_{42}$, $10iR_{43}$, and $10iR_{44}$) [see FIG. 10B] disposed below the respective upper photoelectric conversion units.

Further, the third stacked imaging device $10_3$ includes a blue color filter layer 90B [see FIG. 9A], four polarizer segments $91'B_1$, $91'B_2$, $91'B_3$, and $91'B_4$ [see FIG. 9B] disposed below the blue color filter layer 90B, upper photoelectric conversion units (blue-light imaging devices $10B_1$, $10B_2$, $10B_3$, and $10B_4$) [see FIG. 10A] disposed below the respective four polarizer segments, and lower photoelectric conversion units [near-infrared light photoelectric conversion units $10iR_{31}$, $10iR_{32}$, $10iR_{33}$, and $10iR_{34}$) [see FIG. 10B] disposed below the respective upper photoelectric conversion units.

In a stacked imaging device of Example 1 described above or a modification thereof, the upper photoelectric conversion unit is formed with a photoelectric conversion unit having sensitivity to red light, green light, blue light, or white light, and the lower photoelectric conversion unit is formed with a photoelectric conversion unit having sensitivity to near-infrared light. However, the upper photoelectric conversion unit may be formed with a photoelectric conversion unit having sensitivity to near-infrared light, and the lower photoelectric conversion unit may be formed with a photoelectric conversion unit having sensitivity to red light, green light, blue light, or white light. Further, a photoelectric conversion unit having sensitivity to red light, green light, or blue light may be formed by stacking at least two kinds of photoelectric conversion units selected from a group including a red-light photoelectric conversion unit having sensitivity to red light, a green-light photoelectric conversion unit having sensitivity to green light, and a blue-light photoelectric conversion unit having sensitivity to blue light.

Figure 13B:
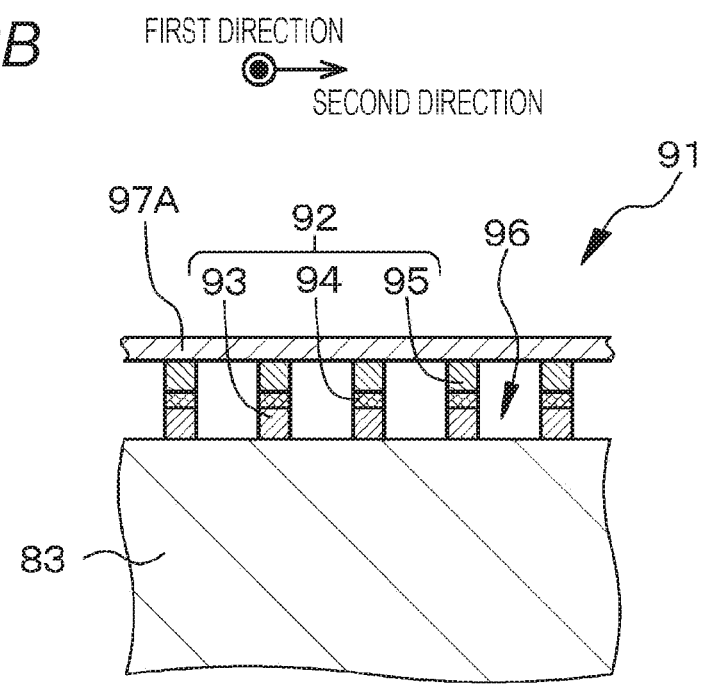

A modification of the wire grid polarizer 91 may be a configuration in which a protective film 97A is formed on the wire grid polarizer 91, and space portions 96 of the wire grid polarizer 91 are void spaces, as shown in a schematic partial end view in FIG. 13B. In other words, some or all of the space portions 96 are filled with air. Specifically, all the space portions 96 are filled with air in Example 1.

Figure 14A:
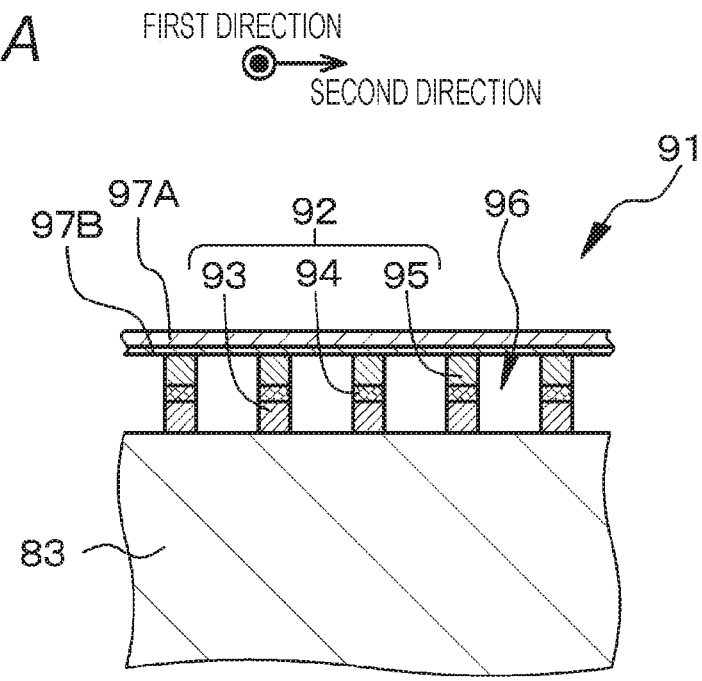

Further, as shown in a schematic partial end view in FIG. 14A, a second protective film 97B may be formed between the wire grid polarizer 91 and the protective film 97A. Where the refractive index of the material forming the protective film 97A is represented by $n_1$, and the refractive index of the material forming the second protective film 97B is represented by $n_2$, $n_1 > n_2$. Here, the protective film 97A includes SiN ($n_1$=2.0), and the second protective film 97B includes SiO$_2$ ($n_2$32 1.46), for example. In the drawing, the bottom surface (the surface facing the photoelectric conversion unit) of the second protective film 97B is shown as a flat surface. However, the bottom surface of the second protective film 97B may be convex toward the space portions 96 in some cases, or the bottom surface of the second protective film 97B may be concave toward the protective film 97A or may be recessed like a wedge in other cases.

Such a structure is obtained by forming the wire grid polarizer 91 having a line-and-space structure, and then forming the second protective film 97B that includes SiO$_2$ and has an average thickness of 0.01 μm to 10 μm by a CVD method. The upper side of the space portions 96 located between the line portions 92 is closed by the second protective film 97B. The protective film 97A that includes SiN and has an average thickness of 0.1 μm to 10 μm is then formed on the second protective film 97B by a CVD method. As the protective film 97A includes SiN, it is possible to obtain an imaging device having high reliability. However, since SiN has a relatively high relative dielectric constant, the second protective film 97B including SiO$_2$ is formed, to lower the average refractive index $n_{ave}$.

Figure 15:
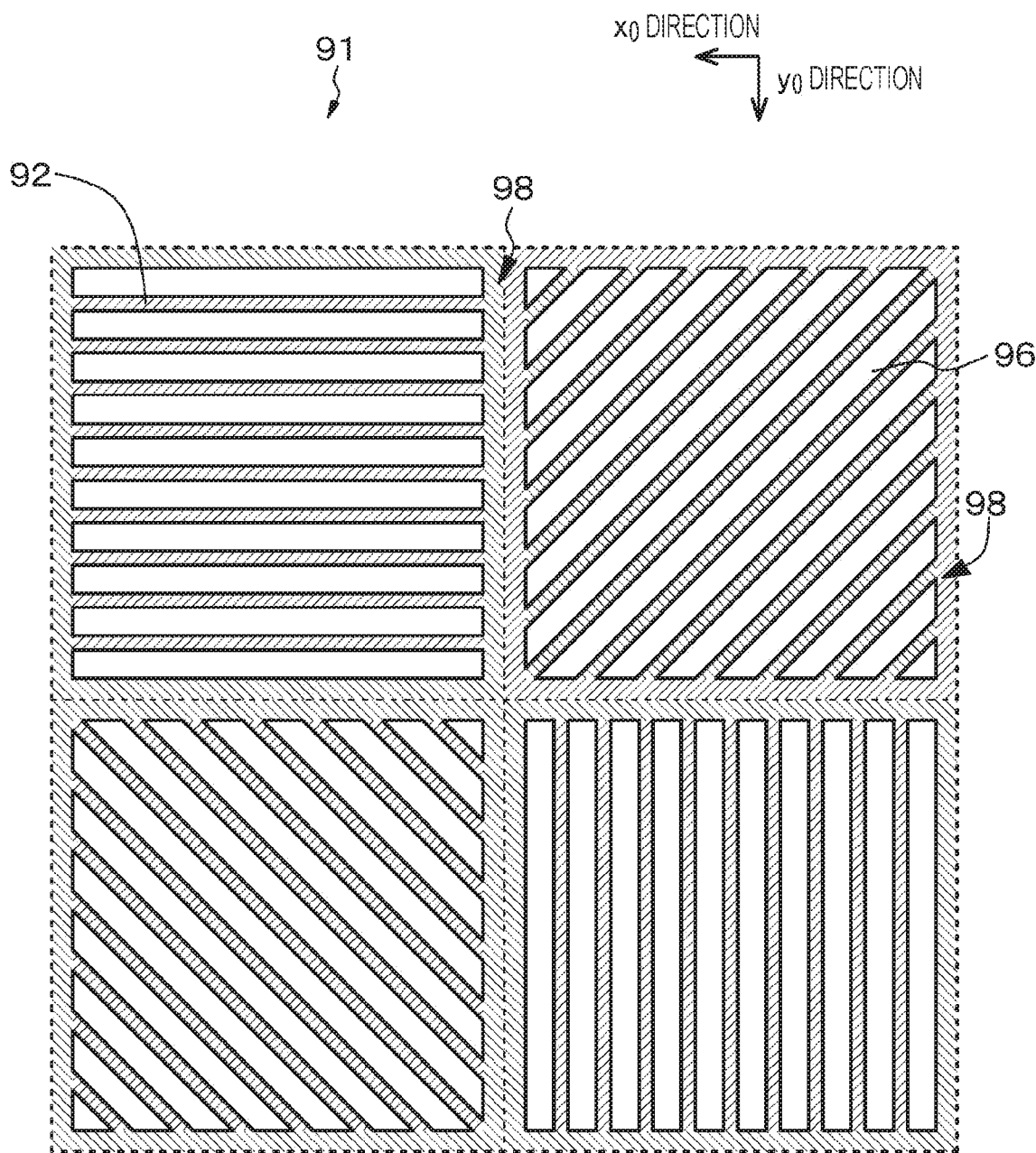

Alternatively, as shown in a schematic partial plan view in FIG. 15, a modification of the wire grid polarizer 91 may be in a stacked imaging device that includes the frame unit 98 surrounding the wire grid polarizer. In this stacked imaging device, the frame unit 98 is joined to the line portions 92 of the wire grid polarizer 91, and the frame unit 98 has the same structure as the line portions 92 of the wire grid polarizer 91.

As the space portions of the wire grid polarizer are void spaces (or specifically, are filled with air), the value of the average refractive index $n_{ave}$ can be made smaller. As a result, the transmittance and the extinction ratio in the wire grid polarizer can be improved. Further, as the value of the formation pitch $P_0$ can be increased, the manufacturing yield of wire grid polarizers can be improved. Furthermore, as a protective film is formed on the wire grid polarizer, it is possible to provide a stacked imaging device and a solid-state imaging apparatus having high reliability. Further, as the frame unit is joined to the line portions of the wire grid polarizer, and the frame unit has the same structure as the line portions of the wire grid polarizer, it is possible to stably form identical wire grid polarizers with uniform quality. Thus, it is possible to solve the problem that peeling from the photoelectric conversion unit occurs in the outer peripheral portions of the wire grid polarizer corresponding to the four corners of a stacked imaging device, the problem that a difference is generated between the structure of the outer peripheral portions of the wire grid polarizer and the structure of the central portion of the wire grid polarizer, and the problem that light that has entered the outer peripheral portions of the wire grid polarizer easily leaks into adjacent stacked imaging devices having different polarization directions. As a result, a stacked imaging device and a solid-state imaging apparatus having high reliability can be provided.

The wire grid polarizer may have a structure from which the insulating film is excluded, or a configuration in which a light reflection layer (including aluminum, for example) and a light absorption layer (including tungsten, for example) are stacked from the side opposite from the light incident side. Alternatively, the wire grid polarizer may be formed with one conductive light-blocking material layer. The material that forms the conductive light-blocking material layer is a conductive material that has a low complex refractive index in the wavelength region in which imaging devices have sensitivity, such as aluminum (Al), copper (Cu), gold (Au), silver (Ag), platinum (Pt), tungsten (W), or an alloy containing these metals.

Figure 14B:
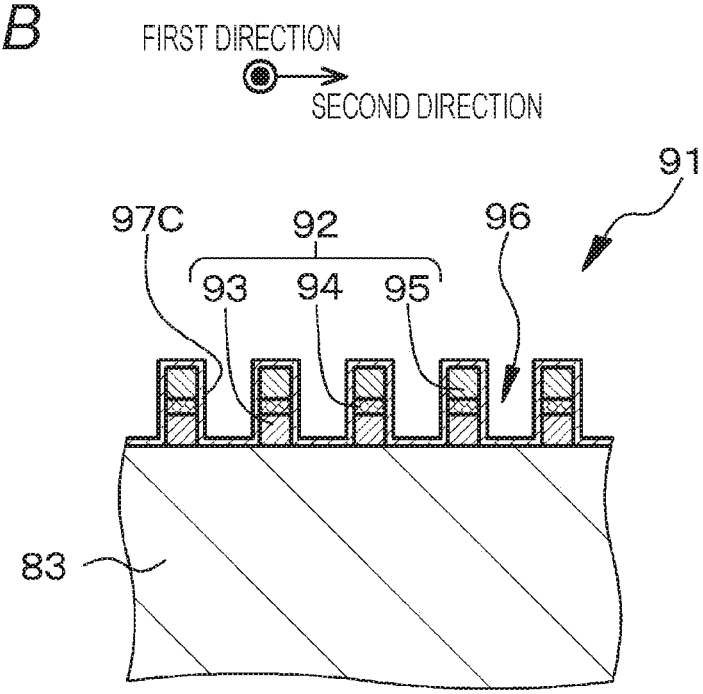

In some cases, as shown in a schematic partial end view of a wire grid polarizer in FIG. 14B, a third protective film 97C including $SiO_2$, for example, may be formed on the side surfaces of the line portions 92 facing the space portions 96. In other words, the space portions 96 are filled with air, and the third protective film 97C is further present in the space portions. The third protective film 97C is formed by an HDP-CVD method, for example, so that a thinner third protective film 97C can be formed conformally on the side surfaces of the line portions 92.

EXAMPLE 2

Figure 16A:
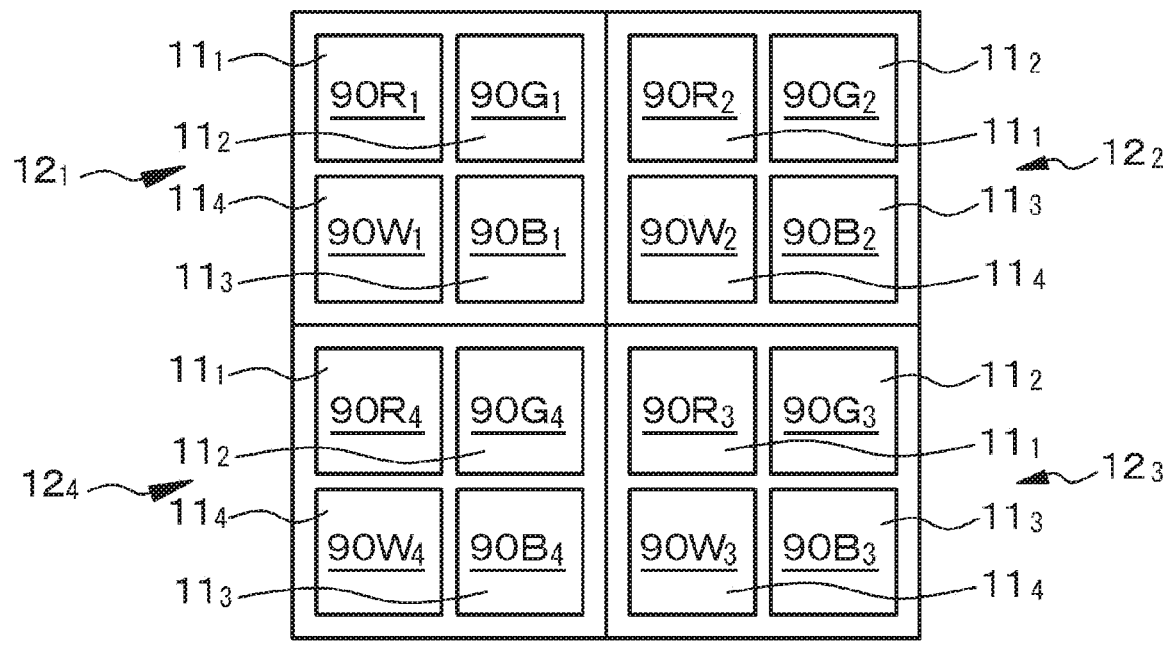
FIGS. 16A and 16B are a schematic layout diagram of color filter layers and the like that form a stacked imaging device for red light, a stacked imaging device for green light, a stacked imaging device for blue light, and a stacked imaging device for white light in Example 2, and a schematic layout diagram of polarizers, respectively.
Figure 16B:
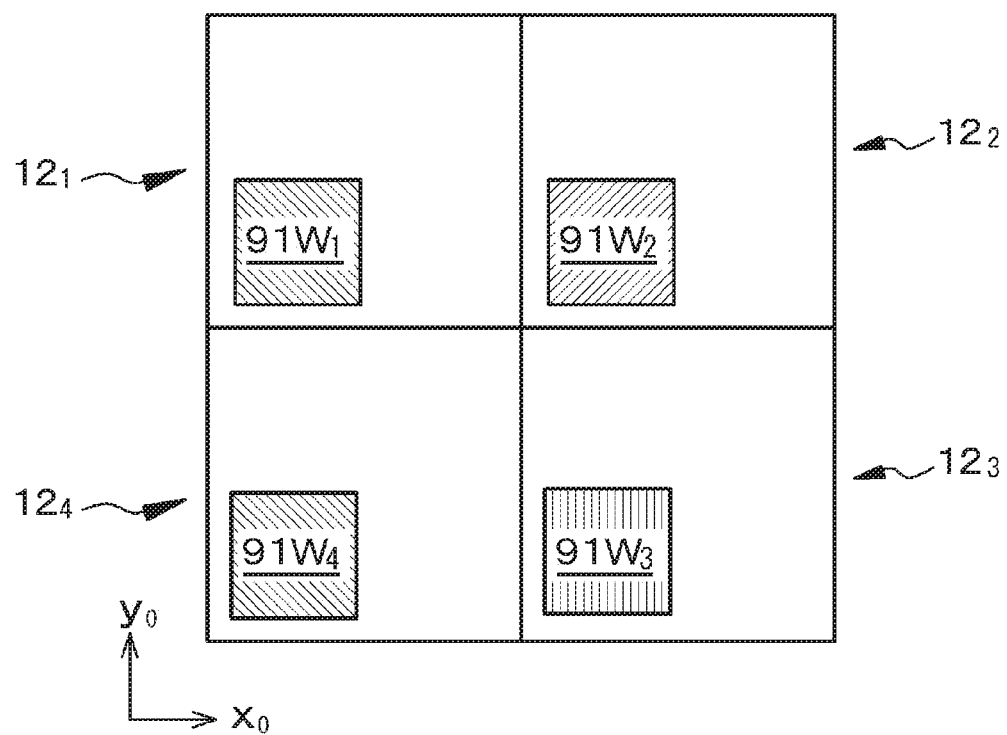
Figure 17A:
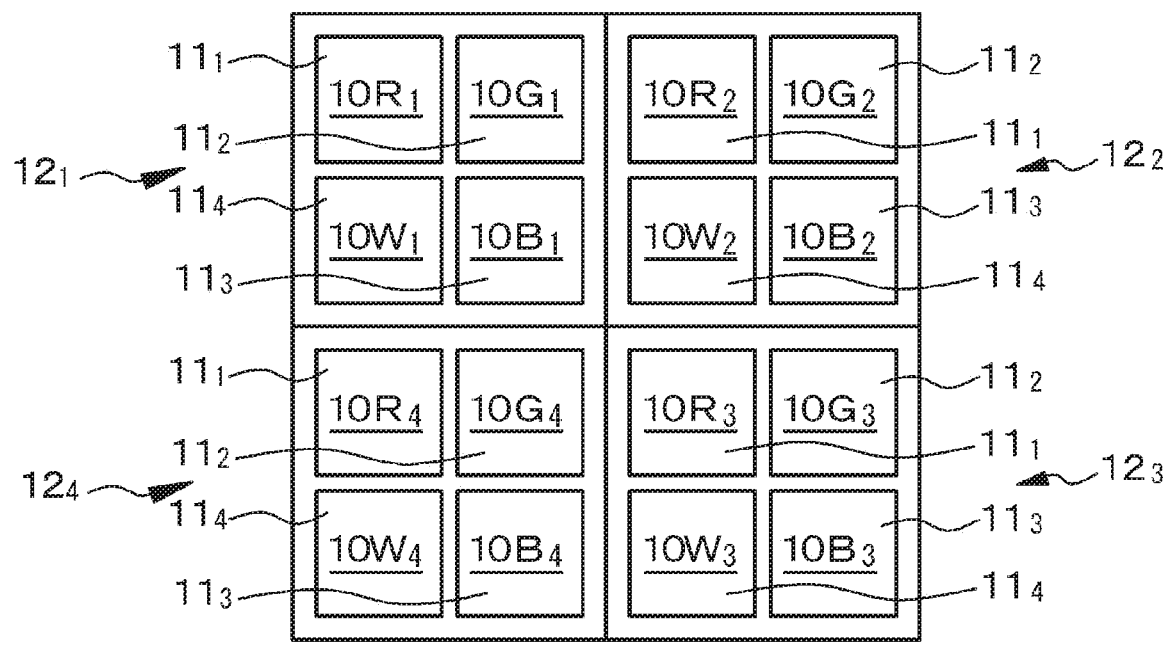
FIGS. 17A and 17B are a schematic layout diagram of upper photoelectric conversion units that form a stacked imaging device for red light, a stacked imaging device for green light, a stacked imaging device for blue light, and a stacked imaging device for white light in Example 2, and a schematic layout diagram of lower photoelectric conversion units, respectively.
Figure 17B:
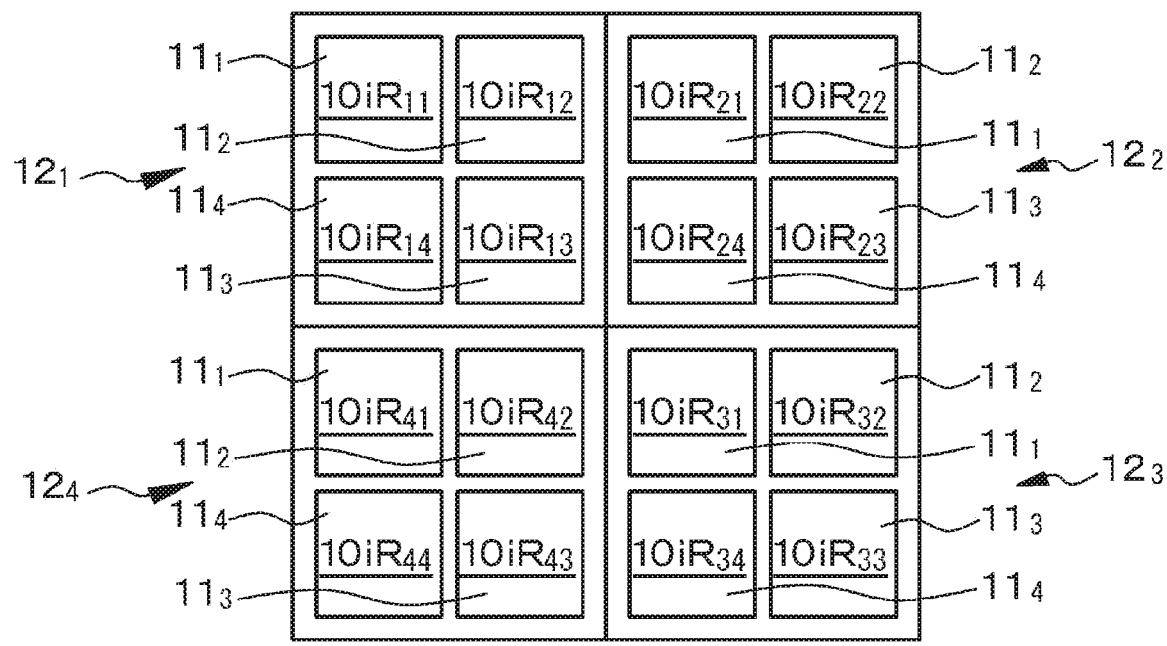

Example 2 is a modification of Example 1, and relates to a solid-state imaging apparatus according to the second embodiment of the present disclosure. FIG. 16A shows a schematic layout diagram of color filter layers and the like that form a stacked imaging device for red light, a stacked imaging device for green light, a stacked imaging device for blue light, and a stacked imaging device for white light in Example 2. FIG. 16B shows a schematic layout diagram of polarizers. Further, FIG. 17A shows a schematic layout diagram of upper photoelectric conversion units that form a stacked imaging device for red light, a stacked imaging device for green light, a stacked imaging device for blue light, and a stacked imaging device for white light in Example 2. FIG. 17B shows a schematic layout diagram of lower photoelectric conversion units.

In a first imaging device unit $12_1$ in a solid-state imaging apparatus of Example 2, a first stacked imaging device $11_1$ includes a photoelectric conversion unit $11R_1$ having sensitivity to red light, and a photoelectric conversion unit $11iR_{11}$ having sensitivity to near-infrared light, a second stacked imaging device $11_2$ includes a photoelectric conversion unit $11G_1$ having sensitivity to green light, and a photoelectric conversion unit $11iR_{12}$ having sensitivity to near-infrared light, a third stacked imaging device $11_3$ includes a photoelectric conversion unit $11B_1$ having sensitivity to blue light, and a photoelectric conversion unit $11iR_{13}$ having sensitivity to near-infrared light, and a fourth stacked imaging device $11_4$ includes a photoelectric conversion unit $11W_1$ having sensitivity to white light, and a photoelectric conversion unit $11iR_{14}$ having sensitivity to near-infrared light.

Likewise, in a second imaging device unit $12_2$, a first stacked imaging device $11_1$ includes a photoelectric conversion unit $11R_2$ having sensitivity to red light, and a photoelectric conversion unit $11iR_{21}$ having sensitivity to near-infrared light, a second stacked imaging device $11_2$ includes a photoelectric conversion unit $11G_2$ having sensitivity to green light, and a photoelectric conversion unit $11iR_{22}$ having sensitivity to near-infrared light, a third stacked imaging device $11_3$ includes a photoelectric conversion unit $11B_2$ having sensitivity to blue light, and a photoelectric conversion unit $11iR_{23}$ having sensitivity to near-infrared light, and a fourth stacked imaging device $11_4$ includes a photoelectric conversion unit $11W_2$ having sensitivity to white light, and a photoelectric conversion unit $11iR_{24}$ having sensitivity to near-infrared light.

Further, in a third imaging device unit $12_3$, a first stacked imaging device $11_1$ includes a photoelectric conversion unit $11R_3$ having sensitivity to red light, and a photoelectric conversion unit $11iR_{31}$ having sensitivity to near-infrared light, a second stacked imaging device $11_2$ includes a photoelectric conversion unit $11G_3$ having sensitivity to green light, and a photoelectric conversion unit $11iR_{32}$ having sensitivity to near-infrared light, a third stacked imaging device $11_3$ includes a photoelectric conversion unit $11B_3$ having sensitivity to blue light, and a photoelectric conversion unit $11iR_{33}$ having sensitivity to near-infrared light, and a fourth stacked imaging device $11_4$ includes a photoelectric conversion unit $11W_3$ having sensitivity to white light, and a photoelectric conversion unit $11iR_{34}$ having sensitivity to near-infrared light.

Also, in a fourth imaging device unit $12_4$, a first stacked imaging device $11_1$ includes a photoelectric conversion unit $11R_4$ having sensitivity to red light, and a photoelectric conversion unit $11iR_{41}$ having sensitivity to near-infrared light, a second stacked imaging device $11_2$ includes a photoelectric conversion unit $11G_4$ having sensitivity to green light, and a photoelectric conversion unit $11iR_{42}$ having sensitivity to near-infrared light, a third stacked imaging device $11_3$ includes a photoelectric conversion unit $11B_4$ having sensitivity to blue light, and a photoelectric conversion unit $11iR_{43}$ having sensitivity to near-infrared light, and a fourth stacked imaging device $11_4$ includes a photoelectric conversion unit $11W_4$ having sensitivity to white light, and a photoelectric conversion unit $11iR_{44}$ having sensitivity to near-infrared light.

Then, the first stacked imaging devices $11_1$, the second stacked imaging devices $11_2$, and the third stacked imaging devices $11_3$ do not include any polarizer, and the fourth stacked imaging devices $11_4$ include polarizers $91W_1$, $91W_2$, $91W_3$, and $91W_4$.

Except for the above aspects, the configuration and the structure of a stacked imaging device, and the configuration and the structure of a solid-state imaging apparatus in Example 2 may be similar to the configurations and the structures of stacked imaging devices and solid-state imaging apparatuses described in Example 1, and therefore, detailed explanation thereof is not made herein.

In Example 2, the first stacked imaging devices $11_1$, the second stacked imaging devices $11_2$, and the third stacked imaging devices $11_3$ do not include any polarizer, and the fourth stacked imaging devices $11_4$ include polarizers $91W_1$, $91W_2$, $91W_3$, and $91W_4$. Accordingly, it is possible to prevent a decrease in luminance output due to wavelength separation among red light, green light, and blue light, acquire polarization information in the wavelength bands of red light, green light, and blue light without fail, and use color, luminance, and polarization information to the maximum. Further, as there is no loss of light in the color filter layers, it is possible to achieve the advantage of an increase in the output including polarization information.

First Modification of a Solid-State Imaging Apparatus of Example 2

Figure 18A:
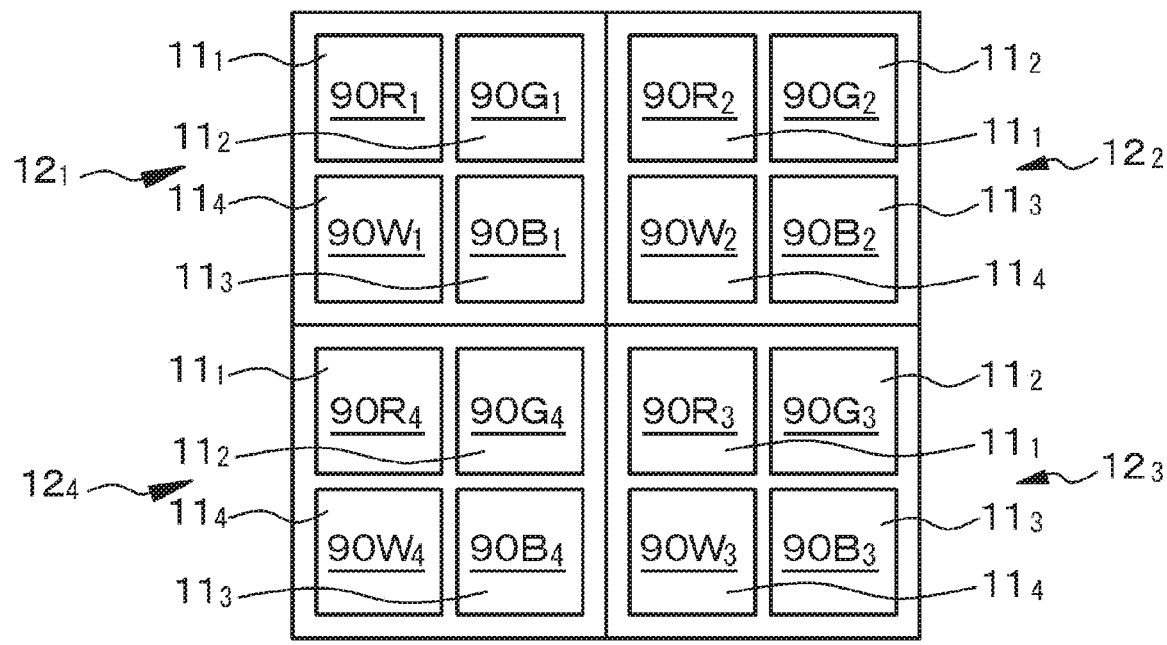
FIGS. 18A and 18B are a schematic layout diagram of color filter layers and the like that form a stacked imaging device for red light, a stacked imaging device for green light, a stacked imaging device for blue light, and a stacked imaging device for white light in a first modification of Example 2, and a schematic layout diagram of polarizers, respectively.
Figure 18B:
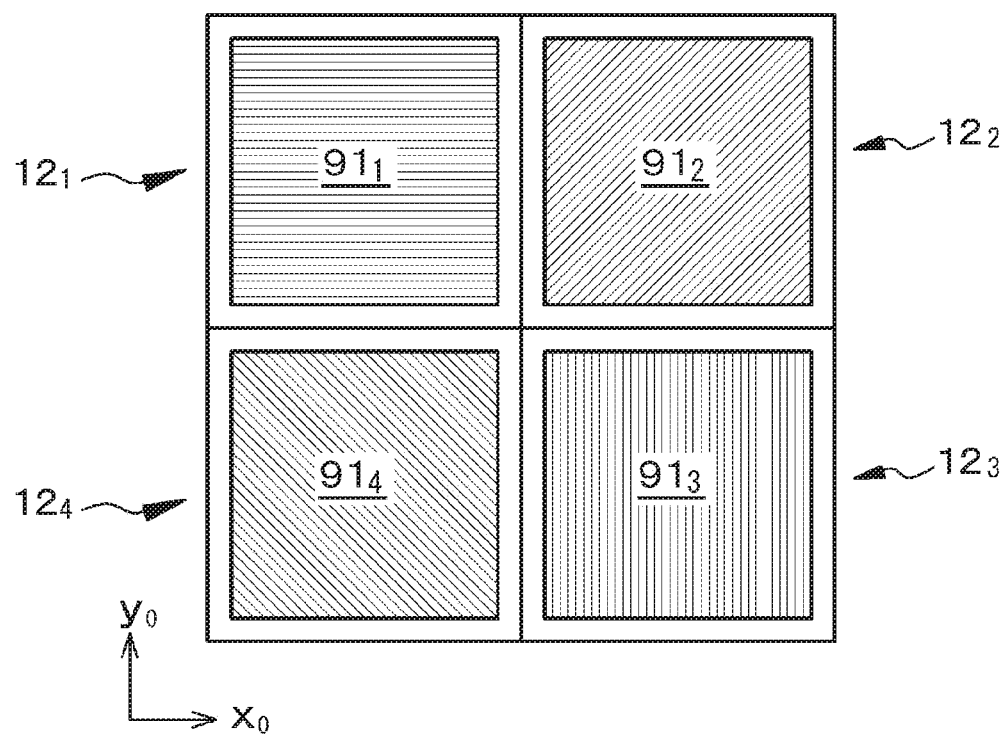
Figure 19A:
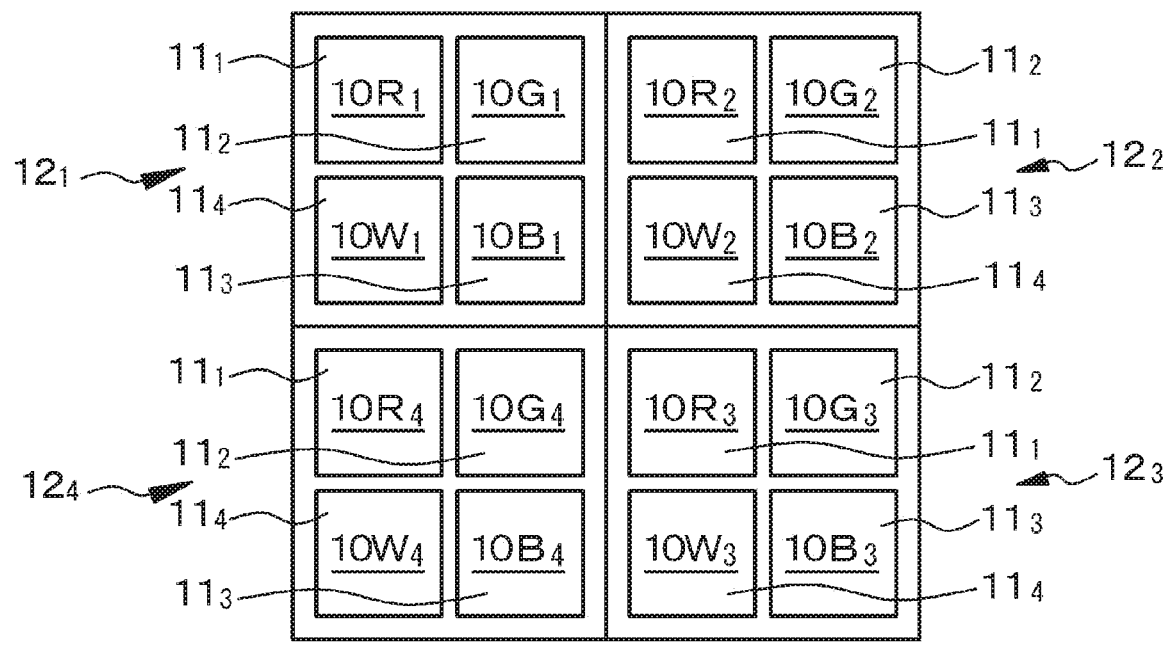
FIGS. 19A and 19B are a schematic layout diagram of upper photoelectric conversion units that form a stacked imaging device for red light, a stacked imaging device for green light, a stacked imaging device for blue light, and a stacked imaging device for white light in a first modification of Example 2, and a schematic layout diagram of lower photoelectric conversion units, respectively.
Figure 19B:
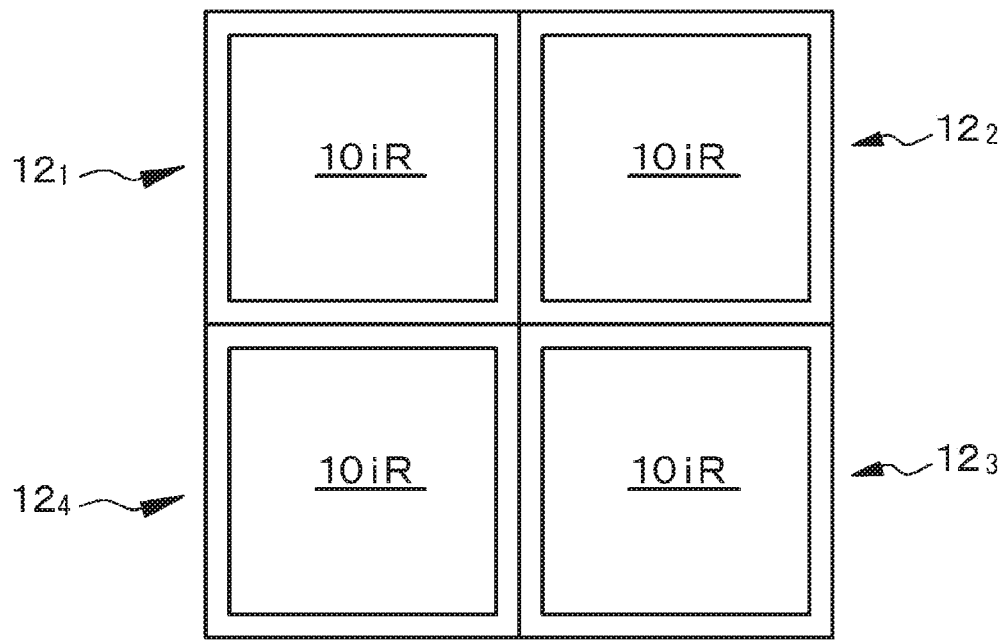

FIG. 18A shows a schematic layout diagram of color filter layers and the like that form a stacked imaging device for red light, a stacked imaging device for green light, a stacked imaging device for blue light, and a stacked imaging device for white light in a first modification of Example 2. FIG. 18B shows a schematic layout diagram of polarizers in the first modification of Example 2. Further, FIG. 19A shows a schematic layout diagram of upper photoelectric conversion units that form a stacked imaging device for red light, a stacked imaging device for green light, a stacked imaging device for blue light, and a stacked imaging device for white light in the first modification of Example 2. FIG. 19B shows a schematic layout diagram of lower photoelectric conversion units in the first modification of Example 2.

In the first modification of Example 2, the respective imaging device units $12_1$, $12_2$, $12_3$, and $12_4$ further include polarizers $91_1$, $91_2$, and $91_3$ on the light incident side of the first stacked imaging devices $11_1$, the second stacked imaging devices $11_2$, and the third stacked imaging devices $11_3$. The polarizers $91_1$, $91_2$, $91_3$, and $91_4$ provided in the first stacked imaging device $11_1$, the second stacked imaging device $11_2$, the third stacked imaging device, and the fourth stacked imaging device $11_4$ each have the same polarization orientation in one polarizer.

Specifically, in the first imaging device unit $12_1$, one polarizer $91_1$ is provided for the photoelectric conversion unit $11R_1$ forming the first stacked imaging device $11_1$, the photoelectric conversion unit $11G_1$ forming the second stacked imaging device $11_1$, the photoelectric conversion unit $11B_1$ forming the third stacked imaging device $11_1$, and the photoelectric conversion unit $11W_1$ forming the fourth stacked imaging device $11_1$, and one lower photoelectric conversion unit $11iR$ is provided.

Likewise, in the second imaging device unit $12_2$, one polarizer $91_2$ is provided for the photoelectric conversion unit $11R_2$ forming the first stacked imaging device $11_2$, the photoelectric conversion unit $11G_2$ forming the second stacked imaging device $11_2$, the photoelectric conversion unit $11B_2$ forming the third stacked imaging device $11_2$, and the photoelectric conversion unit $11W_2$ forming the fourth stacked imaging device $11_2$, and one lower photoelectric conversion unit $11iR$ is provided.

Further, in the third imaging device unit $12_3$, one polarizer $91_3$ is provided for the photoelectric conversion unit $11R_3$ forming the first stacked imaging device $11_3$, the photoelectric conversion unit $11G_3$ forming the second stacked imaging device $11_3$, the photoelectric conversion unit $11B_3$ forming the third stacked imaging device $11_3$, and the photoelectric conversion unit $11W_3$ forming the fourth stacked imaging device $11_3$, and one lower photoelectric conversion unit $11iR$ is provided.

Also, in the fourth imaging device unit $12_4$, one polarizer $91_4$ is provided for the photoelectric conversion unit $11R_4$ forming the first stacked imaging device $11_4$, the photoelectric conversion unit $11G_4$ forming the second stacked imaging device $11_4$, the photoelectric conversion unit $11B_4$ forming the third stacked imaging device $11_4$, and the photoelectric conversion unit $11W_4$ forming the fourth stacked imaging device $11_4$, and one lower photoelectric conversion unit $11iR$ is provided.

Figure 20:
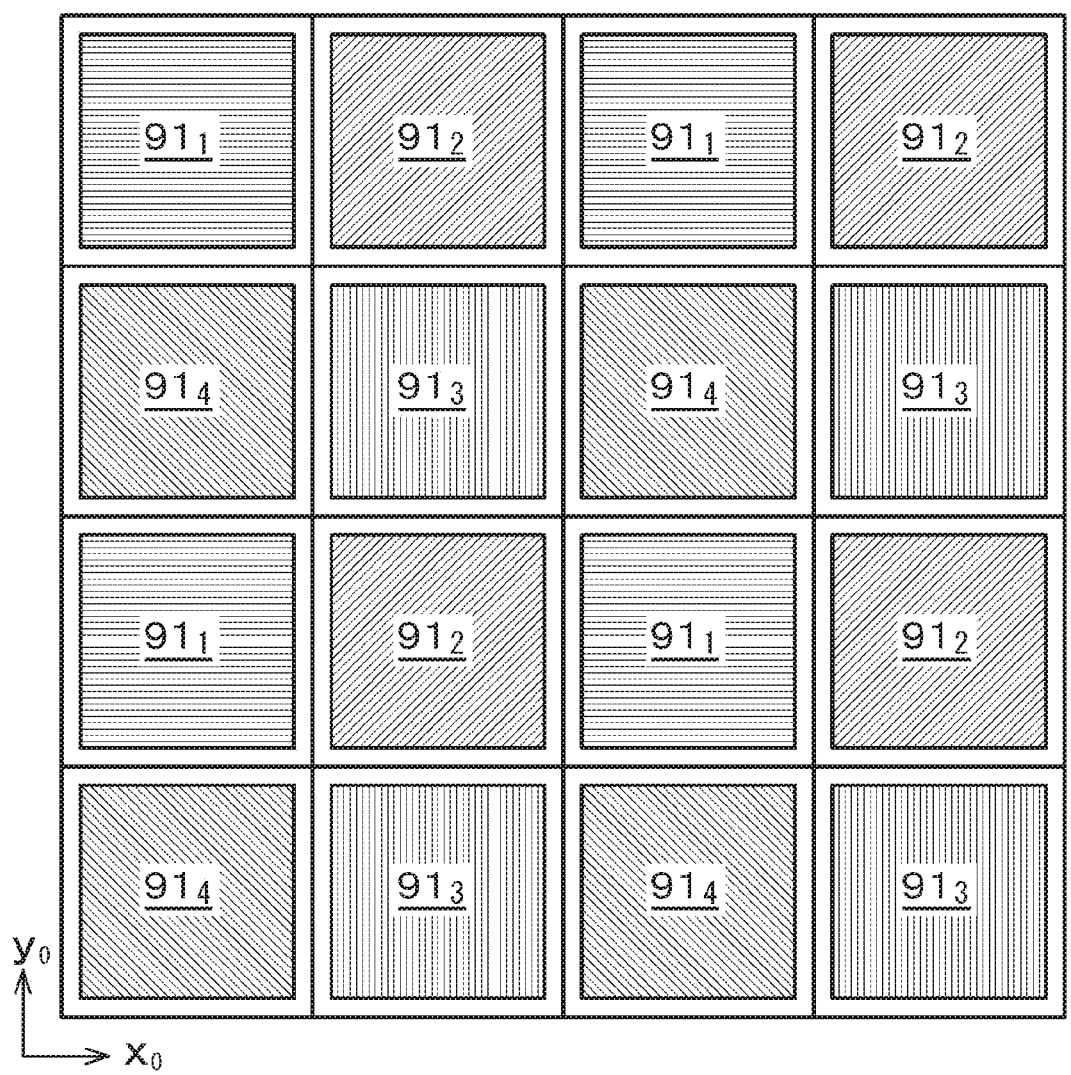
FIG. 20 is a schematic layout diagram of polarizers forming a stacked imaging device for red light, a stacked imaging device for green light, a stacked imaging device for blue light, and a stacked imaging device for white light in a second modification of Example 2, and is a diagram for explaining the relationship with the polarizers in adjacent stacked imaging devices.

Furthermore, in the adjacent imaging device units, the polarization orientations of the polarizers are different (see a schematic layout diagram of the polarizers in FIG. 20).

Second Modification of a Solid-State Imaging Apparatus of Example 2

Figure 21A:
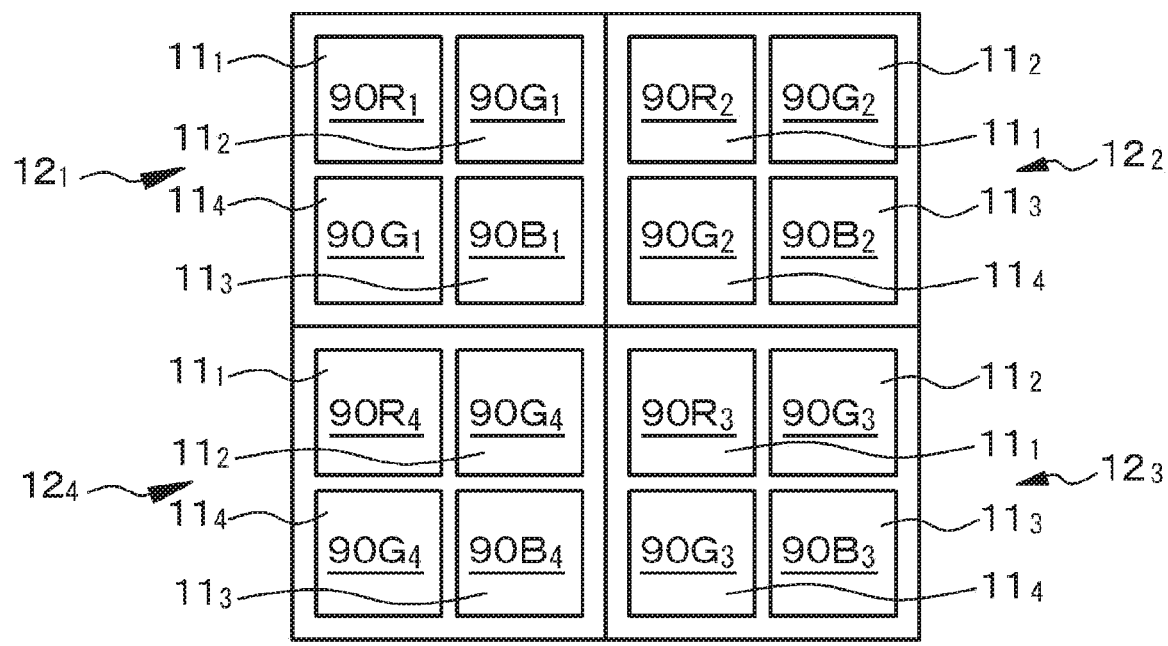
FIGS. 21A and 21B are a schematic layout diagram of color filter layers and the like that form stacked imaging devices for red light, stacked imaging devices for green light, and stacked imaging devices for blue light in a third modification of Example 2, and a schematic layout diagram of polarizers, respectively.
Figure 21B:
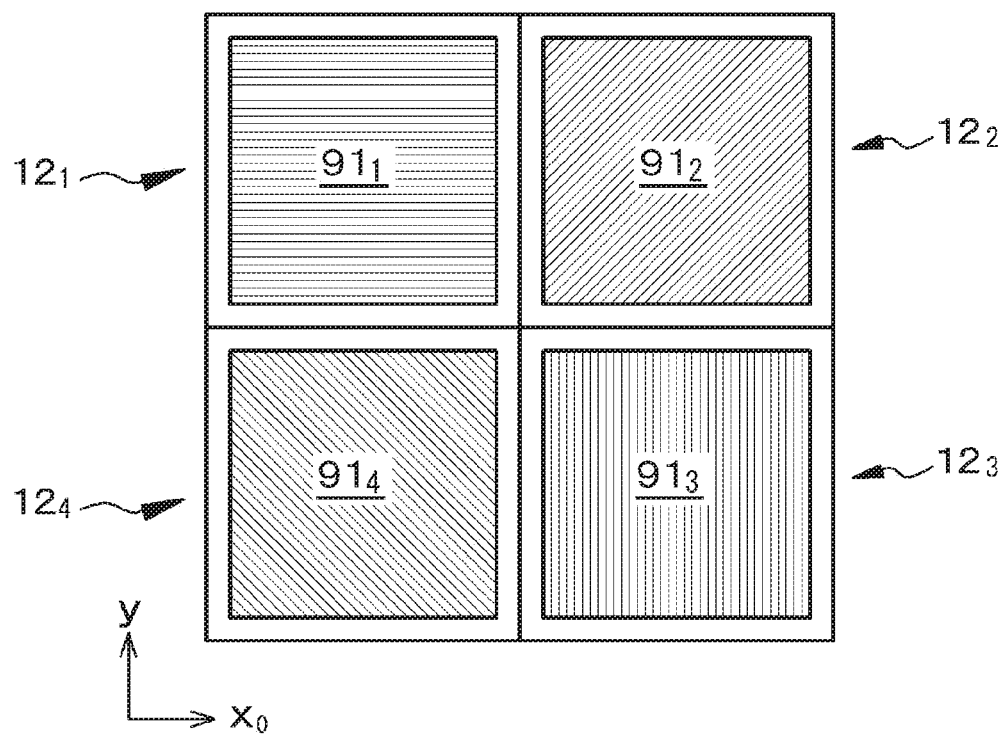
Figure 22A:
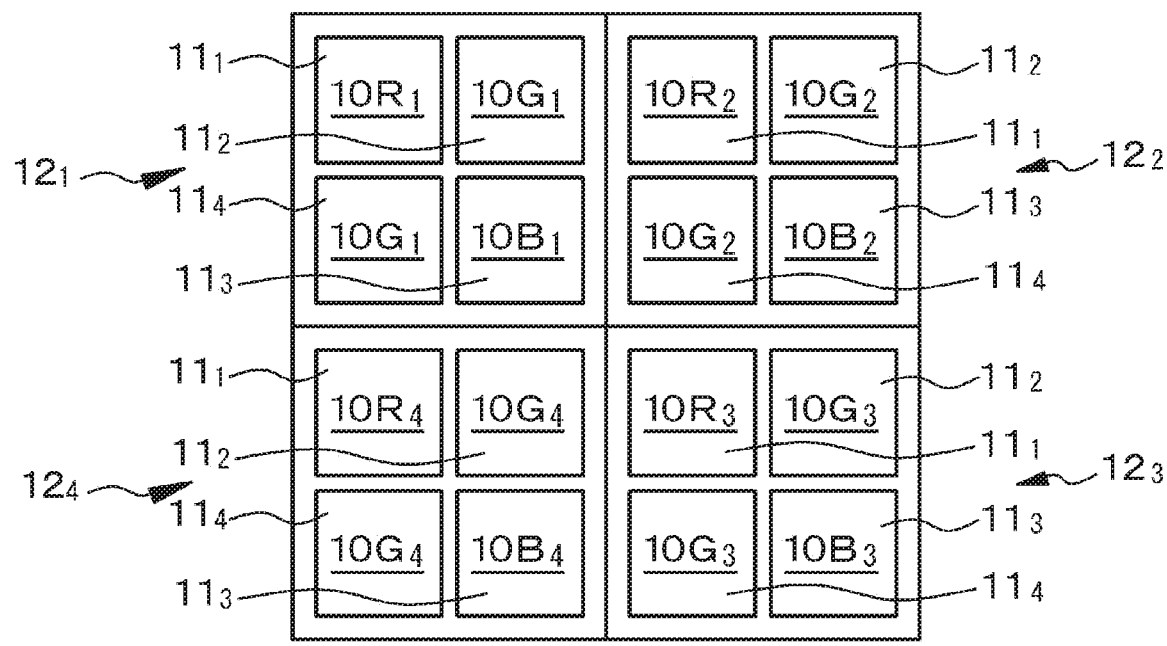
FIGS. 22A and 22B are a schematic layout diagram of upper photoelectric conversion units that form stacked imaging devices for red light, stacked imaging devices for green light, and stacked imaging devices for blue light in the third modification of Example 2, and a schematic layout diagram of lower photoelectric conversion units, respectively.
Figure 22B:
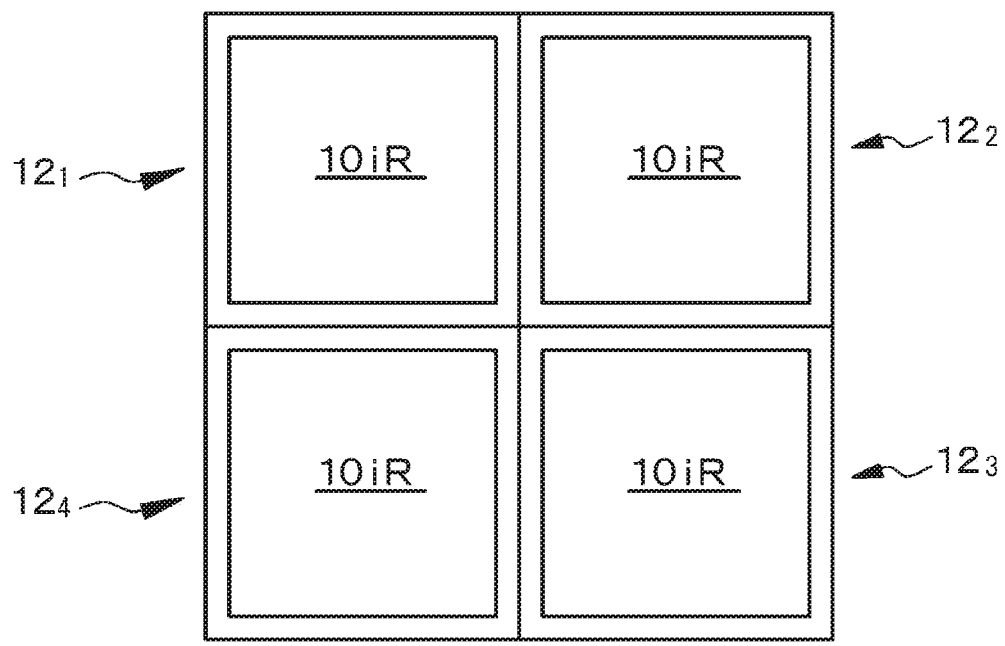

Further, a stacked imaging device that forms a solid-state imaging apparatus having a Bayer array may be a second modification of a stacked imaging device of Example 2. FIG. 21A shows a schematic layout diagram of color filter layers and the like that form a stacked imaging device for red light, stacked imaging devices for green light, and a stacked imaging device for blue light in the second modification of Example 2. FIG. 21B shows a schematic layout diagram of polarizers in the second modification of Example 2. Further, FIG. 22A shows a schematic layout diagram of upper photoelectric conversion units that form a stacked imaging device for red light, stacked imaging devices for green light, and a stacked imaging device for blue light in the second modification of Example 2. FIG. 22B shows a schematic layout diagram of lower photoelectric conversion units in the second modification of Example 2.

In the second modification of a stacked imaging device of Example 2, a plurality of photoelectric conversion units includes photoelectric conversion units having sensitivity to red light, green light, or blue light, and a photoelectric conversion unit having sensitivity to near-infrared light.

Specifically, the first stacked imaging device $11_1$ forming the first imaging device unit $12_1$ includes a red color filter layer $90R_1$, two green color filter layers $90G_1$, a blue color filter layer $90B_1$ [see FIG. 21A], one polarizer $91_1$ [see FIG. 21B] disposed below the color filter layers $90R_1$, $90G_1$, and $90B_1$, four upper photoelectric conversion units (a red-light imaging device $11R_1$, a green-light imaging device $11G_1$, a blue-light imaging device $11B_1$, and a green-light imaging device $11G_1$) [see FIG. 22A] disposed below the one polarizer $91_1$, and one lower photoelectric conversion unit (a near-infrared light photoelectric conversion unit $11iR$) [see FIG. 22B] disposed below the upper photoelectric conversion units.

Likewise, the first stacked imaging device $11_2$ forming the second imaging device unit $12_2$ includes a red color filter layer $90R_2$, two green color filter layers $90G_2$, a blue color filter layer $90B_2$ [see FIG. 21A], one polarizer $91_2$ [see FIG. 21B] disposed below the color filter layers $90R_2$, $90G_2$, and $90B_2$, four upper photoelectric conversion units (a red-light imaging device $11R_2$, a green-light imaging device $11G_2$, a blue-light imaging device $11B_2$, and a green-light imaging device $11G_2$) [see FIG. 22A] disposed below the one polarizer $91_2$, and one lower photoelectric conversion unit (a near-infrared light photoelectric conversion unit $11iR$) [see FIG. 22B] disposed below the upper photoelectric conversion units.

Further, the first stacked imaging device $11_3$ forming the third imaging device unit $12_3$ includes a red color filter layer $90R_3$, two green color filter layers $90G_3$, a blue color filter layer $90B_3$ [see FIG. 21A], one polarizer $91_3$ [see FIG. 21B] disposed below the color filter layers $90R_3$, $90G_3$, and $90B_3$, four upper photoelectric conversion units (a red-light imaging device $11R_3$, a green-light imaging device $11G_3$, a blue-light imaging device $11B_3$, and a green-light imaging device $11G_3$) [see FIG. 22A] disposed below the one polarizer $91_3$, and one lower photoelectric conversion unit (a near-infrared light photoelectric conversion unit $11iR$) [see FIG. 22B] disposed below the upper photoelectric conversion units.

Also, the first stacked imaging device $11_4$ forming the fourth imaging device unit $12_4$ includes a red color filter layer $90R_4$, two green color filter layers $90G_4$, a blue color filter layer $90B_4$ [see FIG. 21A], one polarizer $91_4$ [see FIG. 21B] disposed below the color filter layers $90R_4$, $90G_4$, and $90B_4$, four upper photoelectric conversion units (a red-light imaging device $11R_4$, a green-light imaging device $11G_4$, a blue-light imaging device $11B_4$, and a green-light imaging device $11G_4$) [see FIG. 22A] disposed below the one polarizer $91_4$, and one lower photoelectric conversion unit (a near-infrared light photoelectric conversion unit $11iR$) [see FIG. 22B] disposed below the upper photoelectric conversion units.

Alternatively, or in other words, as shown in FIGS. 18A, 18B, 19A, 19B, 21A, 21B, 22A, and 22B, in the first and second modifications of Example 2, the first stacked imaging device $11_1$ includes a photoelectric conversion unit having sensitivity to red light, and a photoelectric conversion unit having sensitivity to near-infrared light, the second stacked imaging device $11_2$ includes a photoelectric conversion unit having sensitivity to green light, and a photoelectric conversion unit having sensitivity to near-infrared light, the third stacked imaging device $11_3$ includes a photoelectric conversion unit having sensitivity to blue light, and a photoelectric conversion unit having sensitivity to near-infrared light, an imaging device unit group is formed with the four imaging device units of the first imaging device unit $12_1$, the second imaging device unit $12_2$, the third imaging device unit $12_3$, and the fourth imaging device unit $12_4$, which are arranged in a 2×2 array (two imaging device units arranged in the $x_0$ direction, and two imaging device units arranged in the $y_0$ direction), the polarization orientation in which light is to be transmitted by the first polarizer $91_1$ included in the first imaging device unit $12_1$ is a degrees, the polarization orientation in which light is to be transmitted by the second polarizer $91_2$ included in the second imaging device unit $12_2$ is $(\alpha+45)$ degrees, the polarization orientation in which light is to be transmitted by the third polarizer $91_3$ included in the third imaging device unit $12_3$ is $(\alpha+90)$ degrees, and the polarization orientation in which light is to be transmitted by the fourth polarizer $91_4$ included in the fourth imaging device unit $12_4$ is $(\alpha+135)$ degrees.

EXAMPLE 3

Example 3 is modifications of Examples 1 and 2, and relates to a stacked imaging device including a charge storage electrode, and also relates to an imaging device in the present disclosure. In other words, Example 3 relates to an imaging device or the like of the present disclosure.

Figure 23:
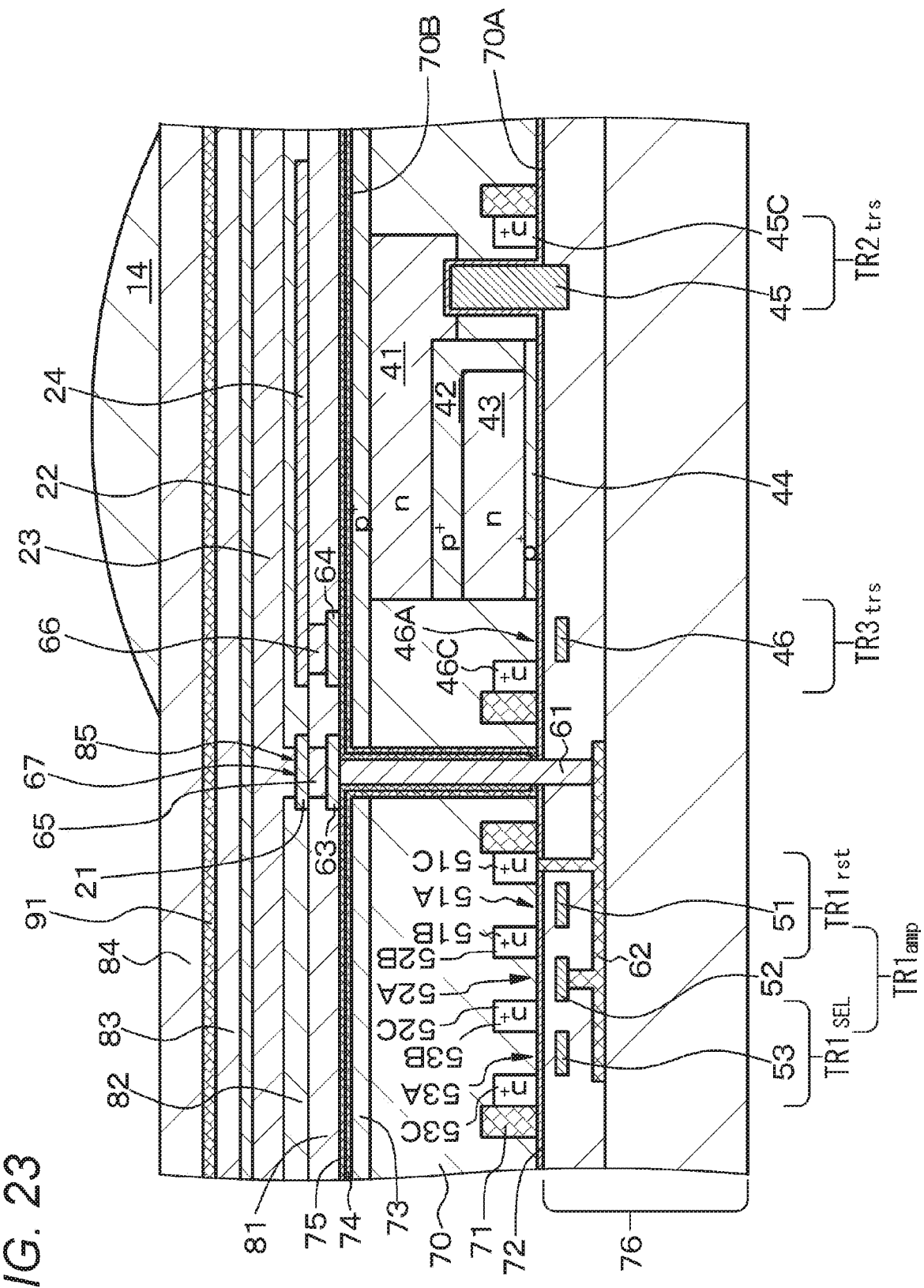
Figure 24:
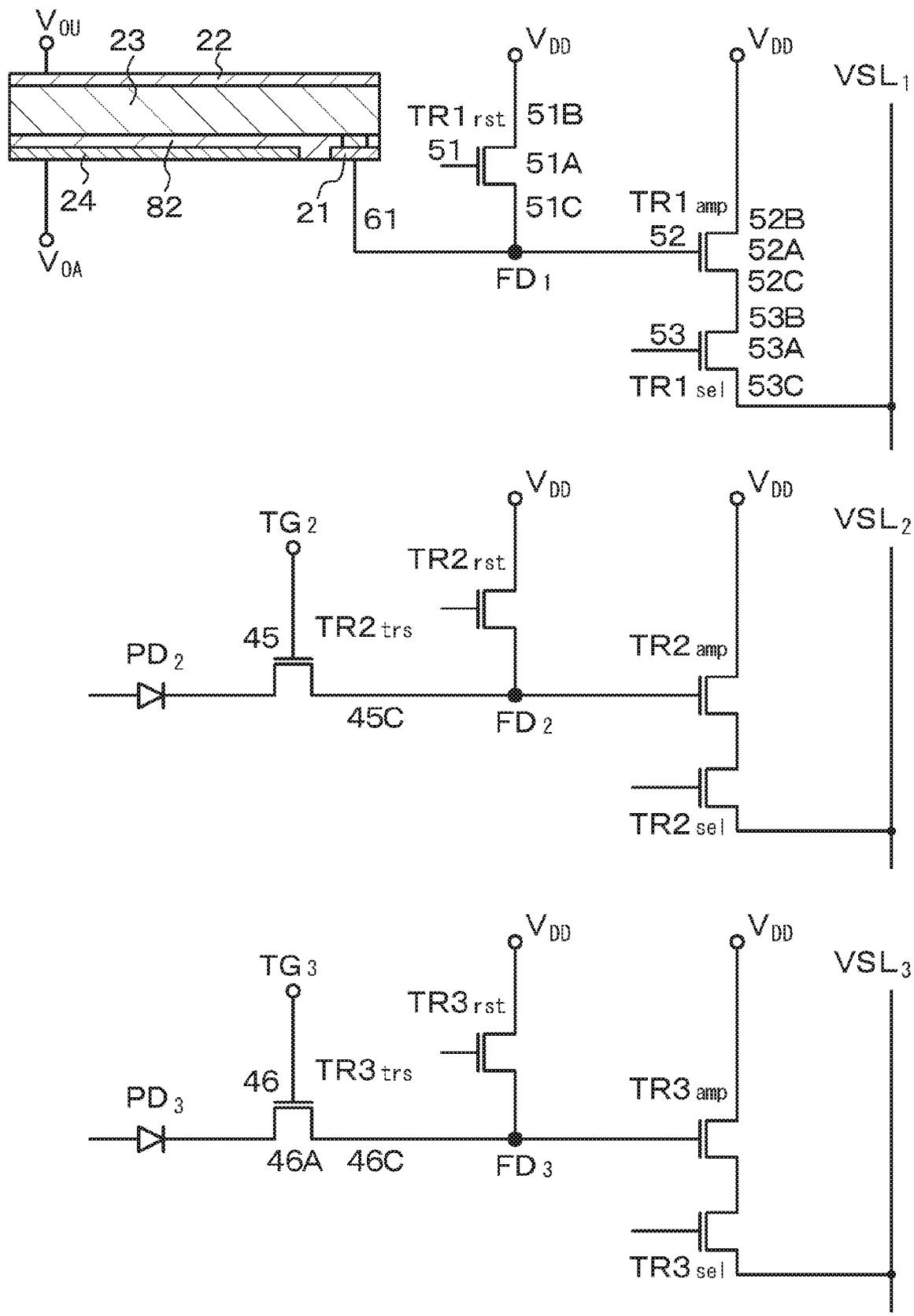
Figure 25:
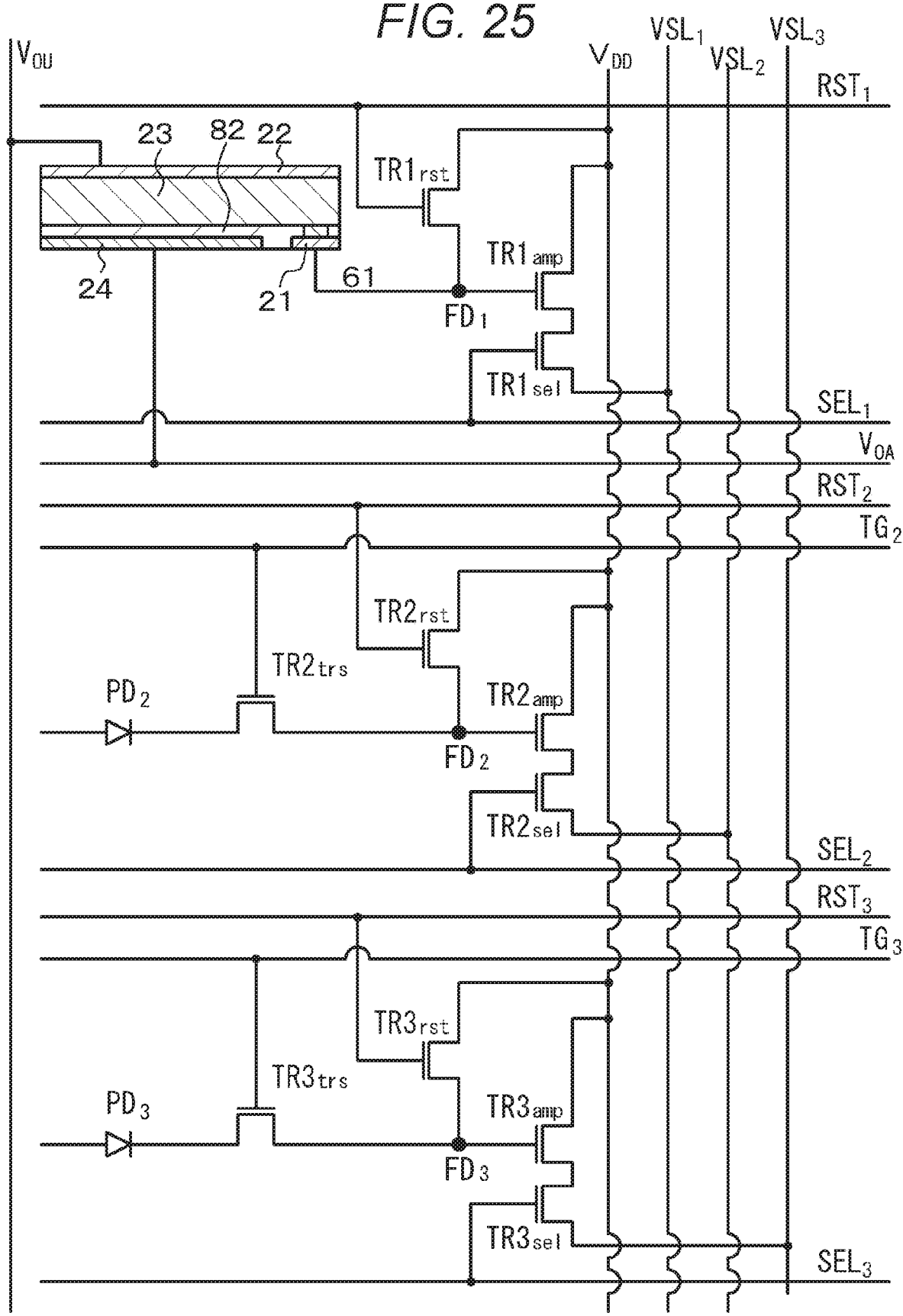
Figure 26:
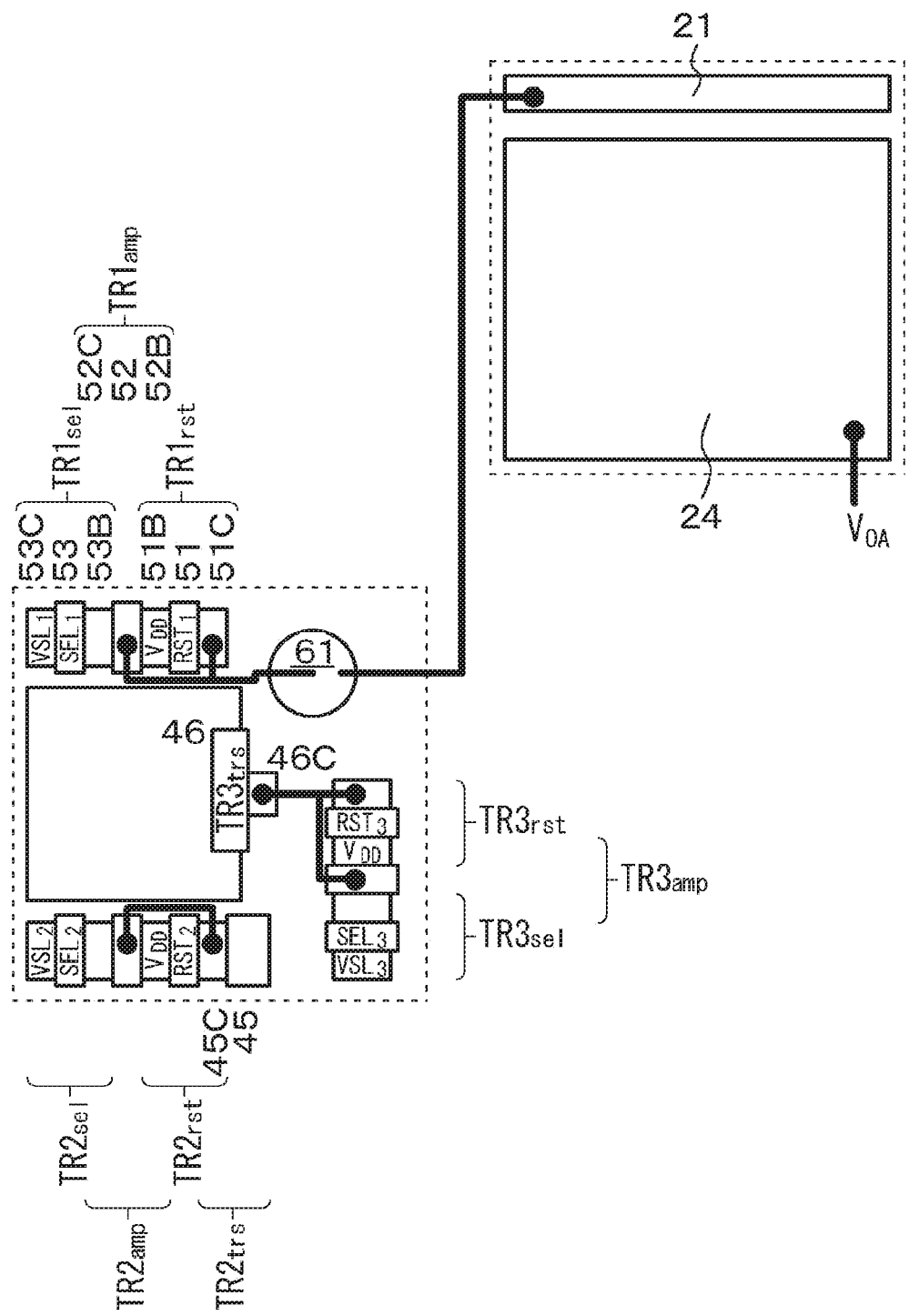
Figure 28A:
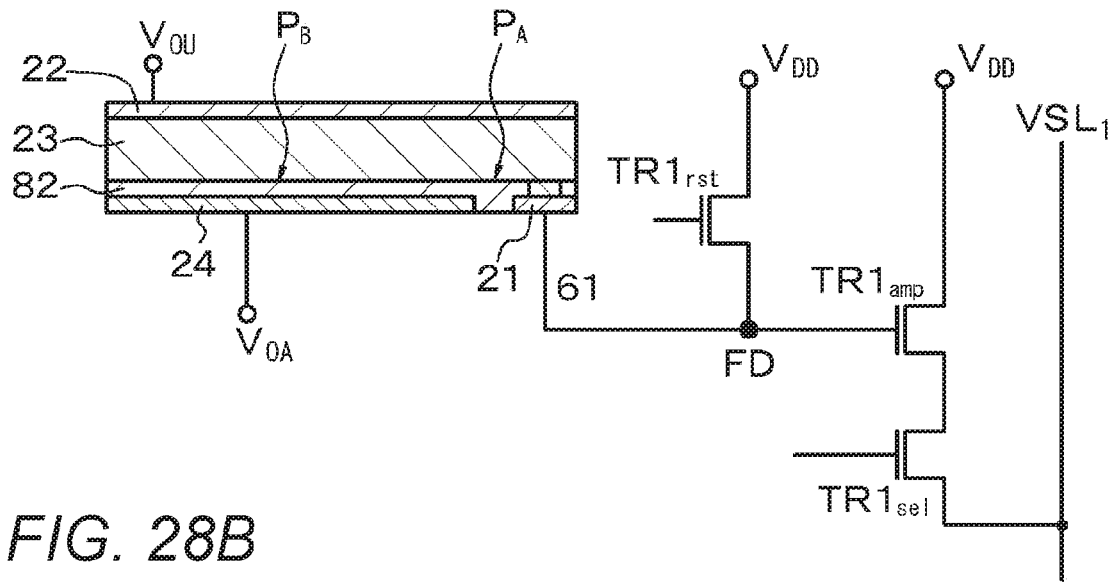
FIGS. 28A, 28B, and 28C are equivalent circuit diagrams of stacked imaging devices of Example 3, Example 6, and Example 8, imaging devices of the present disclosure, or the like, for explaining respective portions shown in FIG. 27 (Example 3), FIGS. 42 and 43 (Example 6), and FIGS. 54 and 55 (Example 8).
Figure 29:
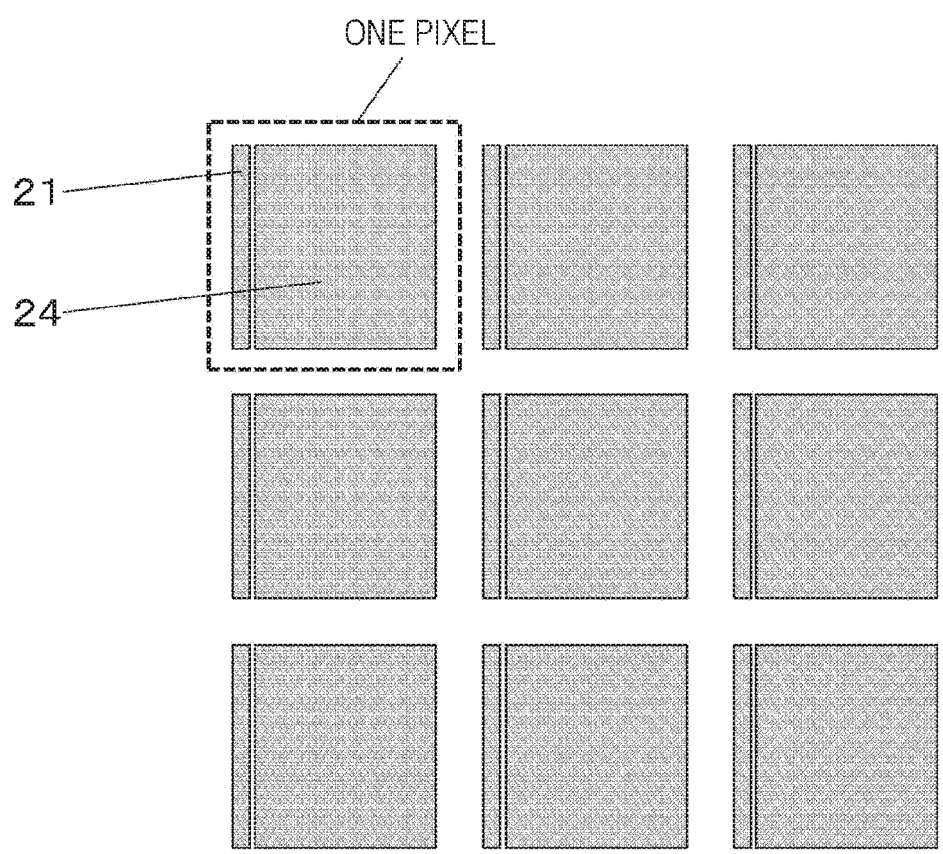
Figure 30:
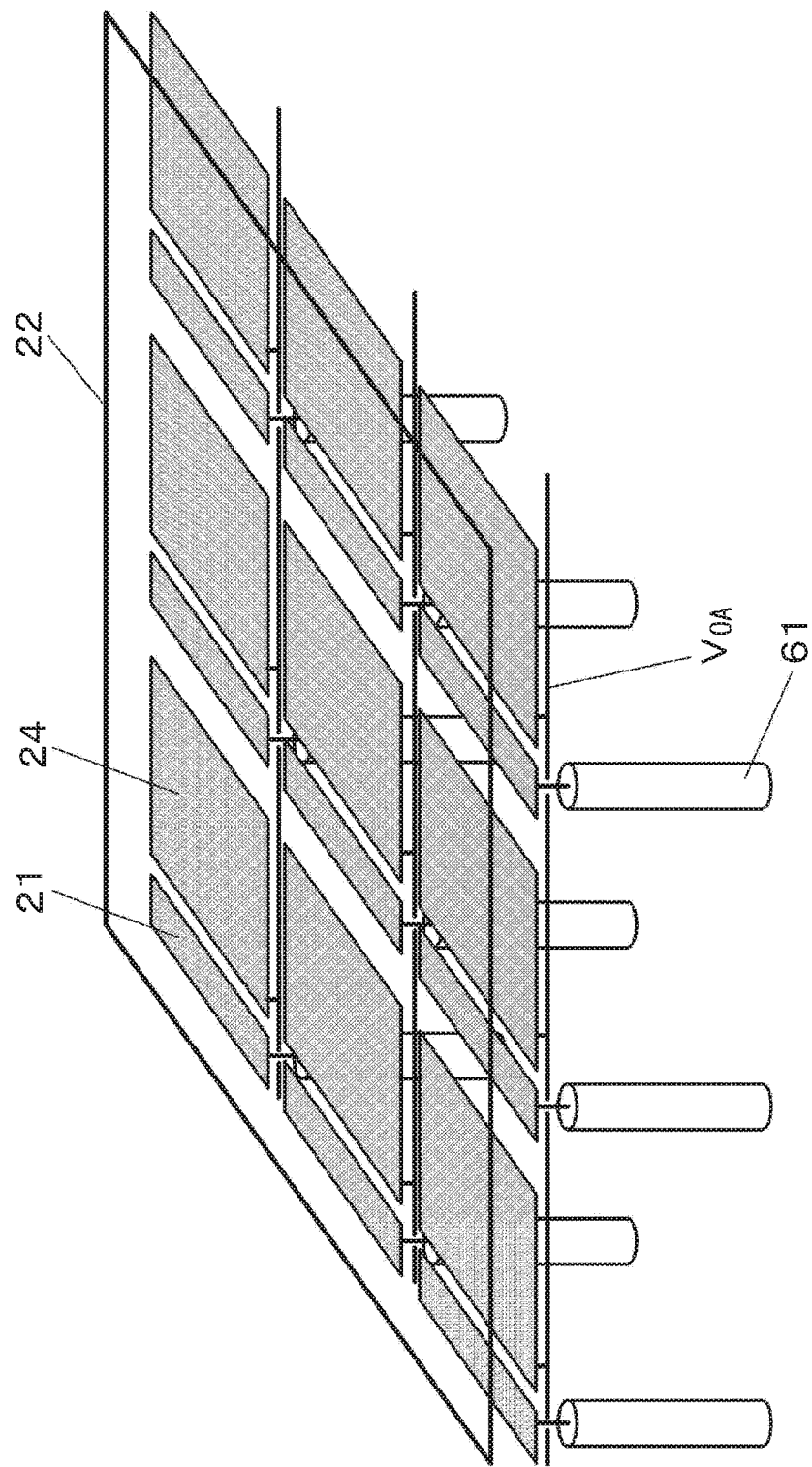

FIG. 23 shows a schematic partial cross-sectional view of a stacked imaging device of Example 3 (including a stacked imaging device equipped with a charge storage electrode and an imaging device in the present disclosure). FIGS. 24 and 25 show equivalent circuit diagrams of the stacked imaging device of Example 3. FIG. 26 shows a schematic layout diagram of a first electrode and a charge storage electrode that constitute a photoelectric conversion unit including the charge storage electrode of the stacked imaging device of Example 3, and transistors that constitute a control unit. FIG. 27 schematically shows the states of the potential at respective portions at a time of operation of the stacked imaging device of Example 3. FIG. 28A shows an equivalent circuit diagram for explaining the respective portions of the stacked imaging device of Example 3. Further, FIG. 29 shows a schematic layout diagram of the first electrode and the charge storage electrode that constitute the photoelectric conversion unit including the charge storage electrode of the stacked imaging device of Example 3. FIG. 30 shows a schematic perspective view of the first electrode, the charge storage electrode, a second electrode, and a contact hole portion.

In a stacked imaging device (a green-light imaging device described later, for example) of Example 3, at least one photoelectric conversion unit (specifically, a photoelectric conversion unit including one charge storage electrode, and an upper photoelectric conversion unit) of a plurality of photoelectric conversion units that is stacked includes a first electrode 21, a photoelectric conversion layer 23, and a second electrode 22 that are stacked, and also includes a charge storage electrode 24 that is disposed at a distance from the first electrode 21 and is positioned to face the photoelectric conversion layer 23 via an insulating layer 82. Note that a polarizer 91 is shown in a simplified manner.

Then, a semiconductor substrate (more specifically, a silicon semiconductor layer) 70 is further provided, and a photoelectric conversion unit (the photoelectric conversion unit including the charge storage electrode) is disposed above the semiconductor substrate 70. A control unit is further provided in the semiconductor substrate 70, and the control unit includes a drive circuit to which the first electrode 21 and the second electrode 22 are connected. Here, the light incidence face of the semiconductor substrate 70 is the upper side, and the opposite side of the semiconductor substrate 70 is the lower side. A wiring layer 62 formed with a plurality of wiring lines is provided below the semiconductor substrate 70.

The semiconductor substrate 70 is provided with at least a floating diffusion layer $FD_1$ and an amplification transistor $TR1_{amp}$, that form the control unit, and the first electrode 21 is connected to the floating diffusion layer $FD_1$ and the gate portion of the amplification transistor $TR1_{amp}$. The semiconductor substrate 70 is further provided with a reset transistor $TR1_{rst}$ and a selection transistor $TR1_{sel}$ that form the control unit. The floating diffusion layer $FD_1$ is connected to one of the source/drain regions of the reset transistor $TR1_{rst}$, one of the source/drain regions of the amplification transistor $TR1_{amp}$ is connected to one of the source/drain regions of the selection transistor $TR1_{sel}$, and the other one of the source/drain regions of the selection transistor $TR1_{sel}$ is connected to a signal line $VSL_1$. The amplification transistor $TR1_{amp}$, the reset transistor $TR1_{rst}$, and the selection transistor $TR1_{sel}$ constitute a drive circuit.

Specifically, a stacked imaging device of Example 3 is a back-illuminated imaging device, and has a structure in which three imaging devices are stacked. The three imaging devices are: a green-light imaging device of Example 3 of a first type that includes a green-light photoelectric conversion layer of the first type that absorbs green light, and has sensitivity to green light (this imaging device will be hereinafter referred to as the "first imaging device"); a conventional blue-light imaging device of a second type that includes a blue-light photoelectric conversion layer of the second type that absorbs blue light, and has sensitivity to blue light (this imaging device will be hereinafter referred to as the "second imaging device"); and a conventional red-light imaging device of the second type that includes a red-light photoelectric conversion layer of the second type that absorbs red light, and has sensitivity to red light (this imaging device will be hereinafter referred to as the "third imaging device"). Here, the red-light imaging device (the third imaging device) and the blue-light imaging device (the second imaging device) are disposed in the semiconductor substrate 70, and the second imaging device is located on the light incident side of the third imaging device is. Further, the green-light imaging device (the first imaging device) is disposed above the blue-light imaging device (the second imaging device). One pixel is formed with the stack structure of the first imaging device, the second imaging device, and the third imaging device. Any color filter layer is not provided.

In the first imaging device, the first electrode 21 and the charge storage electrode 24 are formed at a distance from each other on an interlayer insulating layer 81. The interlayer insulating layer 81 and the charge storage electrode 24 are covered with the insulating layer 82. The photoelectric conversion layer 23 is formed on the insulating layer 82, and the second electrode 22 is formed on the photoelectric conversion layer 23. The lower insulating layer 83 is formed on the entire surface including the second electrode 22, and the polarizer 91, the upper insulating layer 84, and an on-chip microlens 14 are disposed on the lower insulating layer 83. Any color filter layer is not provided. The first electrode 21, the charge storage electrode 24, and the second electrode 22 are formed with transparent electrodes including ITO (work function: about 4.4 eV), for example. The photoelectric conversion layer 23 is formed with a layer containing a known organic photoelectric conversion material (an organic material such as a rhodamine dye, a merocyanine dye, or quinacridone, for example) having sensitivity to at least green light. The photoelectric conversion layer 23 may further include a material layer suitable for charge accumulation. In other words, a material layer suitable for charge accumulation be further formed between the photoelectric conversion layer 23 and the first electrode 21 (or in a connecting portion 67, for example). The interlayer insulating layer 81, the insulating layer 82, the lower insulating layer 83, and the upper insulating layer 84 include a known insulating material ($SiO_2$ or SiN, for example). The photoelectric conversion layer 23 and the first electrode 21 are connected by the connecting portion 67 formed in the insulating layer 82. The photoelectric conversion layer 23 extends in the connecting portion 67. In other words, the photoelectric conversion layer 23 extends in an opening 85 formed in the insulating layer 82, and is connected to the first electrode 21.

The charge storage electrode 24 is connected to a drive circuit. Specifically, the charge storage electrode 24 is connected to a vertical drive circuit 112 forming a drive circuit, via a connecting hole 66, a pad portion 64, and a wiring line $V_{OA}$ provided in the interlayer insulating layer 81.

The size of the charge storage electrode 24 is larger than that of the first electrode 21. Where the area of the charge storage electrode 24 is represented by $S_1'$, and the area of the first electrode 21 is represented by $S_1$, it is preferable to satisfy $4 \leq S_1'/S_1$, which is not restrictive though.

In Example 3, $S_1'/S_1 = 8$, for example, which is not restrictive though. Note that, in Examples 9 through 12 described later, three photoelectric conversion unit segments $10'_1$, $10'_2$, and $10'_3$ have the same size, and also have the same planar shape.

A device separation region 71 is formed on the side of a first surface (front surface) 70A of the semiconductor substrate 70, and an oxide film 72 is formed on the first surface 70A of the semiconductor substrate 70. Further, on the first surface side of the semiconductor substrate 70, the reset transistor $TR1_{rst}$, the amplification transistor $TR1_{amp}$, and the selection transistor $TR1_{sel}$ constituting the control unit of the first imaging device are provided, and the first floating diffusion layer $FD_1$ is also provided.

The reset transistor $TR1_{rst}$ includes a gate portion 51, a channel formation region 51A, and source/drain regions 51B and 51C. The gate portion 51 of the reset transistor $TR1_{rst}$ is connected to a reset line $RST_1$, one source/drain region 51C of the reset transistor $TR1_{rst}$ also serves as the first floating diffusion layer $FD_1$, and the other source/drain region 51B is connected to a power supply $V_{DD}$.

The first electrode 21 is connected to one source/drain region 51C (the first floating diffusion layer $FD_1$) of the reset transistor $TR1_{rst}$, via a connecting hole 65 and a pad portion 63 provided in the interlayer insulating layer 81, a contact hole portion 61 formed in the semiconductor substrate 70 and the interlayer insulating layer 76, and the wiring layer 62 formed in the interlayer insulating layer 76.

The amplification transistor $TR1_{amp}$ includes a gate portion 52, a channel formation region 52A, and source/drain regions 52B and 52C. The gate portion 52 is connected to the first electrode 21 and one source/drain region 51C (the first floating diffusion layer $FD_1$) of the reset transistor $TR1_{rst}$, via the wiring layer 62. Further, one source/drain region 52B is connected to the power supply $V_{DD}$.

The selection transistor $TR1_{sel}$ includes a gate portion 53, a channel formation region 53A, and source/drain regions 53B and 53C. The gate portion 53 is connected to a selection line SEL1. Further, one source/drain region 53B shares a region with the other source/drain region 52C forming the amplification transistor $TR1_{amp}$, and the other source/drain region 53C is connected to a signal line (a data output line) $VSL_1$ (117).

The second imaging device includes a photoelectric conversion layer that is an n-type semiconductor region 41 provided in the semiconductor substrate 70. The gate portion 45 of a transfer transistor $TR2_{trs}$ formed with a vertical transistor extends to the n-type semiconductor region 41, and is connected to a transfer gate line $TG_2$. Further, a second floating diffusion layer $FD_2$ is disposed in a region 45C near the gate portion 45 of the transfer transistor $TR2_{trs}$ in the semiconductor substrate 70. The electric charges stored in the n-type semiconductor region 41 are read into the second floating diffusion layer $FD_2$ via a transfer channel formed along the gate portion 45.

In the second imaging device, a reset transistor $TR2_{rst}$, an amplification transistor $TR2_{amp}$, and a selection transistor $TR2_{sel}$ that constitute the control unit of the second imaging device are further disposed on the first surface side of the semiconductor substrate 70.

The reset transistor $TR2_{rst}$ includes a gate portion, a channel formation region, and source/drain regions. The gate portion of the reset transistor $TR2_{rst}$ is connected to a reset line $RST_2$, one of the source/drain regions of the reset transistor $TR2_{rst}$ is connected to the power supply $V_{DD}$, and the other one of the source/drain regions also serves as the second floating diffusion layer $FD_2$.

The amplification transistor $TR2_{amp}$ includes a gate portion, a channel formation region, and source/drain regions. The gate portion is connected to the other one of the source/drain regions (the second floating diffusion layer $FD_2$) of the reset transistor $TR2_{rst}$. Further, one of the source/drain regions is connected to the power supply $V_{DD}$.

The selection transistor $TR2_{sel}$ includes a gate portion, a channel formation region, and source/drain regions. The gate portion is connected to a selection line $SEL_2$. Further, one of the source/drain regions shares a region with the other one of the source/drain regions forming the amplification transistor $TR2_{amp}$, and the other one of the source/drain regions is connected to a signal line (a data output line) $VSL_2$.

The third imaging device includes a photoelectric conversion layer that is an n-type semiconductor region 43 provided in the semiconductor substrate 70. The gate portion 46 of a transfer transistor $TR3_{trs}$ is connected to a transfer gate line $TG_3$. Further, a third floating diffusion layer $FD_3$ is disposed in a region 46C near the gate portion 46 of the transfer transistor $TR3_{trs}$ in the semiconductor substrate 70. The electric charges stored in the n-type semiconductor region 43 are read into the third floating diffusion layer $FD_3$ via a transfer channel 46A formed along the gate portion 46.

In the third imaging device, a reset transistor $TR3_{rst}$, an amplification transistor $TR3_{amp}$, and a selection transistor $TR3_{sel}$ that constitute the control unit of the third imaging device are further disposed on the first surface side of the semiconductor substrate 70.

The reset transistor $TR3_{rst}$ includes a gate portion, a channel formation region, and source/drain regions. The gate portion of the reset transistor $TR3_{rst}$ is connected to a reset line $RST_3$, one of the source/drain regions of the reset transistor $TR3_{rst}$ is connected to the power supply $V_{DD}$, and the other one of the source/drain regions also serves as the third floating diffusion layer $FD_3$.

The amplification transistor $TR3_{amp}$ includes a gate portion, a channel formation region, and source/drain regions. The gate portion is connected to the other one of the source/drain regions (the third floating diffusion layer $FD_3$) of the reset transistor $TR3_{rst}$. Further, one of the source/drain regions is connected to the power supply $V_{DD}$.

The selection transistor $TR3_{sel}$ includes a gate portion, a channel formation region, and source/drain regions. The gate portion is connected to a selection line $SEL_3$. Further, one of the source/drain regions shares a region with the other one of the source/drain regions forming the amplification transistor $TR3_{amp}$, and the other one of the source/drain regions is connected to a signal line (a data output line) $VSL_3$.

The reset lines $RST_1$, $RST_2$, and $RST_3$, the selection lines $SEL_1$, $SEL_2$, and $SEL_3$, and the transfer gate lines $TG_2$ and $TG_3$ are connected to the vertical drive circuit 112 that forms a drive circuit, and the signal lines (data output lines) $VSL_1$, $VSL_2$, and $VSL_3$ are connected to a column signal processing circuit 113 that forms a drive circuit.

A $p^+$-layer 44 is provided between the n-type semiconductor region 43 and the front surface 70A of the semiconductor substrate 70, to reduce generation of dark current. A $p^+$-layer 42 is formed between the n-type semiconductor region 41 and the n-type semiconductor region 43, and part of a side surface of the n-type semiconductor region 43 is surrounded by the $p^+$-layer 42. A $p^+$-layer 73 is formed on the side of the back surface 70B of the semiconductor substrate 70, and a $HfO_2$ film 74 and an insulating material film 75 are formed in the portion extending from the $p^+$-layer 73 to the formation region of the contact hole portion 61 in the semiconductor substrate 70. In the interlayer insulating layer 76, wiring lines are formed across a plurality of layers, but are not shown in the drawings.

The $HfO_2$ film 74 is a film having a negative fixed electric charge. As such a film is included, generation of dark current can be reduced. Note that, instead of a $HfO_2$ film, it is possible to use an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, an europium oxide ($Eu_2O_3$) film, a gadolinium oxide ($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, a ytterbium oxide ($Yb_2O_3$) film, a lutetium oxide ($Lu_2O_3$) film, a yttrium oxide ($Y_2O_3$) film, a hafnium nitride film, an aluminum nitride film, a hafnium oxynitride film, or an aluminum oxynitride film. These films may be formed by a CVD method, a PVD method, or an ALD method, for example.

In the description below, operation of a stacked imaging device (or an imaging device in the present disclosure, or the first imaging device) including the charge storage electrode of Example 3 is described with reference to FIGS. 27 and 28A. Here, the potential of the first electrode 21 is higher than the potential of the second electrode 22. Specifically, the first electrode 21 has a positive potential, the second electrode 22 has a negative potential, and electrons generated through photoelectric conversion in the photoelectric conversion layer 23 are read into the floating diffusion layer, for example. The same applies to the other Examples. Note that, in a mode where the first electrode 21 has a negative potential, the second electrode 22 has a positive potential, and holes generated through photoelectric conversion in the photoelectric conversion layer 23 are read into the floating diffusion layer, the levels of the potentials described below is only required to be switched.

Figure 42:
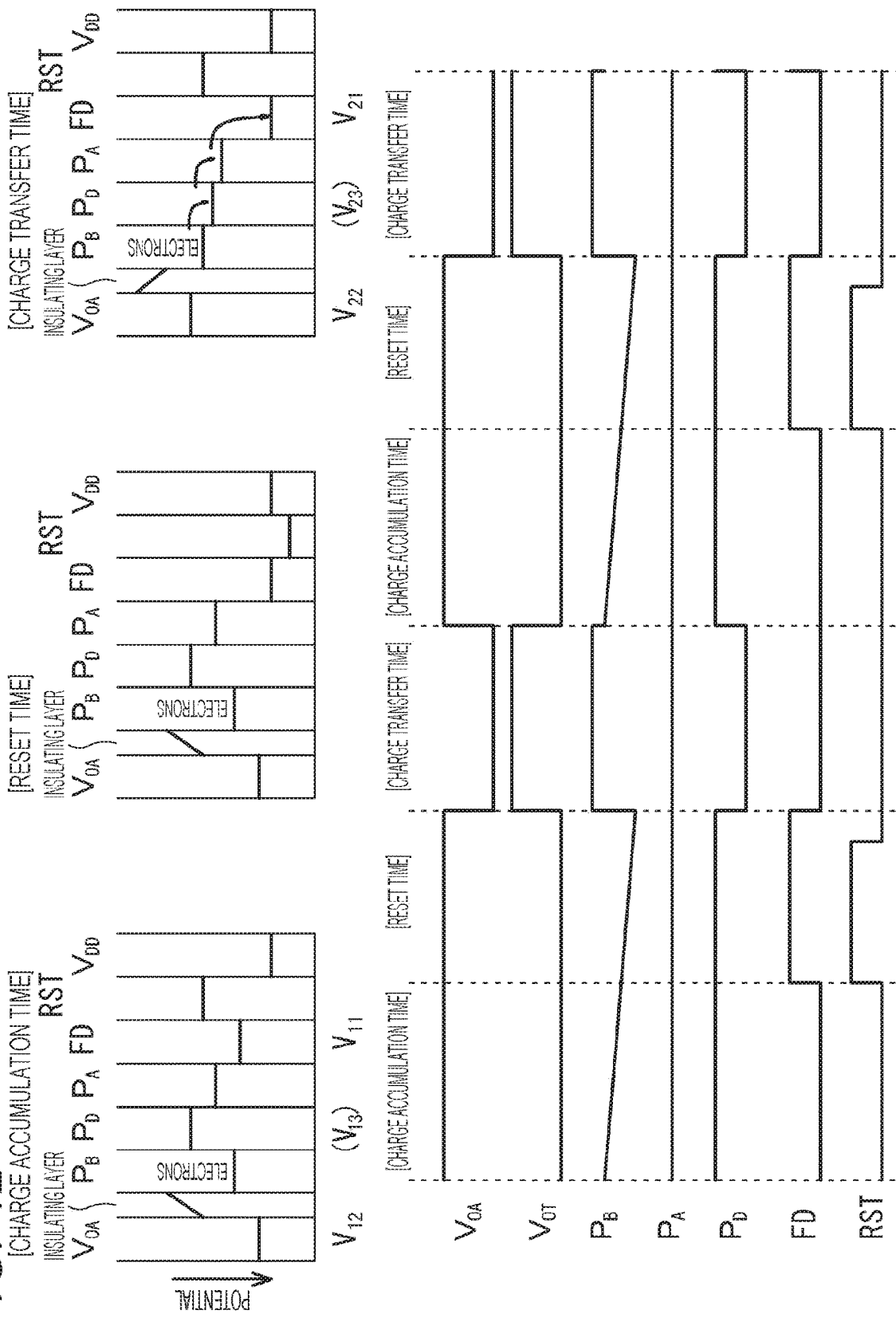
Figure 43:
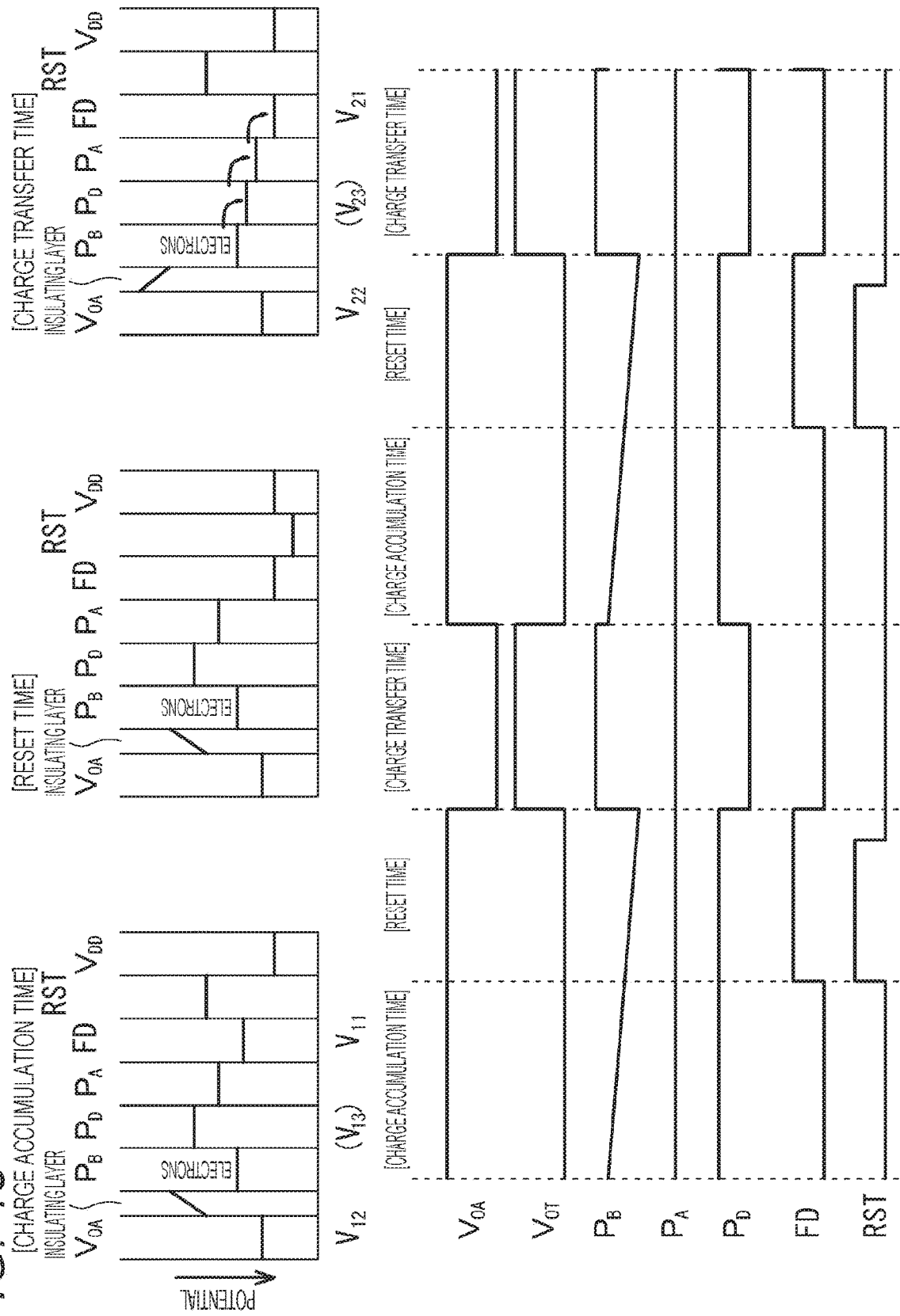

The symbols used in FIG. 27, FIGS. 42 and 43 for Example 6 described later, and FIGS. 54 and 55 for Example 8 described later are as follows.

$P_A$: the potential at a point $P_A$ in a region of the photoelectric conversion layer 23 facing a region located between the charge storage electrode 24 or a transfer control electrode (charge transfer electrode) 25 and the first electrode $P_B$: the potential at a point $P_B$ in a region of the photoelectric conversion layer 23 facing the charge storage electrode 24

$P_{C1}$: the potential at a point $P_{C1}$ in a region of the photoelectric conversion layer 23 facing a charge storage electrode segment 24A $P_{C2}$: the potential at a point $P_{C2}$ in a region of the photoelectric conversion layer 23 facing a charge storage electrode segment 24B $P_{C3}$: the potential at a point $P_{C3}$ in a region of the photoelectric conversion layer 23 facing a charge storage electrode segment 24C $P_D$: the potential at a point $P_D$ in a region of the photoelectric conversion layer 23 facing the transfer control electrode (charge transfer electrode) 25

$F_D$: the potential in the first floating diffusion layer $FD_1$ $V_{OA}$: the potential at the charge storage electrode 24

$V_{OA-A}$: the potential at the charge storage electrode segment 24A $V_{OA-B}$: the potential at the charge storage electrode segment 24B $V_{OA-C}$: the potential at the charge storage electrode segment 24C $V_{OT}$: the potential at the transfer control electrode (charge transfer electrode) 25

RST: the potential at the gate portion 51 of the reset transistor $TR1_{rst}$ $V_{DD}$: the potential of the power supply $VSL_1$: the signal line (data output line) $VSL_1$ $TR1_{rst}$: the reset transistor $TR1_{rst}$ $TR1_{amp}$: the amplification transistor $TR1_{amp}$ $TR1_{sel}$: the selection transistor $TR1_{sel}$ In a charge accumulation period, the drive circuit applies a potential $V_{11}$ to the first electrode 21, and a potential $V_{12}$ to the charge storage electrode 24. Light that has entered the photoelectric conversion layer 23 causes photoelectric conversion in the photoelectric conversion layer 23. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{12} \geq V_{11}$, or preferably, $V_{12} > V_{11}$. As a result, electrons generated by the photoelectric conversion are attracted to the charge storage electrode 24, and stay in the region of the photoelectric conversion layer 23 facing the charge storage electrode 24. In other words, electric charges are accumulated in the photoelectric conversion layer 23. Since $V_{12} > V_{11}$, electrons generated in the photoelectric conversion layer 23 will not move toward the first electrode 21. With the passage of time for photoelectric conversion, the potential in the region of the photoelectric conversion layer 23 facing the charge storage electrode 24 becomes a more negative value.

A reset operation is performed in the latter period in the charge accumulation period. As a result, the potential of the first floating diffusion layer $FD_1$ is reset, and the potential of the first floating diffusion layer $FD_1$ becomes the potential $V_{DD}$ of the power supply.

After completion of the reset operation, the electric charges are read out. In other words, in a charge transfer period, the drive circuit applies a potential $V_{21}$ to the first electrode 21, and a potential $V_{22}$ to the charge storage electrode 24. Here, $V_{22} < V_{21}$. As a result, the electrons remaining in the region of the photoelectric conversion layer 23 facing the charge storage electrode 24 are read into the first electrode 21 and further into the first floating diffusion layer $FD_1$. In other words, the electric charges accumulated in the photoelectric conversion layer 23 are read into the control unit.

In the above manner, a series of operations including charge accumulation, reset operation, and charge transfer is completed.

The operations of the amplification transistor $TR1_{amp}$, and the selection transistor $TR1_{sel}$ after the electrons are read into the first floating diffusion layer $FD_1$ are the same as the operations of conventional amplification and selection transistors. Further, a series of operations including charge accumulation, reset operation, and charge transfer to be performed in the second imaging device and the third imaging device is similar to a series of conventional operations including charge accumulation, reset operation, and charge transfer. Further, the reset noise in the first floating diffusion layer $FD_1$ can be eliminated by a correlated double sampling (CDS) process as in conventional operations.

As described above, in Example 3, the charge storage electrode is disposed at a distance from the first electrode, and is positioned to face the photoelectric conversion layer via the insulating layer. Accordingly, when light is emitted onto the photoelectric conversion unit (the photoelectric conversion unit including the charge storage electrode), and photoelectric conversion is performed in the photoelectric conversion unit, a kind of capacitor is formed by the photoelectric conversion layer, the insulating layer, and the charge storage electrode, and electric charges can be stored in the photoelectric conversion unit. Accordingly, at the start of exposure, the charge storage portion can be fully depleted, and the electric charges can be erased. As a result, it is possible to reduce or prevent a phenomenon in which the kTC noise becomes larger, the random noise is aggravated, and the imaging quality is lowered. Further, all the pixels can be reset simultaneously, a so-called global shutter function can be achieved.

Figure 31:
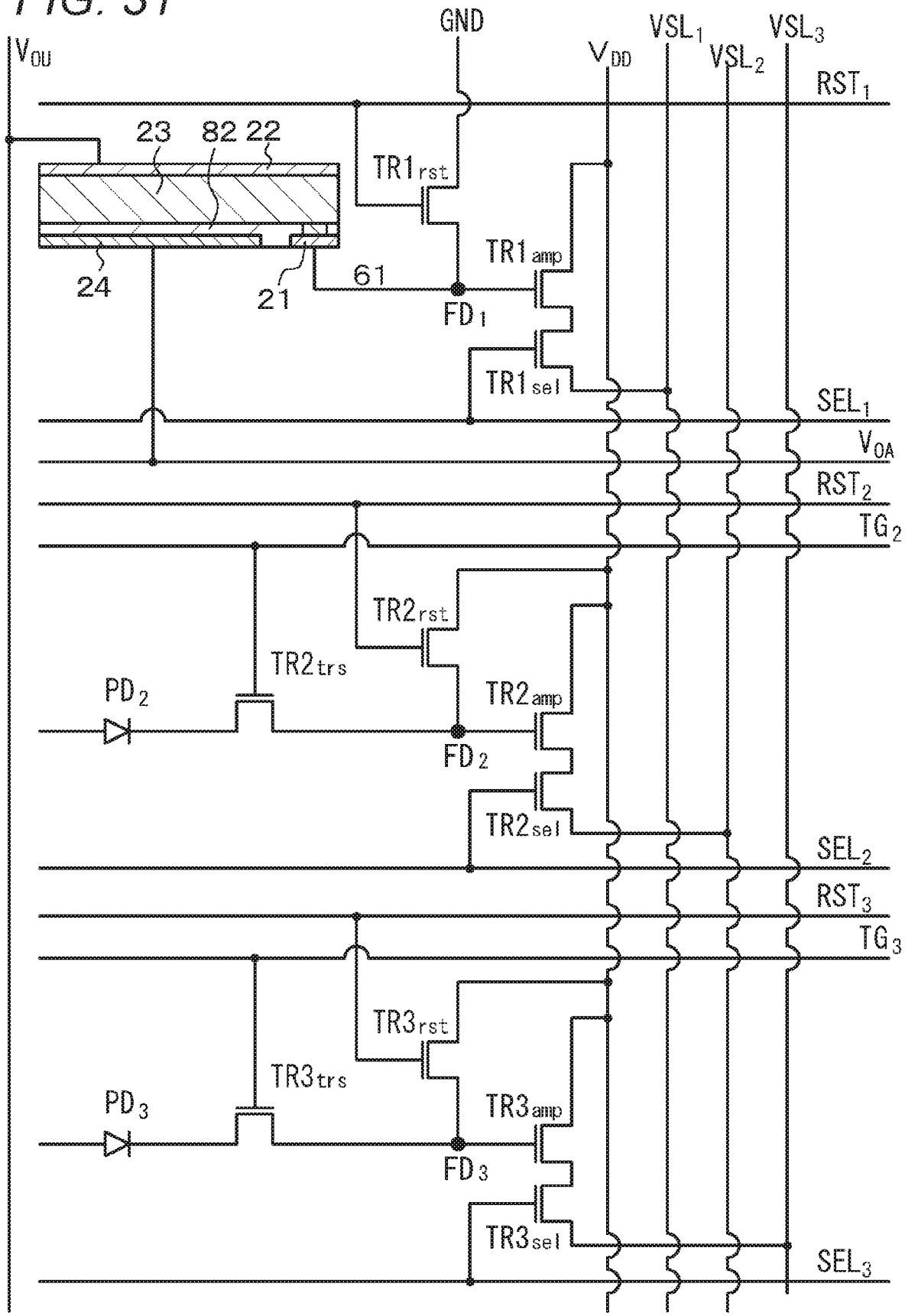
Figure 32:
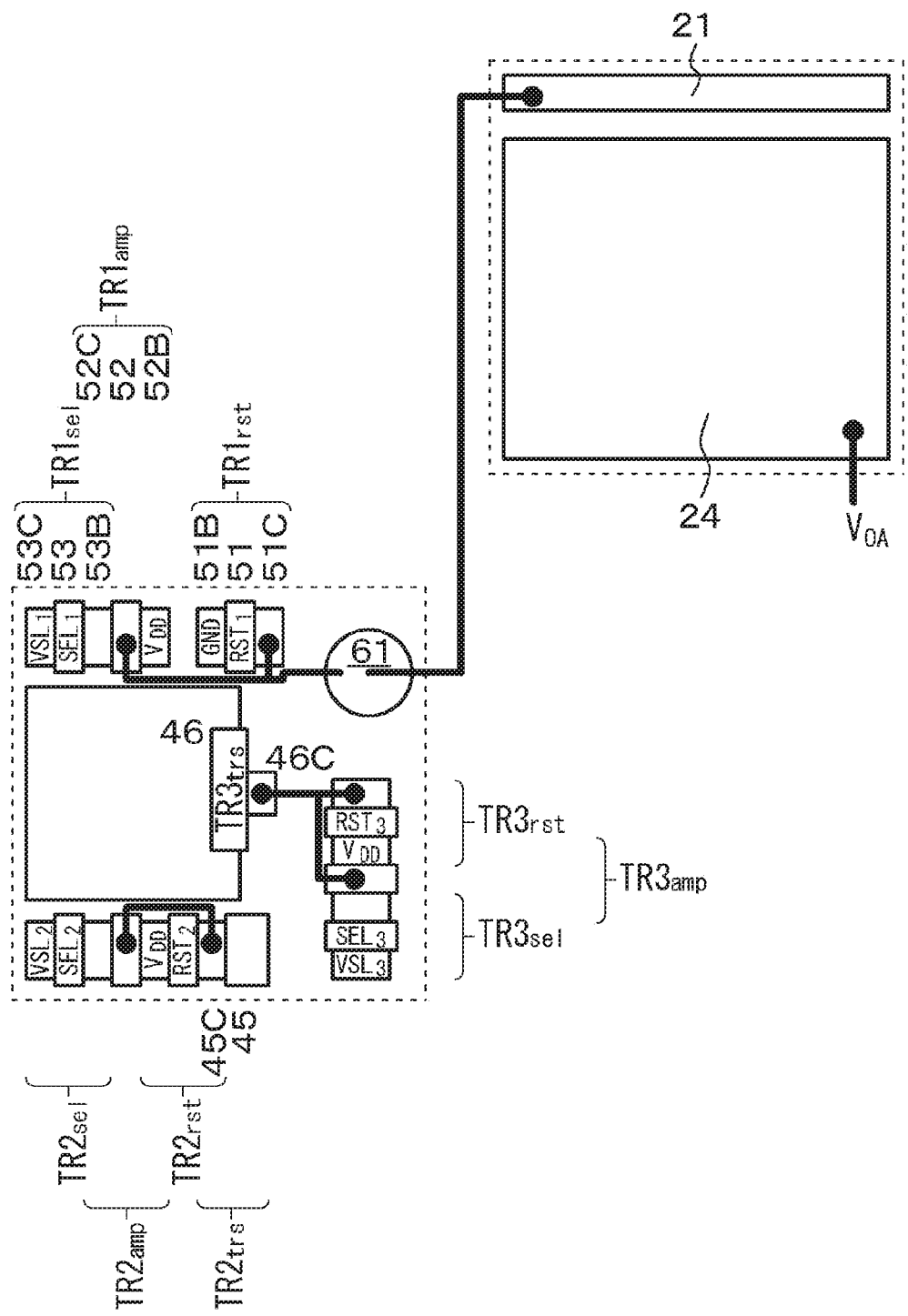
FIG. 32 is a schematic layout diagram of transistors forming a first electrode, a charge storage electrode, and a control unit that constitute a modification of the stacked imaging device of Example 3, the imaging device of the present disclosure, or the like shown in FIG. 31.

FIG. 31 shows an equivalent circuit diagram of a modification of a stacked imaging device of Example 3 (or an imaging device in the present disclosure). FIG. 32 shows a schematic layout diagram of the first electrode, the charge storage electrode, and the transistors constituting the control unit. As shown in FIG. 32, the other source/drain region 51B of the reset transistor $TR1_{rst}$ may be grounded, instead of being connected to the power supply VDD. Note that, as described above, a stacked imaging device and an imaging device in the present disclosure will be hereinafter collectively referred to as a "stacked imaging device or the like" in some cases.

A stacked imaging device or the like of Example 3 can be manufactured by the method described below, for example. Specifically, an SOI substrate is first prepared. A first silicon layer is then formed on the surface of the SOI substrate by an epitaxial growth method, and the p⁺-layer 73 and the n-type semiconductor region 41 are formed in the first silicon layer. A second silicon layer is then formed on the first silicon layer by an epitaxial growth method, and the device separation region 71, the oxide film 72, the p⁺-layer 42, the n-type semiconductor region 43, and the p⁺-layer 44 are formed in the second silicon layer. Further, various transistors and the like that constitute the control unit of the stacked imaging device or the like are formed in the second silicon layer, and the wiring layer 62, the interlayer insulating layer 76, and various wiring lines are formed thereon. After that, the interlayer insulating layer 76 and a support substrate (not shown) are bonded to each other. After that, the SOI substrate is removed, to expose the first silicon layer. Note that the surface of the second silicon layer corresponds to the front surface 70A of the semiconductor substrate 70, and the surface of the first silicon layer corresponds to the back surface 70B of the semiconductor substrate 70. Further, the first silicon layer and the second silicon layer are collectively referred to as the semiconductor substrate 70. The opening for forming the contact hole portion 61 is then formed on the side of the back surface 70B of the semiconductor substrate 70, and the HfO$_2$ film 74, the insulating material film 75, and the contact hole portion 61 are formed. Further, the pad portions 63 and 64, the interlayer insulating layer 81, the connecting holes 65 and 66, the first electrode 21, the charge storage electrode 24, and the insulating layer 82 are formed. An opening is then formed in the connecting portion 67, and the photoelectric conversion layer 23, the second electrode 22, the lower insulating layer 83, the polarizer 91, the upper insulating layer 84, and the on-chip microlens 14 are formed. In the above manner, a stacked imaging device or the like of Example 3 can be obtained.

EXAMPLE 4

Figure 33:
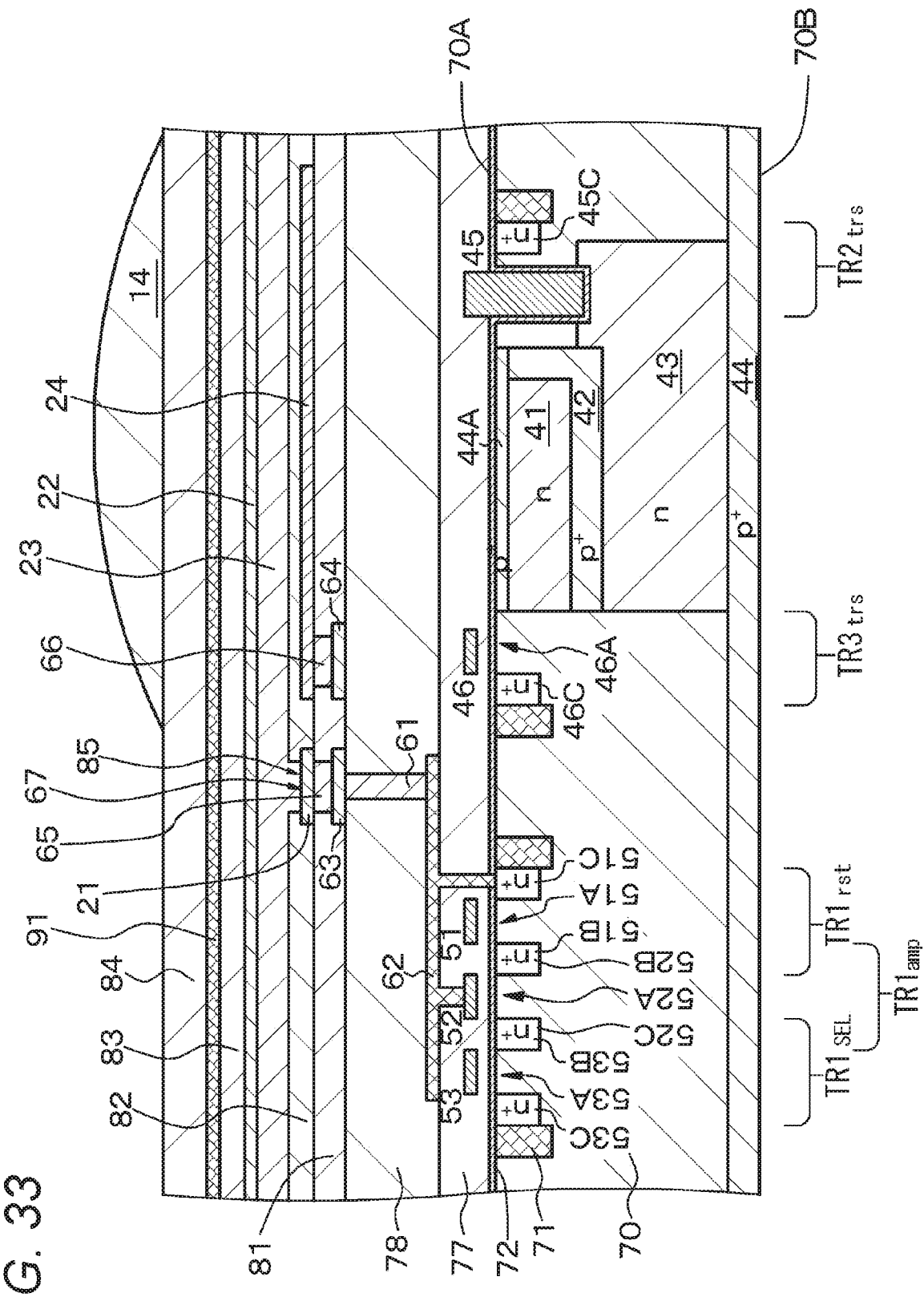

Example 4 is a modification of Example 3. FIG. 33 shows schematic partial cross-sectional view of a stacked imaging device or the like of Example 4. The stacked imaging device or the like is a front-illuminated imaging device, and has a structure in which three imaging devices are stacked. The three imaging devices are: a green-light imaging device of Example 3 of a first type (a first imaging device) that includes a green-light photoelectric conversion layer of the first type that absorbs green light, and has sensitivity to green light; a conventional blue-light imaging device of a second type (a second imaging device) that includes a blue-light photoelectric conversion layer of the second type that absorbs blue light, and has sensitivity to blue light; and a conventional red-light imaging device of the second type (a third imaging device) that includes a red-light photoelectric conversion layer of the second type that absorbs red light, and has sensitivity to red light. Here, the red-light imaging device (the third imaging device) and the blue-light imaging device (the second imaging device) are disposed in the semiconductor substrate 70, and the second imaging device is located on the light incident side of the third imaging device is. Further, the green-light imaging device (the first imaging device) is disposed above the blue-light imaging device (the second imaging device).

On the side of the front surface 70A of the semiconductor substrate 70, various transistors that constitute the control unit are provided, as in Example 3. These transistors may have configurations and structures substantially similar to those of the transistors described in Example 3. Further, the second imaging device and the third imaging device are provided in the semiconductor substrate 70, and these imaging devices may have configurations and structures substantially similar to those of the second imaging device and the third imaging device described in Example 3.

Interlayer insulating layers 77 and 78 are formed on the front surface 70A of the semiconductor substrate 70, and the photoelectric conversion unit (the first electrode 21, the photoelectric conversion layer 23, the second electrode 22, the charge storage electrode 24, and the like) including the charge storage electrode forming the stacked imaging device or the like of Example 3 is provided on the interlayer insulating layer 78.

As described above, except for being of the front-illuminated type, the configuration and the structure of the stacked imaging device or the like of Example 4 may be similar to the configuration and the structure of the stacked imaging device or the like of Example 3, and therefore, detailed explanation thereof is not made herein.

EXAMPLE 5

Example 5 is modifications of Examples 3 and 4.

Figure 34:
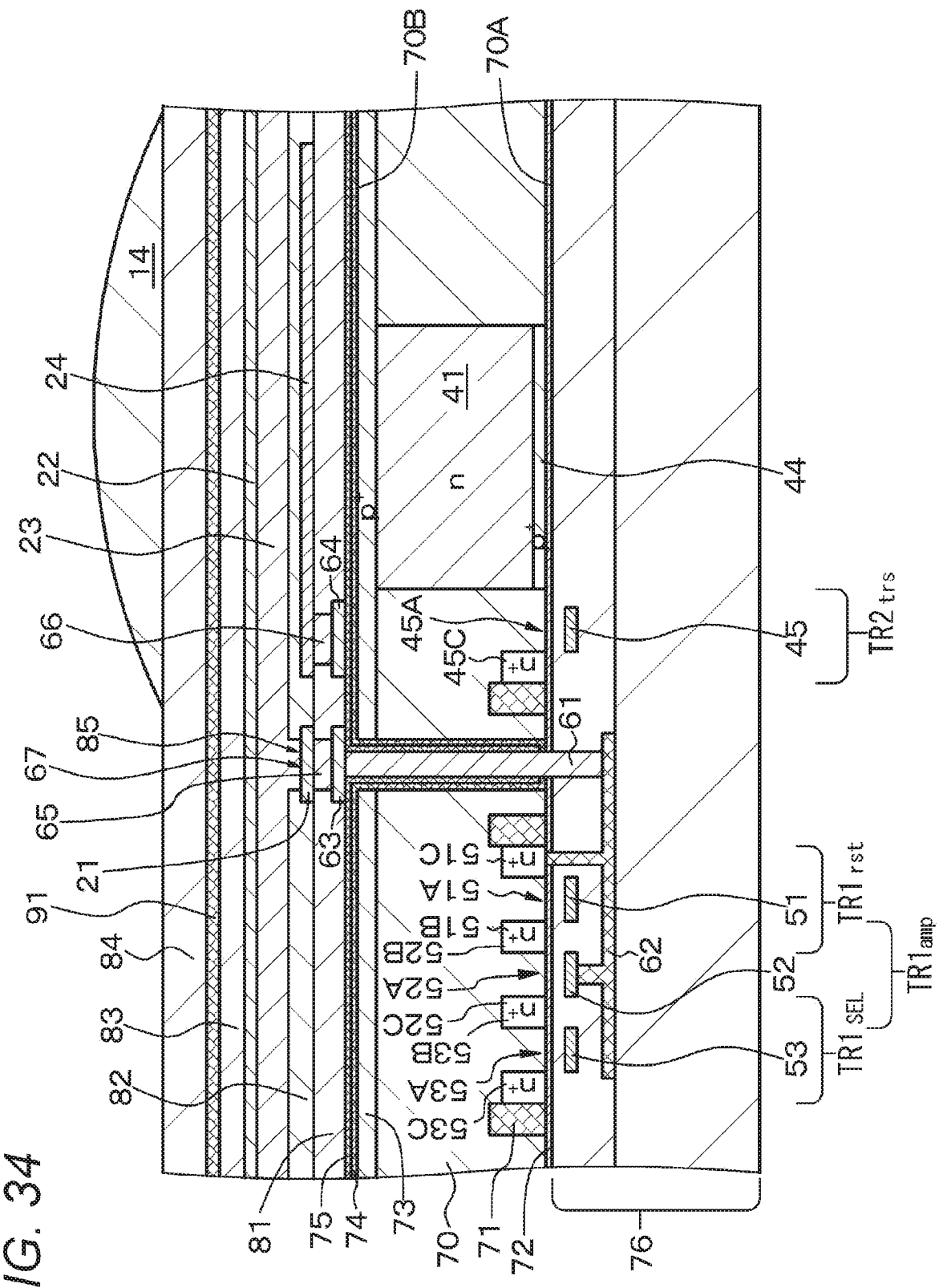
Figure 35:
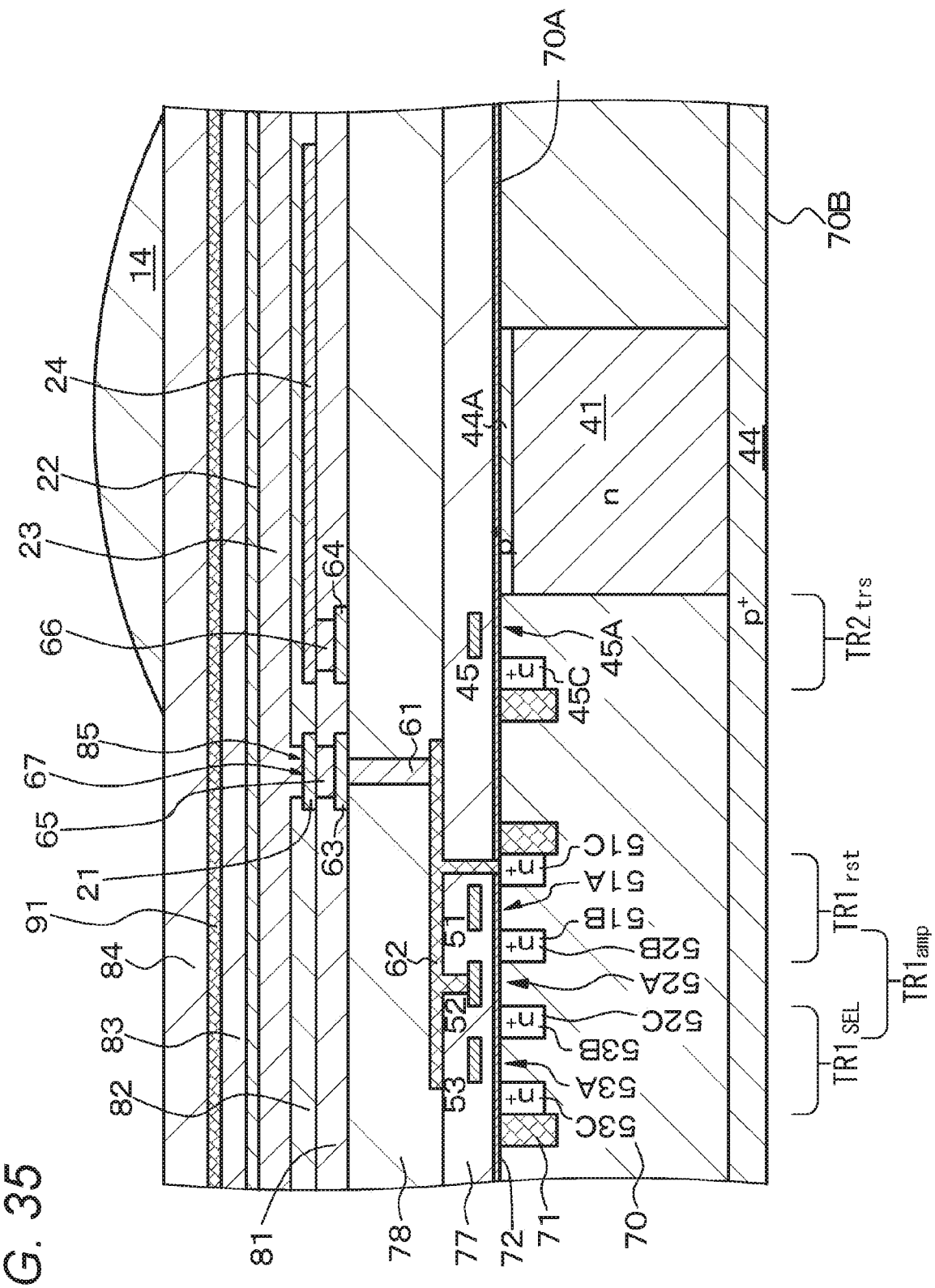

FIG. 34 shows a schematic partial cross-sectional view of a stacked imaging device or the like of Example 5. This stacked imaging device or the like is a back-illuminated imaging device, and has a structure in which the two imaging devices that are the first imaging device of the first type of Example 3 and the second imaging device of the second type are stacked. Further, FIG. 35 shows a schematic partial cross-sectional view of a modification of a stacked imaging device or the like of Example 5. This modification is a front-illuminated imaging device, and has a structure in which the two imaging devices that are the first imaging device of the first type of Example 3 and the second imaging device of the second type are stacked. Here, the first imaging device absorbs primary color light, and the second imaging device absorbs complementary color light. Alternatively, the first imaging device absorbs white light, and the second imaging device absorbs infrared rays.

Figure 36:
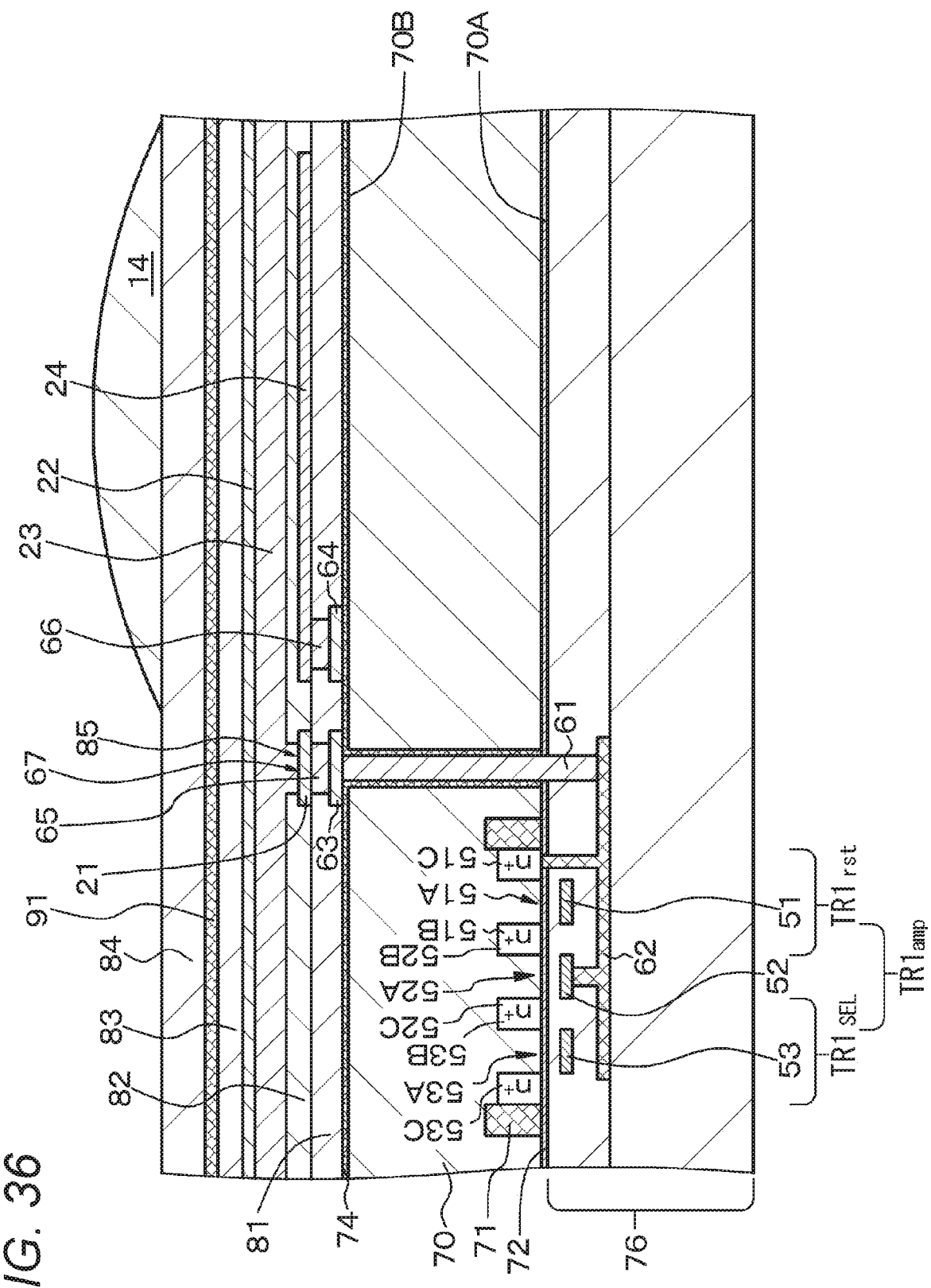
Figure 37:
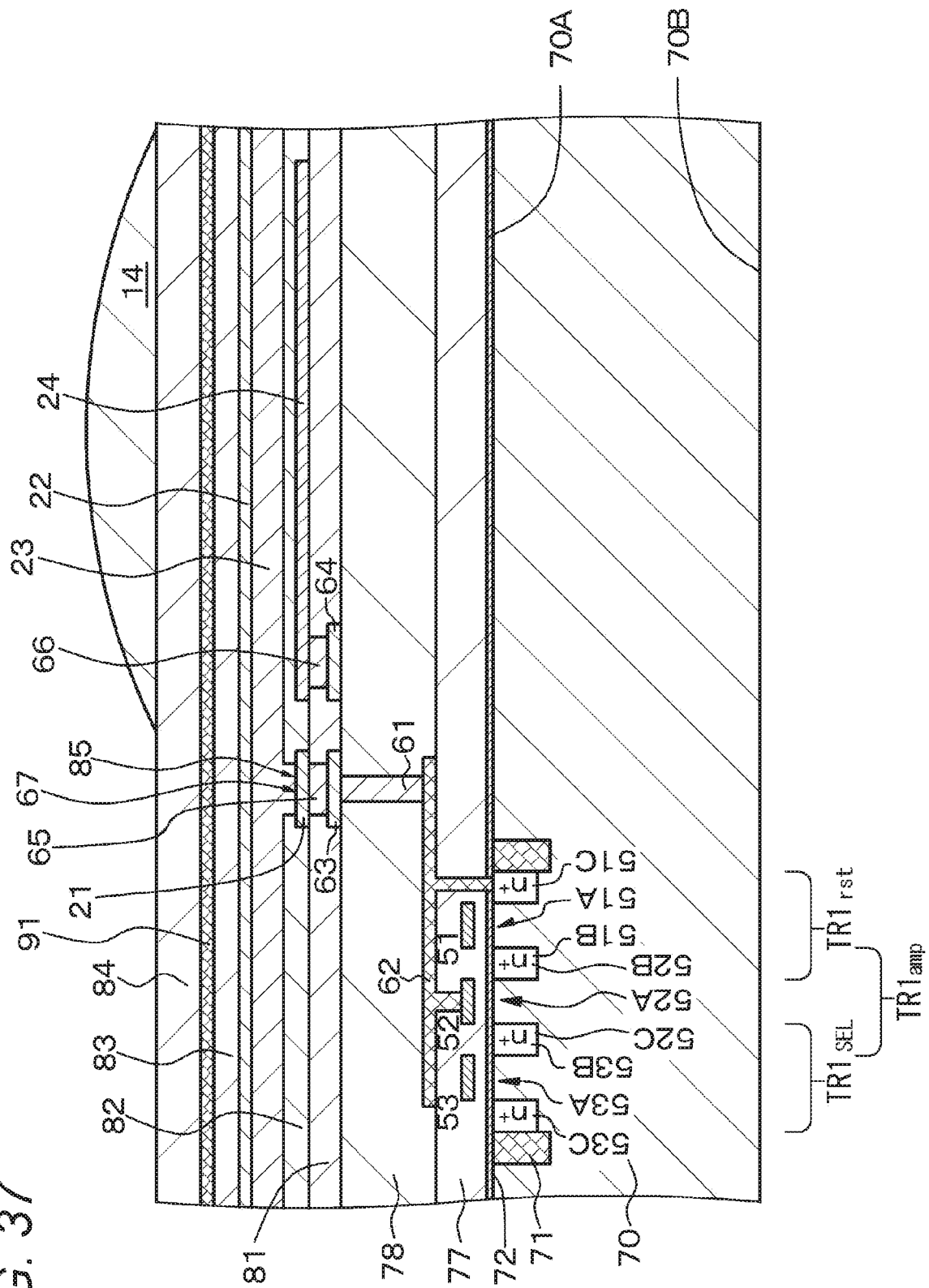

FIG. 36 shows a schematic partial cross-sectional view of a modification of a stacked imaging device or the like of Example 5. This modification is a back-illuminated stacked imaging device or the like, and is formed with the first imaging device of the first type of Example 3. Further, FIG. 37 shows a schematic partial cross-sectional view of a modification of a stacked imaging device or the like of Example 5. This modification is a front-illuminated imaging device, and is formed with the first imaging device of the first type of Example 3. Here, the first imaging device is formed with three types of imaging devices that are an imaging device that absorbs red light, an imaging device that absorbs green light, and an imaging device that absorbs blue light. Further, a plurality of these imaging devices constitutes a solid-state imaging apparatus according to the first embodiment of the present disclosure. The plurality of these imaging devices may be arranged in a Bayer array. On the light incident side of each imaging device, a color filter layer for performing blue, green, or red spectral separation is disposed as necessary.

Note that, instead of one photoelectric conversion unit including the charge storage electrode of the first type of Example 3, two photoelectric conversion units may be stacked (in other words, two photoelectric conversion units each including the charge storage electrode may be stacked, and the control units for the two photoelectric conversion units may be provided in the semiconductor substrate). Alternatively, three photoelectric conversion units may be stacked (in other words, three photoelectric conversion units each including the charge storage electrode may be stacked, and the control units for the three photoelectric conversion units may be provided in the semiconductor substrate). Examples of stack structures formed with imaging devices of the first type and imaging devices of the second type are shown in the table below.

|  | First type | Second type |
|---|---|---|
| Back-illuminated type and front-illuminated type | 1<br>Green<br>1<br>Primary<br>1 | 2<br>Blue + red<br>1<br>Complementary<br>1 |

-continued

| First type | Second type |
|---|---|
| White | Infrared rays |
| 1 | 0 |
| Blue, green, or red | |
| 2 | 2 |
| Green + infrared light | Blue + red |
| 2 | 1 |
| Green + blue | Red |
| 3 | 0 |
| White + infrared light | |
| 3 | 2 |
| Green + blue + red | Blue-green (emerald) + infrared light |
| 3 | 1 |
| Green + blue + red | Infrared light |
| 3 | 0 |
| Blue + green + red | |

EXAMPLE 6

Figure 28B:
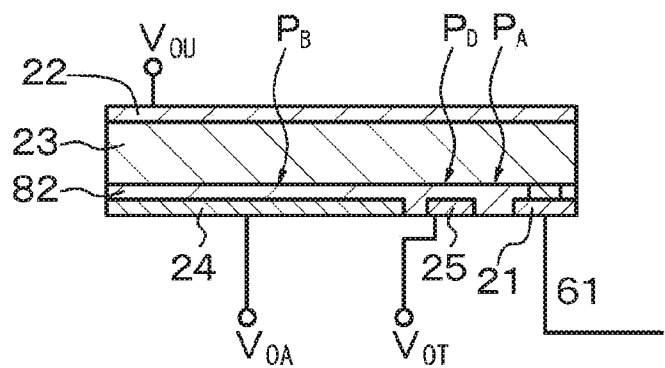
Figure 38:
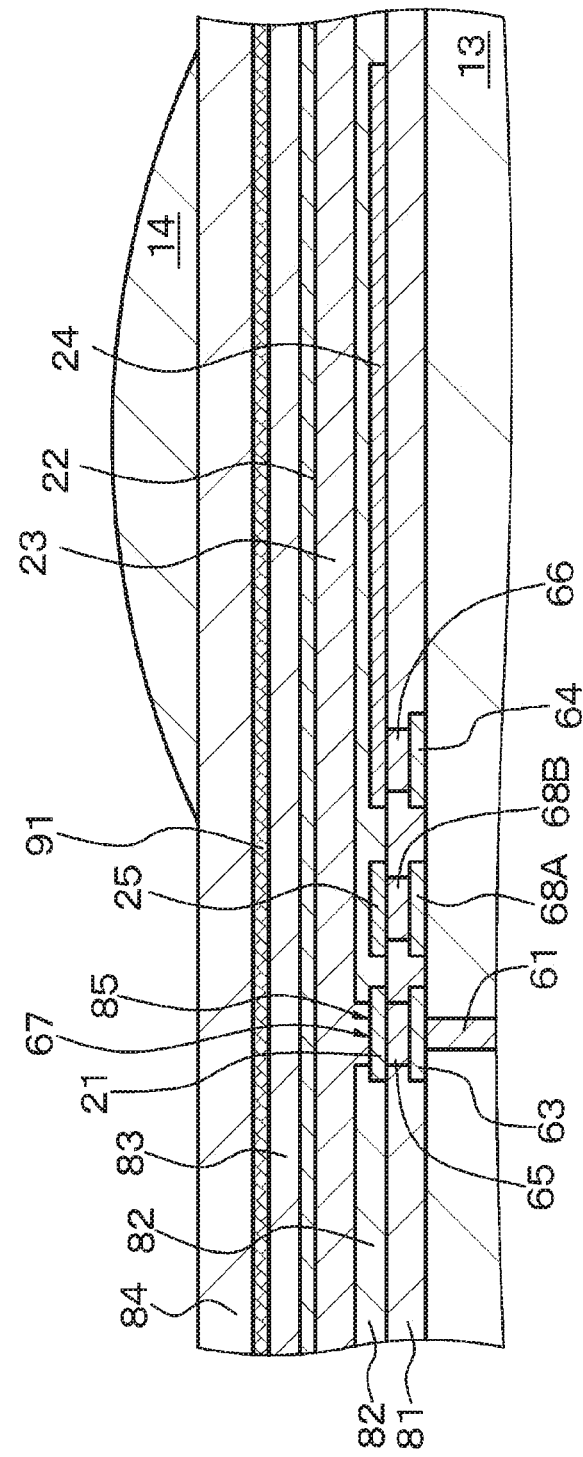
Figure 39:
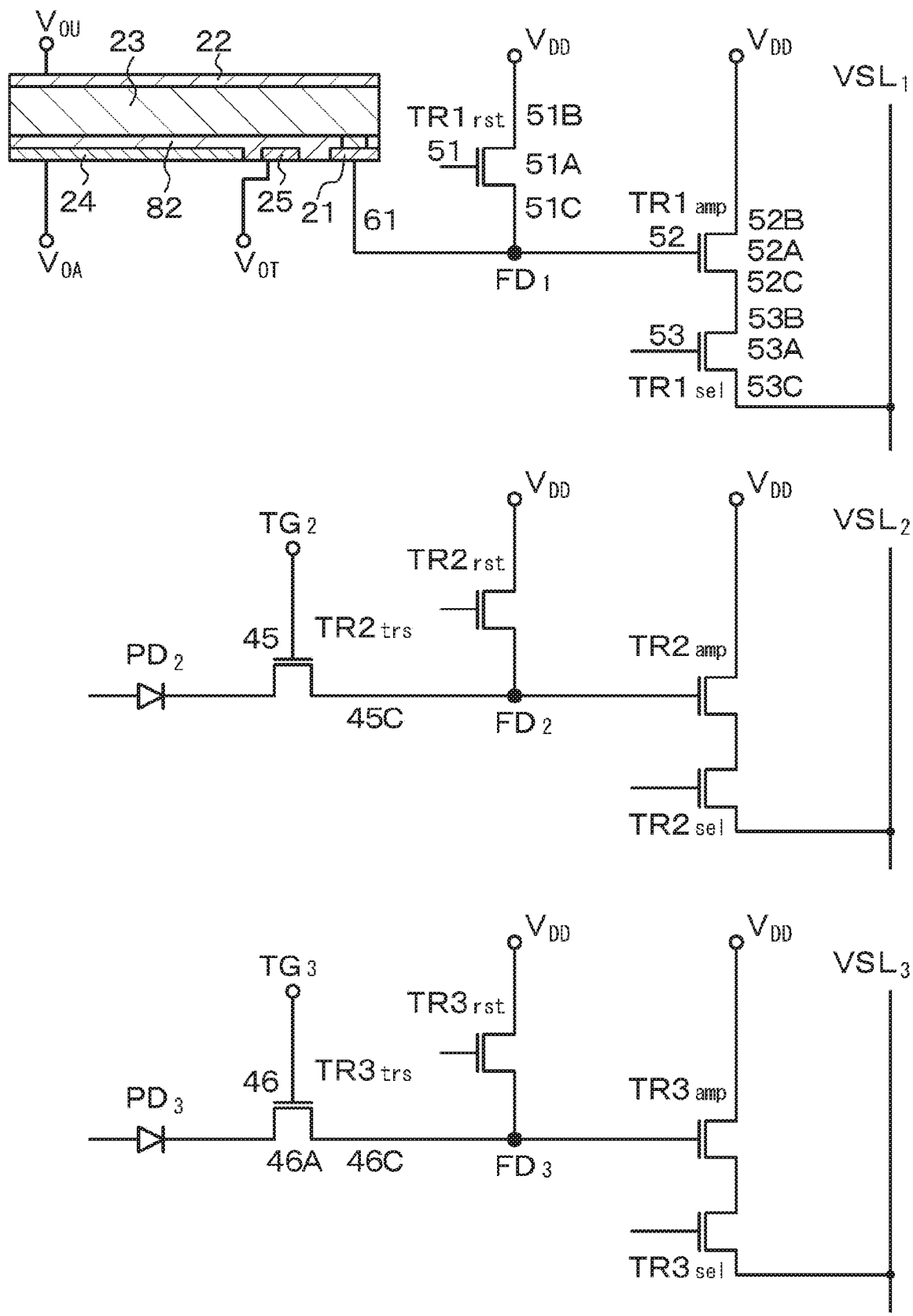
Figure 40:
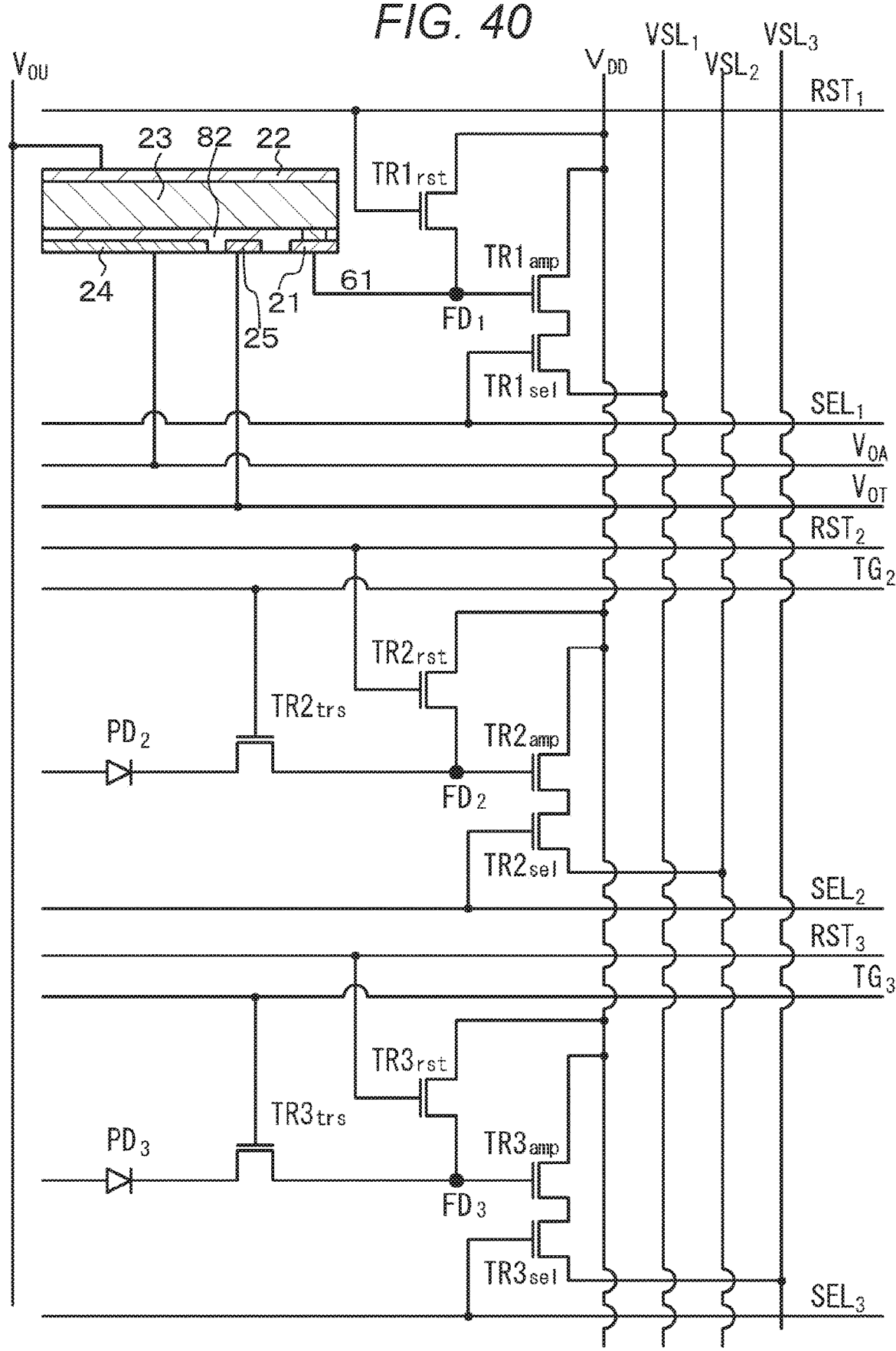
Figure 41:
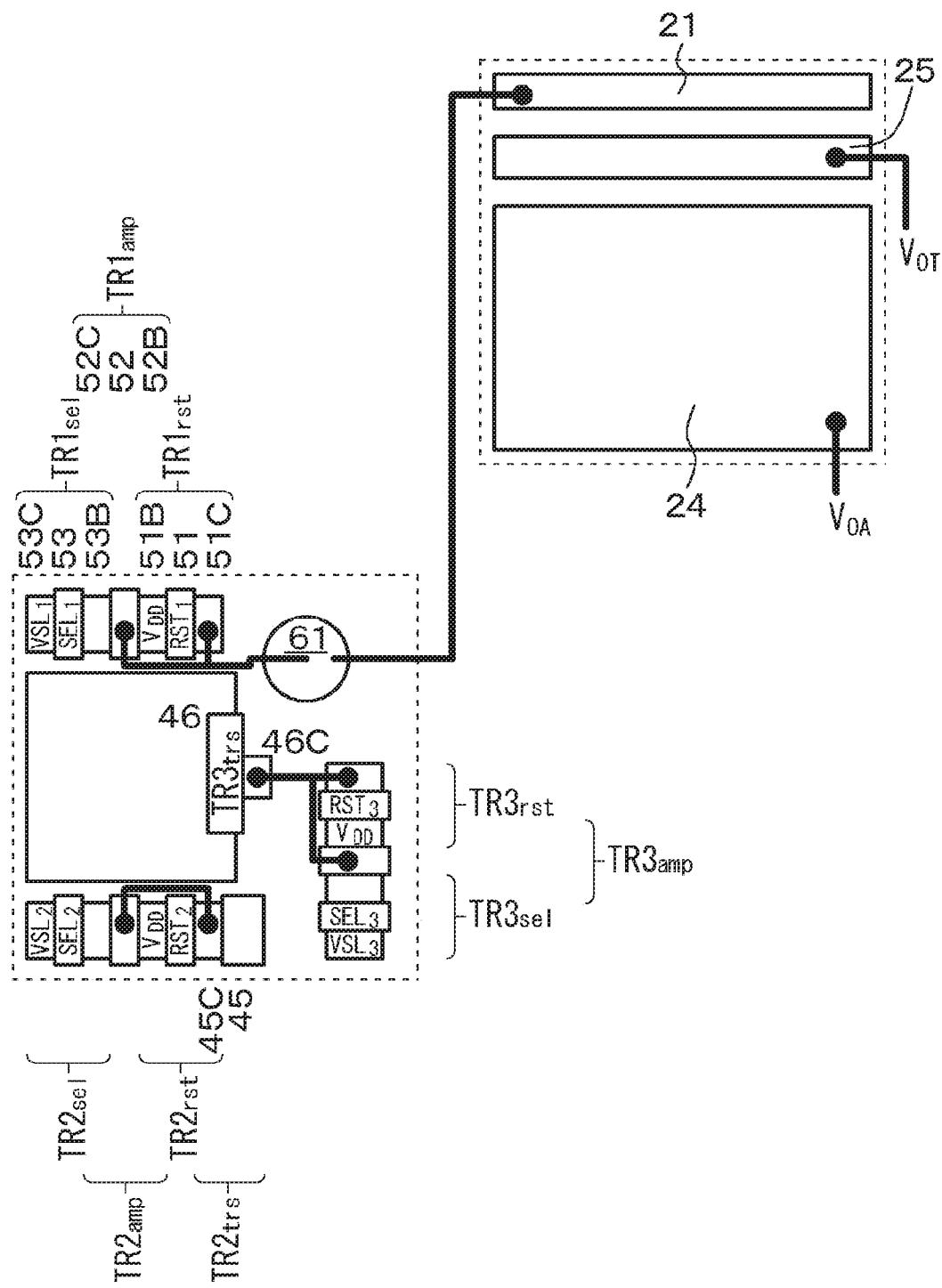
Figure 44:
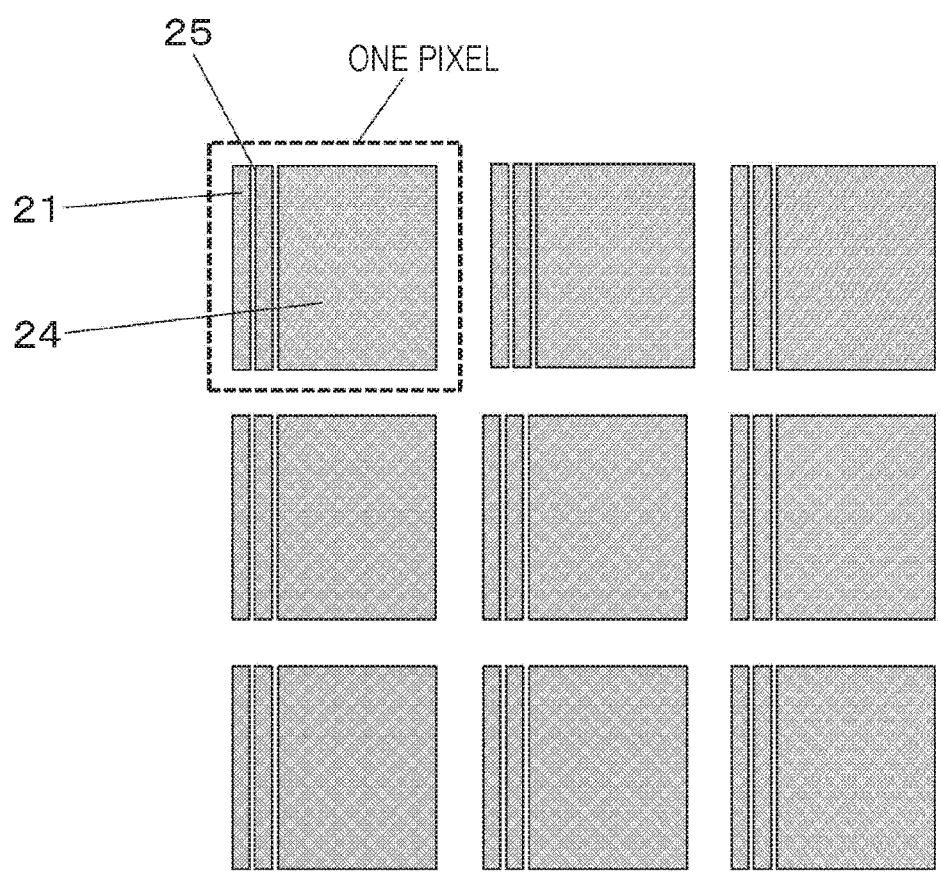
Figure 45:
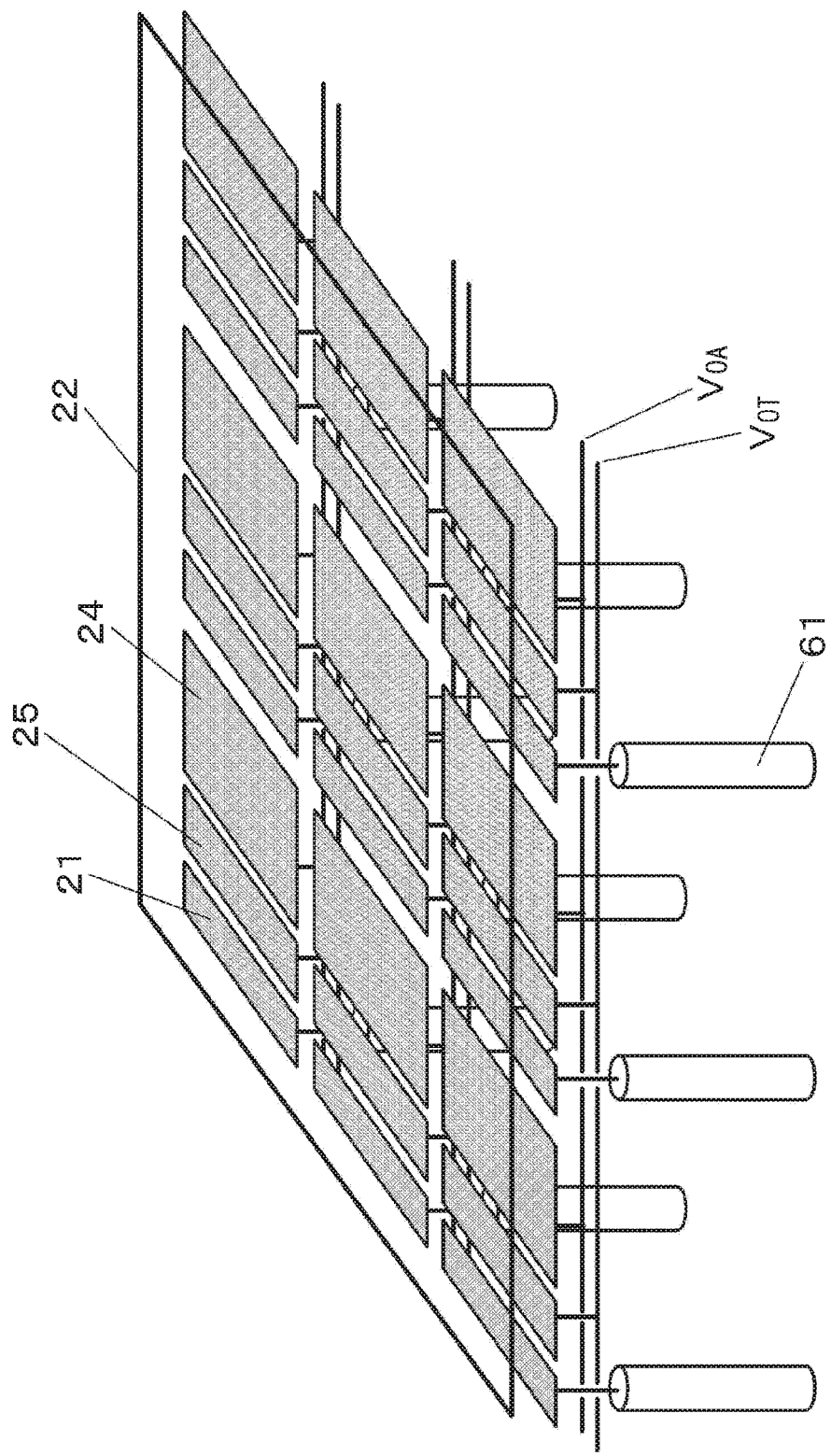

Example 6 is modifications of Examples 3 through 5, and relates to imaging devices or the like of the present disclosure including a transfer control electrode (a charge transfer electrode). FIG. 38 shows a schematic partial cross-sectional view of part of a stacked imaging device or the like of Example 6. FIGS. 39 and 40 show equivalent circuit diagrams of the stacked imaging device or the like of Example 6. FIG. 41 shows a schematic layout diagram of a first electrode, a transfer control electrode, and a charge storage electrode that constitute a photoelectric conversion unit including a charge storage electrode of the stacked imaging device or the like of Example 6, and transistors that constitute a control unit. FIGS. 42 and 43 schematically shows the states of the potential at respective portions at a time of operation of the stacked imaging device or the like of Example 6. FIG. 28B shows an equivalent circuit diagram for explaining the respective portions of the stacked imaging device or the like of Example 6. Further, FIG. 44 shows a schematic layout diagram of the first electrode, the transfer control electrode, and the charge storage electrode that constitute the photoelectric conversion unit including the charge storage electrode of the stacked imaging device or the like of Example 6. FIG. 45 shows a schematic perspective view of the first electrode, the transfer control electrode, the charge storage electrode, a second electrode, and a contact hole portion.

In the stacked imaging device or the like of Example 6, a transfer control electrode (a charge transfer electrode) 25 is further provided between the first electrode 21 and the charge storage electrode 24. The transfer control electrode 25 is disposed at a distance from the first electrode 21 and the charge storage electrode 24, and is positioned to face the photoelectric conversion layer 23 via the insulating layer 82. The transfer control electrode 25 is connected to the pixel drive circuit that forms the drive circuit, via a connecting hole 68B, a pad portion 68A, and a wiring line VoT that are formed in the interlayer insulating layer 81. Note that, to simplify the drawings, the various imaging device components located below the interlayer insulating layer 81 are collectively denoted by reference numeral 13 for the sake of convenience.

In the description below, operation of the stacked imaging device or the like (the first imaging device) of Example 6 is described, with reference to FIGS. 42 and 43. Note that the value of the potential to be applied to the charge storage electrode 24 and the value of the potential at point PD are different between FIGS. 42 and 43.

In a charge accumulation period, the drive circuit applies a potential $V_{11}$ to the first electrode 21, a potential $V_{12}$ to the charge storage electrode 24, and a potential $V_{13}$ to the transfer control electrode 25. Light that has entered the photoelectric conversion layer 23 causes photoelectric conversion in the photoelectric conversion layer 23. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{12}>V_{13}$ (for example, $V_{12}>V_{11}>V_{13}$, or $V_{11}>V_{12}>V_{13}$). As a result, electrons generated by the photoelectric conversion are attracted to the charge storage electrode 24, and stay in the region of the photoelectric conversion layer 23 facing the charge storage electrode 24. In other words, electric charges are accumulated in the photoelectric conversion layer 23. Since $V_{12}>V_{13}$, the electrons generated in the photoelectric conversion layer 23 can be reliably prevented from moving toward the first electrode 21. With the passage of time for photoelectric conversion, the potential in the region of the photoelectric conversion layer 23 facing the charge storage electrode 24 becomes a more negative value.

A reset operation is performed in the latter period in the charge accumulation period. As a result, the potential of the first floating diffusion layer $FD_1$ is reset, and the potential of the first floating diffusion layer $FD_1$ becomes the potential VDD of the power supply.

After completion of the reset operation, the electric charges are read out. In other words, in a charge transfer period, the drive circuit applies a potential $V_{21}$ to the first electrode 21, a potential $V_{22}$ to the charge storage electrode 24, and a potential $V_{23}$ to the transfer control electrode 25. Here, $V_{22} \leq V_{23} \leq V_{21}$. As a result, the electrons remaining in the region of the photoelectric conversion layer 23 facing the charge storage electrode 24 are read into the first electrode 21 and further into the first floating diffusion layer $FD_1$ without fail. In other words, the electric charges accumulated in the photoelectric conversion layer 23 are read into the control unit.

In the above manner, a series of operations including charge accumulation, reset operation, and charge transfer is completed.

The operations of the amplification transistor $TR1_{amp}$, and the selection transistor $TR1_{sel}$ after the electrons are read into the first floating diffusion layer $FD_1$ are the same as the operations of conventional amplification and selection transistors. Further, a series of operations including charge accumulation, reset operation, and charge transfer to be performed in the second imaging device and the third imaging device is similar to a series of conventional operations including charge accumulation, reset operation, and charge transfer, for example.

Figure 46:
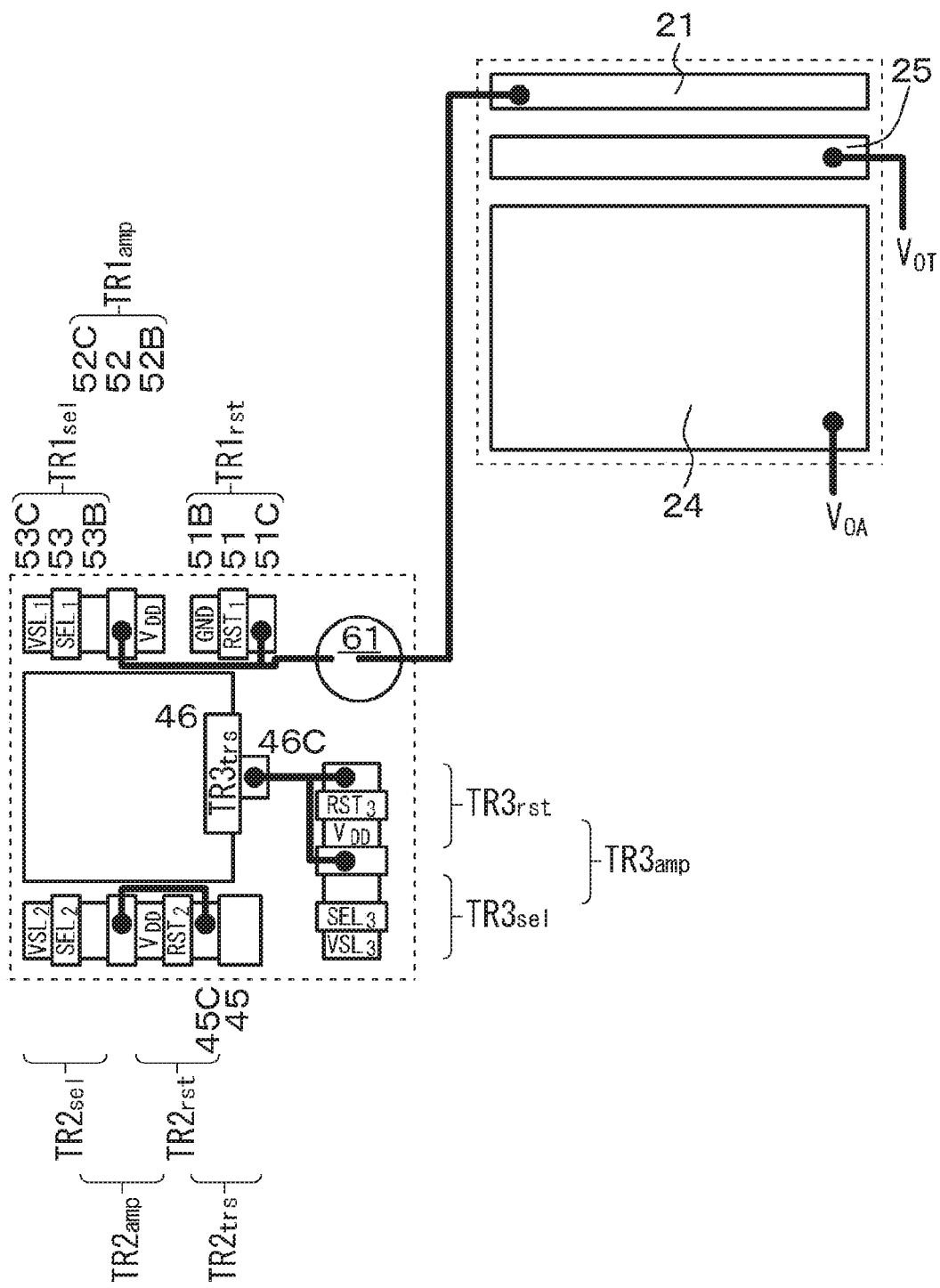

FIG. 46 shows a schematic layout diagram of the first electrode, the charge storage electrode, and the transistors constituting the control unit of a modification of a stacked imaging device or the like of Example 6. As shown in FIG. 46, the other source/drain region 51B of the reset transistor $TR1_{rst}$ may be grounded, instead of being connected to the power supply $V_{DD}$.

EXAMPLE 7

Figure 47:
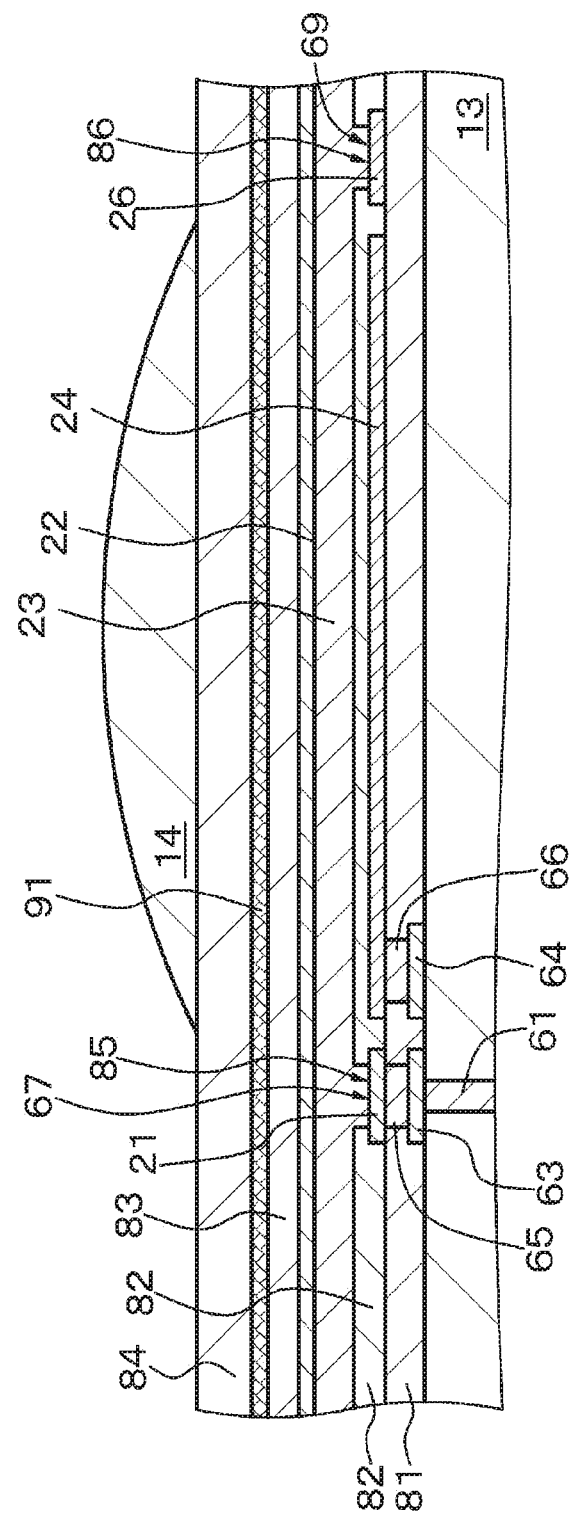
Figure 48:
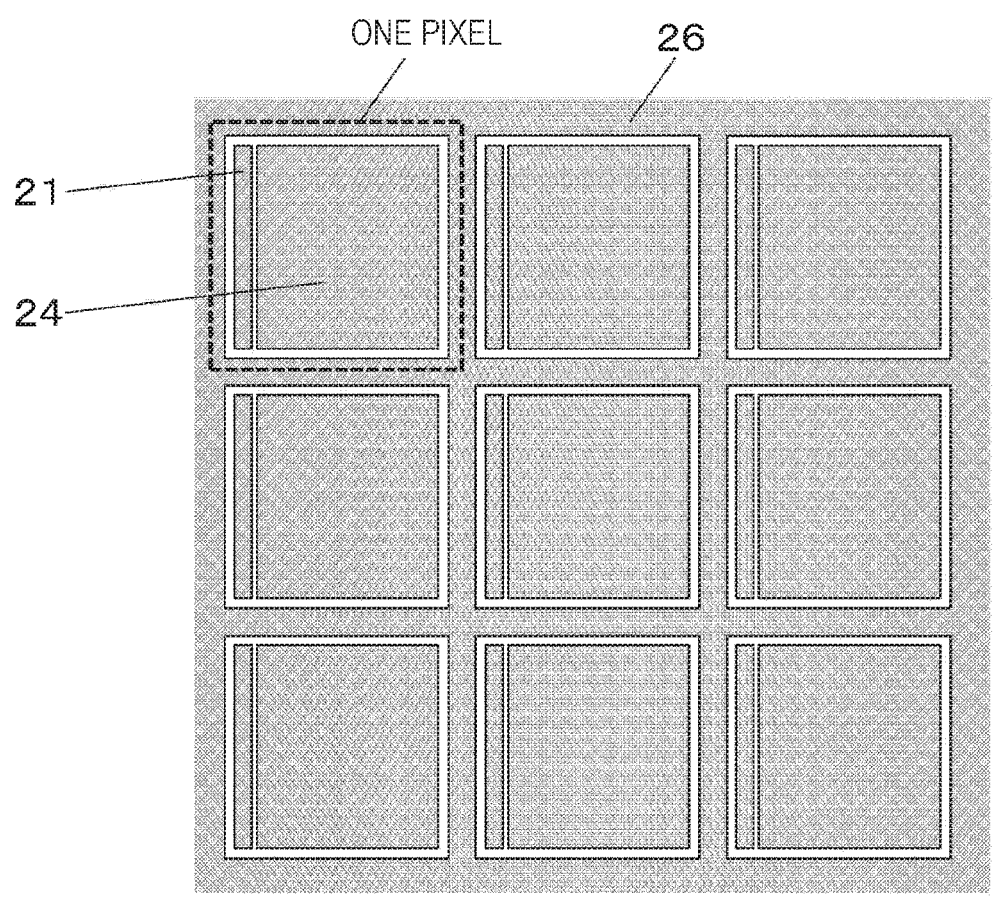
Figure 49:
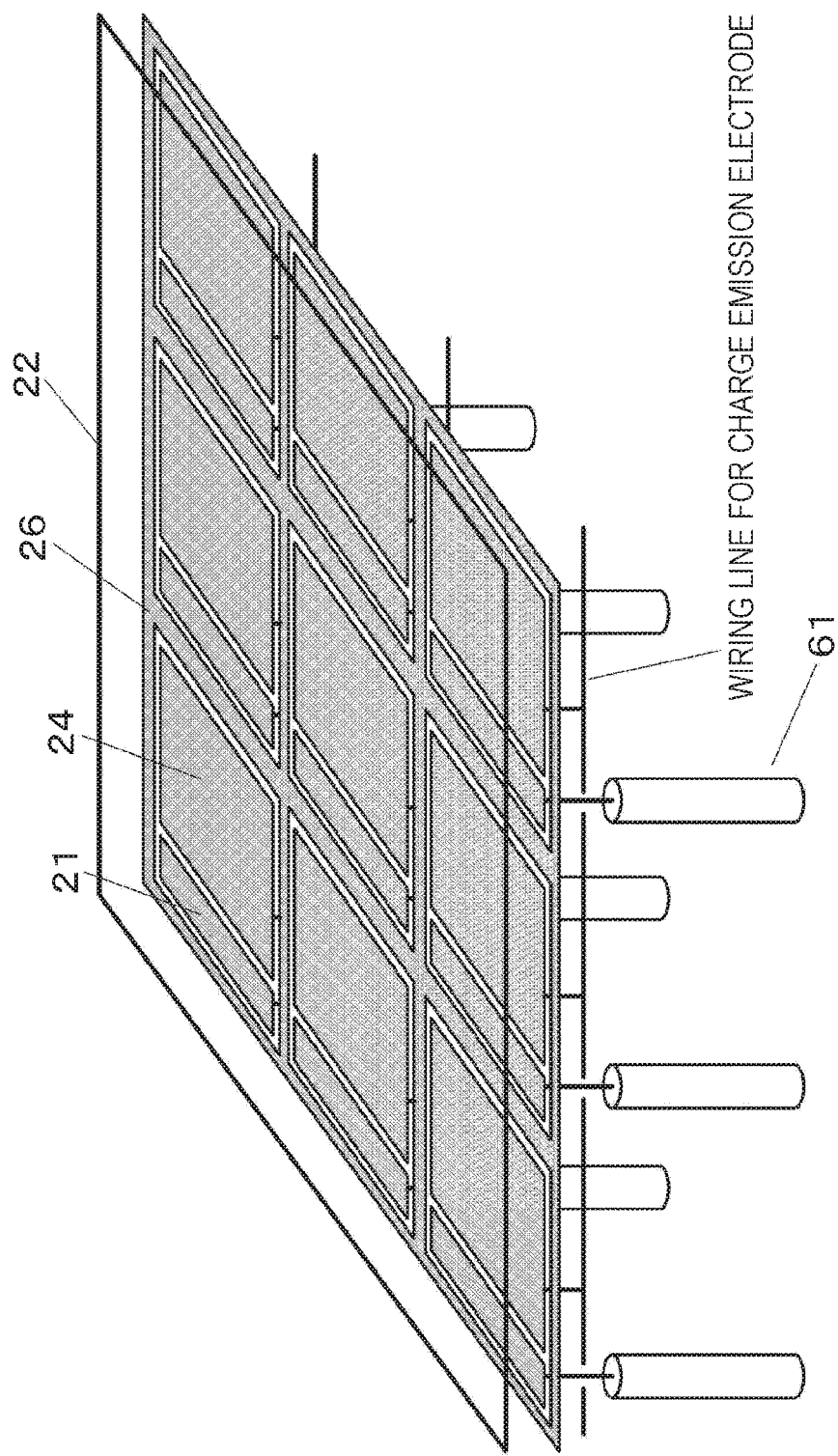

Example 7 is modifications of Examples 3 through 6, and relates to imaging devices or the like of the present disclosure including a charge emission electrode. FIG. 47 shows a schematic partial cross-sectional view of part of a stacked imaging device or the like of Example 7. FIG. 48 shows a schematic layout diagram of the first electrode, the charge storage electrode, and the charge emission electrode that constitute the photoelectric conversion unit including the charge storage electrode of the stacked imaging device or the like of Example 7. FIG. 49 shows a schematic perspective view of the first electrode, the charge storage electrode, the charge emission electrode, the second electrode, and the contact hole portion.

In the stacked imaging device or the like of Example 7, a charge emission electrode 26 is further provided. The charge emission electrode 26 is connected to the photoelectric conversion layer 23 via a connecting portion 69, and is disposed at a distance from the first electrode 21 and the charge storage electrode 24. Here, the charge emission electrode 26 is disposed so as to surround the first electrode 21 and the charge storage electrode 24 (or like a frame). The charge emission electrode 26 is connected to a pixel drive circuit that forms a drive circuit. The photoelectric conversion layer 23 extends in the connecting portion 69. In other words, the photoelectric conversion layer 23 extends in a second opening 86 formed in the insulating layer 82, and is connected to the charge emission electrode 26. The charge emission electrode 26 is shared (made common) in a plurality of stacked imaging devices or the like.

In Example 7, in a charge accumulation period, the drive circuit applies a potential $V_{11}$ to the first electrode 21, a potential $V_{12}$ to the charge storage electrode 24, and a potential $V_{14}$ to the charge emission electrode 26, and electric charges are accumulated in the photoelectric conversion layer 23. Light that has entered the photoelectric conversion layer 23 causes photoelectric conversion in the photoelectric conversion layer 23. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{14} > V_{11}$ (for example, $V_{12} > V_{14} > V_{11}$). As a result, the electrons generated by the photoelectric conversion are attracted to the charge storage electrode 24, and stay in the region of the photoelectric conversion layer 23 facing the charge storage electrode 24. Thus, the electrons can be reliably prevented from moving toward the first electrode 21. However, electrons not sufficiently attracted by the charge storage electrode 24, or electrons not accumulated in the photoelectric conversion layer 23 (so-called overflowed electrons) are sent to the drive circuit via the charge emission electrode 26.

A reset operation is performed in the latter period in the charge accumulation period. As a result, the potential of the first floating diffusion layer $FD_1$ is reset, and the potential of the first floating diffusion layer $FD_1$ becomes the potential VDD of the power supply.

After completion of the reset operation, the electric charges are read out. In other words, in a charge transfer period, the drive circuit applies a potential $V_{21}$ to the first electrode 21, a potential $V_{22}$ to the charge storage electrode 24, and a potential $V_{24}$ to the charge emission electrode 26. Here, $V_{24} < V_{21}$ (for example, $V_{24} < V_{22} < V_{21}$). As a result, the electrons remaining in the region of the photoelectric conversion layer 23 facing the charge storage electrode 24 are read into the first electrode 21 and further into the first floating diffusion layer $FD_1$ without fail. In other words, the electric charges accumulated in the photoelectric conversion layer 23 are read into the control unit.

In the above manner, a series of operations including charge accumulation, reset operation, and charge transfer is completed.

The operations of the amplification transistor $TR1_{amp}$ and the selection transistor $TR1_{sel}$ after the electrons are read into the first floating diffusion layer $FD_1$ are the same as the operations of conventional amplification and selection transistors. Further, a series of operations including charge accumulation, reset operation, and charge transfer to be performed in the second imaging device and the third imaging device is similar to a series of conventional operations including charge accumulation, reset operation, and charge transfer, for example.

In Example 7, so-called overflowed electrons are sent to the drive circuit via the charge emission electrode 26, so that leakage into the charge storage portions of the adjacent pixels can be reduced, and blooming can be prevented. Thus, the imaging performance of the stacked imaging device or the like can be improved.

EXAMPLE 8

Example 8 is modifications of Examples 3 through 7, and relates to imaging devices or the like of the present disclosure including a plurality of charge storage electrode segments.

Figure 28C:
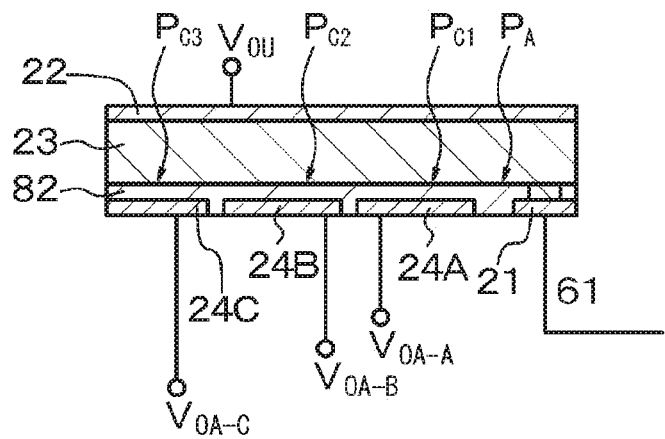
Figure 50:
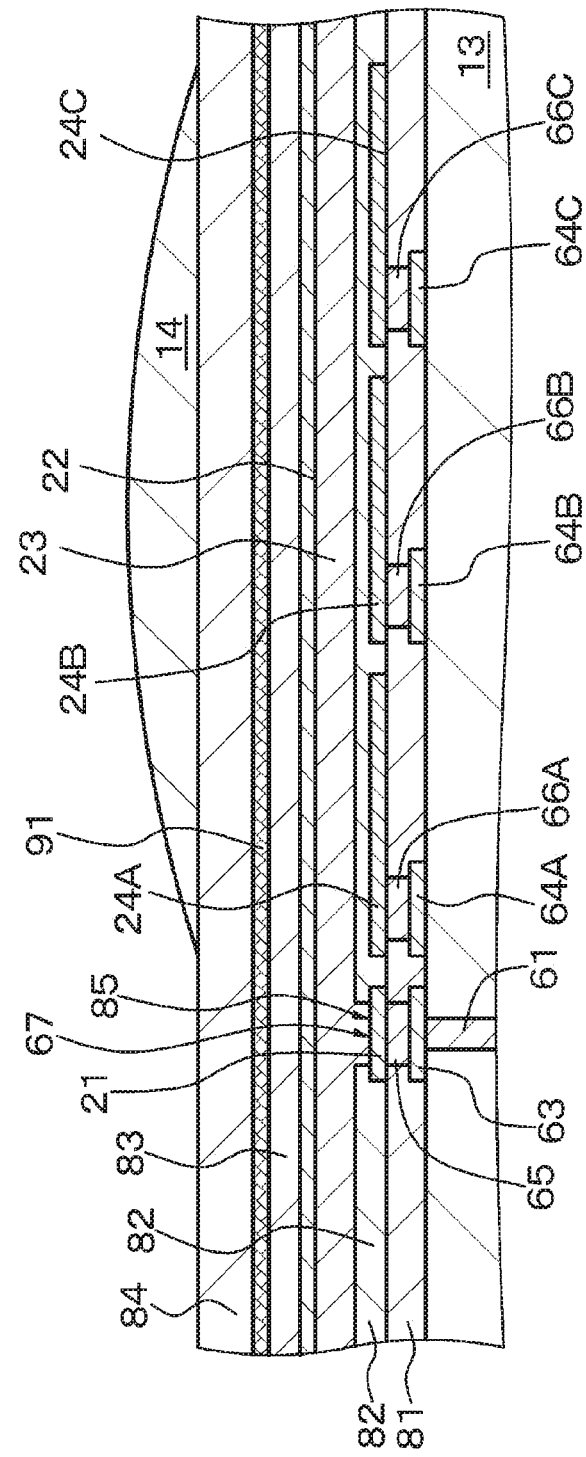
Figure 51:
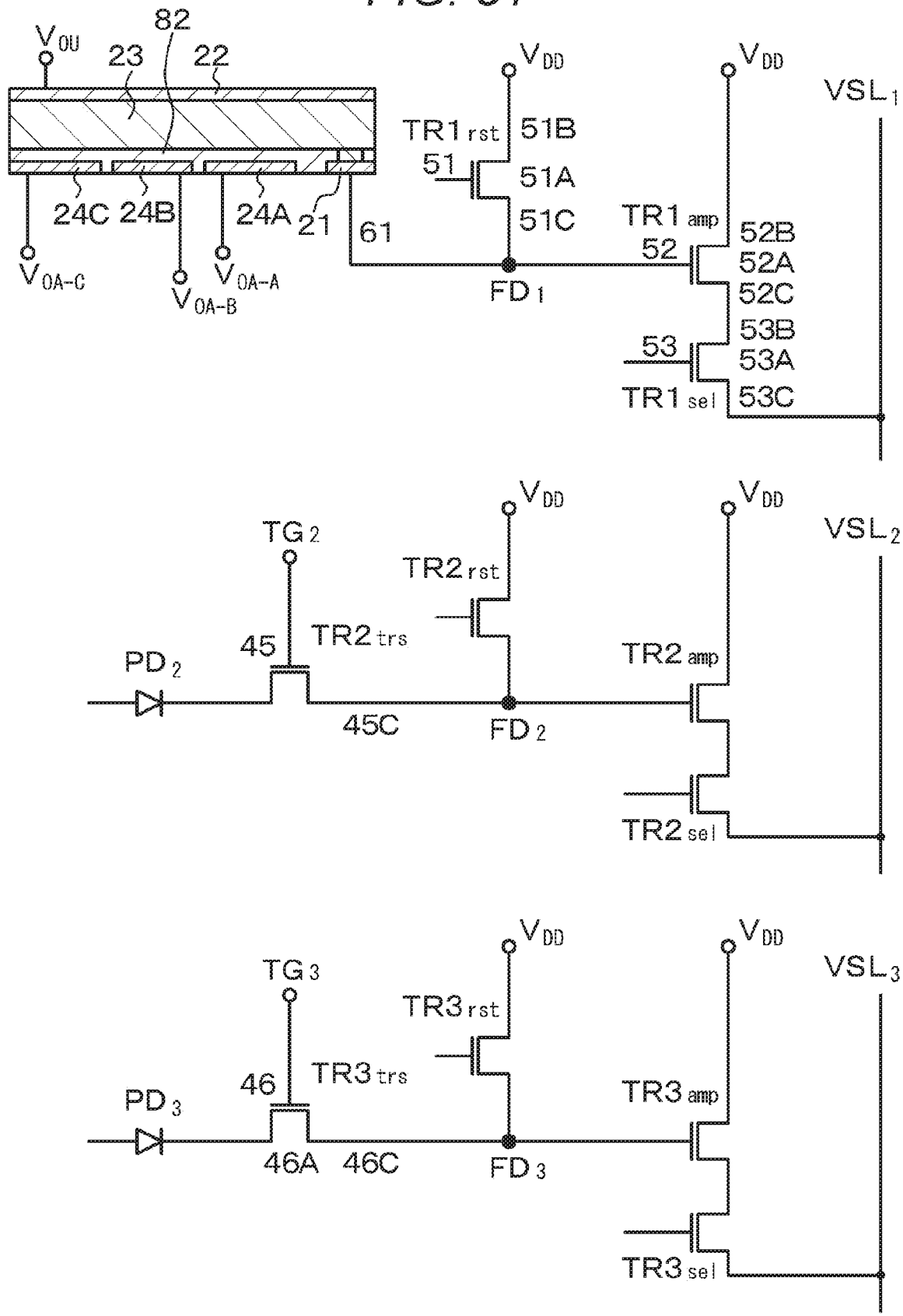
Figure 52:
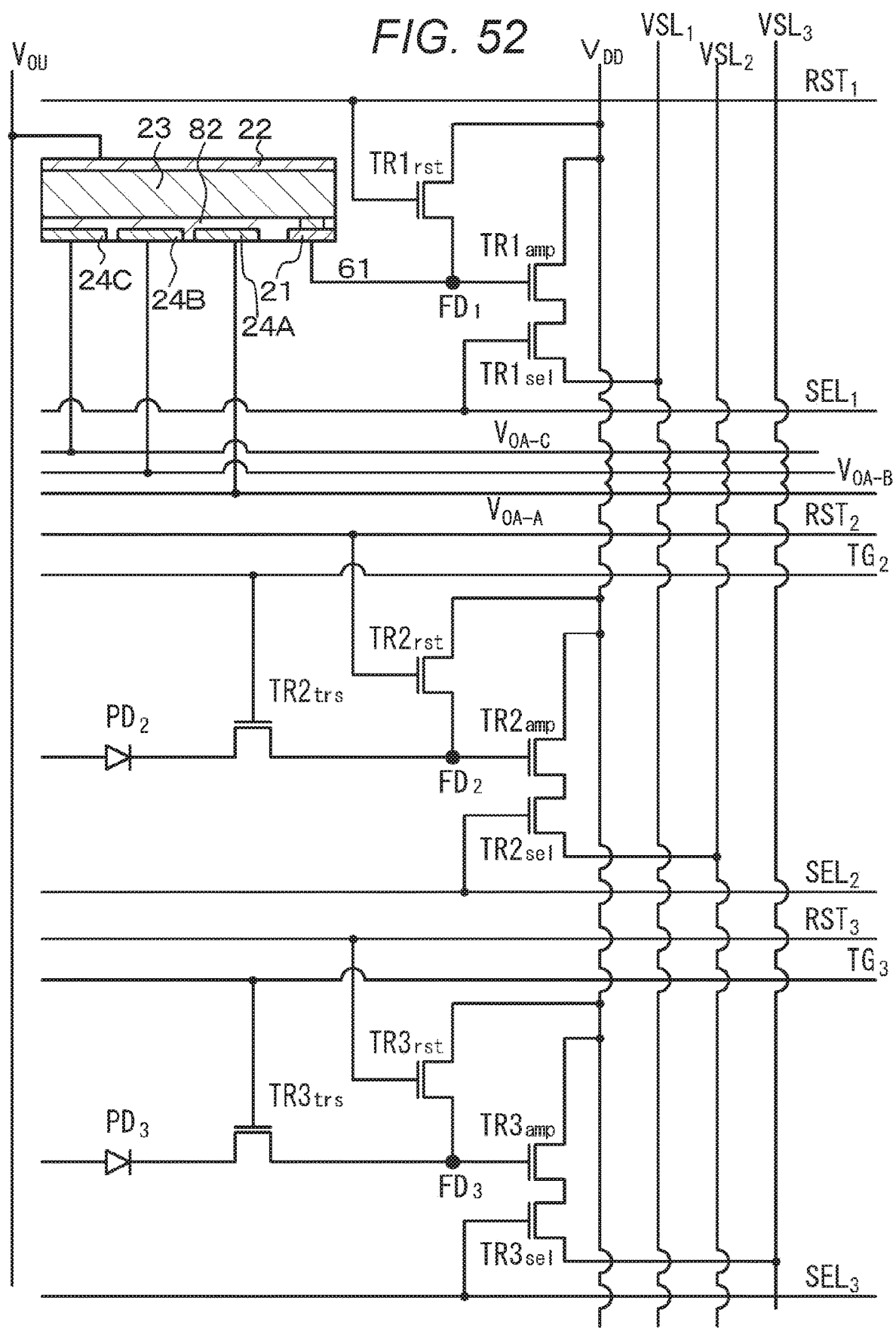
Figure 53:
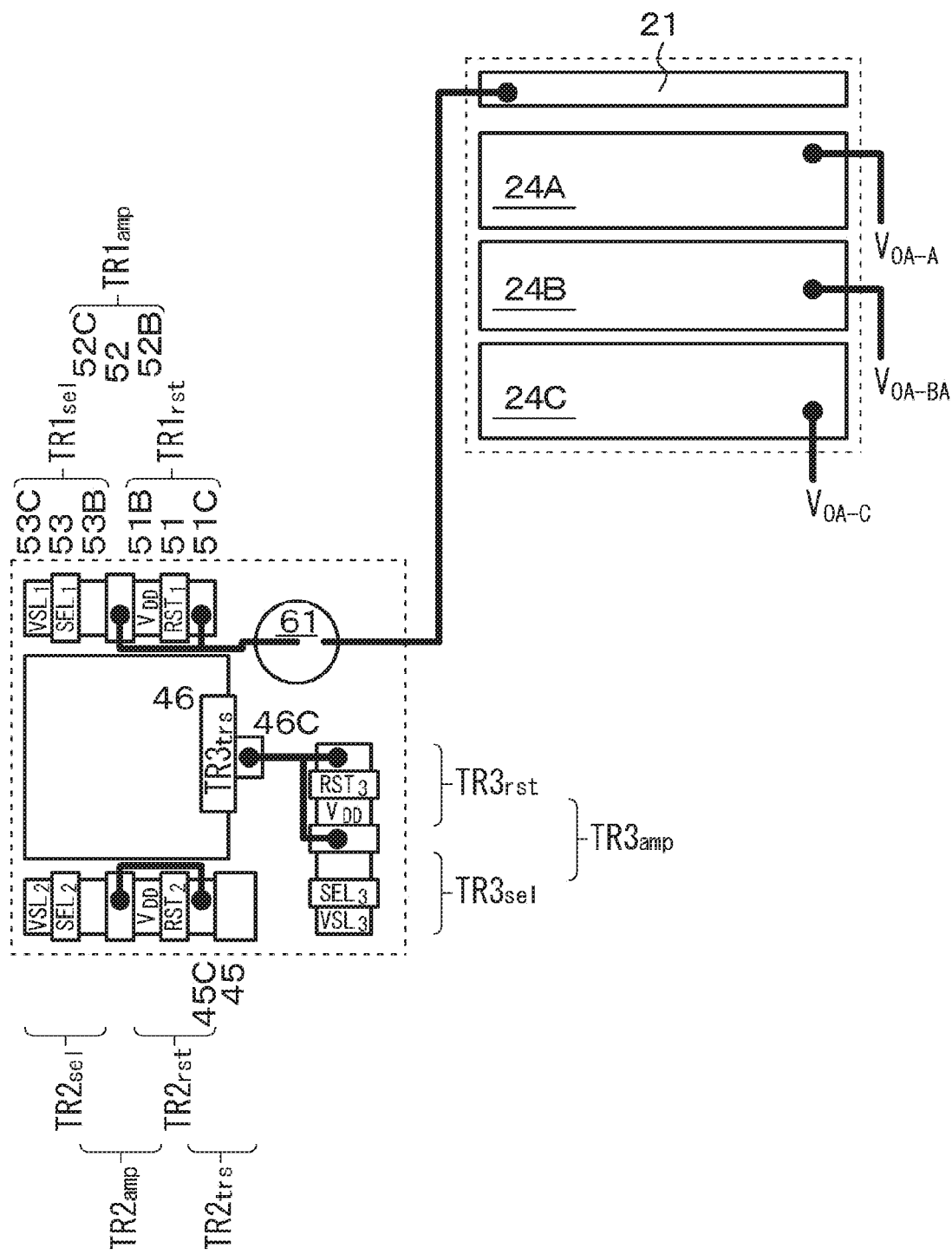
Figure 55:
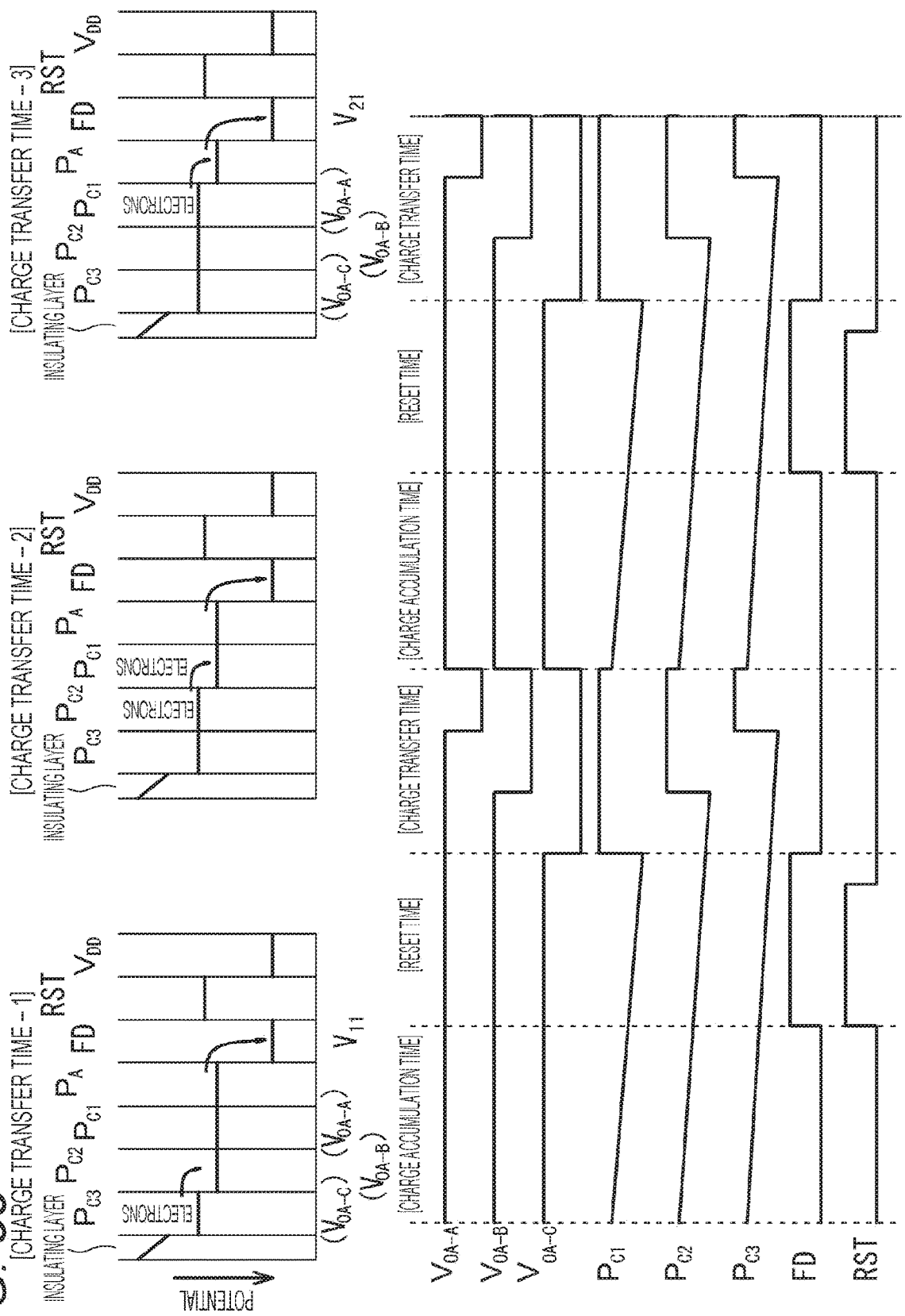
Figure 56:
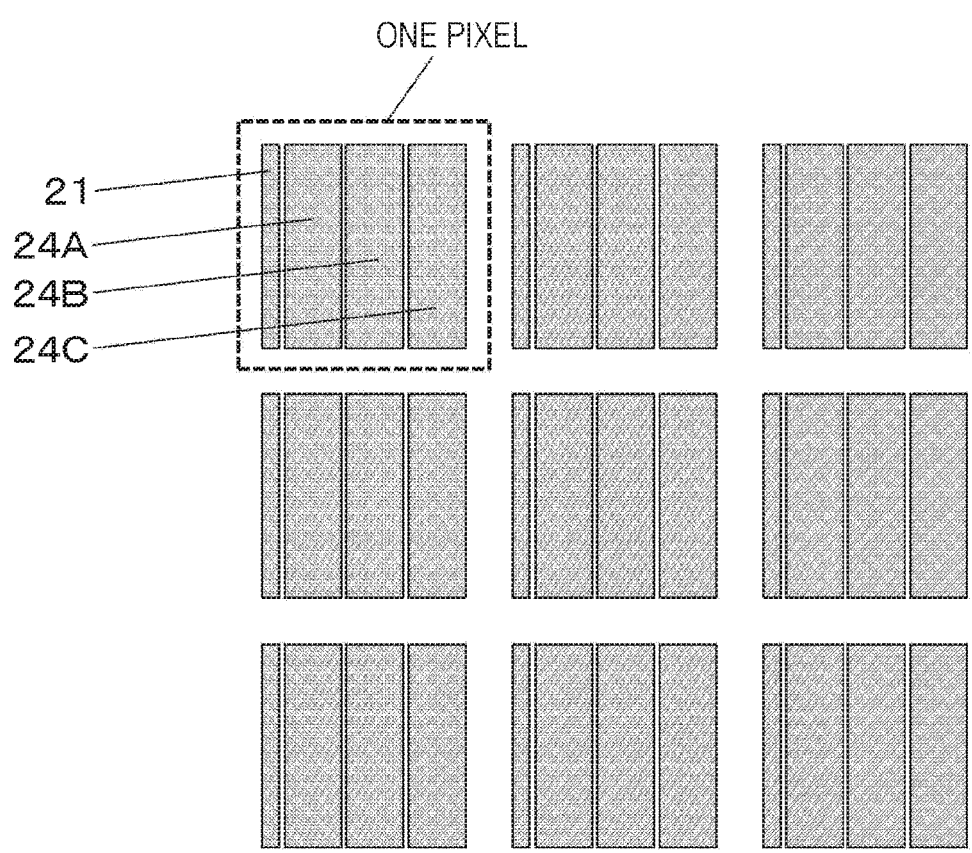
Figure 57:
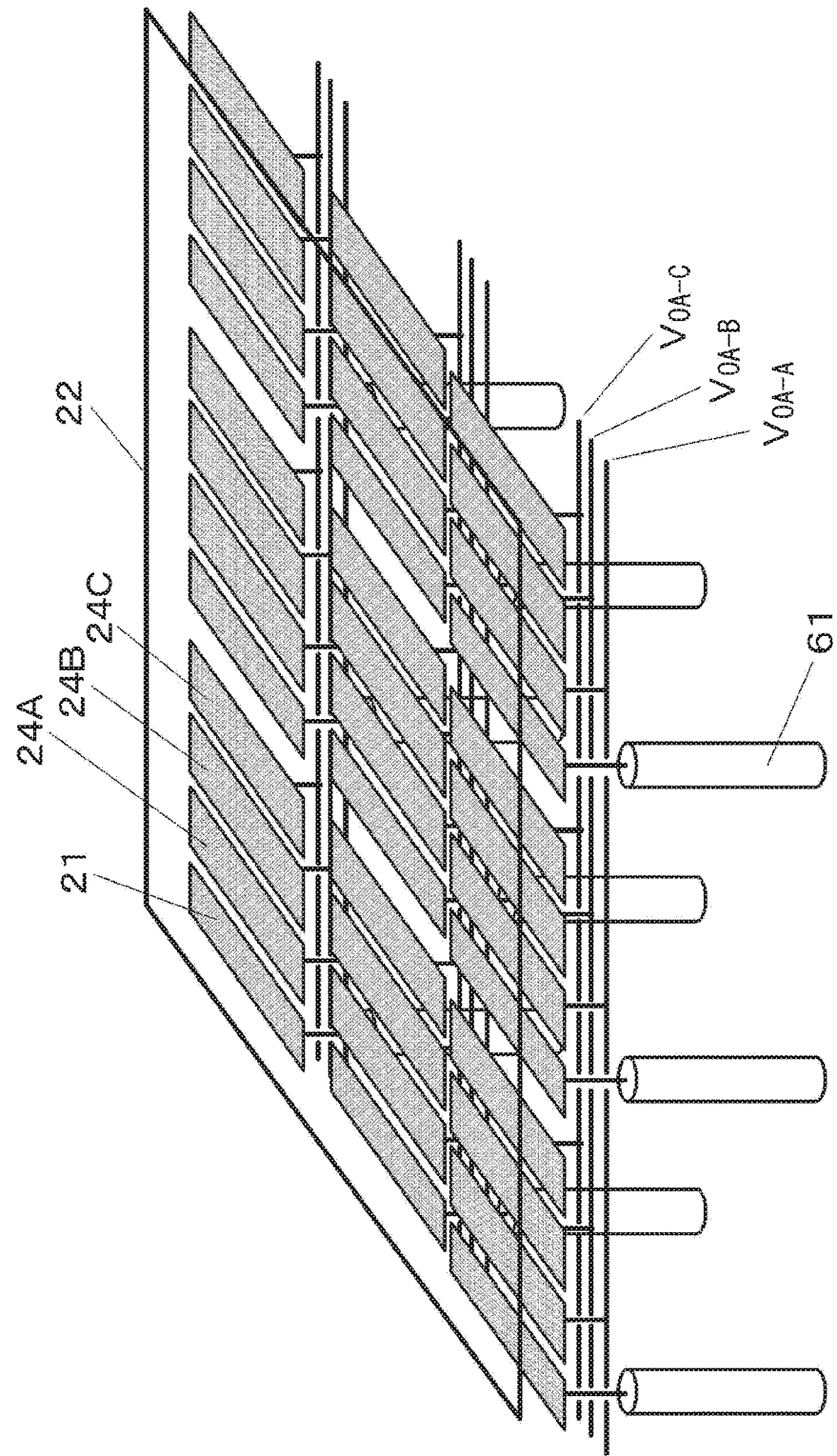

FIG. 50 shows a schematic partial cross-sectional view of part of a stacked imaging device or the like of Example 8. FIGS. 51 and 52 show equivalent circuit diagrams of the stacked imaging device or the like of Example 8. FIG. 53 shows a schematic layout diagram of a first electrode and a charge storage electrode that constitute a photoelectric conversion unit including the charge storage electrode of the stacked imaging device or the like of Example 8, and transistors that constitute a control unit. FIGS. 54 and 55 schematically shows the states of the potential at respective portions at a time of operation of the stacked imaging device or the like of Example 8. FIG. 28C shows an equivalent circuit diagram for explaining the respective portions of the stacked imaging device or the like of Example 8. Further, FIG. 56 shows a schematic layout diagram of the first electrode and the charge storage electrode that constitute the photoelectric conversion unit including the charge storage electrode of the stacked imaging device or the like of Example 8. FIG. 57 shows a schematic perspective view of the first electrode, the charge storage electrode, a second electrode, and a contact hole portion.

In Example 8, the charge storage electrode 24 is formed with a plurality of charge storage electrode segments 24A, 24B, and 24C. The number of charge storage electrode segments is two or larger, and is "3" in Example 8. Further, in the stacked imaging device or the like of Example 8, the potential of the first electrode 21 is higher than the potential of the second electrode 22, or a positive potential is applied to the first electrode 21 while a negative potential is applied to the second electrode 22, for example. Therefore, in a charge transfer period, the potential to be applied to the charge storage electrode segment 24A located closest to the first electrode 21 is higher than the potential to be applied to the charge storage electrode segment 24C located farthest from the first electrode 21. As such a potential gradient is formed in the charge storage electrode 24, electrons remaining in the region of the photoelectric conversion layer 23 facing the charge storage electrode 24 are read into the first electrode 21 and further into the first floating diffusion layer FD$_1$ with higher reliability. In other words, the electric charges accumulated in the photoelectric conversion layer 23 are read into the control unit.

Figure 54:
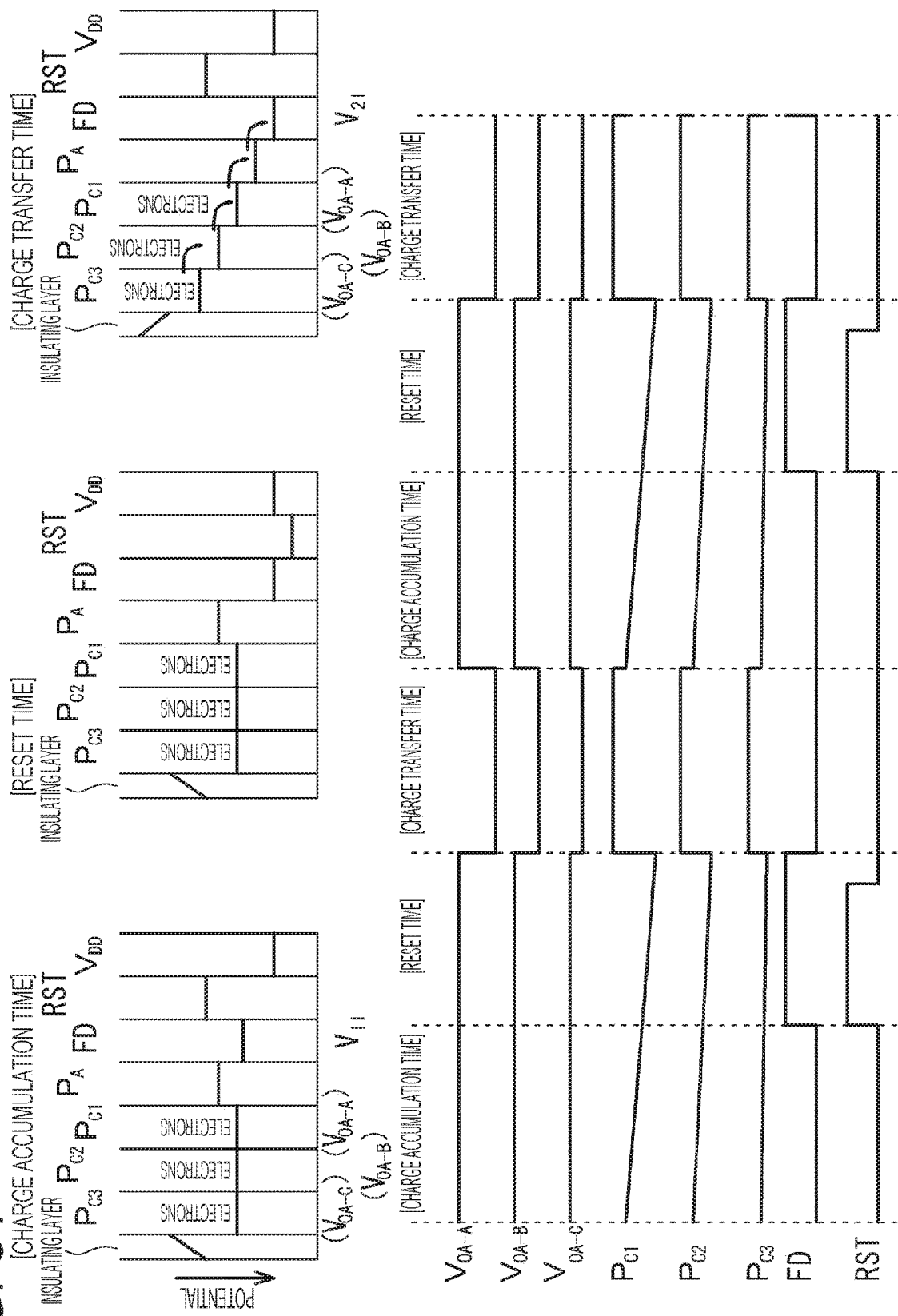

In an example shown in FIG. 54, in a charge transfer period, the potential of the charge storage electrode segment 24C<the potential of the charge storage electrode segment 24B<the potential of the charge storage electrode segment 24A. With this arrangement, the electrons remaining in the region of the photoelectric conversion layer 23 are simultaneously read into the first floating diffusion layer FD$_1$. In an example shown in FIG. 55, on the other hand, in a charge transfer period, the potential of the charge storage electrode segment 24C, the potential of the charge storage electrode segment 24B, and the potential of the charge storage electrode segment 24A are gradually varied (in other words, varied in a stepwise or slope-like manner). With this arrangement, the electrons remaining in the region of the photoelectric conversion layer 23 facing the charge storage electrode segment 24C are moved to the region of the photoelectric conversion layer 23 facing the charge storage electrode segment 24B, the electrons remaining in the region of the photoelectric conversion layer 23 facing the charge storage electrode segment 24B are then moved to the region of the photoelectric conversion layer 23 facing the charge storage electrode segment 24A, and the electrons remaining in the region of the photoelectric conversion layer 23 facing the charge storage electrode segment 24A are then read into the first floating diffusion layer FD$_1$ without fail.

Figure 58:
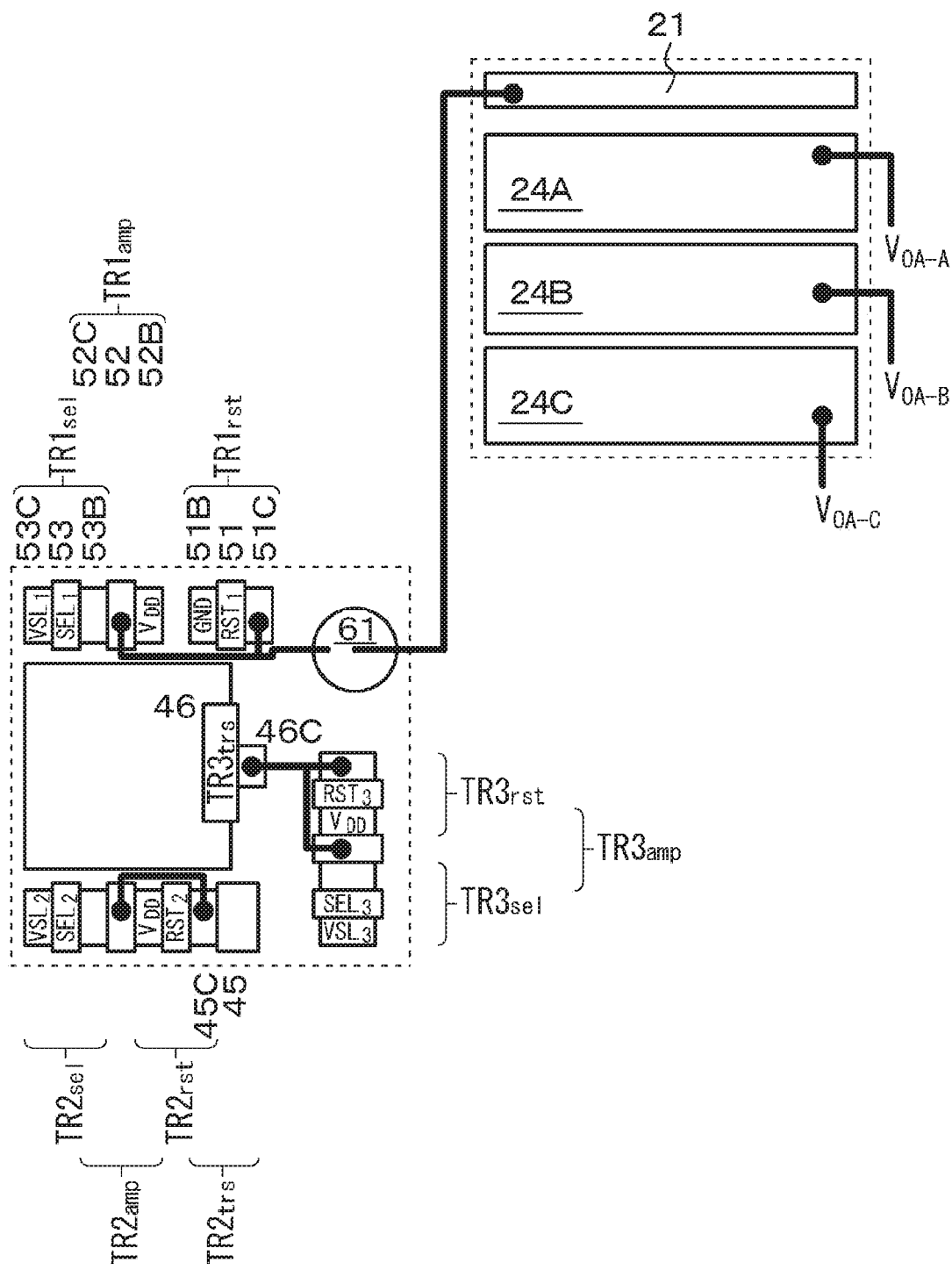

FIG. 58 shows a schematic layout diagram of the first electrode, the charge storage electrode, and the transistors constituting the control unit of a modification of a stacked imaging device or the like of Example 8. As shown in FIG. 58, the other source/drain region 51B of the reset transistor TR1$_{rst}$ may be grounded, instead of being connected to the power supply V$_{DD}$.

EXAMPLE 9

Example 9 is modifications of Examples 3 through 8, and relates to imaging devices of the first configuration and the sixth configuration.

Figure 59:
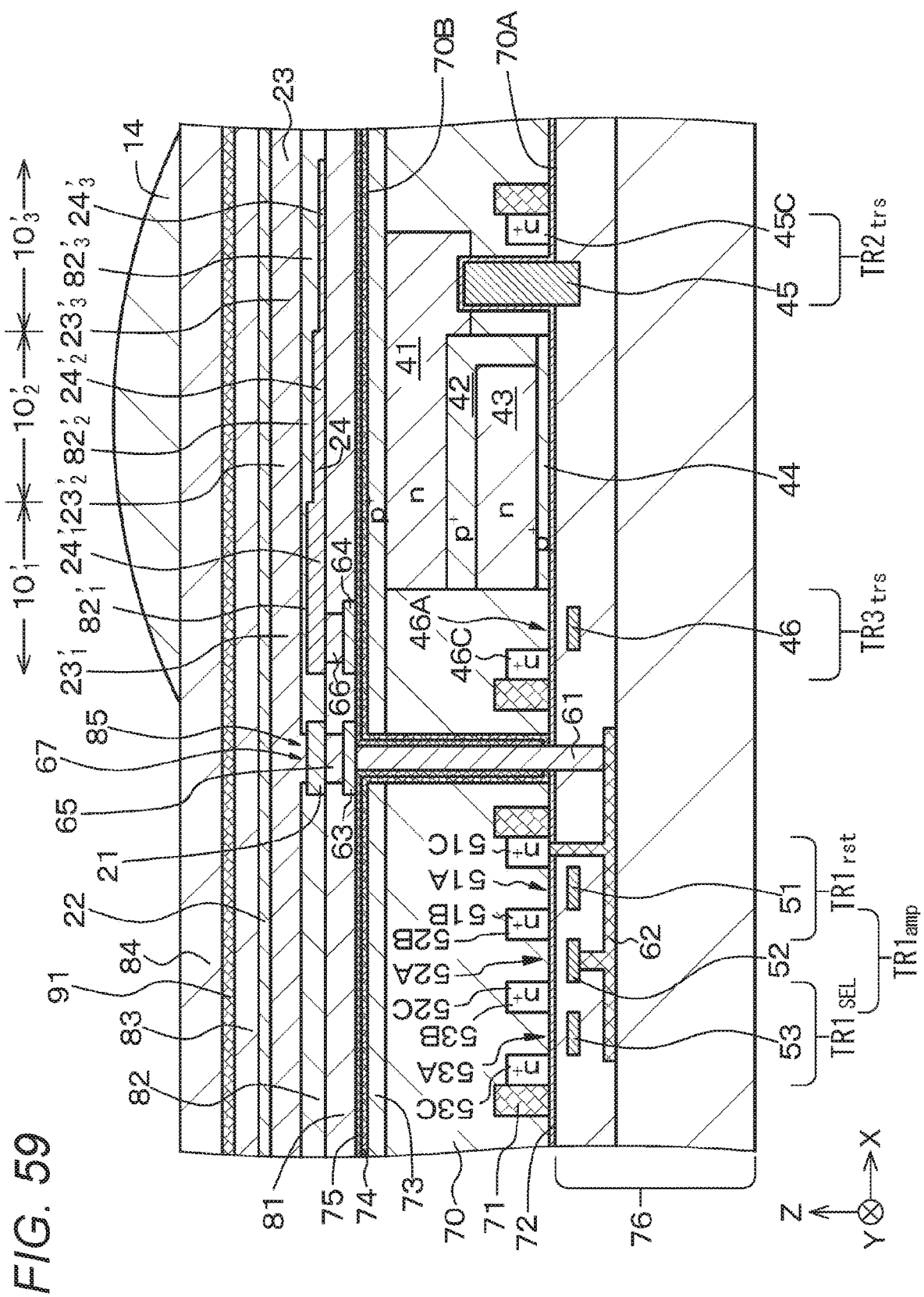
Figure 60:
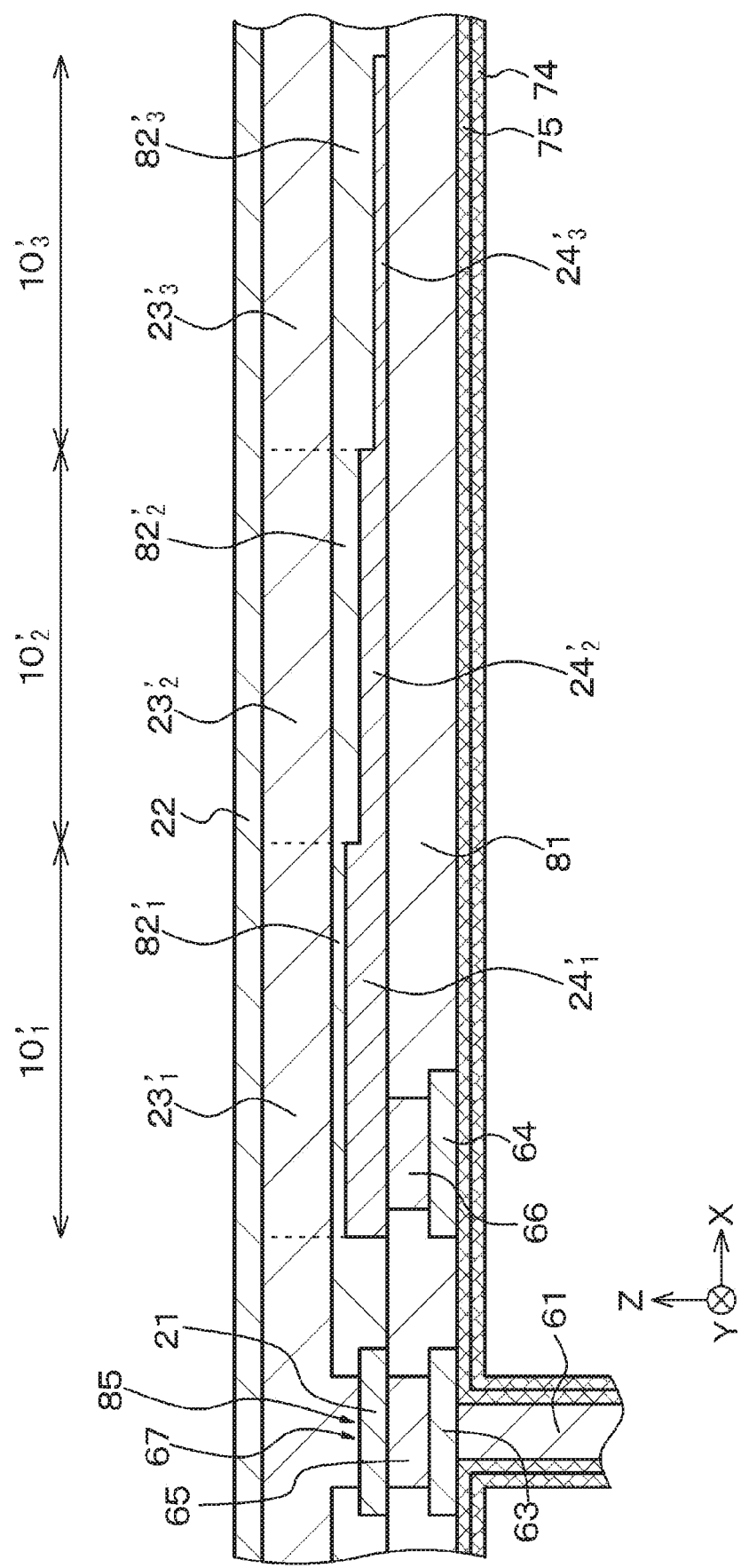

FIG. 59 shows a schematic partial cross-sectional view of a stacked imaging device or the like of Example 9. FIG. 60 shows a schematic partial cross-sectional view of an enlarged view of a portion in which a charge storage electrode, a photoelectric conversion layer, and a second electrode are stacked. An equivalent circuit diagram of the stacked imaging device or the like of Example 9 is similar to the equivalent circuit diagram of the stacked imaging device or the like of Example 3 described with reference to FIGS. 24 and 25. A schematic layout diagram of the first electrode and the charge storage electrode constituting the photoelectric conversion unit including the charge storage electrode, and the transistors constituting the control unit of the stacked imaging device or the like of Example 9 is similar to that of the stacked imaging device or the like of Example 3 described with reference to FIG. 26. Further, operation of the stacked imaging device or the like (first imaging device) of Example 9 is substantially similar to operation of the stacked imaging device or the like of Example 3.

Here, in the stacked imaging device of Example 9 or the like, or in a stacked imaging device of one of Examples 10 through 14 described later, a photoelectric conversion unit is formed with N (N≥2) photoelectric conversion unit segments (specifically, three photoelectric conversion unit segments 10'$_1$, 10'$_2$, and 10'$_3$), the photoelectric conversion layer 23 is formed with N photoelectric conversion layer segments (specifically, three photoelectric conversion layer segments 23'$_1$, 23'$_2$, and 23'$_3$), the insulating layer 82 includes N insulating layer segments (specifically, three insulating layer segments 82'$_1$, 82'$_2$, and 82'$_3$), In Examples 9 through 11, the charge storage electrode 24 is formed with N charge storage electrode segments (specifically, three charge storage electrode segments 24'$_1$, 24'$_2$, and 24'$_3$ in each of these Examples), In Examples 12 and 13, and in Example 11 in some cases, the charge storage electrode 24 is formed with N charge storage electrode segments (specifically, three charge storage electrode segments 24'$_1$, 24'$_2$, and 24'$_3$) that are disposed at a distance from one another, the nth (n=1, 2, 3, . . . N) photoelectric conversion unit segment 10'$_n$ is formed with the nth charge storage electrode segment 24'$_n$, the nth insulating layer segment 82'$_n$, and the nth photoelectric conversion layer segments 23'$_n$, and a photoelectric conversion unit segment having a larger value for n is located farther away from the first electrode 21.

Alternatively, the stacked imaging device of Example 9, or a stacked imaging device or the like of Example 10 or 13 described later further includes a photoelectric conversion unit in which the first electrode 21, the photoelectric conversion layer 23, and the second electrode 22 are stacked.

the photoelectric conversion unit further includes the charge storage electrode 24 that is disposed at a distance from the first electrode 21, and is positioned to face the photoelectric conversion layer 23 via the insulating layer 82.

Where the stacking direction of the charge storage electrode 24, the insulating layer 82, and the photoelectric conversion layer 23 is the Z direction, and the direction away from the first electrode 21 is the X direction, cross-sectional areas of the stacked portions of the charge storage electrode 24, the insulating layer 82, and the photoelectric conversion layer 23 taken along a Y-Z virtual plane vary depending on the distance from the first electrode.

Further, in the stacked imaging device or the like of Example 9, the thicknesses of the insulating layer segments gradually vary from the first photoelectric conversion unit segment 10'$_1$ to the Nth photoelectric conversion unit segment 10'$_N$. Specifically, the thicknesses of the insulating layer segments are made gradually greater. Alternatively, in the stacked imaging device or the like of Example 9, the widths of cross-sections of the stacked portions are constant, and the thickness of a cross-section of a stacked portion, or specifically, the thickness of an insulating layer segment gradually increases depending on the distance from the first electrode 21. Note that the thicknesses of the insulating layer segments are increased stepwise. The thickness of the insulating layer segment 82'$_n$ in the nth photoelectric conversion unit segment 10'$_n$ is constant. Where the thickness of the insulating layer segment 82'$_n$ in the nth photoelectric conversion unit segment 10'$_n$ is "1", the thickness of the insulating layer segment 82'$_{(n+1)}$ in the (n+1)th photoelectric conversion unit segment 10'$_{(n+1)}$ may be 2 to 10, for example, but is not limited to these values. In Example 9, the thicknesses of the charge storage electrode segments 24'$_1$, 24'$_2$, and 24'$_3$ are made to become gradually smaller, so that the thicknesses of the insulating layer segments 82'$_1$, 82'$_2$, and 82'$_3$ become gradually greater. The thicknesses of the photoelectric conversion layer segments 23'$_1$, 23'$_2$, and 23'$_3$ are uniform.

In the description below, operation of the stacked imaging device or the like of Example 9 is described.

In a charge accumulation period, the drive circuit applies a potential $V_{11}$ to the first electrode 21, and a potential $V_{12}$ to the charge storage electrode 24. Light that has entered the photoelectric conversion layer 23 causes photoelectric conversion in the photoelectric conversion layer 23. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{12} \geq V_{11}$, or preferably, $V_{12} > V_{11}$. As a result, electrons generated by the photoelectric conversion are attracted to the charge storage electrode 24, and stay in the region of the photoelectric conversion layer 23 facing the charge storage electrode 24. In other words, electric charges are accumulated in the photoelectric conversion layer 23. Since $V_{12} > V_{11}$, electrons generated in the photoelectric conversion layer 23 will not move toward the first electrode 21. With the passage of time for photoelectric conversion, the potential in the region of the photoelectric conversion layer 23 facing the charge storage electrode 24 becomes a more negative value.

The stacked imaging device or the like of Example 9 has a configuration in which the thicknesses of the insulating layer segments gradually increase. Accordingly, in a charge accumulation period, when $V_{12} \geq V_{11}$, the nth photoelectric conversion unit segment $10'_n$ can store more electric charges than the (n+1)th photoelectric conversion unit segment $10'_{(n+1)}$, and a strong electric field is applied so that electric charges can be reliably prevented from flowing from the first photoelectric conversion unit segment $10'_1$ toward the first electrode 21.

A reset operation is performed in the latter period in the charge accumulation period. As a result, the potential of the first floating diffusion layer $FD_1$ is reset, and the potential of the first floating diffusion layer $FD_1$ becomes the potential $V_{DD}$ of the power supply.

After completion of the reset operation, the electric charges are read out. In other words, in a charge transfer period, the drive circuit applies a potential $V_{21}$ to the first electrode 21, and a potential $V_{22}$ to the charge storage electrode 24. Here, $V_{21} > V_{22}$. As a result, the electrons remaining in the region of the photoelectric conversion layer 23 facing the charge storage electrode 24 are read into the first electrode 21 and further into the first floating diffusion layer $FD_1$. In other words, the electric charges accumulated in the photoelectric conversion layer 23 are read into the control unit.

More specifically, when $V_{21} > V_{22}$ in a charge transfer period, it is possible to reliably secure the flow of electric charges from the first photoelectric conversion unit segment $10'_1$ toward the first electrode 21, and the flow of electric charges from the (n+1)th photoelectric conversion unit segment $10'_{(n+1)}$ toward the nth photoelectric conversion unit segment $10'_n$.

In the above manner, a series of operations including charge accumulation, reset operation, and charge transfer is completed.

In a stacked imaging device or the like of Example 9, a kind of charge transfer gradient is formed, and the electric charges generated through photoelectric conversion can be transferred more easily and reliably, because the thicknesses of the insulating layer segments gradually vary from the first photoelectric conversion unit segment to the Nth photoelectric conversion unit segment, or because cross-sectional areas of the stacked portions of the charge storage electrode, the insulating layer, and the photoelectric conversion layer taken along a Y-Z virtual plane vary depending on the distance from the first electrode.

A stacked imaging device or the like of Example 9 can be manufactured by a method substantially similar to the method for manufacturing a stacked imaging device or the like of Example 3, and therefore, detailed explanation thereof is not made herein.

Note that, in a stacked imaging device or the like of Example 9, to form the first electrode 21, the charge storage electrode 24, and the insulating layer 82, a conductive material layer for forming the charge storage electrode $24'_3$ is first formed on the interlayer insulating layer 81, and patterning is performed on the conductive material layer, to leave the conductive material layer in the regions in which the photoelectric conversion unit segments $10'_1$, $10'_2$, and $10'_3$ and the first electrode 21 are to be formed. In this manner, part of the first electrode 21 and the charge storage electrode $24'_3$ can be obtained. An insulating layer for forming the insulating layer segment $82'_3$ is then formed on the entire surface, patterning is performed on the insulating layer, and a planarization process is performed, to obtain the insulating layer segment $82'_3$. A conductive material layer for forming the charge storage electrode $24'_2$ is then formed on the entire surface, and patterning is performed on the conductive material layer, to leave the conductive material layer in the regions in which the photoelectric conversion unit segments $10'_1$ and $10'_2$ and the first electrode 21 are to be formed. In this manner, part of the first electrode 21 and the charge storage electrode $24'_2$ can be obtained. An insulating layer for forming the insulating layer segment $82'_2$ is then formed on the entire surface, patterning is performed on the insulating layer, and a planarization process is performed, to obtain the insulating layer segment $82'_2$. A conductive material layer for forming the charge storage electrode $24'_1$ is then formed on the entire surface, and patterning is performed on the conductive material layer, to leave the conductive material layer in the regions in which the photoelectric conversion unit segment $10'_1$ and the first electrode 21 are to be formed. In this manner, the first electrode 21 and the charge storage electrode $24'_1$ can be obtained. An insulating layer is then formed on the entire surface, and a planarization process is performed, to obtain the insulating layer segment $82'_1$ (the insulating layer 82). The photoelectric conversion layer 23 is then formed on the insulating layer 82. Thus, the photoelectric conversion unit segments $10'_1$, $10'_2$, and $10'_3$ can be obtained.

Figure 61:
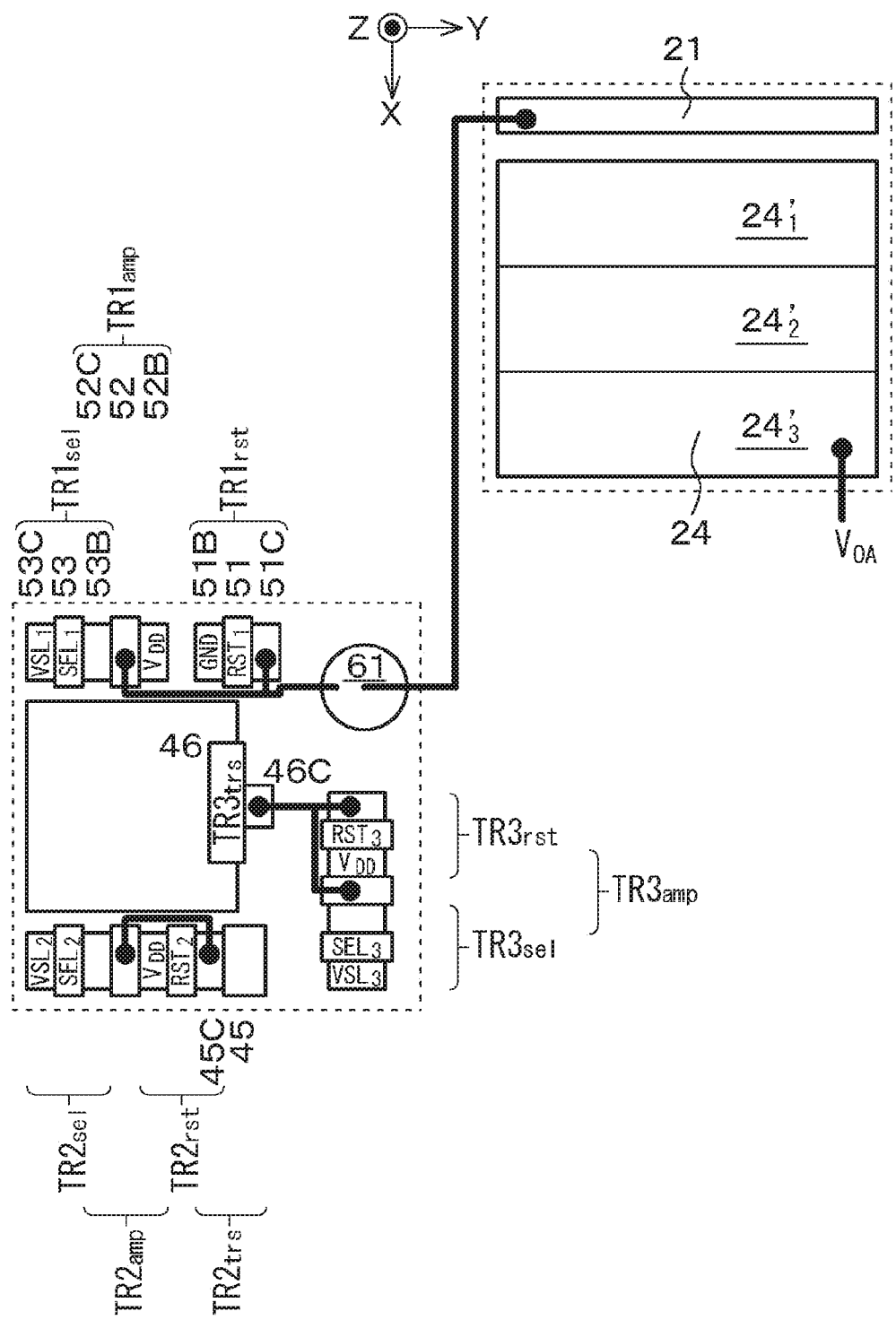

FIG. 61 shows a schematic layout diagram of the first electrode, the charge storage electrode, and the transistors constituting the control unit of a modification of a stacked imaging device or the like of Example 9. As shown in FIG. 61, the other source/drain region 51B of the reset transistor $TR1_{rst}$ may be grounded, instead of being connected to the power supply $V_{DD}$.

EXAMPLE 10

Figure 62:
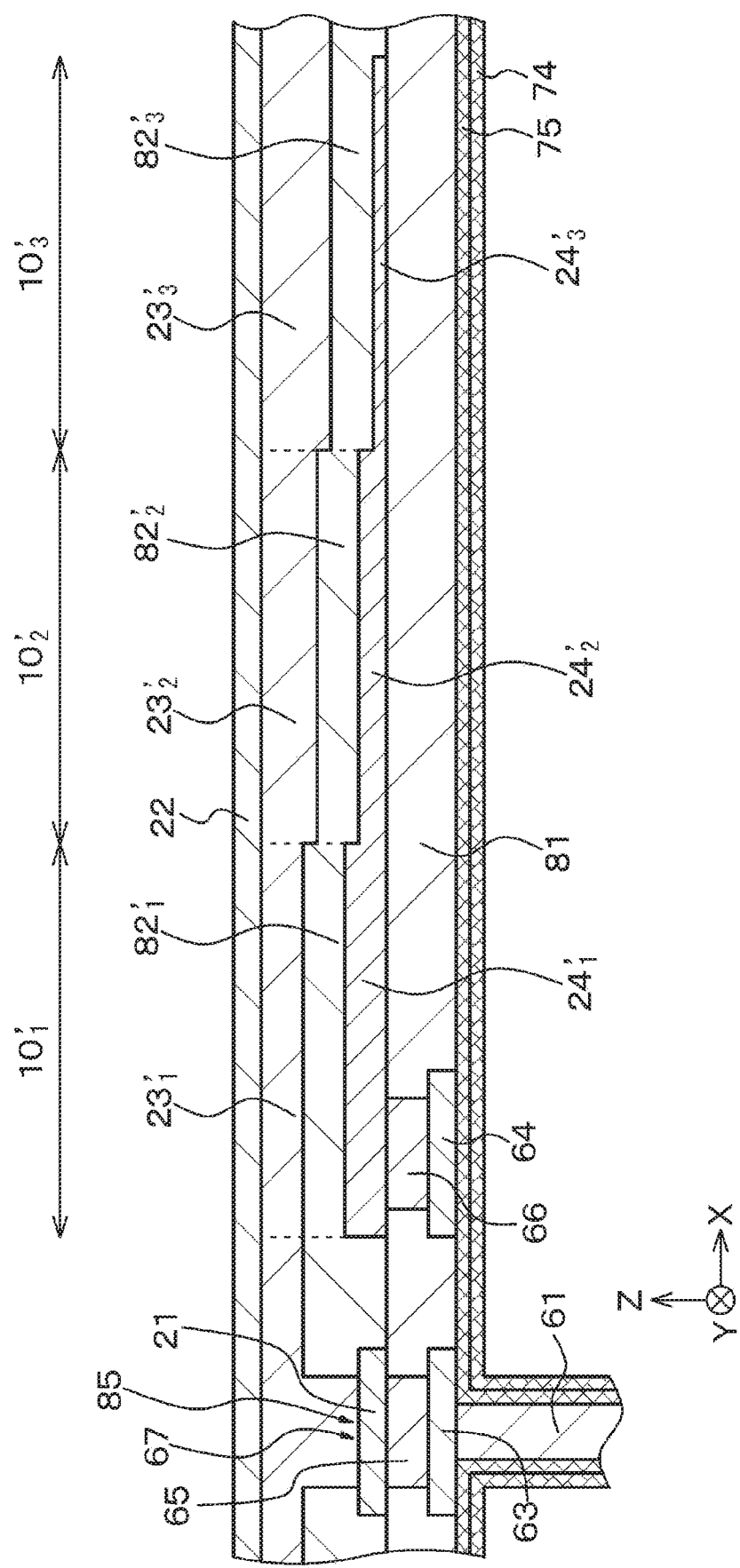

Stacked imaging devices or the like of Example 10 relate to imaging devices of the second configuration and the sixth configuration of the present disclosure. FIG. 62 is a schematic partial cross-sectional view showing an enlarged view of the portion in which the charge storage electrode, the photoelectric conversion layer, and the second electrode are stacked. As shown in FIG. 62, in the stacked imaging device or the like of Example 10, the thicknesses of the photoelectric conversion layer segments gradually vary from the first photoelectric conversion unit segment $10'_1$ to the Nth photoelectric conversion unit segment $10'_N$. Alternatively, in the stacked imaging device or the like of Example 10, the widths of cross-sections of the stacked portions are constant, and the thickness of a cross-section of a stacked portion, or specifically, the thickness of a photoelectric conversion layer segment gradually increases depending on the distance from the first electrode 21. More specifically, the thicknesses of the photoelectric conversion layer segments are made gradually greater. Note that the thicknesses of the photoelectric conversion layer segments are increased stepwise. The thickness of the photoelectric conversion layer segment $23'_n$ in the nth photoelectric conversion unit segment $10'_n$ is constant. Where the thickness of the photoelectric conversion layer segment $23'_n$ in the nth photoelectric conversion unit segment $10'_n$ is "1", the thickness of the photoelectric conversion layer segment $23'_{(n+1)}$ in the (n+1)th photoelectric conversion unit segment $10'_{(n+1)}$ may be 2 to 10, for example, but is not limited to these values. In Example 10, the thicknesses of the charge storage electrode segments $24'_1$, $24'_2$, and $24'_3$ are made to become gradually smaller, so that the thicknesses of the photoelectric conversion layer segments $23'_1$, $23'_2$, and $23'_3$ become gradually greater. The thicknesses of the insulating layer segments $82'_1$, $82'_2$, and $82'_3$ are uniform.

In the stacked imaging device or the like of Example 10, the thicknesses of the photoelectric conversion layer segments gradually increase. Accordingly, in a charge accumulation period, when $V_{12} \geq V_{11}$, a stronger electric field is applied to the nth photoelectric conversion unit segment $10'_n$ than to the (n+1)th photoelectric conversion unit segment $10'_{(n+1)}$, and electric charges can be reliably prevented from flowing from the first photoelectric conversion unit segment $10'_1$ toward the first electrode 21. Further, when $V_{22} < V_{21}$ in a charge transfer period, it is possible to reliably secure the flow of electric charges from the first photoelectric conversion unit segment $10'_1$ toward the first electrode 21, and the flow of electric charges from the (n+1)th photoelectric conversion unit segment $10'_{(n+1)}$ toward the nth photoelectric conversion unit segment $10'_n$.

As described above, in a stacked imaging device or the like of Example 10, a kind of charge transfer gradient is formed, and the electric charges generated through photoelectric conversion can be transferred more easily and reliably, because the thicknesses of the photoelectric conversion layer segments gradually vary from the first photoelectric conversion unit segment to the Nth photoelectric conversion unit segment, or because cross-sectional areas of the stacked portions of the charge storage electrode, the insulating layer, and the photoelectric conversion layer taken along a Y-Z virtual plane vary depending on the distance from the first electrode.

In a stacked imaging device or the like of Example 10, to form the first electrode 21, the charge storage electrode 24, the insulating layer 82, and the photoelectric conversion layer 23, a conductive material layer for forming the charge storage electrode $24'_3$ is first formed on the interlayer insulating layer 81, and patterning is performed on the conductive material layer, to leave the conductive material layer in the regions in which the photoelectric conversion unit segments $10'_1$, $10'_2$, and $10'_3$ and the first electrode 21 are to be formed. In this manner, part of the first electrode 21 and the charge storage electrode $24'_3$ can be obtained. A conductive material layer for forming the charge storage electrode $24'_2$ is then formed on the entire surface, and patterning is performed on the conductive material layer, to leave the conductive material layer in the regions in which the photoelectric conversion unit segments $10'_1$ and $10'_2$ and the first electrode 21 are to be formed. In this manner, part of the first electrode 21 and the charge storage electrode $24'_2$ can be obtained. A conductive material layer for forming the charge storage electrode $24'_1$ is then formed on the entire surface, and patterning is performed on the conductive material layer, to leave the conductive material layer in the regions in which the photoelectric conversion unit segment $10'_1$ and the first electrode 21 are to be formed. In this manner, the first electrode 21 and the charge storage electrode $24'_1$ can be obtained. The insulating layer 82 is then formed conformally on the entire surface. The photoelectric conversion layer 23 is then formed on the insulating layer 82, and a planarization process is performed on the photoelectric conversion layer 23. Thus, the photoelectric conversion unit segments $10'_1$, $10'_2$, and $10'_3$ can be obtained.

EXAMPLE 11

Figure 63:
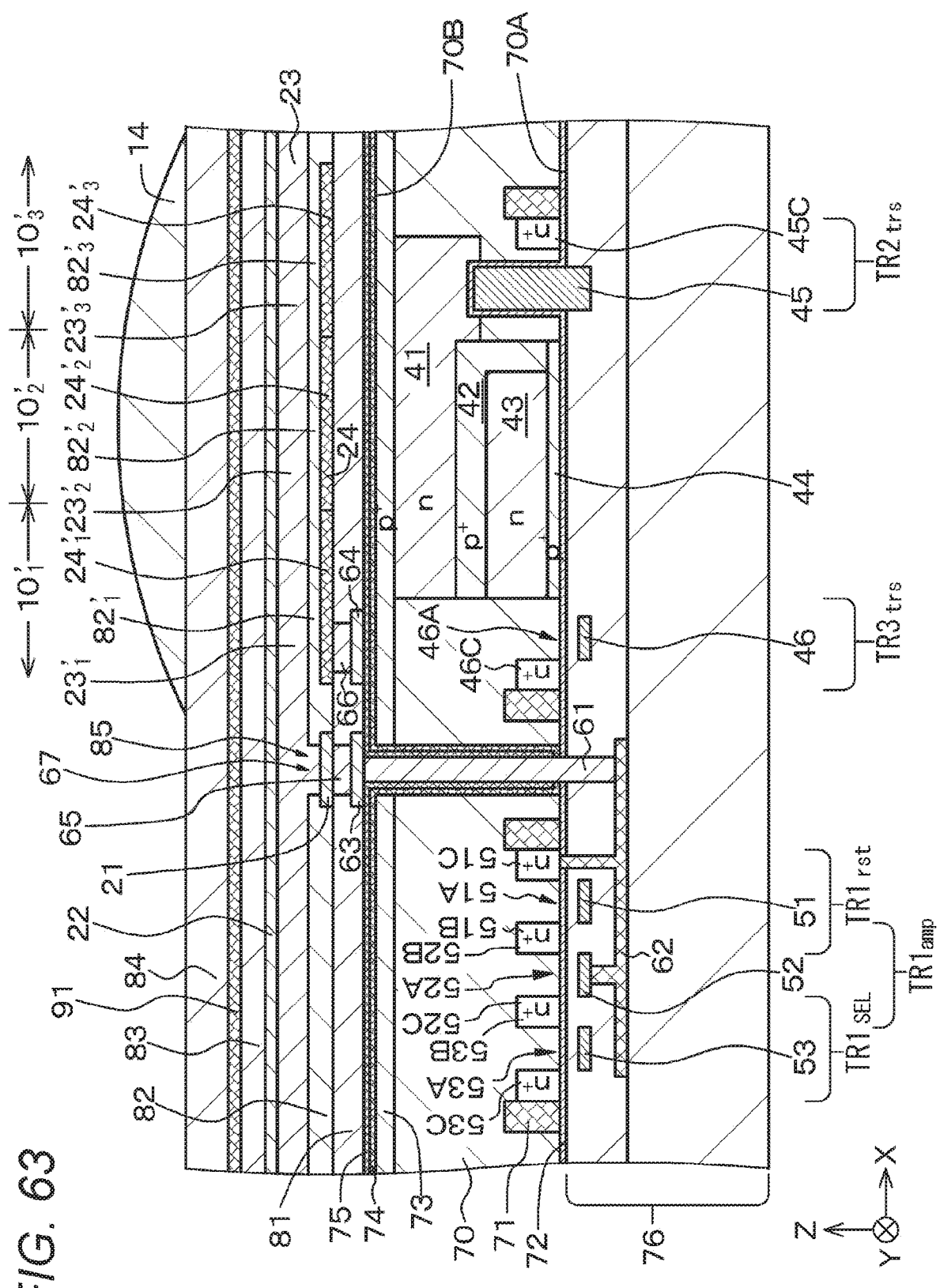

Example 11 relates to an imaging device of the third configuration. FIG. 63 shows a schematic partial cross-sectional view of a stacked imaging device or the like of Example 11. In a stacked imaging device or the like of Example 11, the material forming the insulating layer segment is different between adjacent photoelectric conversion unit segments. Here, the values of the relative dielectric constants of the insulating layer segments are gradually reduced from the first photoelectric conversion unit segment $10'_1$ to the Nth photoelectric conversion unit segment $10'_N$. In a stacked imaging device or the like of Example 11, the same potential may be applied to all of the N charge storage electrode segments, or different potentials may be applied to the respective N charge storage electrode segments. In the latter case, the charge storage electrode segments $24'_1$, $24'_2$, and $24'_3$ that are disposed at a distance from one another are only required to be connected to the vertical drive circuit 112 forming the drive circuit, via pad portions $64_1$, $64_2$, and $64_3$, as in a manner similar to that described later in Example 12.

Then, as such a configuration is adopted, a kind of charge transfer gradient is formed, and, when $V_{12} > V_{11}$ in a charge accumulation period, the nth photoelectric conversion unit segment can store more electric charges than the (n+1) the photoelectric conversion unit segment. Further, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

EXAMPLE 12

Figure 64:
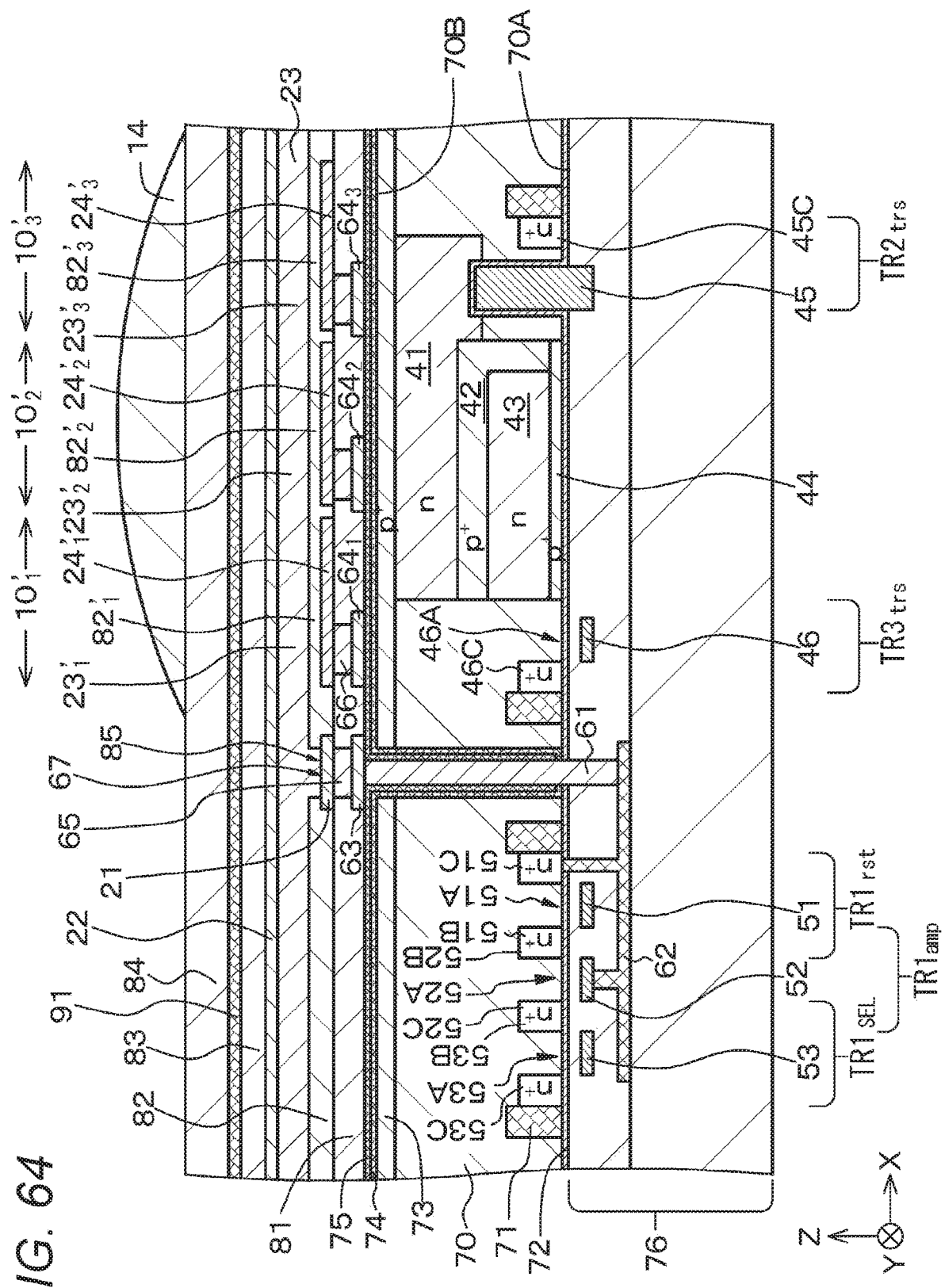
Figure 65A:
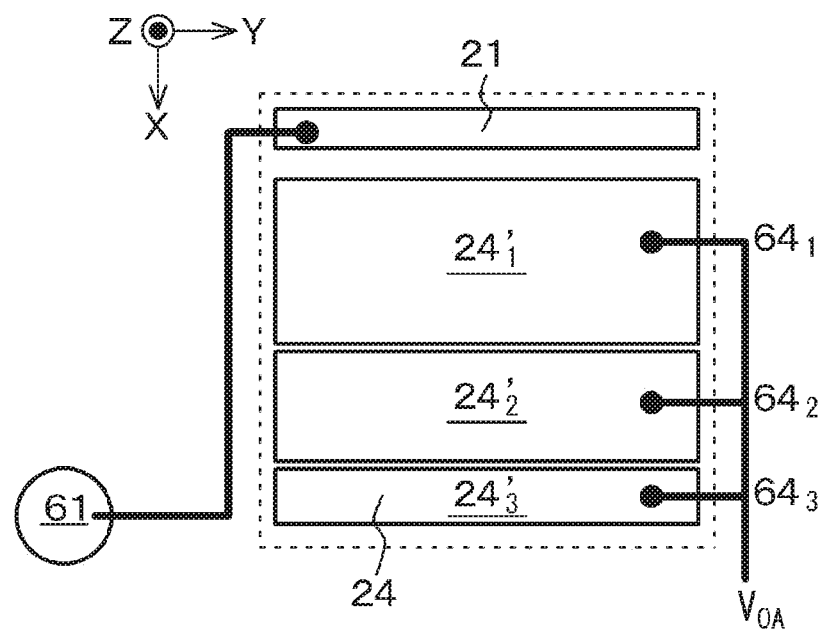
FIGS. 65A and 65B are schematic plan views of a charge storage electrode segment in Example 13.
Figure 65B:
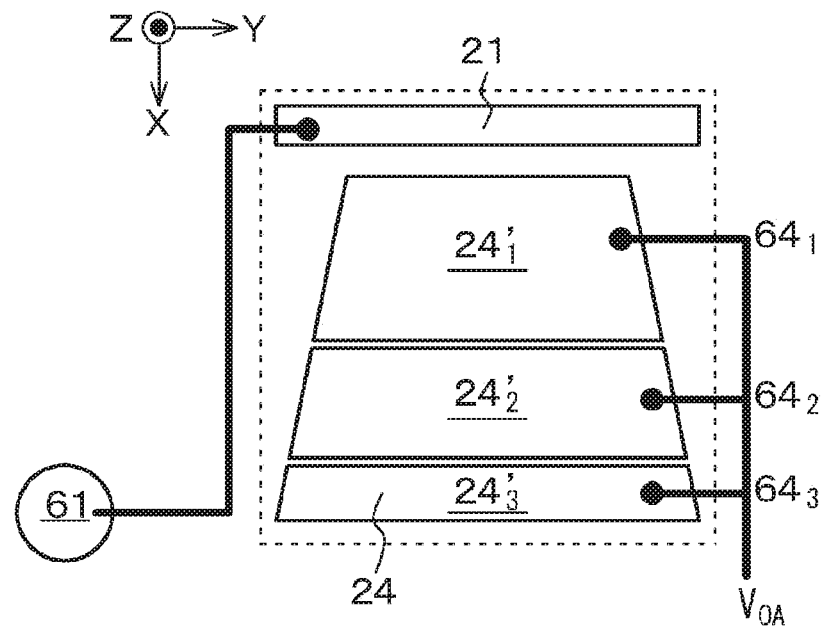
Figure 66A:
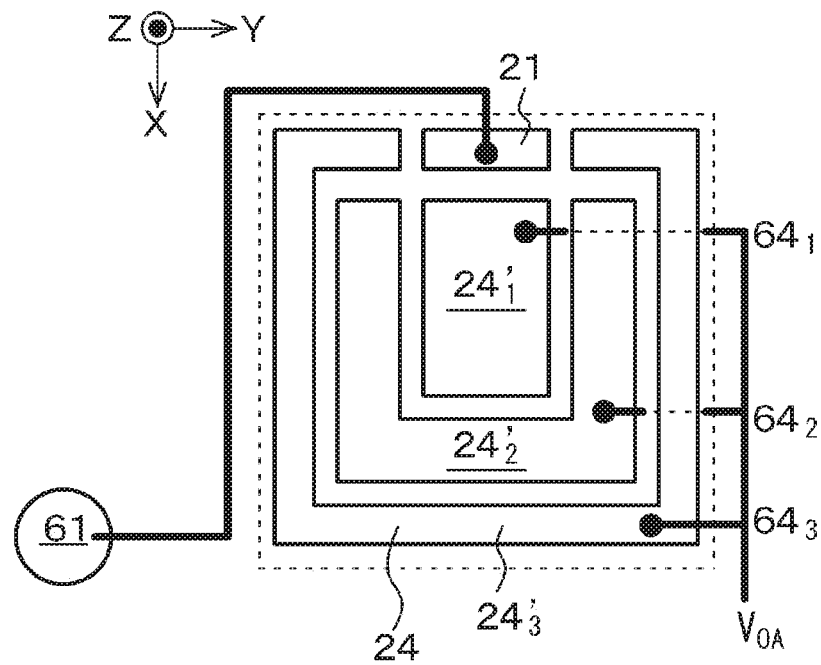
FIGS. 66A and 66B are schematic plan views of a charge storage electrode segment in Example 13.
Figure 66B:
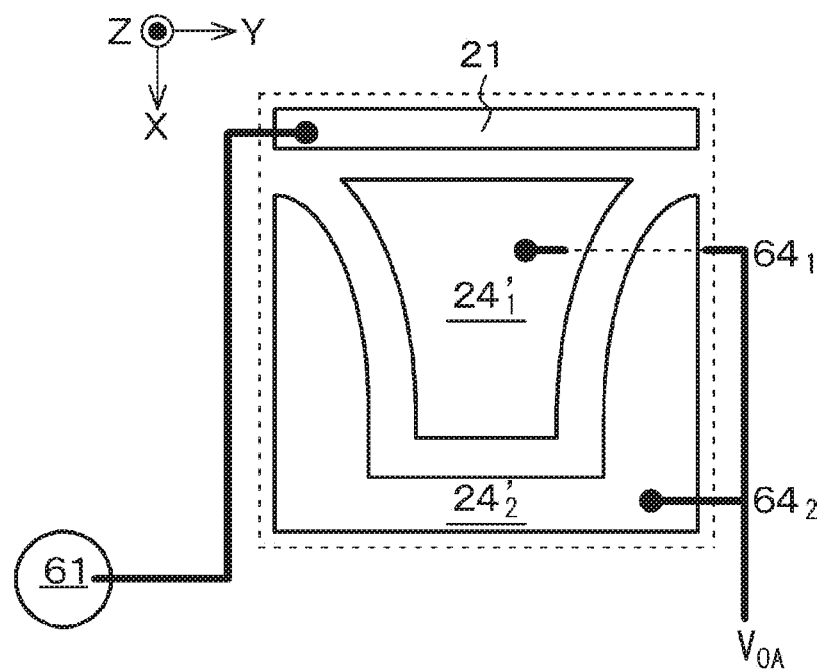

Example 12 relates to an imaging device of the fourth configuration. FIG. 64 shows a schematic partial cross-sectional view of a stacked imaging device or the like of Example 12. In a stacked imaging device or the like of Example 12, the material forming the charge storage electrode segment is different between adjacent photoelectric conversion unit segments. Here, the values of the work functions of the insulating layer segments are gradually increased from the first photoelectric conversion unit segment $10'_1$ to the Nth photoelectric conversion unit segment $10'_N$. In a stacked imaging device or the like of Example 12, the same potential may be applied to all of the N charge storage electrode segments, or different potentials may be applied to the respective N charge storage electrode segments. In the latter case, the charge storage electrode segments $24'_1$, $24'_2$, and $24'_3$ are connected to the vertical drive circuit 112 forming the drive circuit, via pad portions $64_1$, $64_2$, and $64_3$.

EXAMPLE 13

Figure 67:
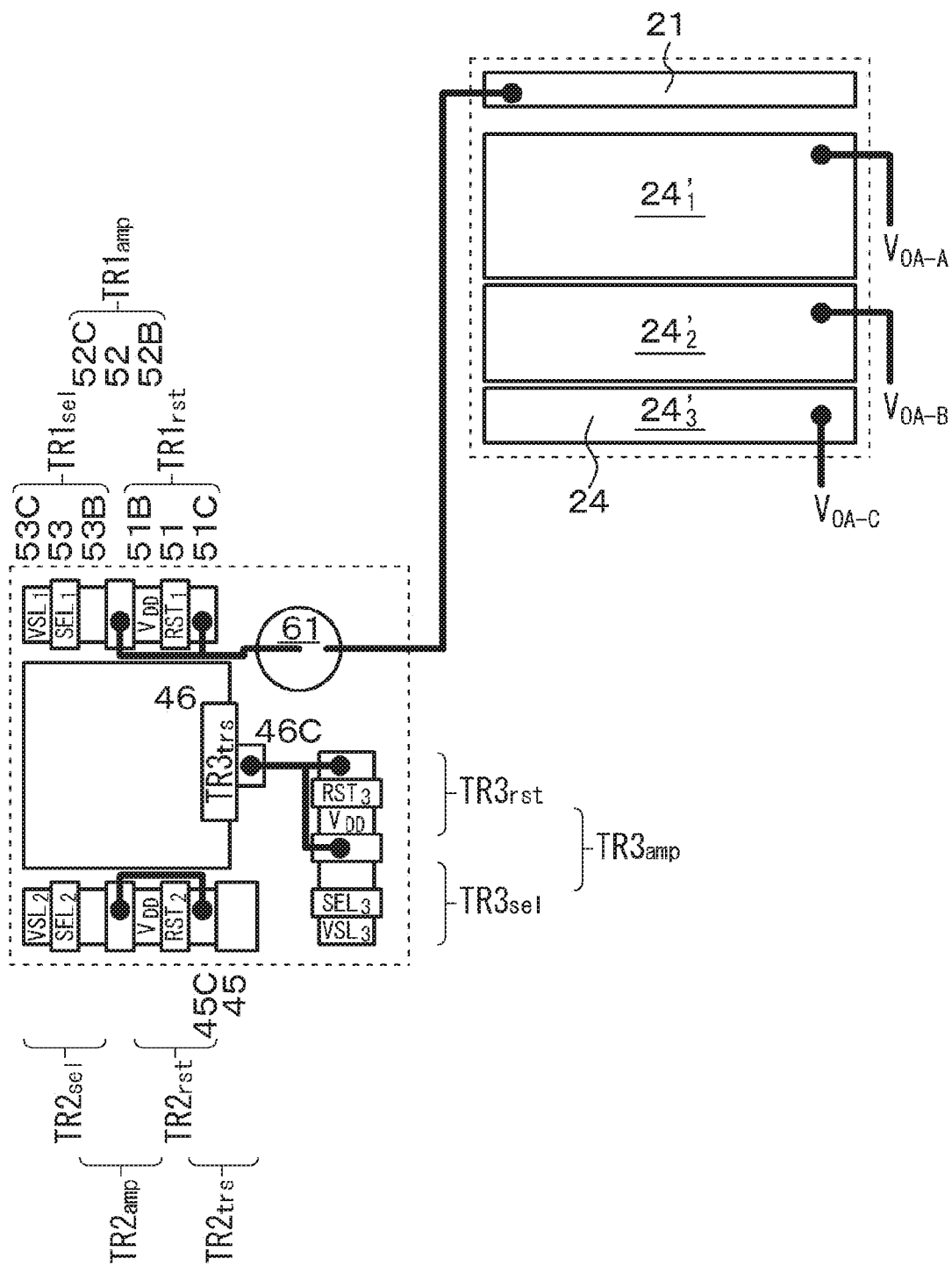

Stacked imaging devices or the like of Example 13 relate to imaging devices of the fifth configuration. FIGS. 65A, 65B, 66A, and 66B show schematic plan views of charge storage electrode segments in Example 13. FIG. 67 shows a schematic layout diagram of the first electrode and the charge storage electrode that constitute the photoelectric conversion unit including the charge storage electrode of a stacked imaging device or the like of Example 13, and the transistors that constitute the control unit. A schematic partial cross-sectional view of a stacked imaging device or the like of Example 13 is similar to that shown in FIG. 64 or 69. In a stacked imaging device or the like of Example 13, the areas of the charge storage electrode segments are gradually reduced from the first photoelectric conversion unit segment $10'_1$ to the Nth photoelectric conversion unit segment $10'_N$. In a stacked imaging device or the like of Example 13, the same potential may be applied to all of the N charge storage electrode segments, or different potentials may be applied to the respective N charge storage electrode segments. Specifically, the charge storage electrode segments $24'_1$, $24'_2$, and $24'_3$ that are disposed at a distance from one another are only required to be connected to the vertical drive circuit 112 forming the drive circuit, via pad portions $64_1$, $64_2$, and $64_3$, as in a manner similar to that described in Example 12.

In Example 13, the charge storage electrode 24 is formed with a plurality of charge storage electrode segment $24'_1$, and $24'_2$, and $24'_3$. The number of charge storage electrode segments is two or larger, and is "3" in Example 13. Further, in a stacked imaging device or the like of Example 13, the potential of the first electrode 21 is higher than the potential of the second electrode 22, or a positive potential is applied to the first electrode 21 while a negative potential is applied to the second electrode 22, for example. Therefore, in a charge transfer period, the potential to be applied to the charge storage electrode segment $24'_1$ located closest to the first electrode 21 is higher than the potential to be applied to the charge storage electrode segment $24'_3$ located farthest from the first electrode 21. As such a potential gradient is formed in the charge storage electrode 24, electrons remaining in the region of the photoelectric conversion layer 23 facing the charge storage electrode 24 are read into the first electrode 21 and further into the first floating diffusion layer $FD_1$ with higher reliability. In other words, the electric charges accumulated in the photoelectric conversion layer 23 are read into the control unit.

Then, in a charge transfer period, the potential of the charge storage electrode segment $24'_3$<the potential of the charge storage electrode segment $24'_2$<the potential of the charge storage electrode segment $24'_1$. With this arrangement, the electrons remaining in the region of the photoelectric conversion layer 23 are simultaneously read into the first floating diffusion layer $FD_1$. Alternatively, in a charge transfer period, the potential of the charge storage electrode segment $24'_3$, the potential of the charge storage electrode segment $24'_2$, and the potential of the charge storage electrode segment $24'_1$ are gradually varied (in other words, varied in a stepwise or slope-like manner). With this arrangement, the electrons remaining in the region of the photoelectric conversion layer 23 facing the charge storage electrode segment $24'_3$ are moved to the region of the photoelectric conversion layer 23 facing the charge storage electrode segment $24'_2$, the electrons remaining in the region of the photoelectric conversion layer 23 facing the charge storage electrode segment $24'_2$ are then moved to the region of the photoelectric conversion layer 23 facing the charge storage electrode segment $24'_1$, and the electrons remaining in the region of the photoelectric conversion layer 23 facing the charge storage electrode segment $24'_1$ are then read into the first floating diffusion layer $FD_1$ without fail.

Figure 68:
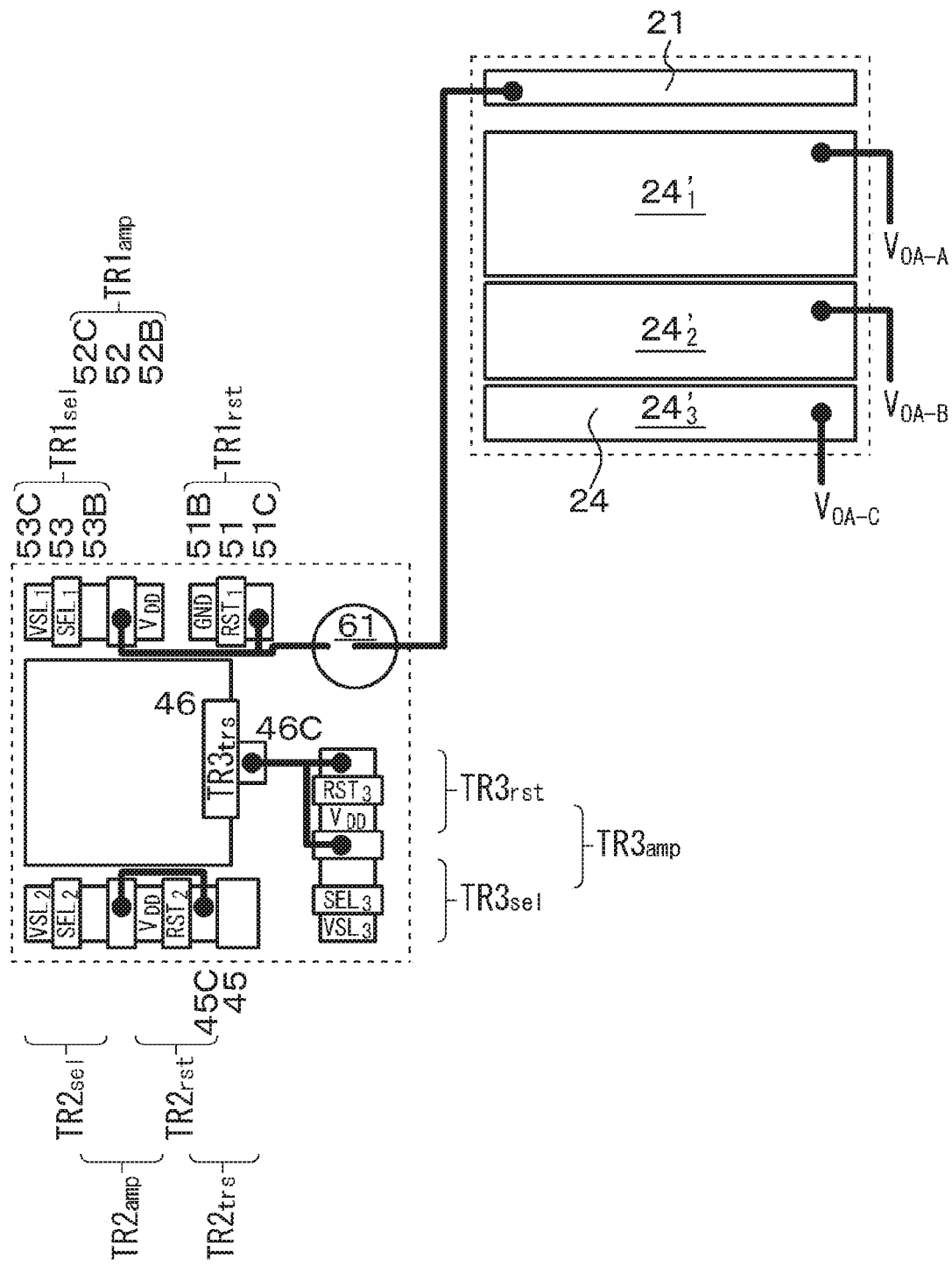

FIG. 68 shows a schematic layout diagram of the first electrode, the charge storage electrode, and the transistors constituting the control unit of a modification of a stacked imaging device or the like of Example 13. As shown in FIG. 68, the other source/drain region 51B of the reset transistor $TR3_{rst}$ may be grounded, instead of being connected to the power supply $V_{DD}$.

In a stacked imaging device or the like of Example 13, such a configuration is adopted, so that a kind of charge transfer gradient is formed. In other words, the areas of the charge storage electrode segments gradually decrease from the first photoelectric conversion unit segment $10'_1$ to the Nth photoelectric conversion unit segment $10'_N$. Accordingly, when $V_{12}<V_{11}$ in a charge accumulation period, the nth photoelectric conversion unit segment can store more electric charges than the (n+1)th photoelectric conversion unit segment. Further, when $V_{22}<V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

EXAMPLE 14

Figure 69:
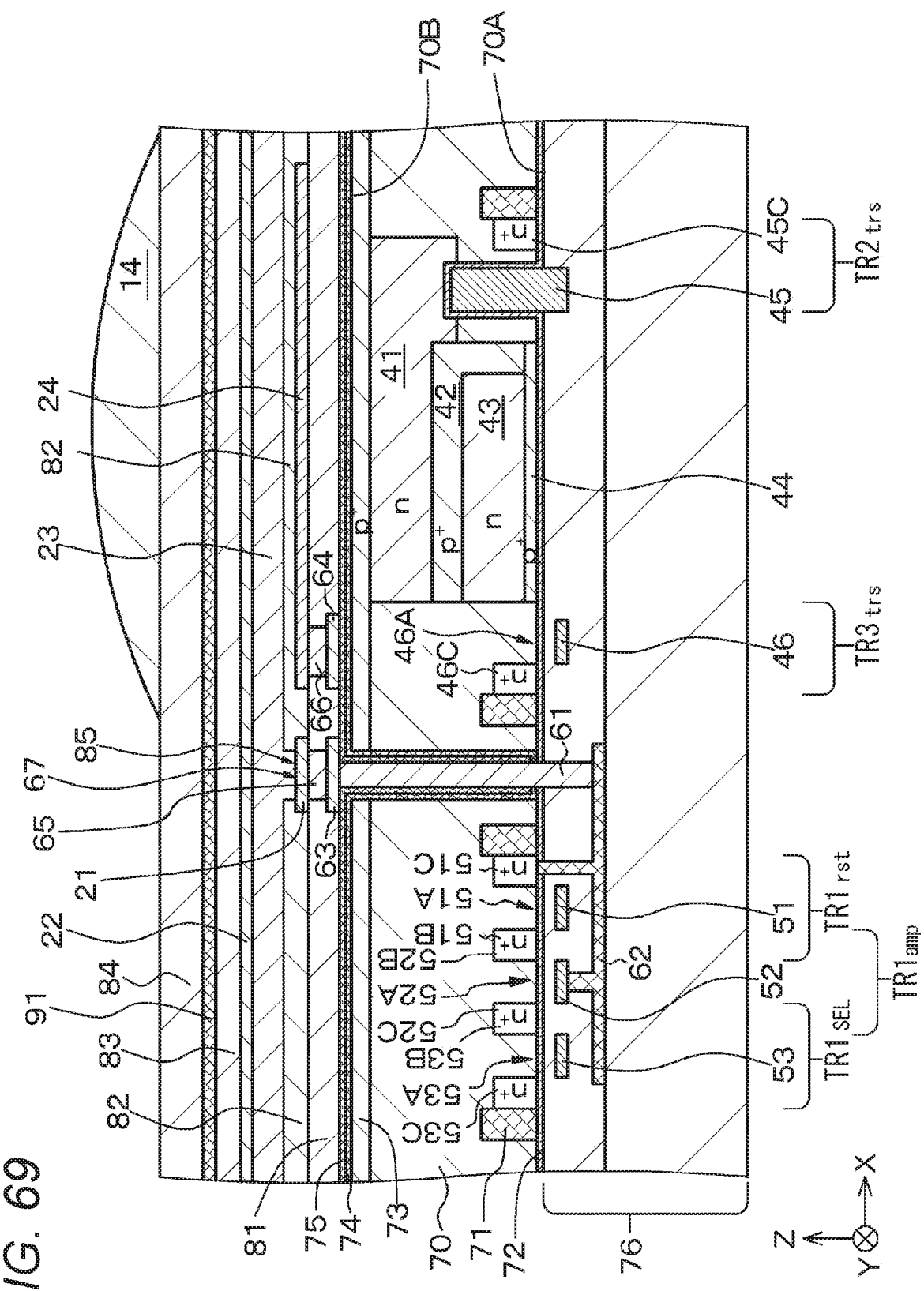
Figure 70A:
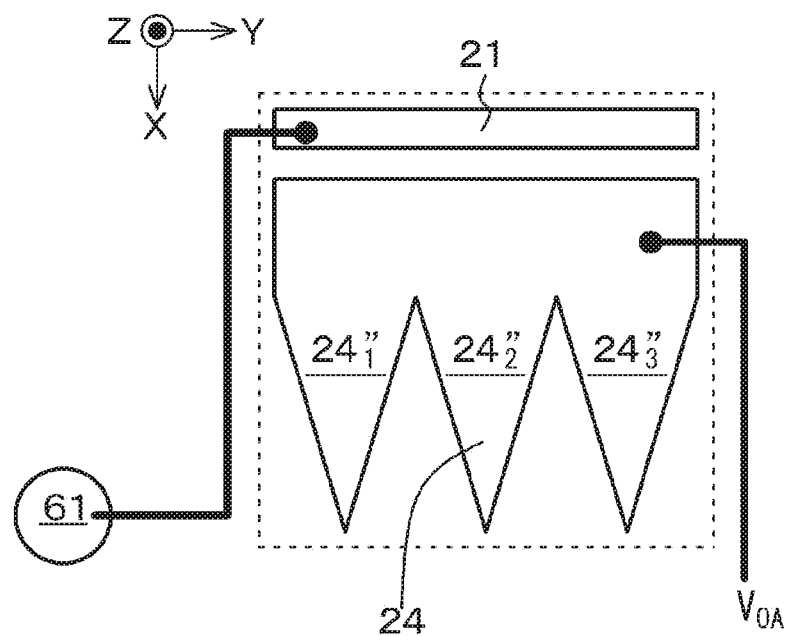
FIGS. 70A and 70B are schematic plan views of charge storage electrode segments in Example 14.
Figure 70B:
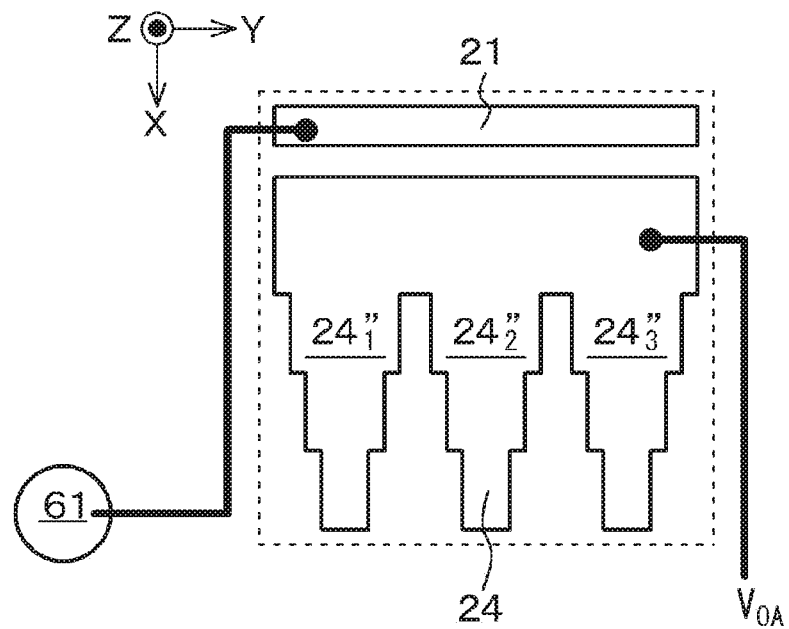

Example 14 relates to an imaging device of the sixth configuration. FIG. 69 shows a schematic partial cross-sectional view of a stacked imaging device or the like of Example 14. Further, FIGS. 70A and 70B are schematic plan views of charge storage electrode segments in Example 14. A stacked imaging device or the like of Example 14 includes a photoelectric conversion unit formed by stacking the first electrode 21, the photoelectric conversion layer 23, and the second electrode 22, and the photoelectric conversion unit further includes the charge storage electrode 24 ($24''_1$, $24''_2$, and $24''_3$) that are disposed at a distance from the first electrode 21 and are positioned to face the photoelectric conversion layer 23 via the insulating layer 82. Then, where the stacking direction of the charge storage electrode 24 ($24''_1$, $24''_2$, and $24''_3$), the insulating layer 82, and the photoelectric conversion layer 23 is the Z direction, and the direction away from the first electrode 21 is the X direction, the cross-sectional area of a stacked portion of the charge storage electrodes 24 ($24''_1$, $24''_2$, and $24''_3$), the insulating layer 82, and the photoelectric conversion layer 23 taken along a Y-Z virtual plane varies depending on the distance from the first electrode 21.

Specifically, in a stacked imaging device or the like of Example 14, the thicknesses of cross-sections of stacked portions are constant, and the width of a cross-section of a stacked portion is narrower at a longer distance from the first electrode 21. Note that the widths may be narrowed continuously (see FIG. 70A) or may be narrowed stepwise (see FIG. 70B).

As described above, in a stacked imaging device or the like of Example 14, a kind of charge transfer gradient is formed, and the electric charges generated through photoelectric conversion can be transferred more easily and reliably, because cross-sectional areas of the stacked portions of the charge storage electrode 24 ($24''_1$, $24''_2$, and $24''_3$), the insulating layer 82, and the photoelectric conversion layer 23 taken along a Y-Z virtual plane vary depending on the distance from the first electrode.

EXAMPLE 15

Example 15 relates to solid-state imaging apparatuses of the first configuration and the second configuration.

A solid-state imaging apparatus of Example 15 includes a photoelectric conversion unit in which a first electrode 21, a photoelectric conversion layer 23, and a second electrode 22 are stacked, the photoelectric conversion unit further includes a plurality of stacked imaging devices or the like each including a charge storage electrode 24 that is disposed at a distance from the first electrode 21 and is positioned to face the photoelectric conversion layer 23 via an insulating layer 82, an imaging device block is formed with the plurality of stacked imaging devices or the like, and the plurality of stacked imaging devices or the like that forms the imaging device block shares the first electrode 21.

Alternatively, a solid-state imaging apparatus of Example 15 includes a plurality of stacked imaging devices or the like described in any of Examples 3 through 14.

In Example 15, one floating diffusion layer is provided for a plurality of stacked imaging devices or the like. The timing of a charge transfer period is then appropriately controlled, so that the plurality of stacked imaging devices or the like can share the one floating diffusion layer. Then, in this case, the plurality of stacked imaging devices or the like can share one contact hole portion.

Note that a solid-state imaging apparatus of Example 15 has a configuration and a structure that are similar to those of the solid-state imaging apparatuses described in Examples 3 through 14, except that the plurality of stacked imaging devices or the like constituting an imaging device block shares the first electrode 21.

Figure 71:
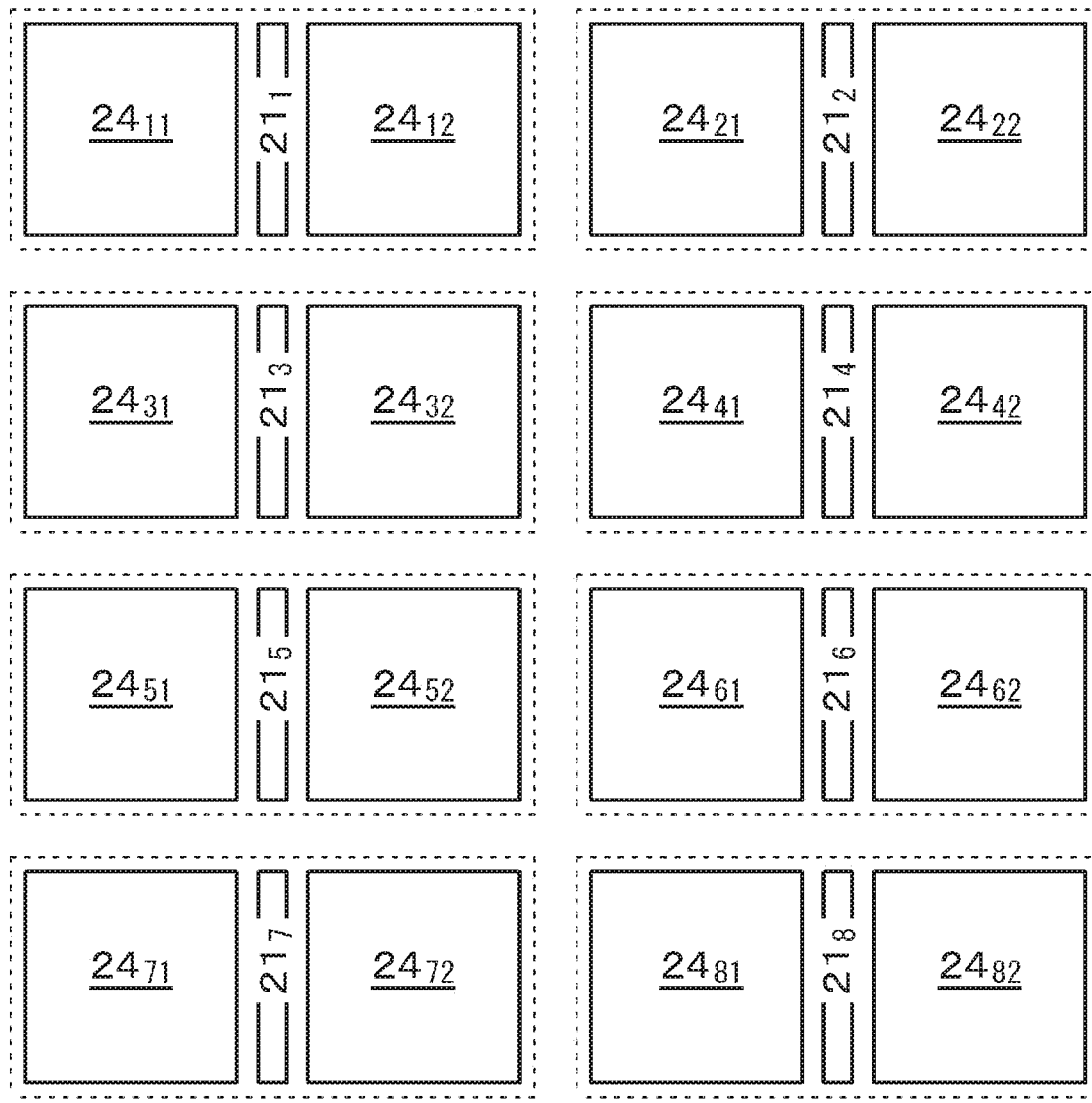
FIG. 71 is a schematic plan view of first electrodes and charge storage electrode segments in a solid-state imaging apparatus of Example 15.
Figure 72:
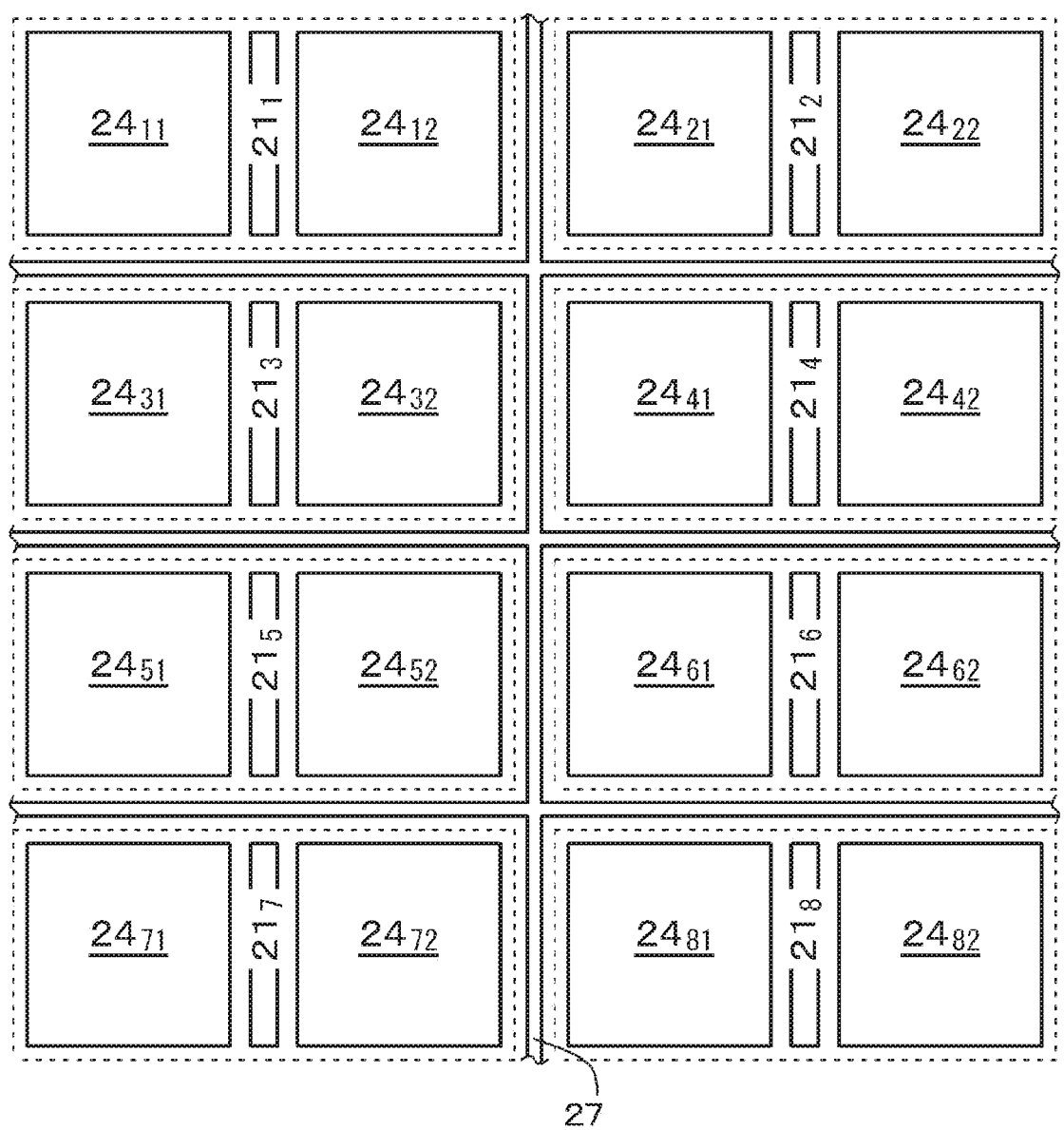
FIG. 72 is a schematic plan view of first electrodes and charge storage electrode segments in a first modification of a solid-state imaging apparatus of Example 15.
Figure 73:
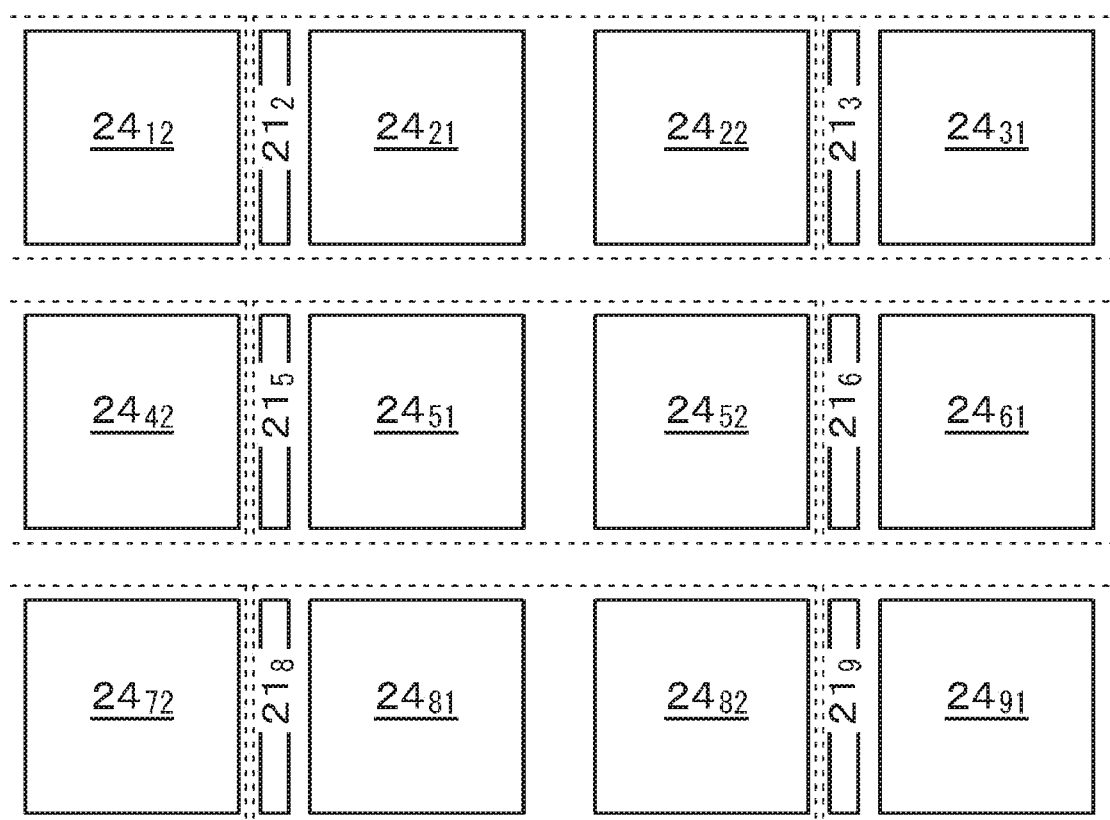
FIG. 73 is a schematic plan view of first electrodes and charge storage electrode segments in a second modification of a solid-state imaging apparatus of Example 15.
Figure 74:
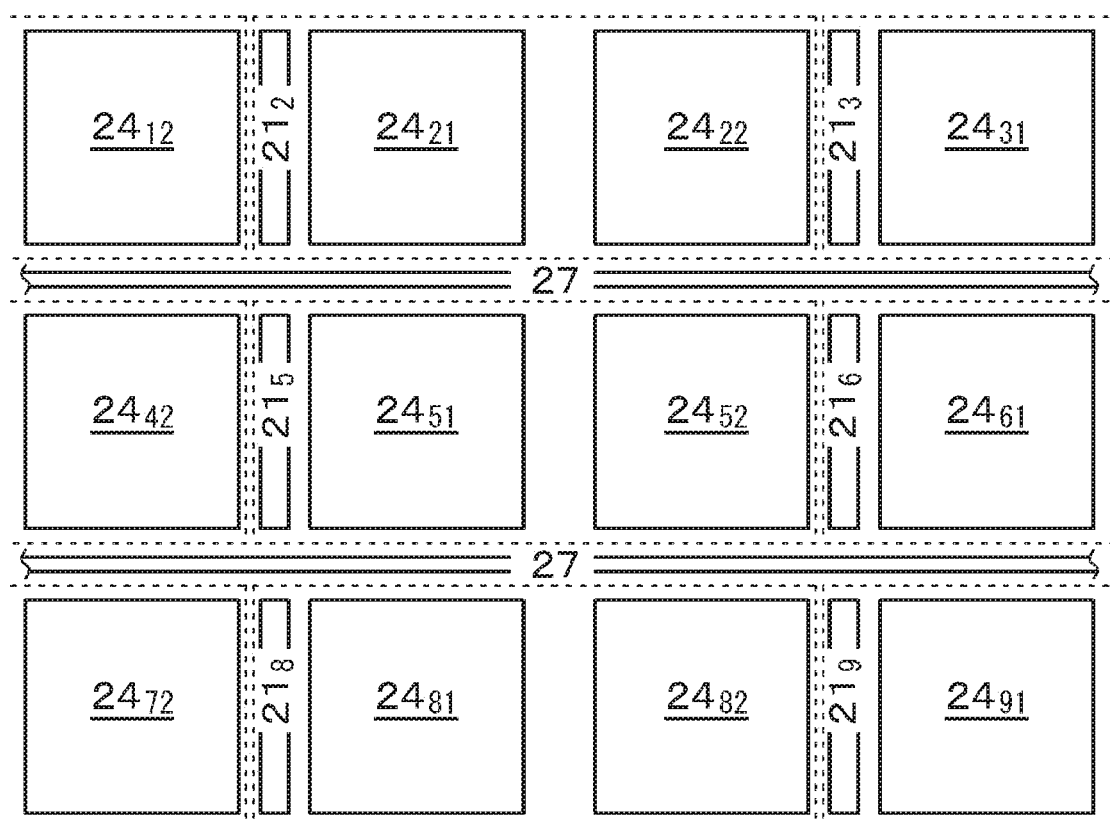
FIG. 74 is a schematic plan view of first electrodes and charge storage electrode segments in a third modification of a solid-state imaging apparatus of Example 15.
Figure 75:
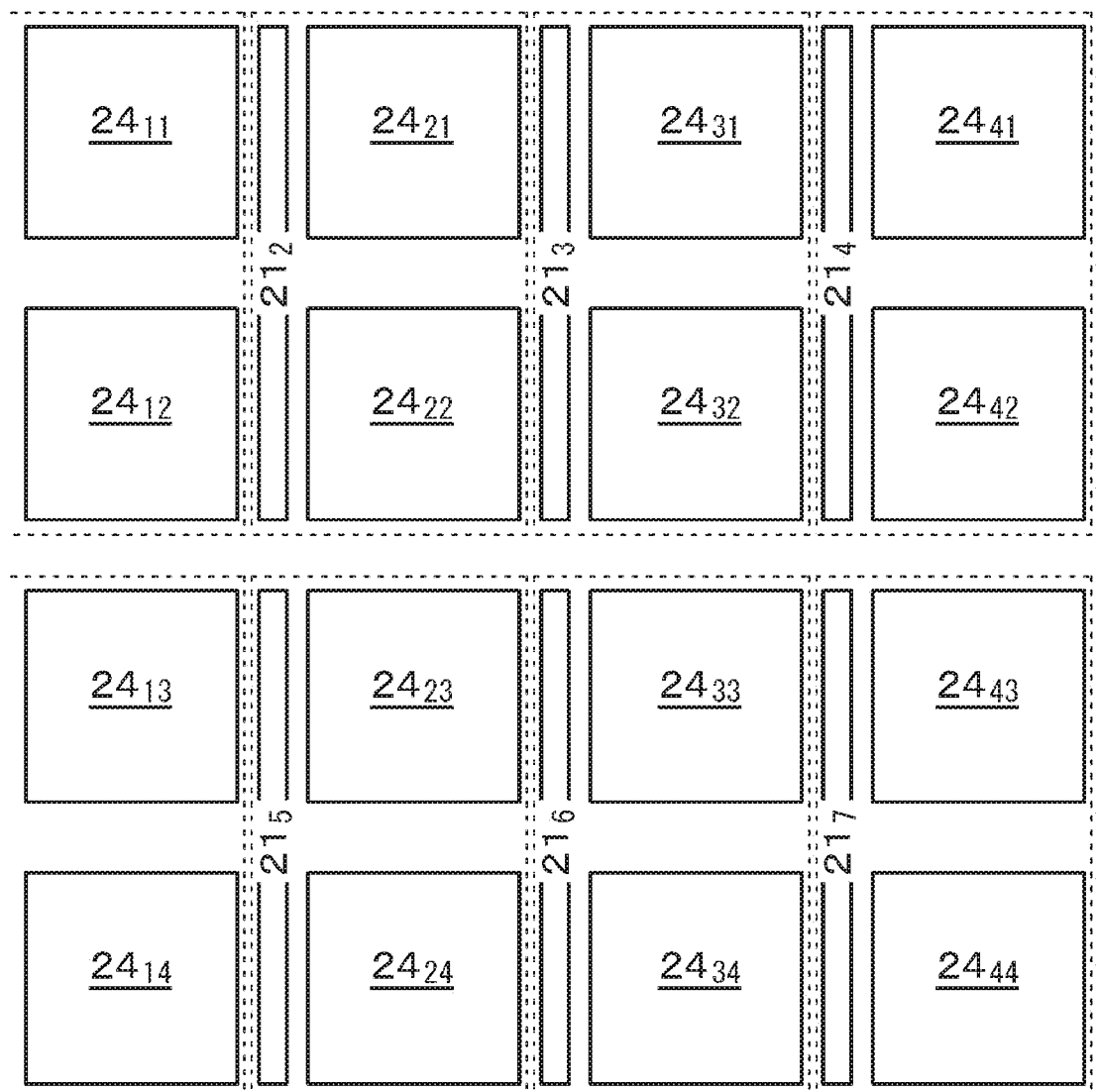
FIG. 75 is a schematic plan view of first electrodes and charge storage electrode segments in a fourth modification of a solid-state imaging apparatus of Example 15.
Figure 76:
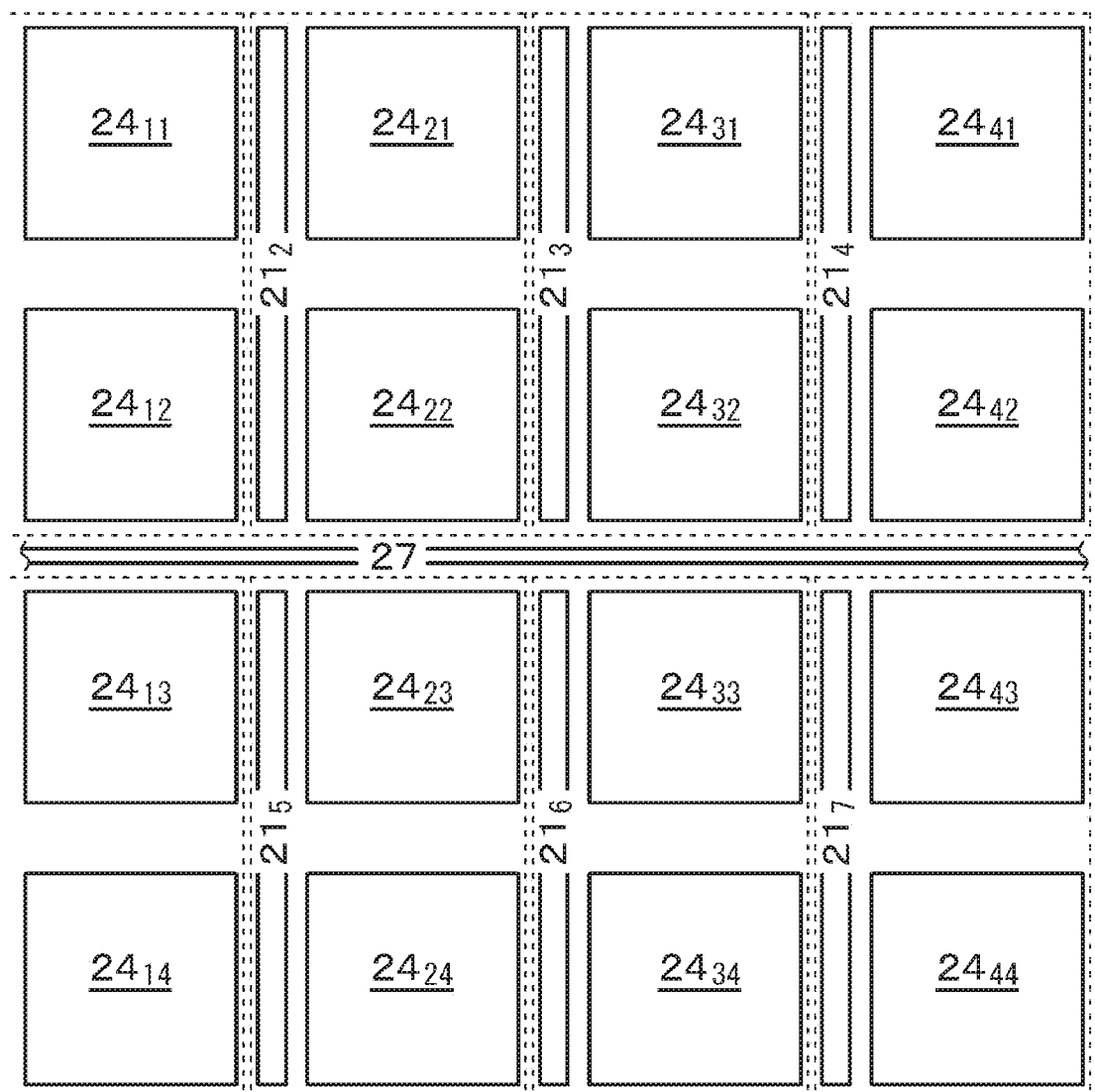
FIG. 76 is a schematic plan view of first electrodes and charge storage electrode segments in a fifth modification of a solid-state imaging apparatus of Example 15.

Layouts of the first electrode 21 and the charge storage electrode 24 in solid-state imaging apparatuses of Example 15 are schematically shown in FIG. 71 (Example 15), FIG. 72 (a first modification of Example 15), FIG. 73 (a second modification of Example 15), FIG. 74 (a third modification of Example 15), and FIG. 75 (a fourth modification of Example 15). FIGS. 71, 72, 75, and 76 show 16 stacked imaging devices or the like, and FIGS. 73 and 74 show 12 stacked imaging devices or the like. Then, each imaging device block is formed with two stacked imaging devices or the like. Each imaging device block is surrounded by a dotted line in the drawings. The suffixes attached to the first electrodes 21 and the charge storage electrodes 24 are for distinguishing the first electrodes 21 and the charge storage electrodes 24. The same applies to in the descriptions below. Further, one on-chip microlens (not shown in FIGS. 71 through 80) is disposed above each one stacked imaging device or the like. Then, in each one imaging device block, two charge storage electrodes 24 are disposed, with one first electrode 21 interposed in between (see FIGS. 71 and 72). Alternatively, one first electrode 21 is disposed to face two charge storage electrodes 24 that are arranged in parallel (see FIGS. 75 and 76). In other words, one first electrode is disposed adjacent to the charge storage electrodes in each stacked imaging device or the like. Alternatively, one first electrode is disposed adjacent to one of the charge storage electrodes in each of a plurality of stacked imaging devices, but is not disposed adjacent to the other charge storage electrode in each of the plurality of stacked imaging devices (see FIGS. 73 and 74). In this case, electric charge transfer from the rest of the plurality of stacked imaging devices or the like to the first electrode is transfer via one of the plurality of stacked imaging devices or the like. To ensure electric charge transfer from each stacked imaging device to the first electrode, the distance A between a charge storage electrode of a stacked imaging device or the like and another charge storage electrode of the stacked imaging device or the like is preferably longer than the distance B between the first electrode and the charge storage electrodes in the stacked imaging device or the like adjacent to the first electrode. Further, the value of the distance A is preferably greater for a stacked imaging device or the like located farther away from the first electrode. Meanwhile, in the examples shown in FIGS. 72, 74, and 76, a charge transfer control electrode 27 is disposed between the plurality of stacked imaging devices or the like constituting the imaging device blocks. As the charge transfer control electrode 27 is provided, it is possible to reliably reduce electric charge transfer in the imaging device blocks located to interpose the charge transfer control electrode 27. Note that, where the potential to be applied to the charge transfer control electrode 27 is represented by $V_{17}$, $V_{12} > V_{17}$ (for example, $V_{12-2} > V_{17}$).

The charge transfer control electrode 27 may be formed on the first electrode side at the same level as the first electrode 21 or the charge storage electrodes 24, or may be formed at a different level (specifically, at a level lower than the first electrode 21 or the charge storage electrodes 24). In the former case, the distance between the charge transfer control electrode 27 and the photoelectric conversion layer can be shortened, and accordingly, the potential can be easily controlled. In the latter case, on the other hand, the distance between the charge transfer control electrode 27 and the charge storage electrodes 24 can be shortened, which is advantageous for miniaturization.

The following is a description of operation of an imaging device block formed with a first electrode $21_2$ and two charge storage electrodes $24_{21}$ and $24_{22}$.

In a charge accumulation period, the drive circuit applies a potential $V_a$ to the first electrode $21_2$, and a potential $V_A$ to the charge storage electrodes $24_{21}$ and $24_{22}$. Light that has entered the photoelectric conversion layer 23 causes photoelectric conversion in the photoelectric conversion layer 23. Holes generated by the photoelectric conversion are sent from the second electrode 22 to the drive circuit via a wiring line $V_{OU}$. Meanwhile, since the potential of the first electrode $21_2$ is higher than the potential of the second electrode 22, or a positive potential is applied to the first electrode $21_2$ while a negative potential is applied to the second electrode 22, for example, $V_A \geq V_a$, or preferably, $V_A > V_a$. As a result, electrons generated by the photoelectric conversion are attracted to the charge storage electrodes $24_{21}$ and $24_{22}$, and stay in the region of the photoelectric conversion layer 23 facing the charge storage electrodes $24_{21}$ and $24_{22}$. In other words, electric charges are accumulated in the photoelectric conversion layer 23. Since $V_A \geq V_a$, electrons generated in the photoelectric conversion layer 23 will not move toward the first electrode $21_2$. With the passage of time for photoelectric conversion, the potential in the region of the photoelectric conversion layer 23 facing the charge storage electrodes $24_{21}$ and $24_{22}$ becomes a more negative value.

A reset operation is performed in the latter period in the charge accumulation period. As a result, the potential of the first floating diffusion layer is reset, and the potential of the first floating diffusion layer becomes the potential $V_{DD}$ of the power supply.

After completion of the reset operation, the electric charges are read out. In other words, in a charge transfer period, the drive circuit applies a potential $V_b$ to the first electrode $21_2$, a potential $V_{21-B}$ to the charge storage electrode $24_{21}$, and a potential $V_{22}$-B to the charge storage electrode $24_{22}$. Here, $V_{21-B} < V_b < V_{22-B}$. As a result, the electrons remaining in the region of the photoelectric conversion layer 23 facing the charge storage electrode $24_{21}$ are read into the first electrode $21_2$ and further into the first floating diffusion layer. In other words, the electric charges stored in the region of the photoelectric conversion layer 23 facing the charge storage electrode $24_{21}$ are read into the control unit. After the reading is completed, $V_{22-B} \leq V_{21-B} < V_b$. Note that, in the examples shown in FIGS. 75 and 76, $V_{22-B} < V_b < V_{21-B}$ may be satisfied. As a result, the electrons remaining in the region of the photoelectric conversion layer 23 facing the charge storage electrode $24_{22}$ are read into the first electrode $21_2$ and further into the first floating diffusion layer. Further, in the examples shown in FIGS. 73 and 74, the electrons remaining in the region of the photoelectric conversion layer 23 facing the charge storage electrode $24_{22}$ may be read into the first floating diffusion layer via the first electrode $21_3$ to which the charge storage electrode $24_{22}$ is adjacent. In this manner, the electric charges stored in the region of the photoelectric conversion layer 23 facing the charge storage electrode $24_{22}$ are read into the control unit. Note that, after all the electric charges stored in the region of the photoelectric conversion layer 23 facing the charge storage electrode $24_{21}$ have been read into the control unit, the potential of the first floating diffusion layer may be reset.

Figure 81A:
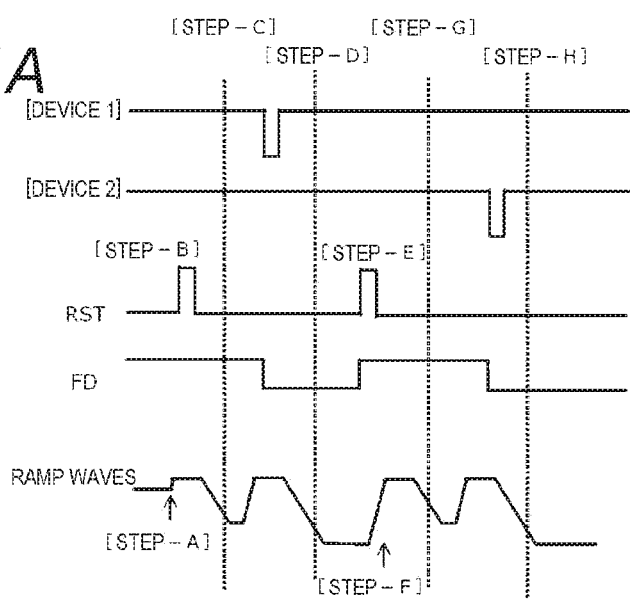
FIGS. 81A, 81B, and 81C are charts showing examples of readout driving in an imaging device block of Example 15.

FIG. 81A shows an example of readout driving in the imaging device block of Example 15.

[Step-A]
Autozero signal input to a comparator;
[Step-B]
a reset operation on a shared floating diffusion layer;
[Step-C]
P-phase readout and electric charge transfer to the first electrode $21_2$ in the stacked imaging device or the like corresponding to the charge storage electrode $24_{21}$;
[Step-D]
D-phase readout and electric charge transfer to the first electrode $21_2$ in the stacked imaging device or the like corresponding to the charge storage electrode $24_{21}$;
[Step-E]
a reset operation on a shared floating diffusion layer;
[Step-F]
autozero signal input to the comparator;
[Step-G]
P-phase readout and electric charge transfer to the first electrode $21_2$ in the stacked imaging device or the like corresponding to the charge storage electrode $24_{22}$; and
[Step-H]
D-phase readout and electric charge transfer to the first electrode $21_2$ in the stacked imaging device or the like corresponding to the charge storage electrode $24_{22}$.

In this flow, signals from the two stacked imaging devices or the like corresponding to the charge storage electrode $24_{21}$ and the charge storage electrode $24_{22}$ are read out. On the basis of a correlated double sampling (CDS) process, the difference between the P-phase readout in [Step-C] and the D-phase readout in [Step-D] is a signal from the stacked imaging device or the like corresponding to the charge storage electrode $24_{21}$, and the difference between the P-phase readout in [Step-G] and the D-phase readout in [Step-H] is a signal from the stacked imaging device or the like corresponding to the charge storage electrode $24_{22}$.

Figure 81B:
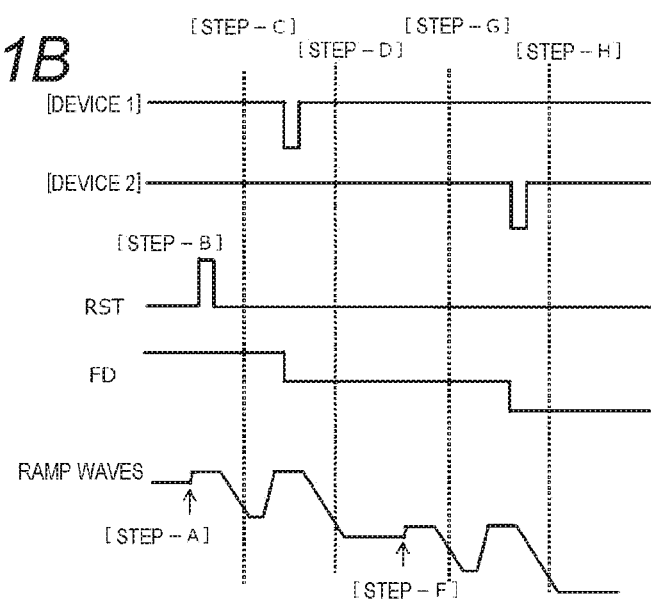
Figure 81C:
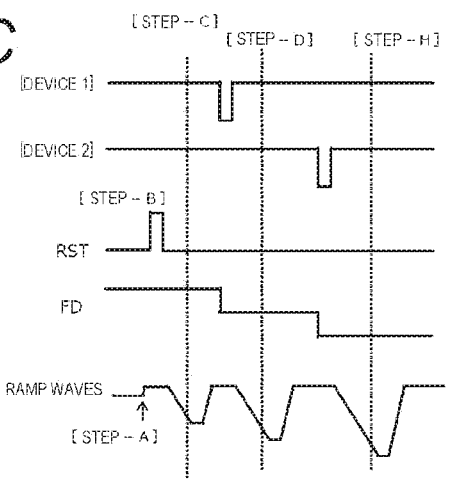
Figure 82:
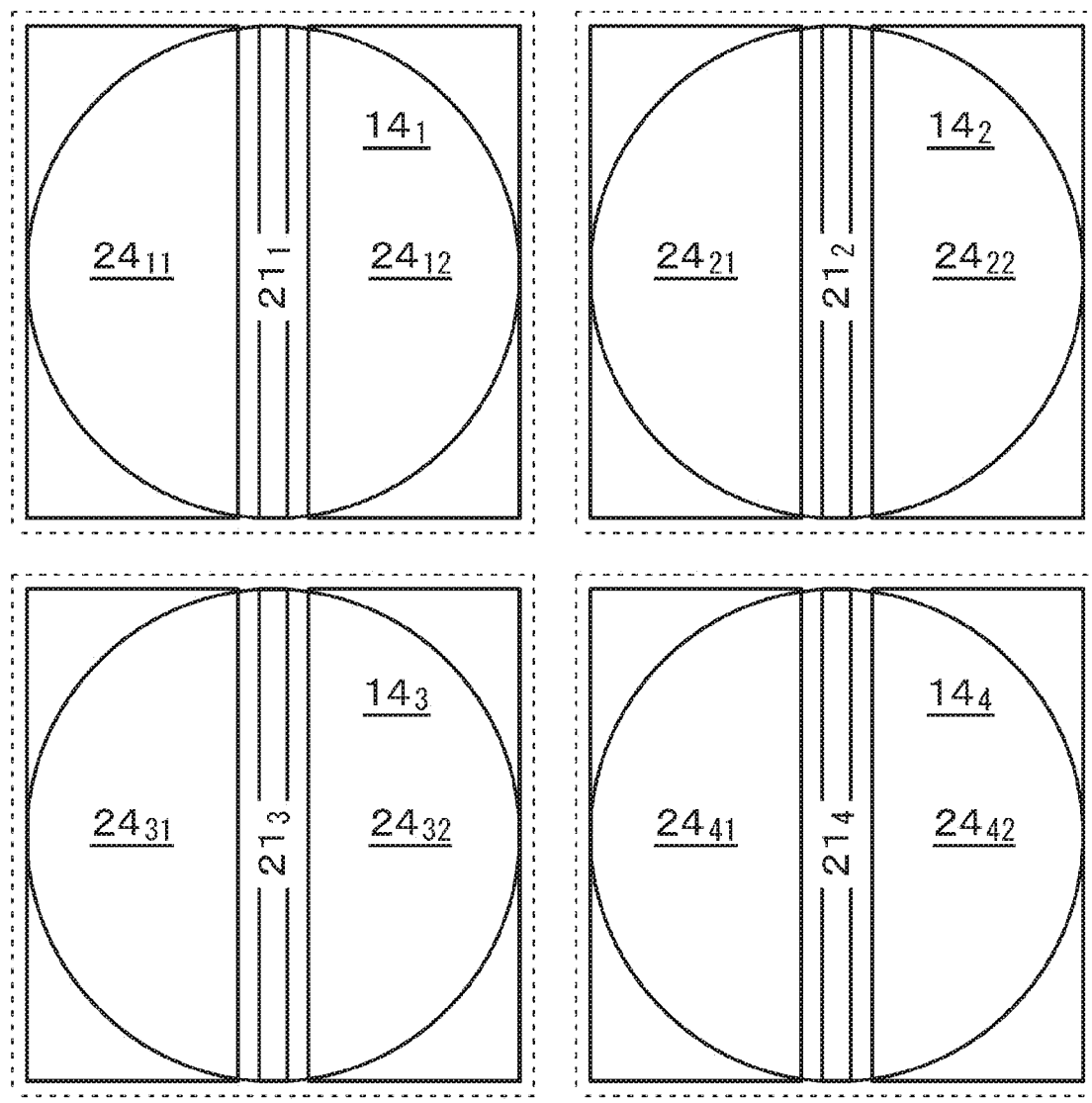
FIG. 82 is a schematic plan view of first electrodes and charge storage electrode segments in a solid-state imaging apparatus of Example 16.
Figure 83:
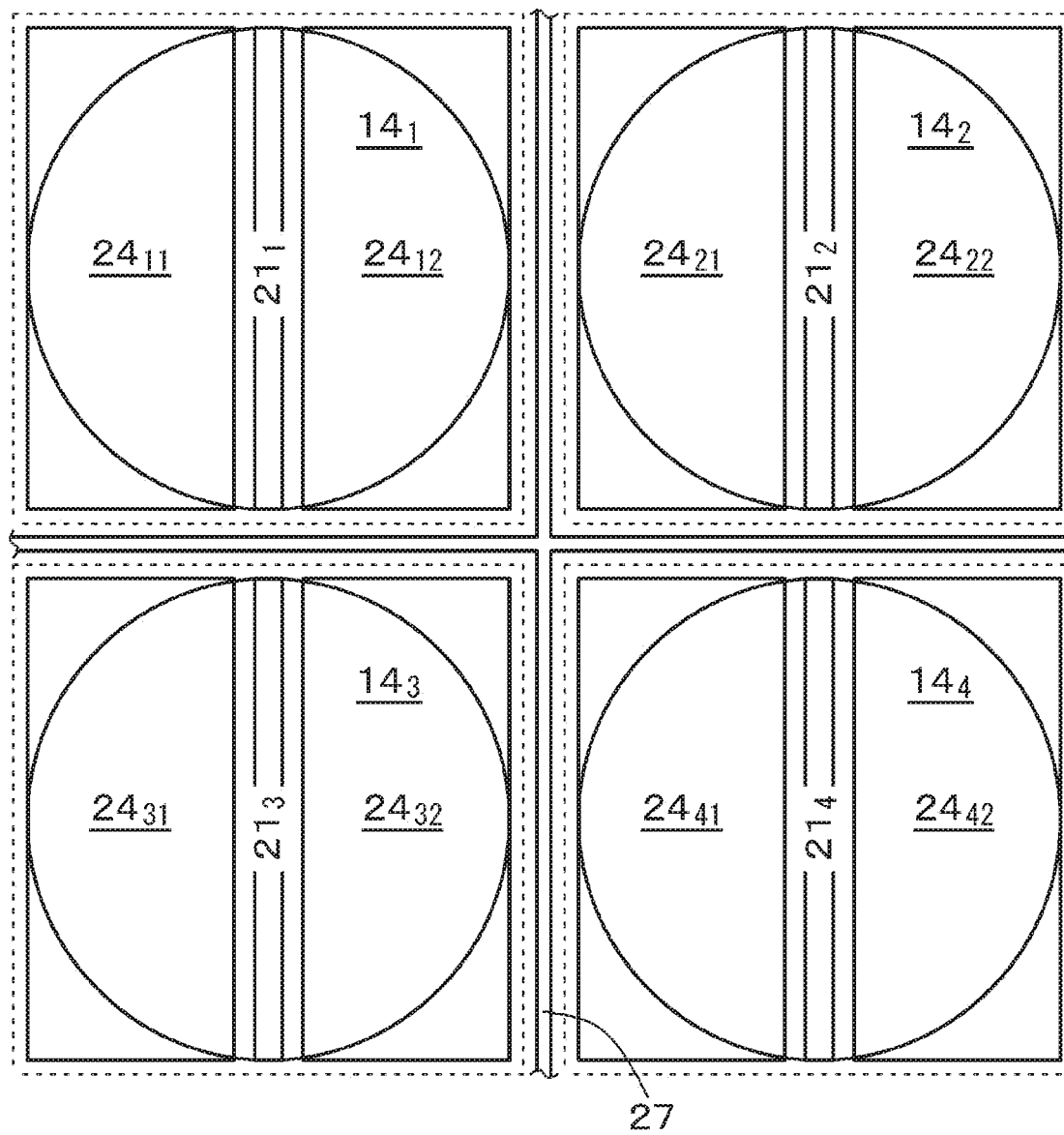
FIG. 83 is a schematic plan view of first electrodes and charge storage electrode segments in a modification of a solid-state imaging apparatus of Example 16.
Figure 84:
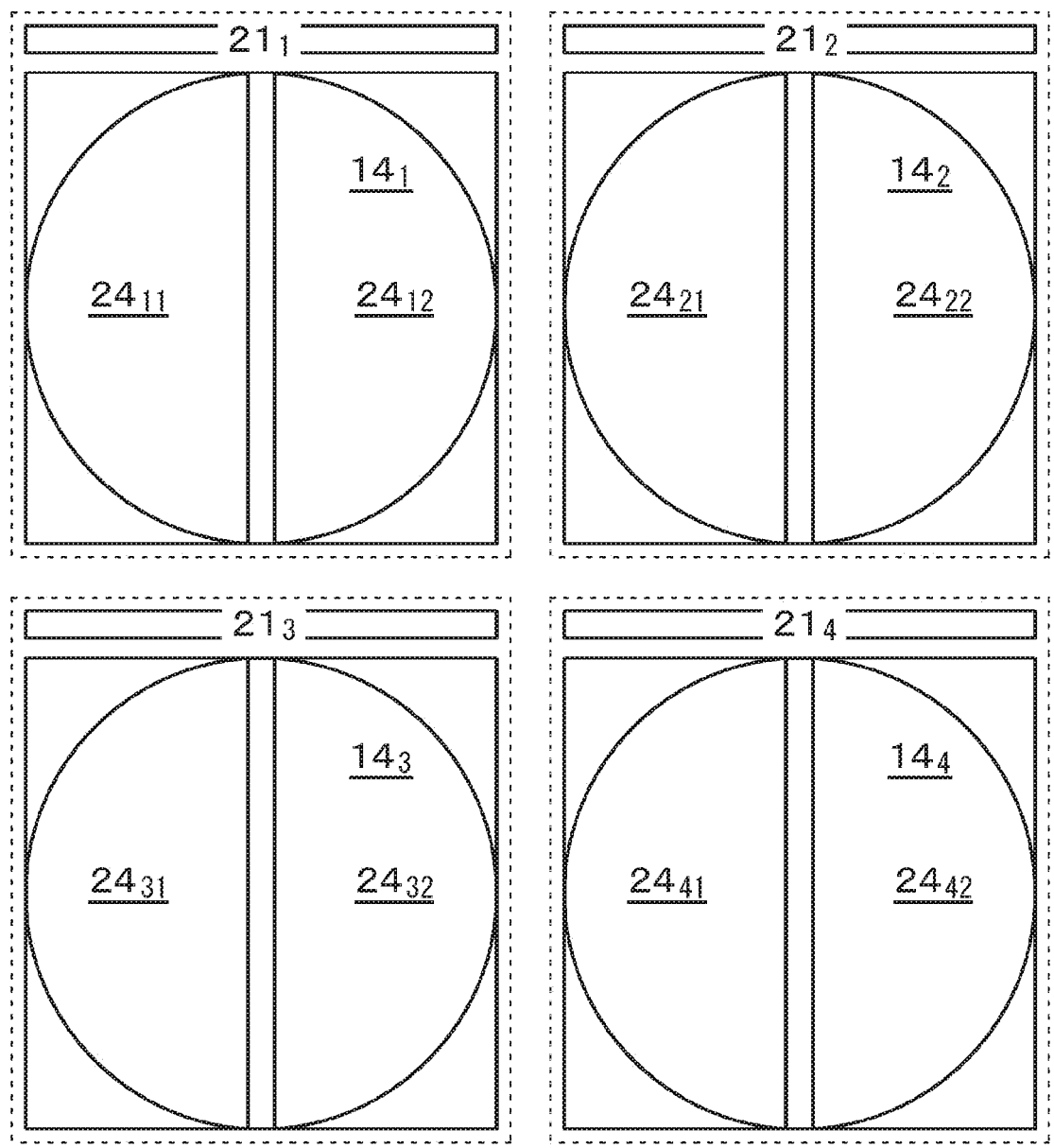
FIG. 84 is a schematic plan view of first electrodes and charge storage electrode segments in a modification of a solid-state imaging apparatus of Example 16.
Figure 85:
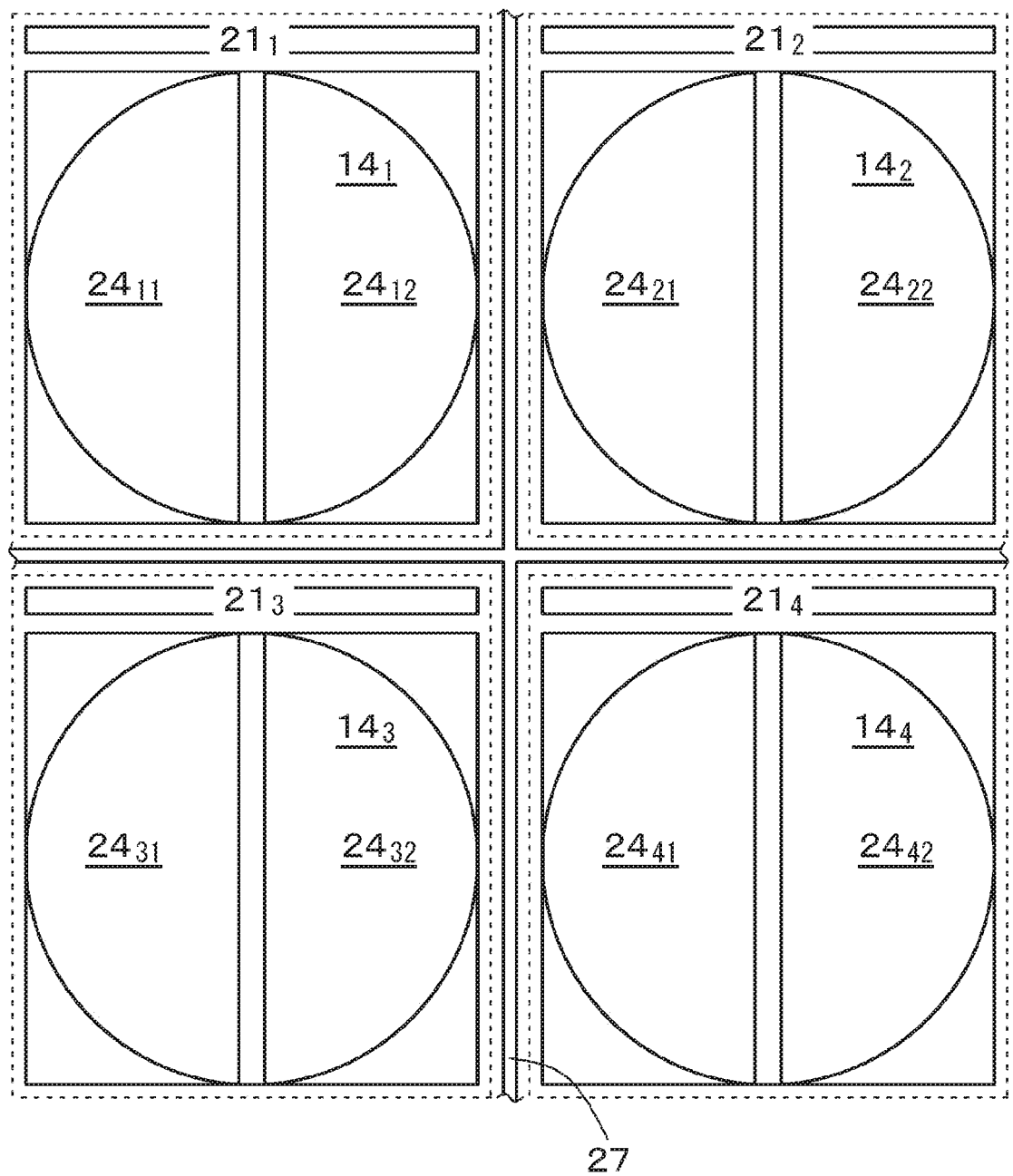
FIG. 85 is a schematic plan view of first electrodes and charge storage electrode segments in a modification of a solid-state imaging apparatus of Example 16.

Note that the operation in [Step-E] may be skipped (see FIG. 81B). Further, the operation in [Step-F] may also be omitted, and furthermore, in this case, [Step-G] may also be omitted (see FIG. 81C), and the difference between the P-phase readout in [Step-C] and the D-phase readout in [Step-D] is a signal from the stacked imaging device or the like corresponding to the charge storage electrode $24_{21}$, and the difference between the D-phase readout in [Step-D] and the D-phase readout in [Step-H] is a signal from the stacked imaging device or the like corresponding to the charge storage electrode $24_{22}$.

Figure 77:
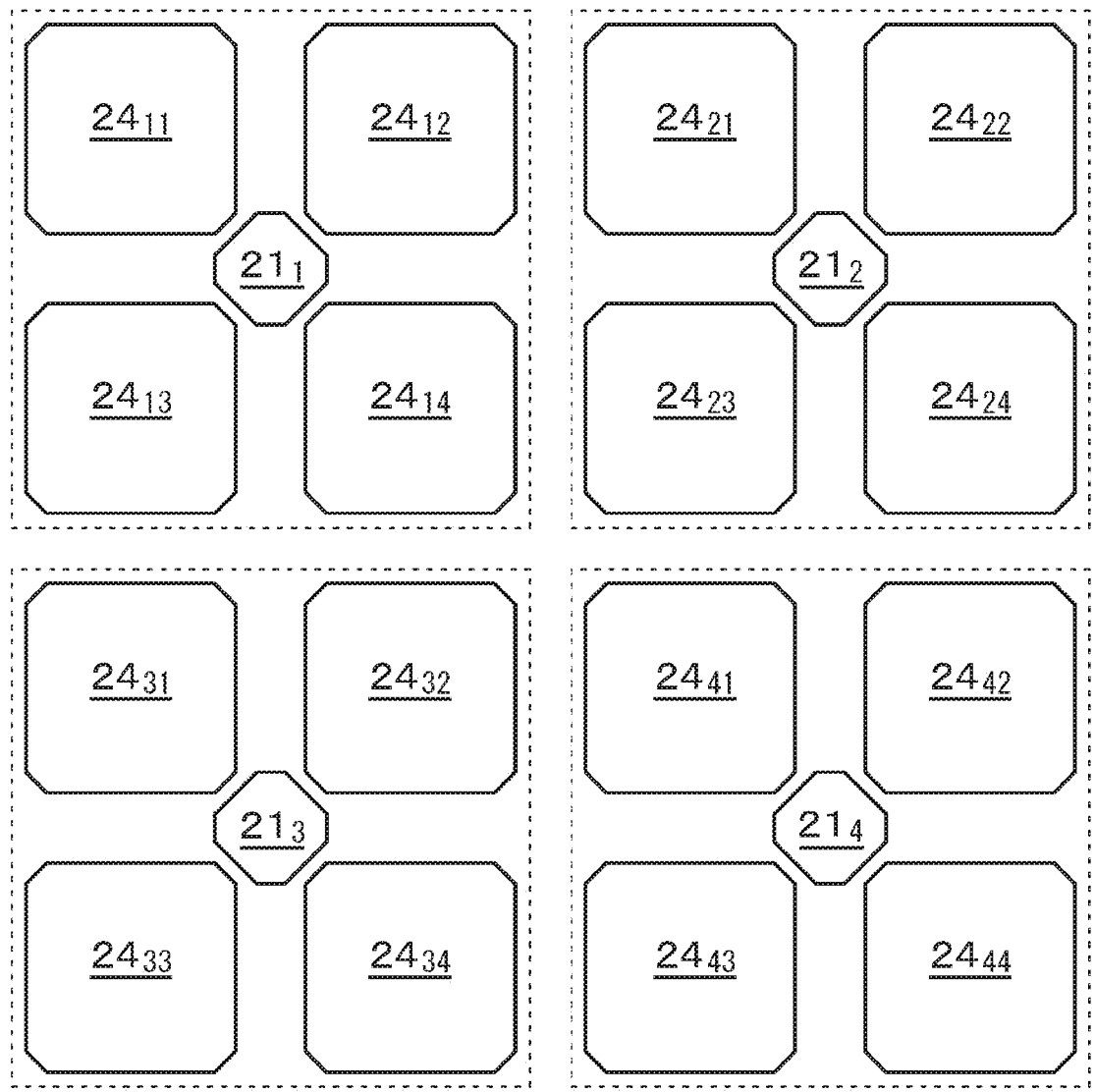
FIG. 77 is a schematic plan view of first electrodes and charge storage electrode segments in a sixth modification of a solid-state imaging apparatus of Example 15.
Figure 78:
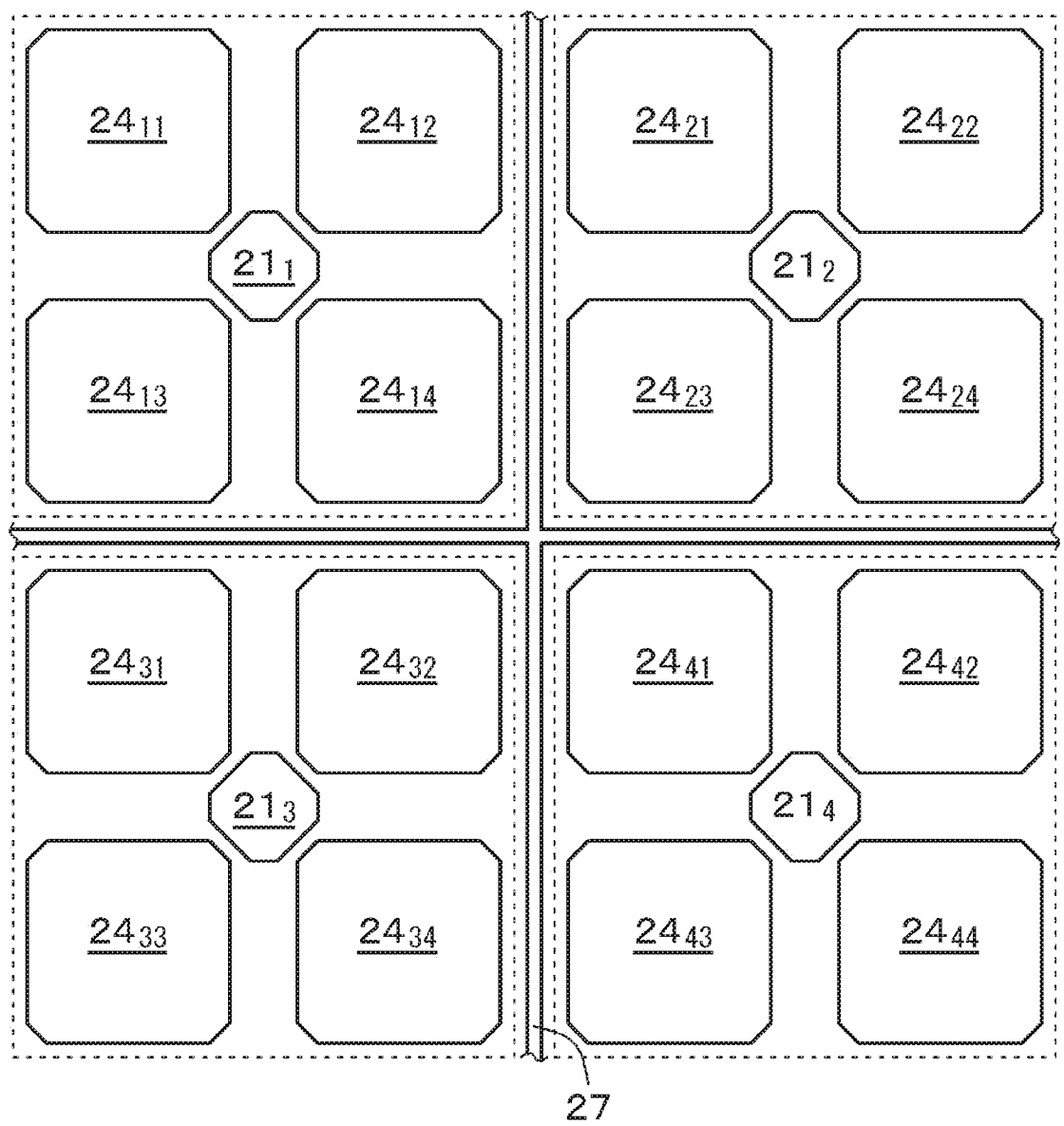
FIG. 78 is a schematic plan view of first electrodes and charge storage electrode segments in a seventh modification of a solid-state imaging apparatus of Example 15.

In modifications shown in FIG. 77 (a sixth modification of Example 15) and FIG. 78 (a seventh modification of Example 15) schematically showing layouts of first electrodes 21 and charge storage electrodes 24, an imaging device block is formed with four stacked imaging devices or the like. Operations of these solid-state imaging apparatuses may be substantially similar to operations of the solid-state imaging apparatuses shown in FIGS. 71 through 76.

Figure 79:
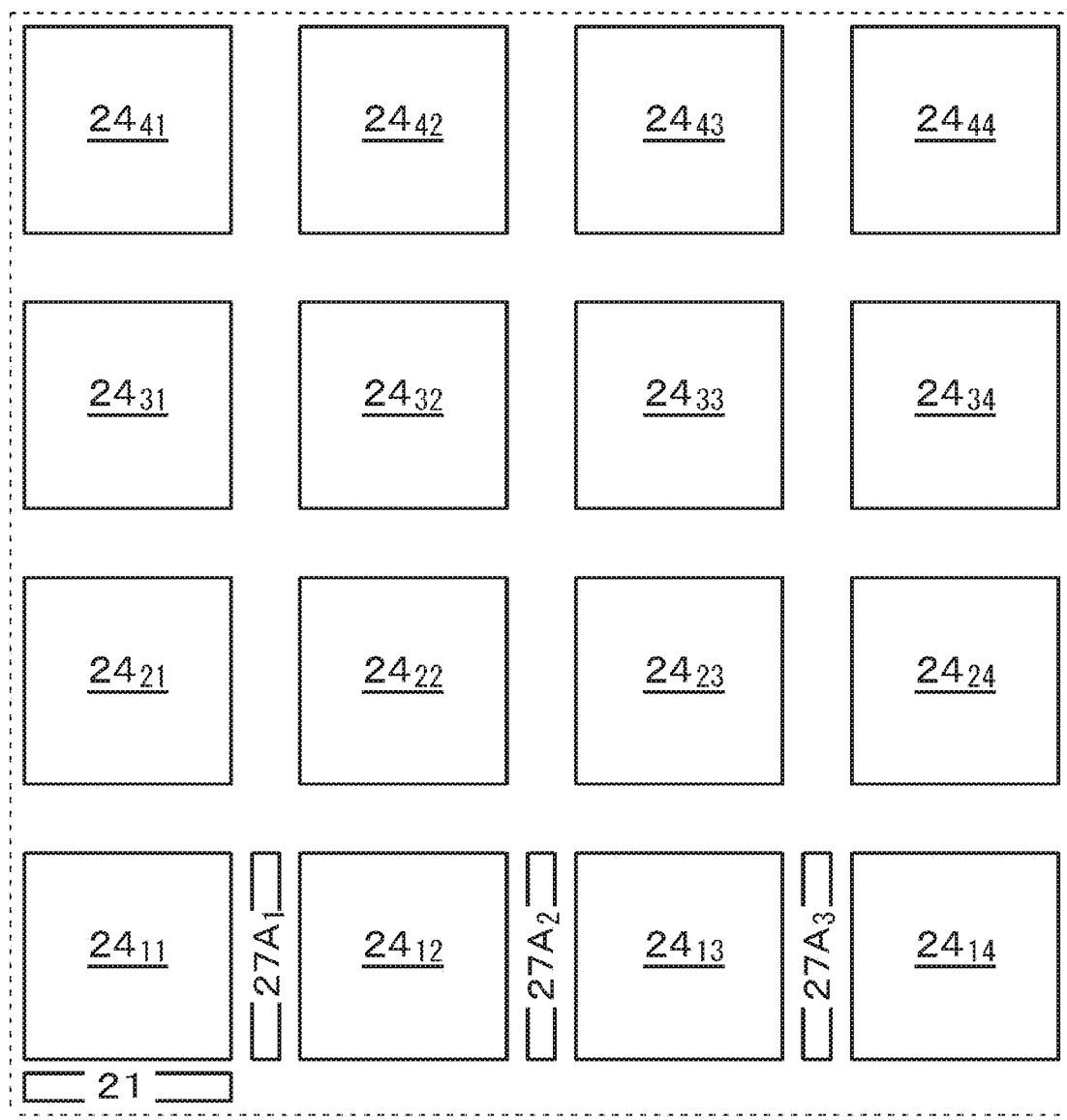
FIG. 79 is a schematic plan view of first electrodes and charge storage electrode segments in an eighth modification of a solid-state imaging apparatus of Example 15.
Figure 80:
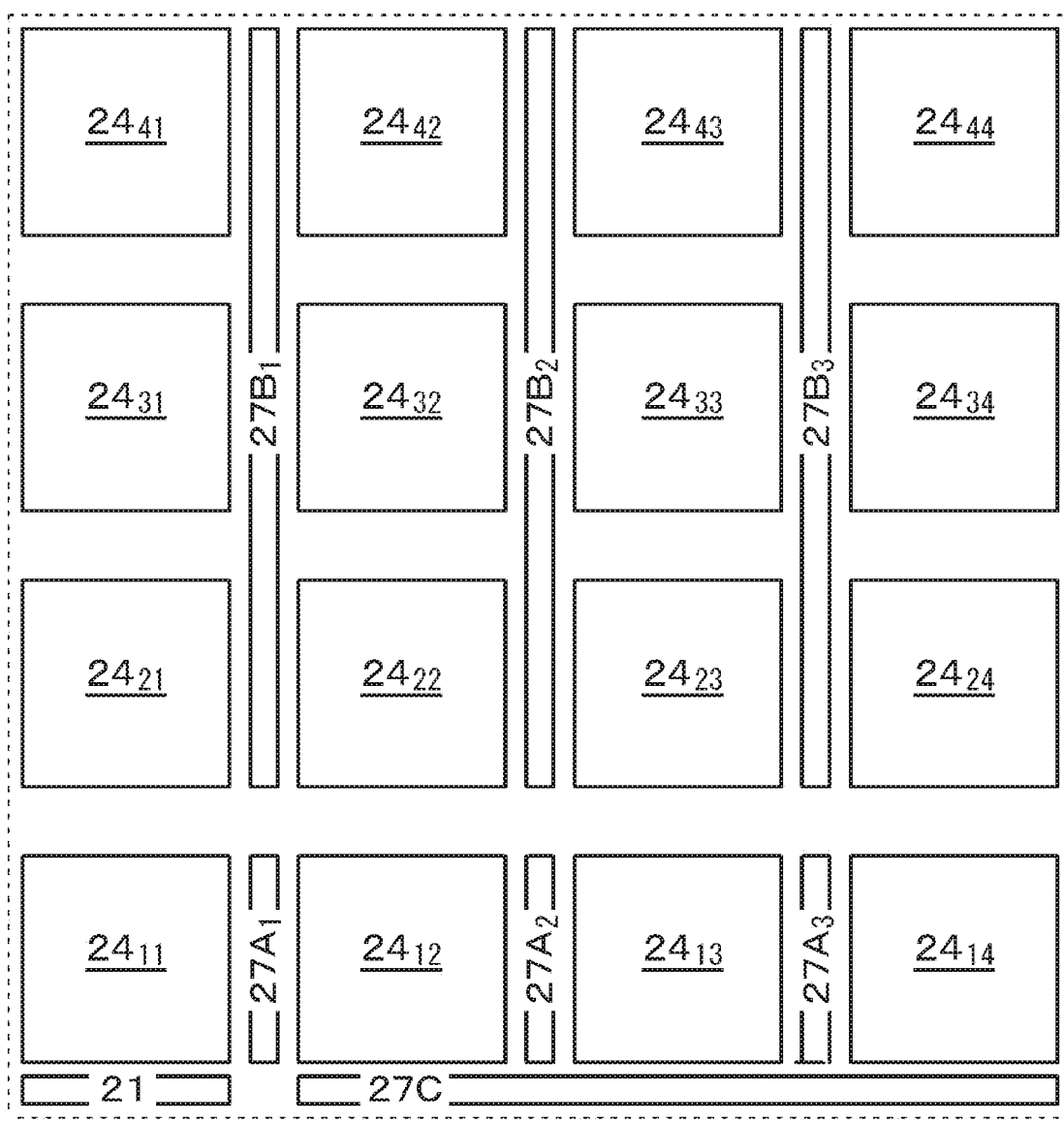
FIG. 80 is a schematic plan view of first electrodes and charge storage electrode segments in a ninth modification of a solid-state imaging apparatus of Example 15.

In an eighth modification shown in FIG. 79 and a ninth modification shown in FIG. 80 schematically showing layouts of first electrodes 21 and charge storage electrodes 24, an imaging device block is formed with 16 stacked imaging devices or the like. As shown in FIGS. 79 and 80, charge transfer control electrodes $27A_1$, $27A_2$, and $27A_3$ are disposed between the charge storage electrode $24_{11}$ and the charge storage electrode $24_{12}$, between the charge storage electrode $24_{12}$ and the charge storage electrode $24_{13}$, and between the charge storage electrode $24_{13}$ and the charge storage electrode $24_{14}$. Alternatively, as shown in FIG. 80, charge transfer control electrodes $27B_1$, $27B_2$, and $27B_3$ are disposed between charge storage electrodes $24_{21}$, $24_{31}$, and $24_{41}$ and the charge storage electrodes $24_{22}$, $24_{32}$, and $24_{42}$, between the charge storage electrodes $24_{22}$, $24_{32}$, and $24_{42}$ and the charge storage electrodes $24_{23}$, $24_{33}$, and $24_{43}$, and between the charge storage electrodes $24_{23}$, $24_{33}$, and $24_{43}$ and the charge storage electrodes $24_{24}$, $24_{34}$, and $24_{44}$. Further, a charge transfer control electrode 27C is disposed between an imaging device block and an imaging device block. Then, in these solid-state imaging apparatuses, the 16 charge storage electrodes 24 are controlled, so that the electric charges stored in the photoelectric conversion layer 23 can be read out from the first electrode 21.

[Step-10]
Specifically, the electric charges stored in the region of the photoelectric conversion layer 23 facing the charge storage electrode $24_{11}$ are first read out from the first electrode 21. The electric charges stored in the region of the photoelectric conversion layer 23 facing the charge storage electrode $24_{12}$ are then read from the first electrode 21 via the region of the photoelectric conversion layer 23 facing the charge storage electrode $24_{11}$. The electric charges stored in the region of the photoelectric conversion layer 23 facing the charge storage electrode $24_{13}$ are then read from the first electrode 21 via the regions of the photoelectric conversion layer 23 facing the charge storage electrode $24_{12}$ and the charge storage electrode $24_{11}$.

[Step-20]
After that, the electric charges stored in the region of the photoelectric conversion layer 23 facing the charge storage electrode $24_{21}$ are transferred to the region of the photoelectric conversion layer 23 facing the charge storage electrode $24_{11}$. The electric charges stored in the region of the photoelectric conversion layer 23 facing the charge storage electrode $24_{22}$ are transferred to the region of the photoelectric conversion layer 23 facing the charge storage electrode $24_{12}$. The electric charges stored in the region of the photoelectric conversion layer 23 facing the charge storage electrode $24_{23}$ are transferred to the region of the photoelectric conversion layer 23 facing the charge storage electrode $24_{13}$. The electric charges stored in the region of the photoelectric conversion layer 23 facing the charge storage electrode $24_{24}$ are transferred to the region of the photoelectric conversion layer 23 facing the charge storage electrode $24_{14}$.

[Step-21]

The electric charges stored in the region of the photoelectric conversion layer 23 facing the charge storage electrode $24_{31}$ are transferred to the region of the photoelectric conversion layer 23 facing the charge storage electrode $24_{21}$. The electric charges stored in the region of the photoelectric conversion layer 23 facing the charge storage electrode $24_{32}$ are transferred to the region of the photoelectric conversion layer 23 facing the charge storage electrode $24_{22}$. The electric charges stored in the region of the photoelectric conversion layer 23 facing the charge storage electrode $24_{33}$ are transferred to the region of the photoelectric conversion layer 23 facing the charge storage electrode $24_{23}$. The electric charges stored in the region of the photoelectric conversion layer 23 facing the charge storage electrode $24_{34}$ are transferred to the region of the photoelectric conversion layer 23 facing the charge storage electrode $24_{24}$.

[Step-22]

The electric charges stored in the region of the photoelectric conversion layer 23 facing the charge storage electrode $24_{41}$ are transferred to the region of the photoelectric conversion layer 23 facing the charge storage electrode $24_{31}$. The electric charges stored in the region of the photoelectric conversion layer 23 facing the charge storage electrode $24_{42}$ are transferred to the region of the photoelectric conversion layer 23 facing the charge storage electrode $24_{32}$. The electric charges stored in the region of the photoelectric conversion layer 23 facing the charge storage electrode $24_{43}$ are transferred to the region of the photoelectric conversion layer 23 facing the charge storage electrode $24_{33}$. The electric charges stored in the region of the photoelectric conversion layer 23 facing the charge storage electrode $24_{44}$ are transferred to the region of the photoelectric conversion layer 23 facing the charge storage electrode $24_{34}$.

[Step-30]

[Step-10] is then carried out again, so that the electric charges stored in the region of the photoelectric conversion layer 23 facing the charge storage electrode $24_{21}$, the electric charges stored in the region of the photoelectric conversion layer 23 facing the charge storage electrode $24_{22}$, the electric charges stored in the region of the photoelectric conversion layer 23 facing the charge storage electrode $24_{23}$, and the electric charges stored in the region of the photoelectric conversion layer 23 facing the charge storage electrode $24_{24}$ can be read out via the first electrode 21.

[Step-40]

After that, the electric charges stored in the region of the photoelectric conversion layer 23 facing the charge storage electrode $24_{21}$ are transferred to the region of the photoelectric conversion layer 23 facing the charge storage electrode $24_{11}$. The electric charges stored in the region of the photoelectric conversion layer 23 facing the charge storage electrode $24_{22}$ are transferred to the region of the photoelectric conversion layer 23 facing the charge storage electrode $24_{12}$. The electric charges stored in the region of the photoelectric conversion layer 23 facing the charge storage electrode $24_{23}$ are transferred to the region of the photoelectric conversion layer 23 facing the charge storage electrode $24_{13}$. The electric charges stored in the region of the photoelectric conversion layer 23 facing the charge storage electrode $24_{24}$ are transferred to the region of the photoelectric conversion layer 23 facing the charge storage electrode $24_{14}$.

[Step-41]

The electric charges stored in the region of the photoelectric conversion layer 23 facing the charge storage electrode $24_{31}$ are transferred to the region of the photoelectric conversion layer 23 facing the charge storage electrode $24_{21}$. The electric charges stored in the region of the photoelectric conversion layer 23 facing the charge storage electrode $24_{32}$ are transferred to the region of the photoelectric conversion layer 23 facing the charge storage electrode $24_{22}$. The electric charges stored in the region of the photoelectric conversion layer 23 facing the charge storage electrode $24_{33}$ are transferred to the region of the photoelectric conversion layer 23 facing the charge storage electrode $24_{23}$. The electric charges stored in the region of the photoelectric conversion layer 23 facing the charge storage electrode $24_{34}$ are transferred to the region of the photoelectric conversion layer 23 facing the charge storage electrode $24_{24}$.

[Step-50]

[Step-10] is then carried out again, so that the electric charges stored in the region of the photoelectric conversion layer 23 facing the charge storage electrode $24_{31}$, the electric charges stored in the region of the photoelectric conversion layer 23 facing the charge storage electrode $24_{32}$, the electric charges stored in the region of the photoelectric conversion layer 23 facing the charge storage electrode $24_{33}$, and the electric charges stored in the region of the photoelectric conversion layer 23 facing the charge storage electrode $24_{34}$ can be read out via the first electrode 21.

[Step-60]

After that, the electric charges stored in the region of the photoelectric conversion layer 23 facing the charge storage electrode $24_{21}$ are transferred to the region of the photoelectric conversion layer 23 facing the charge storage electrode $24_{11}$. The electric charges stored in the region of the photoelectric conversion layer 23 facing the charge storage electrode $24_{22}$ are transferred to the region of the photoelectric conversion layer 23 facing the charge storage electrode $24_{12}$. The electric charges stored in the region of the photoelectric conversion layer 23 facing the charge storage electrode $24_{23}$ are transferred to the region of the photoelectric conversion layer 23 facing the charge storage electrode $24_{13}$. The electric charges stored in the region of the photoelectric conversion layer 23 facing the charge storage electrode $24_{24}$ are transferred to the region of the photoelectric conversion layer 23 facing the charge storage electrode $24_{14}$.

[Step-70]

[Step-10] is then carried out again, so that the electric charges stored in the region of the photoelectric conversion layer 23 facing the charge storage electrode $24_{41}$, the electric charges stored in the region of the photoelectric conversion layer 23 facing the charge storage electrode $24_{42}$, the electric charges stored in the region of the photoelectric conversion layer 23 facing the charge storage electrode $24_{43}$, and the electric charges stored in the region of the photoelectric conversion layer 23 facing the charge storage electrode $24_{44}$ can be read out via the first electrode 21.

In a solid-state imaging apparatus of Example 15, a plurality of stacked imaging devices or the like that constitutes an imaging device block shares a first electrode, and accordingly, the configuration and the structure in the pixel region in which the plurality of stacked imaging devices or the like is arranged can be simplified and miniaturized. Note that the plurality of stacked imaging devices or the like provided for one floating diffusion layer may be formed with a plurality of imaging devices of the first type, or may be formed with at least one imaging device of the first type and one or more imaging devices of the second type.

EXAMPLE 16

Example 16 is a modification of Example 15. In solid-state imaging apparatuses of Example 16 shown in FIGS. 82, 83, 84, and 85 schematically showing the layouts of first electrodes 21 and charge storage electrodes 24, an imaging device block is formed with two stacked imaging devices or the like. One on-chip microlens 14 is then disposed above each imaging device block. Note that, in the examples shown in FIGS. 83 and 85, a charge transfer control electrode 27 is disposed between the plurality of stacked imaging devices or the like constituting the imaging device blocks.

For example, the photoelectric conversion layers corresponding to the charge storage electrodes $24_{11}$, $24_{21}$, $24_{31}$, and $24_{41}$ forming imaging device blocks have high sensitivity to incident light from the upper right in each drawing. Further, the photoelectric conversion layers corresponding to the charge storage electrodes $24_{12}$, $24_{22}$, $24_{32}$, and $24_{42}$ forming the imaging device blocks have high sensitivity to incident light from the upper left in each drawing. Accordingly, the stacked imaging device or the like including the charge storage electrode $24_{11}$ and the stacked imaging device or the like including the charge storage electrode $24_{12}$ are combined, for example, to enable acquisition of an image plane phase difference signal. Further, a signal from the stacked imaging device or the like including the charge storage electrode $24_{11}$ and a signal from the stacked imaging device or the like including the charge storage electrode $24_{12}$ are added to each other, so that one stacked imaging device or the like can be formed with the combination of these stacked imaging devices or the like. In the example shown in FIG. 82, the first electrode $21_1$ is disposed between the charge storage electrode $24_{11}$ and the charge storage electrode $24_{12}$. However, as in the example shown in FIG. 84, the single first electrode $21_1$ may be disposed to face the two charge storage electrodes $24_{11}$ and $24_{12}$, to further increase sensitivity.

EXAMPLE 17

The technology (the present technology) according to the present disclosure can be applied to various products. For example, the technology according to the present disclosure may be embodied as an apparatus mounted on any type of moving object, such as an automobile, an electrical vehicle, a hybrid electrical vehicle, a motorcycle, a bicycle, a personal mobility device, an airplane, a drone, a vessel, or a robot.

Figure 114:
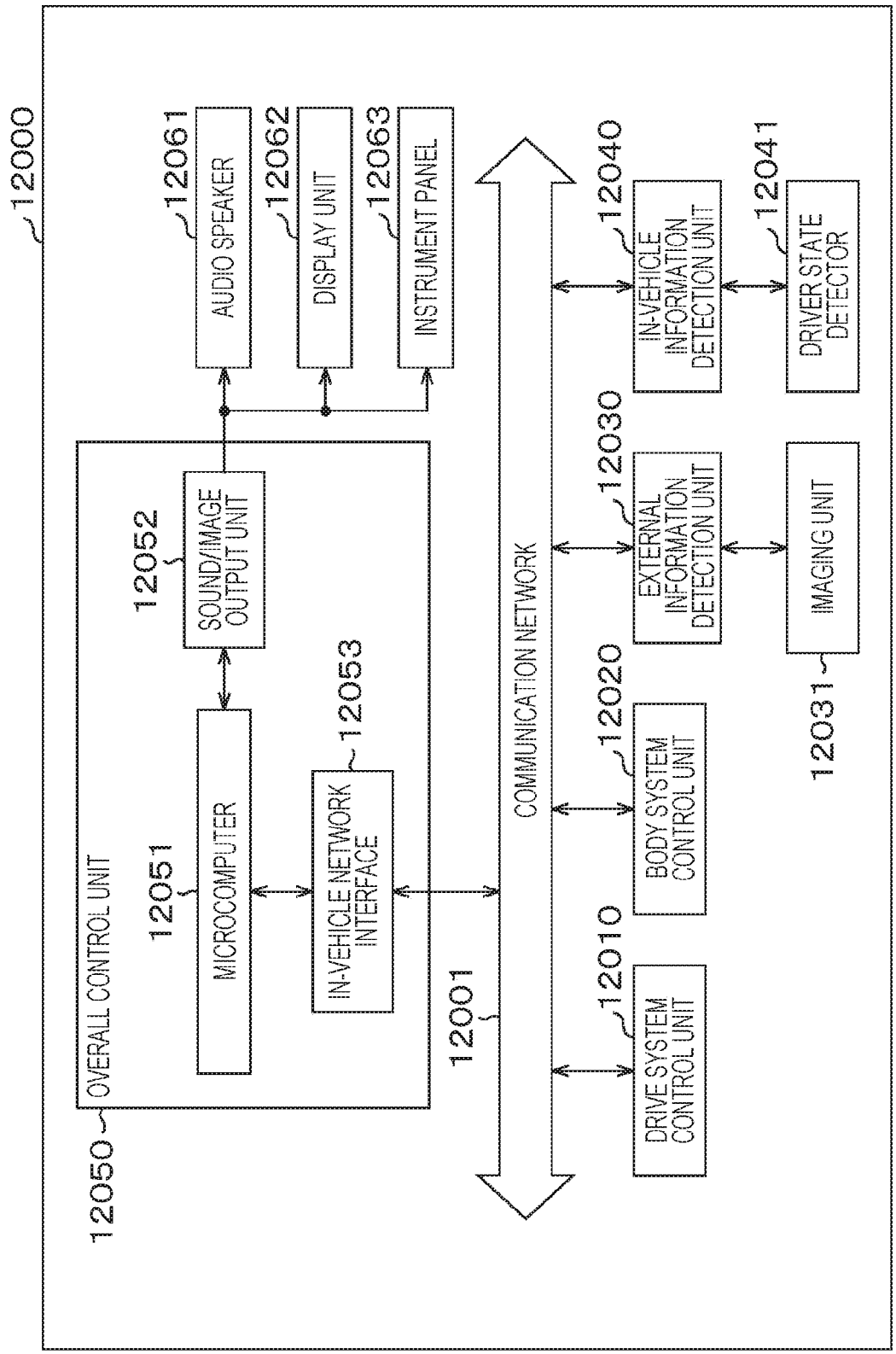
FIG. 114 is a block diagram schematically showing an example configuration of a vehicle control system.

FIG. 114 is a block diagram schematically showing an example configuration of a vehicle control system that is an example of a moving object control system to which the technology according to the present disclosure may be applied.

The vehicle control system 12000 includes a plurality of electronic control units connected via a communication network 12001. In the example shown in FIG. 114, the vehicle control system 12000 includes a drive system control unit 12010, a body system control unit 12020, an external information detection unit 12030, an in-vehicle information detection unit 12040, and an overall control unit 12050. A microcomputer 12051, a sound/image output unit 12052, and an in-vehicle network interface (I/F) 12053 are also shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. On the basis of the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared rays.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, on the basis of detected information input from the driver state detector 12041, the in-vehicle information detection unit 12040 may calculate the degree of fatigue or the degree of concentration of the driver, or determine whether the driver is dozing off.

On the basis of the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle speed maintenance running, vehicle collision warning, vehicle lane deviation warning, or the like.

The microcomputer 12051 can also perform cooperative control to conduct automatic driving or the like for autonomously running not depending on the operation of the driver, by controlling the driving force generation device, the steering mechanism, the braking device, or the like on the basis of information about the surroundings of the vehicle, the information having being acquired by the external information detection unit 12030 or the in-vehicle information detection unit 12040.

The microcomputer 12051 can also output a control command to the body system control unit 12020, on the basis of the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 114, an audio speaker 12061, a display unit 12062, and an instrument panel 12063 are shown as output devices. The display unit 12062 may include an on-board display and/or a head-up display, for example.

Figure 115:
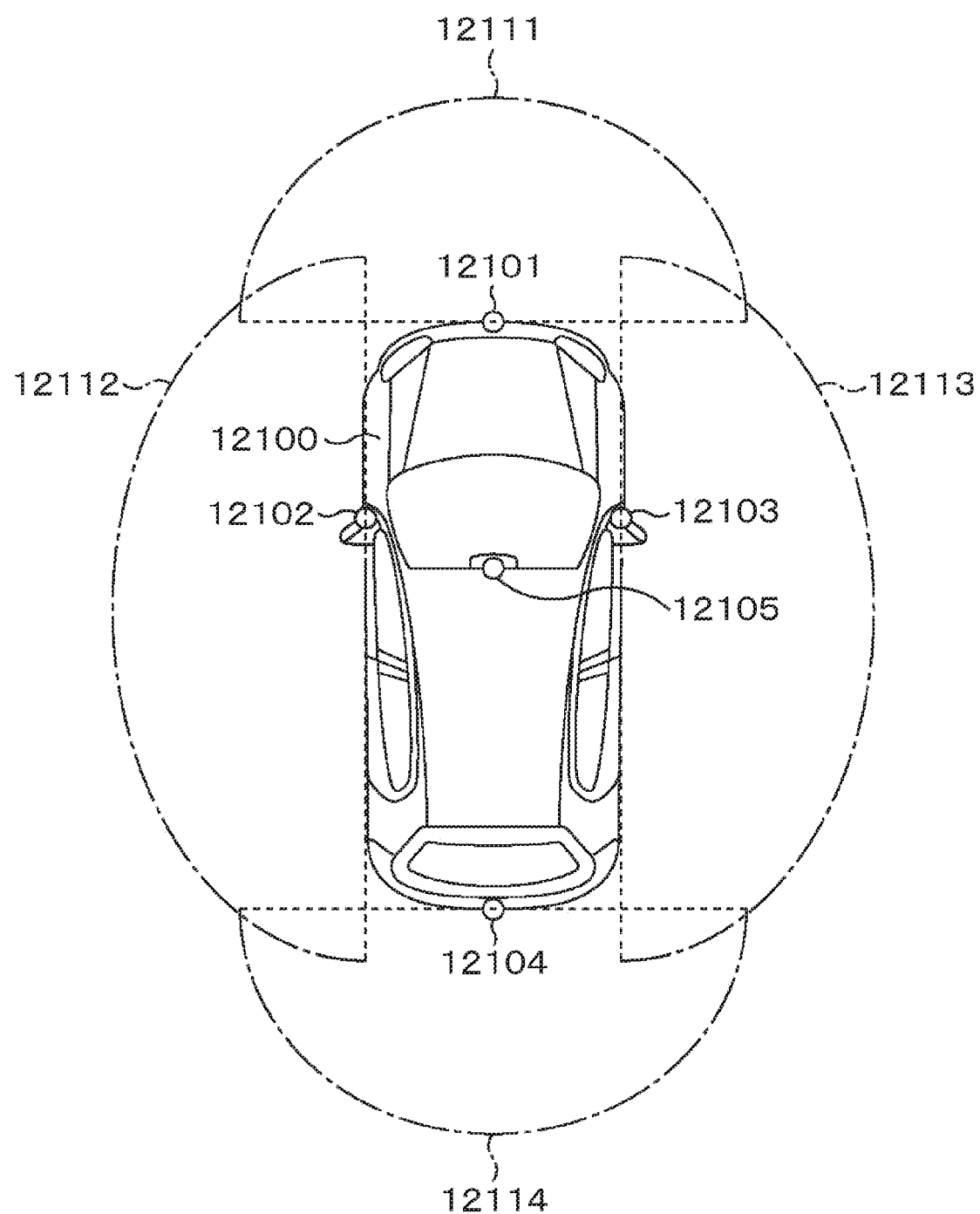
FIG. 115 is an explanatory diagram showing an example of installation positions of external information detectors and imaging units.

FIG. 115 is a diagram showing an example of installation positions of imaging units 12031.

In FIG. 115, a vehicle 12100 includes imaging units 12101, 12102, 12103, 12104, and 12105 as the imaging units 12031.

Imaging units 12101, 12102, 12103, 12104, and 12105 are provided at the following positions: the front end edge of a vehicle 12100, a side mirror, the rear bumper, a rear door, and an upper portion of the front windshield inside the vehicle, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 115 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, in accordance with distance information obtained from the imaging units 12101 through 12104, the microcomputer 12051 calculates the distances to the respective three-dimensional objects within the imaging ranges 12111 through 12114, and temporal changes in the distances (the speeds relative to the vehicle 12100). In this manner, the three-dimensional object that is the closest three-dimensional object on the traveling path of the vehicle 12100 and is traveling at a predetermined speed (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 outputs a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared light. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. The sound/image output unit 12052 may also control the display unit 12062 to display an icon or the like indicating the pedestrian at a desired position.

EXAMPLE 18

The technology (the present technology) according to the present disclosure may also be applied to various products.

For example, the technology according to the present disclosure may be applied to an endoscopic surgery system.

Figure 116:
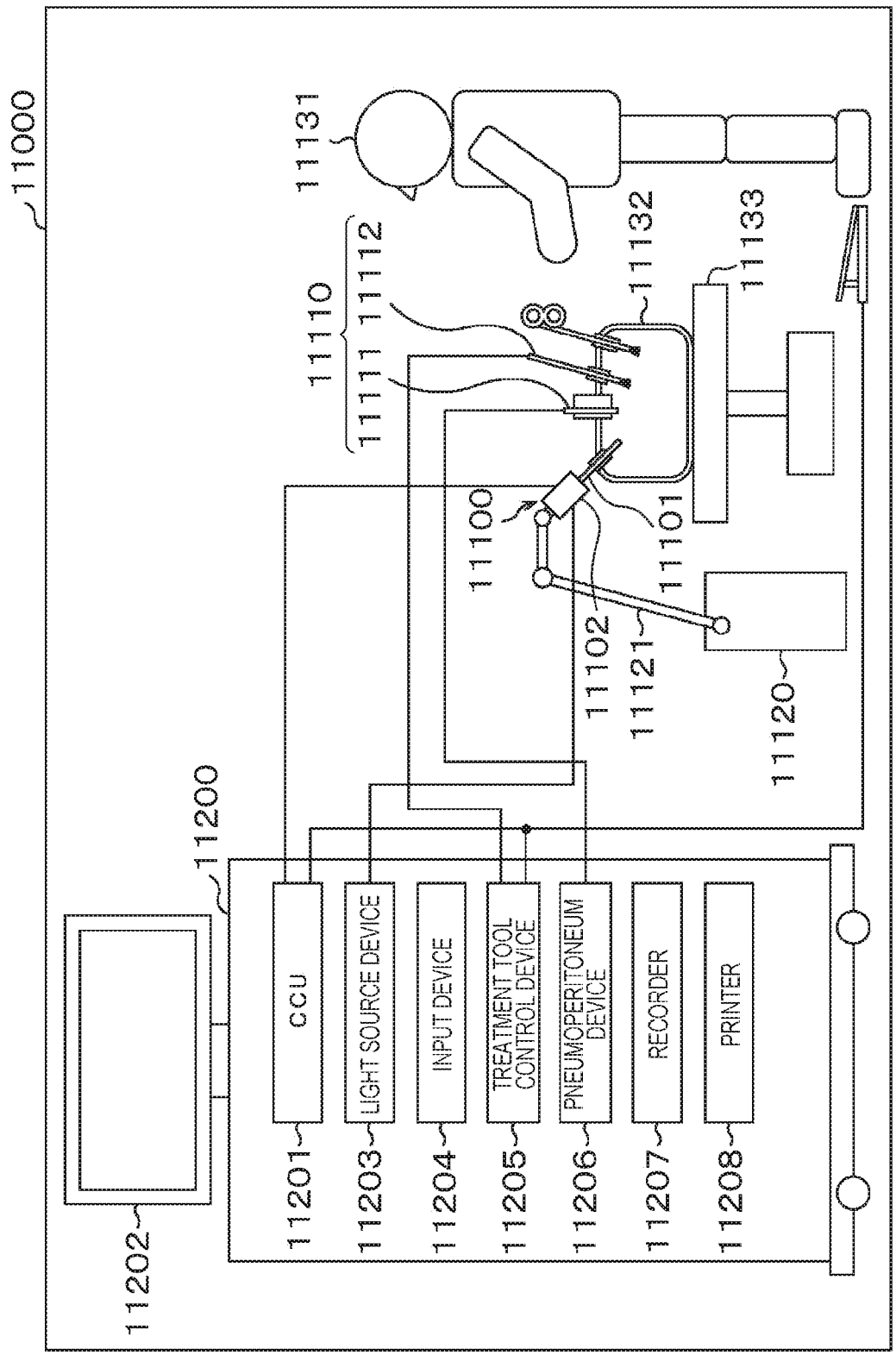
FIG. 116 is a diagram schematically showing an example configuration of an endoscopic surgery system.

FIG. 116 is a diagram schematically showing an example configuration of an endoscopic surgery system to which the technology (the present technology) according to the present disclosure may be applied.

FIG. 116 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is configured as a so-called rigid scope having a rigid lens barrel 11101. However, the endoscope 11100 may be configured as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a direct-view mirror, an oblique-view mirror, or a side-view mirror.

An optical system and an imaging device are provided inside the camera head 11102, and reflected light (observation light) from the current observation target is converged on the imaging device by the optical system. The observation light is photoelectrically converted by the imaging device, and an electrical signal corresponding to the observation light, or an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. Further, the CCU 11201 receives an image signal from the camera head 11102, and subjects the image signal to various kinds of image processing, such as a development process (demosaicing process), for example, to display an image based on the image signal.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging the surgical site or the like.

An input device 11204 is an input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical site can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging device of the camera head 11102 may be controlled in synchronization with the timing of the light emission. Thus, images corresponding to the respective RGB colors can be captured in a time-division manner. According to the method, a color image can be obtained without any color filter layer provided in the imaging device.

The driving of the light source device 11203 may also be controlled so that the intensity of light to be output is changed at predetermined time intervals. The driving of the imaging device of the camera head 11102 is controlled in synchronism with the timing of the change in the intensity of the light, and images are acquired in a time-division manner and are then combined. Thus, a high dynamic range image with no black portions and no white spots can be generated.

The light source device 11203 may also be designed to be capable of supplying light of a predetermined wavelength band compatible with special light observation. In special light observation, light of a narrower band than the illuminating light (or white light) at the time of normal observation is emitted, with the wavelength dependence of light absorption in body tissue being taken advantage of, for example. As a result, so-called narrow band imaging is performed to image predetermined tissue such as a blood vessel in a mucosal surface layer or the like, with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (autofluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of suppling narrowband light and/or excitation light compatible with such special light observation.

Figure 117:
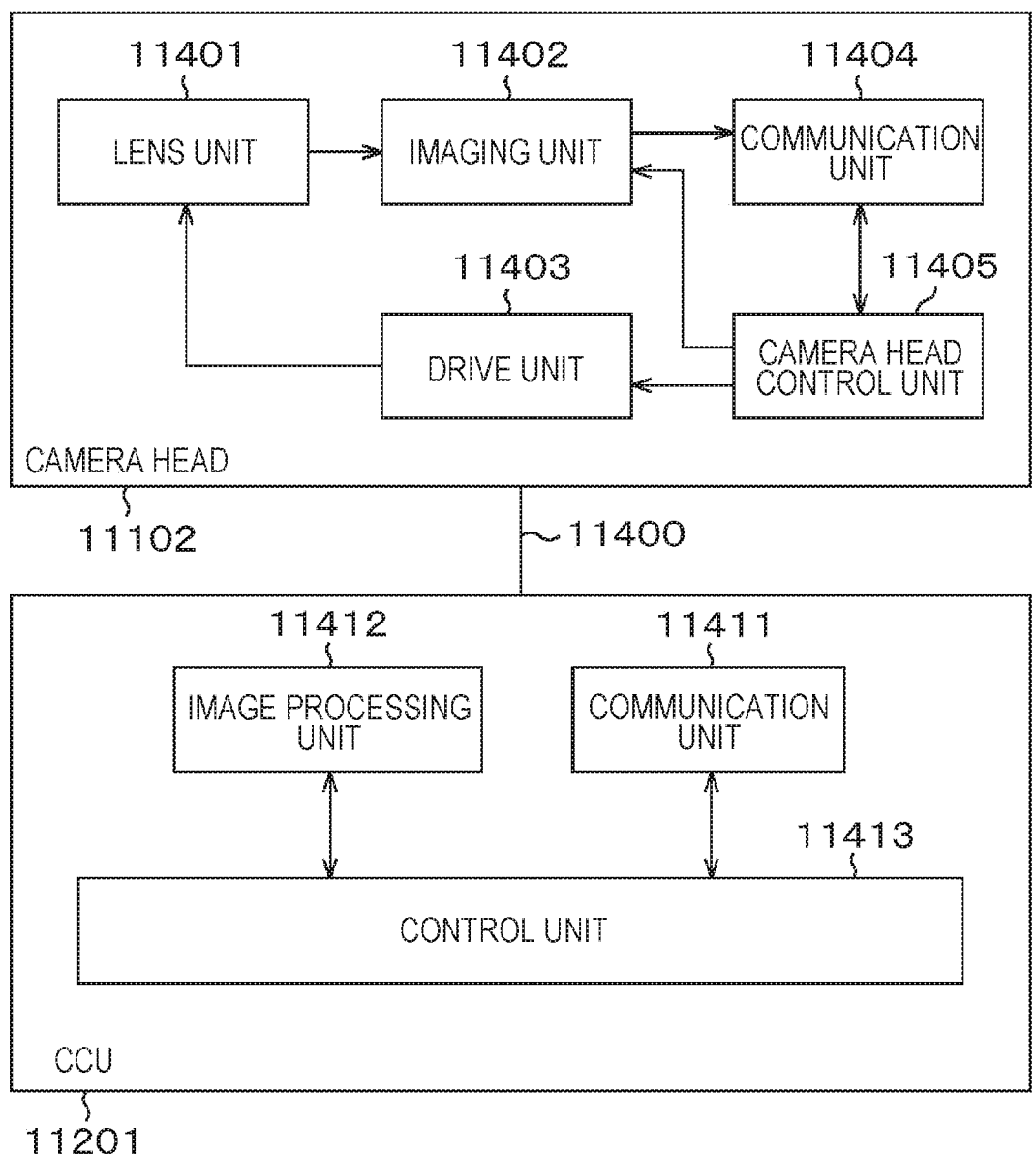
FIG. 117 is a block diagram showing an example of the functional configurations of a camera head and a CCU.

FIG. 117 is a block diagram showing an example of the functional configurations of the camera head 11102 and the CCU 11201 shown in FIG. 116.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the connecting portion with the lens barrel 11101. Observation light captured from the top end of the lens barrel 11101 is guided to the camera head 11102, and enters the lens unit 11401. The lens unit 11401 is formed with a combination of a plurality of lenses including a zoom lens and a focus lens.

The imaging unit 11402 is formed with an imaging device. The imaging unit 11402 may be formed with one imaging device (a so-called single-plate type), or may be formed with a plurality of imaging devices (a so-called multiple-plate type). In a case where the imaging unit 11402 is of a multiple-plate type, for example, image signals corresponding to the respective RGB colors may be generated by the respective imaging devices, and be then combined to obtain a color image. Alternatively, the imaging unit 11402 may be designed to include a pair of imaging devices for acquiring right-eye and left-eye image signals compatible with three-dimensional (3D) display. As the 3D display is conducted, the surgeon 11131 can grasp more accurately the depth of the living tissue at the surgical site. Note that, in a case where the imaging unit 11402 is of a multiple-plate type, a plurality of lens units 11401 are provided for the respective imaging devices.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit 11401 by a predetermined distance along the optical axis. With this arrangement, the magnification and the focal point of the image captured by the imaging unit 11402 can be appropriately adjusted.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

The communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 on the basis of an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, on the basis of a control signal received from the CCU 11201 via the communication unit 11404.

The communication unit 11411 is formed with a communication device for transmitting and receiving various kinds of information to and from the camera head 11102. The communication unit 11411 receives an image signal transmitted from the camera head 11102 via the transmission cable 11400.

The communication unit 11411 also transmits a control signal for controlling the driving of the camera head 11102, to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical portion or the like captured by the endoscope 11100, and a captured image obtained through imaging of the surgical site or the like. For example, the control unit 11413 generates a control signal for controlling the driving of the camera head 11102.

The control unit 11413 also causes the display device 11202 to display a captured image showing the surgical site or the like, on the basis of the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body site, bleeding, the mist at the time of use of the energy treatment tool 11112, and the like. When causing the display device 11202 to display the captured image, the control unit 11413 may cause the display device 11202 to superimpose various kinds of surgery aid information on the image of the surgical site on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400. However, communication between the camera head 11102 and the CCU 11201 may be performed in a wireless manner.

EXAMPLE 19

Further, the technology according to the present disclosure (the present technology) may be applied to various products. For example, the technology according to the present disclosure may be applied to an endoscopic surgery system.

Figure 118:
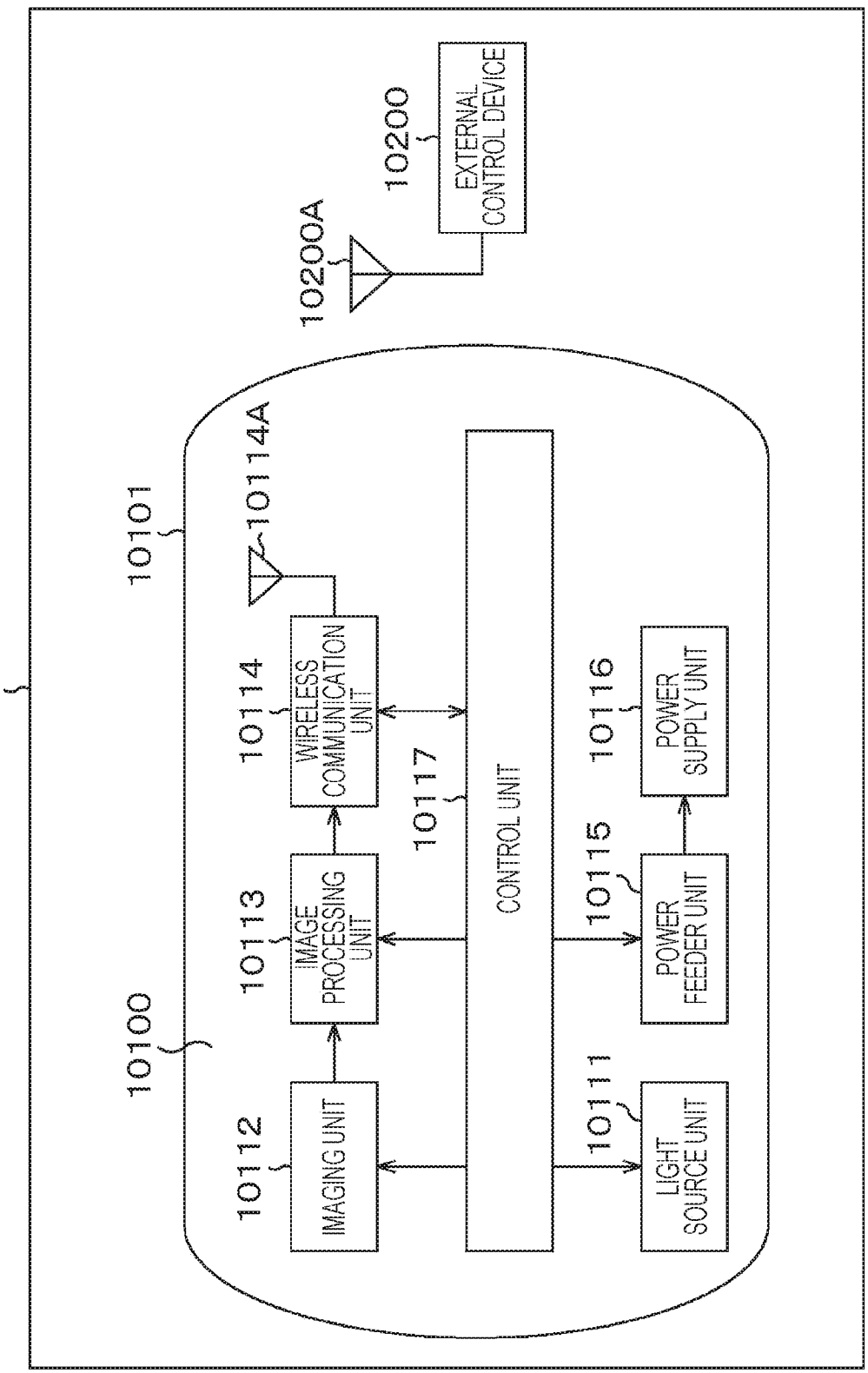
FIG. 118 is a block diagram schematically showing an example configuration of an in-vivo information acquisition system.

FIG. 118 is a block diagram schematically showing an example configuration of a patient's in-vivo information acquisition system using a capsule endoscope to which the technology (the present technology) according to the present disclosure may be applied.

An in-vivo information acquisition system 10001 includes a capsule endoscope 10100 and an external control device 10200.

The capsule endoscope 10100 is swallowed by the patient at the time of examination. The capsule endoscope 10100 has an imaging function and a wireless communication function. Before naturally discharged from the patient, the capsule endoscope 10100 moves inside the internal organs such as the stomach and the intestines by peristaltic motion or the like, sequentially captures images of the inside of the internal organs (these images will be hereinafter also referred to as in-vivo images) at predetermined intervals, and sequentially transmits information about the in-vivo images to the external control device 10200 outside the body in a wireless manner.

The external control device 10200 controls the overall operation of the in-vivo information acquisition system 10001. The external control device 10200 also receives the information about the in-vivo images transmitted from the capsule endoscope 10100, and, on the basis of the received in-vivo image information, generates image data for displaying the in-vivo images on a display device (not shown).

In this manner, the in-vivo information acquisition system 10001 can acquire in-vivo images showing the states of the inside of the body of the patient at any appropriate time until the swallowed capsule endoscope 10100 is discharged.

The configurations and the functions of the capsule endoscope 10100 and the external control device 10200 are now described in greater detail.

The capsule endoscope 10100 has a capsule-like housing 10101, and the housing 10101 houses a light source unit 10111, an imaging unit 10112, an image processing unit 10113, a wireless communication unit 10114, a power feeder unit 10115, a power supply unit 10116, and a control unit 10117.

The light source unit 10111 is formed with a light source such as a light emitting diode (LED), for example, and emits light onto the imaging field of view of the imaging unit 10112.

The imaging unit 10112 is formed with an imaging device and an optical system including a plurality of lenses provided in front of the imaging device. Reflected light of light emitted to body tissue as the current observation target (this reflected light will be hereinafter referred to as the observation light) is collected by the optical system, and enters the imaging device. In the imaging unit 10112, the observation light incident on the imaging device is photoelectrically converted, and an image signal corresponding to the observation light is generated. The image signal generated by the imaging unit 10112 is supplied to the image processing unit 10113.

The image processing unit 10113 is formed with a processor such as a central processing unit (CPU) or a graphics processing unit (GPU), and performs various kinds of signal processing on the image signal generated by the imaging unit 10112. The image processing unit 10113 supplies the image signal subjected to the signal processing as RAW data to the wireless communication unit 10114.

The wireless communication unit 10114 performs predetermined processing such as modulation processing on the image signal subjected to the signal processing by the image processing unit 10113, and transmits the image signal to the external control device 10200 via an antenna 10114A. The wireless communication unit 10114 also receives a control signal related to control of driving of the capsule endoscope 10100 from the external control device 10200 via the antenna 10114A. The wireless communication unit 10114 supplies the control signal received from the external control device 10200 to the control unit 10117.

The power feeder unit 10115 includes an antenna coil for power reception, a power regeneration circuit that regenerates electric power from the current generated in the antenna coil, a booster circuit, and the like. In the power feeder unit 10115, electric power is generated according to a so-called non-contact charging principle.

The power supply unit 10116 is formed with a secondary battery, and stores the electric power generated by the power feeder unit 10115. In FIG. 118, to avoid complication of the drawing, an arrow or the like indicating the destination of power supply from the power supply unit 10116 is not shown. However, the electric power stored in the power supply unit 10116 is supplied to the light source unit 10111, the imaging unit 10112, the image processing unit 10113, the wireless communication unit 10114, and the control unit 10117, and can be used for driving these units.

The control unit 10117 is formed with a processor such as a CPU, and drives the light source unit 10111, the imaging unit 10112, the image processing unit 10113, the wireless communication unit 10114, and the power feeder unit 10115 unit as appropriate in accordance with a control signal transmitted from the external control device 10200.

The external control device 10200 is formed with a processor such as a CPU or a GPU, or a microcomputer, a control board, or the like on which a processor and a storage element such as a memory are mounted together. The external control device 10200 controls operation of the capsule endoscope 10100 by transmitting a control signal to the control unit 10117 of the capsule endoscope 10100 via an antenna 10200A. In the capsule endoscope 10100, the conditions for emitting light to the current observation target in the light source unit 10111 can be changed in accordance with the control signal from the external control device 10200, for example. The imaging conditions (such as the frame rate, the exposure value, and the like in the imaging unit 10112, for example) can also be changed in accordance with the control signal from the external control device 10200. Further, the contents of the processing in the image processing unit 10113 and the conditions (such as the transmission intervals and the number of images to be transmitted, for example) for the wireless communication unit 10114 to transmit image signals may be changed in accordance with the control signal from the external control device 10200.

The external control device 10200 also performs various kinds of image processing on the image signal transmitted from the capsule endoscope 10100, and generates image data for displaying a captured in-vivo image on the display device. Examples of the image processing include various kinds of signal processing, such as a development process (a demosaicing process), an image quality enhancement process (a band emphasizing process, a super-resolution process, a noise reduction (NR) process, a camera shake correction process, and/or the like), and/or an enlargement process (an electronic zooming process), for example. The external control device 10200 controls driving of the display device, to cause the display device to display an in-vivo image captured on the basis of the generated image data. Alternatively, the external control device 10200 may cause a recording device (not shown) to record the generated image data, or cause a printing device (not shown) to print out the generated image data.

Although the present disclosure has been described so far on the basis of preferred examples, the present disclosure is not limited to those examples. The structures, the configurations, the manufacturing conditions, the manufacturing methods, and the materials used for the stacked imaging devices, the stacked imaging devices or the like, and the solid-state imaging apparatus described in Examples are merely examples, and may be modified as appropriate. The stacked imaging devices or the like of Examples may be combined as appropriate. For example, it is possible to combine a stacked imaging device or the like of Example 9, a stacked imaging device or the like of Example 10, a stacked imaging device or the like of Example 11, a stacked imaging device or the like of Example 12, and a stacked imaging device or the like of Example 13 in a desired manner. It is also possible to combine a stacked imaging device or the like of Example 9, a stacked imaging device or the like of Example 10, a stacked imaging device or the like of Example 11, a stacked imaging device or the like of Example 12, and a stacked imaging device or the like of Example 14 in a desired manner.

In some cases, floating diffusion layers $FD_1$, $FD_2$, $FD_3$, 51C, 45C, and 46C can be shared.

Figure 86:
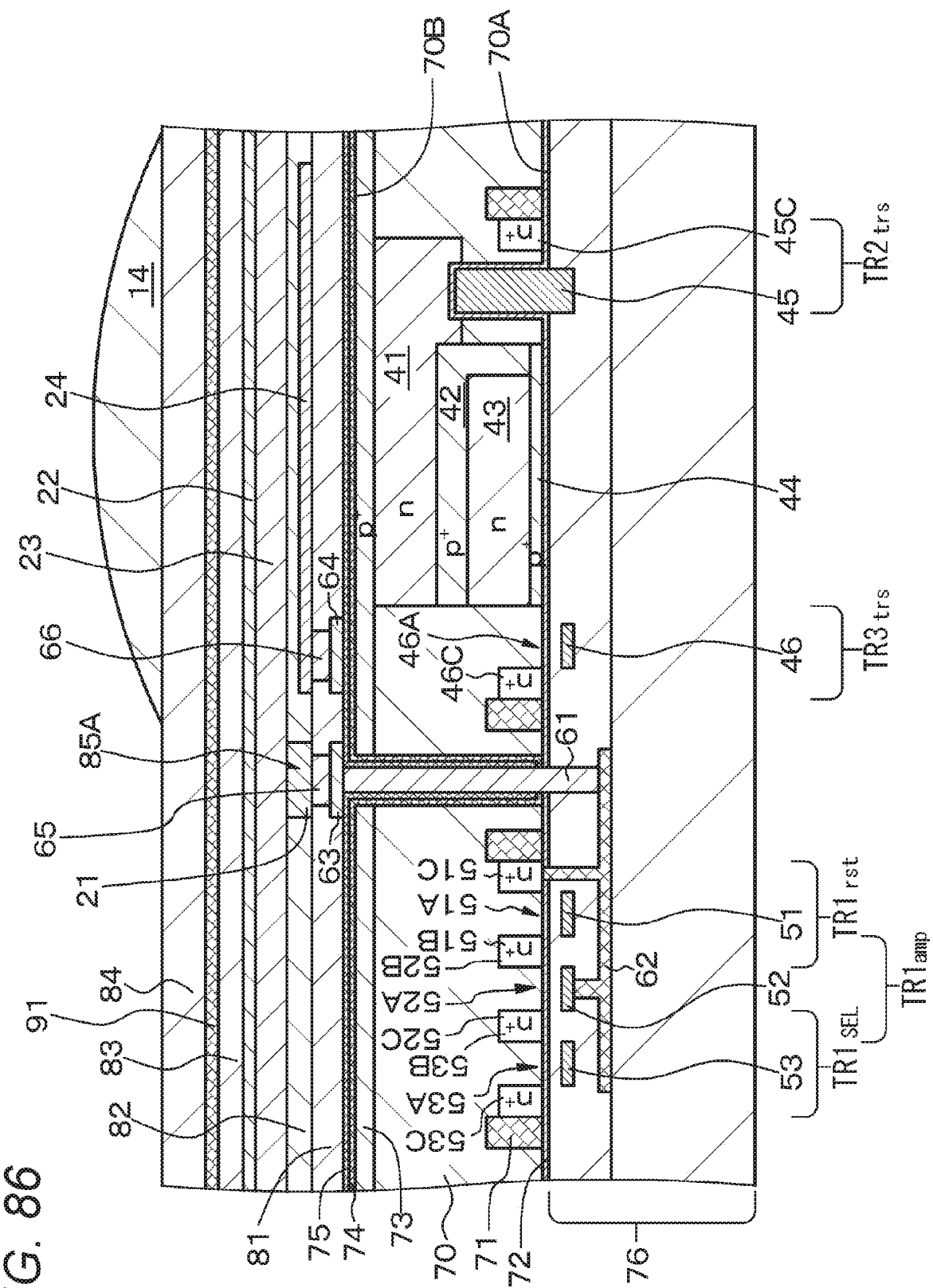

As shown in FIG. 86, which shows a modification of a stacked imaging device or the like described in Example 3, the first electrode 21 may extend in an opening 85A formed in the insulating layer 82, and be connected to the photoelectric conversion layer 23, for example.

Figure 87:
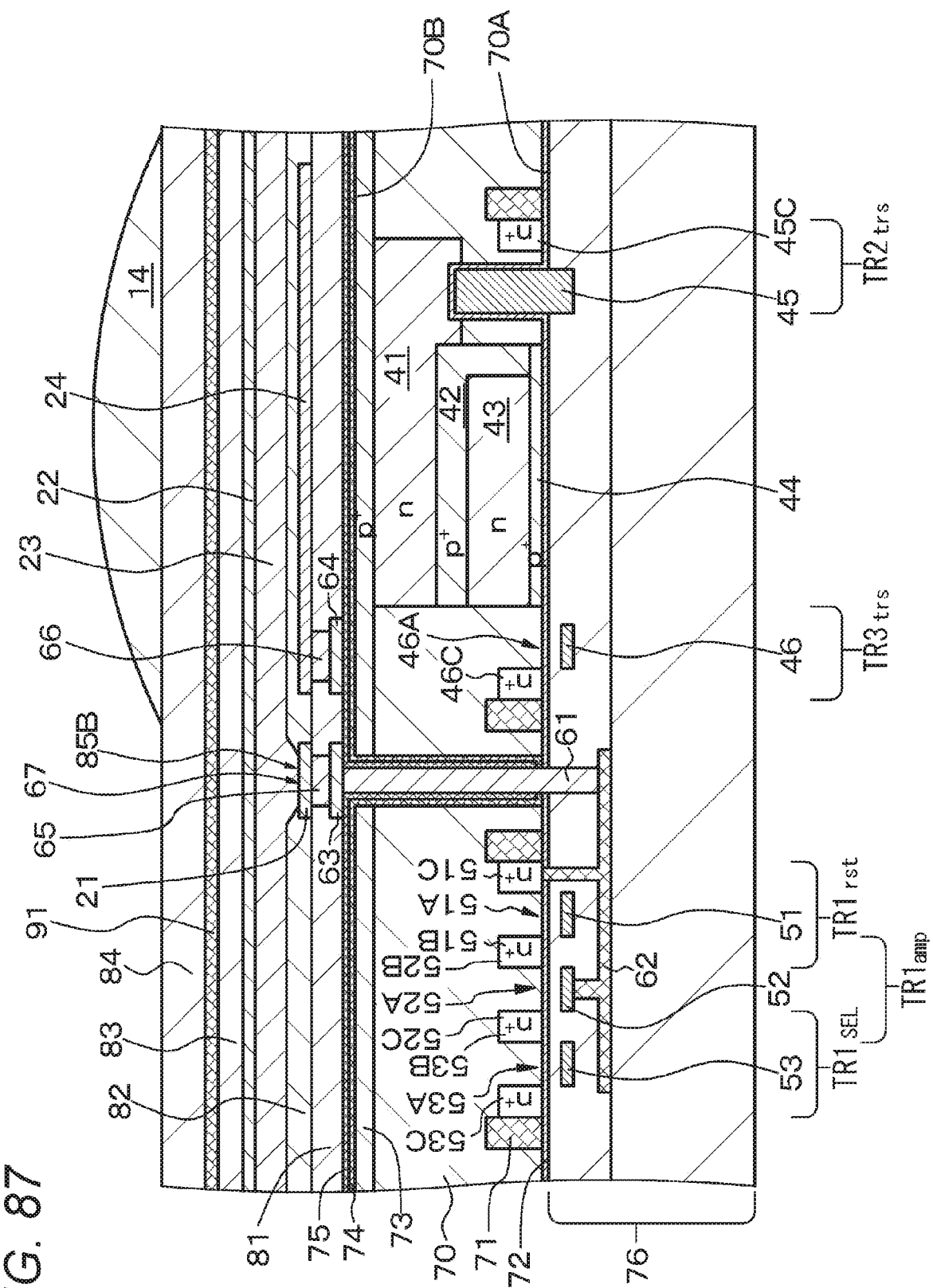
Figure 88A:
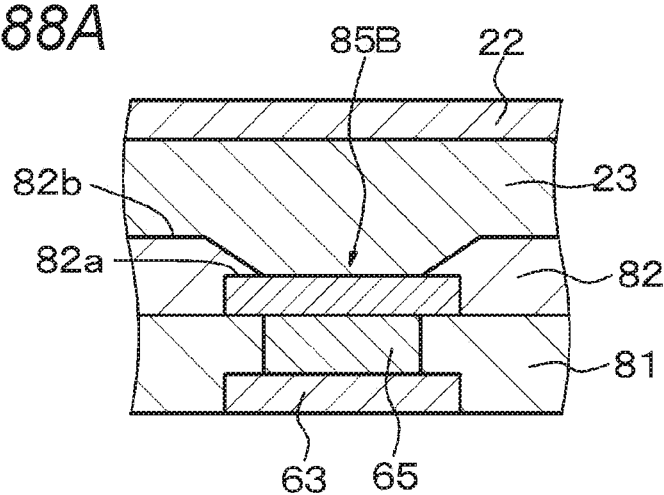
Figure 88B:
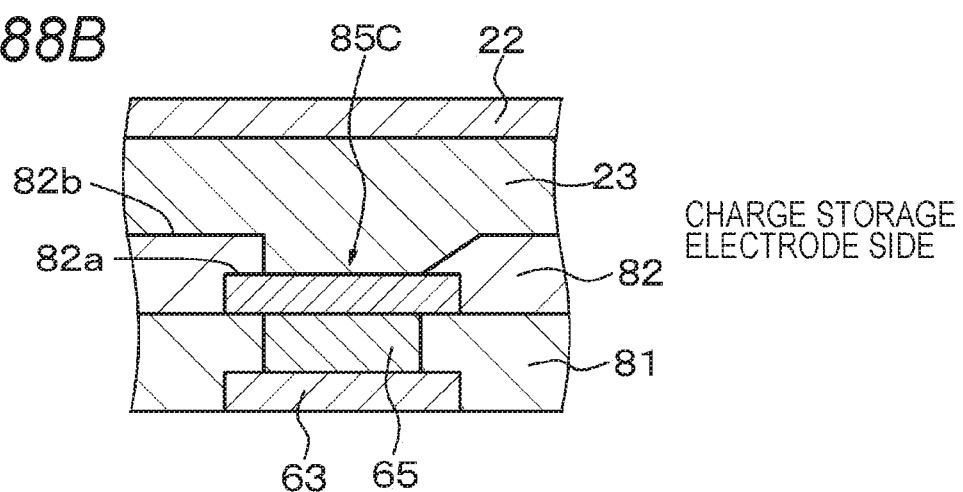
Figure 88C:
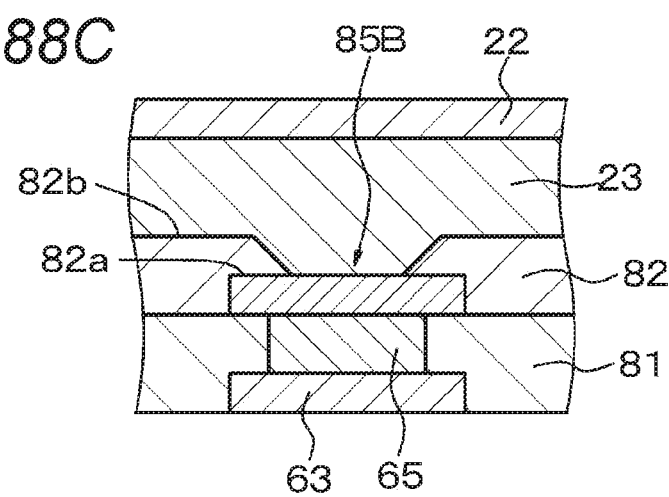

Alternatively, as shown in FIG. 87, which shows a modification of a stacked imaging device or the like described in Example 3, and in FIG. 88A showing a schematic partial cross-sectional view of an enlarged view of the portion of the first electrode and the like, the edge portion of the top surface of the first electrode 21 is covered with the insulating layer 82, and the first electrode 21 is exposed through the bottom surface of an opening 85B. Where the surface of the insulating layer 82 in contact with the top surface of the first electrode 21 is a first surface 82a, and the surface of the insulating layer 82 in contact with the portion of the photoelectric conversion layer 23 facing the charge storage electrode 24 is a second surface 82b, the side surfaces of the opening 85B are slopes spreading from the first surface 82a toward the second surface 82b, for example. As the side surfaces of the opening 85B are sloped as above, electric charge transfer from the photoelectric conversion layer 23 to the first electrode 21 becomes smoother. Note that, in the example shown in FIG. 88A, the side surfaces of the opening 85B are rotationally symmetrical about the axis line of the opening 85B. However, as shown in FIG. 88B, an opening 85C may be designed so that a side surface of the opening 85C having a slope spreading from the first surface 82a toward the second surface 82b is located on the side of the charge storage electrode 24. This makes it difficult for electric charges to transfer from the portion of the photoelectric conversion layer 23 on the opposite side of the opening 85C from the charge storage electrode 24. While the side surface of the opening 85B has a slope which spreads from the first surface 82a to the second surface 82b, the edge portions of the side surfaces of the opening 85B in the second surface 82b may be located on the outer side of the edge portion of the first electrode 21 as shown in FIG. 88A, or may be located on the inner side of the edge portion of the first electrode 21 as shown in FIG. 88C. The former configuration is adopted to further facilitate electric charge transfer. The latter configuration is adopted to reduce the variation in the shape of the opening at the time of formation.

To form these openings 85B and 85C, an etching mask including the resist material formed when an opening is formed in an insulating layer by an etching method is reflowed, so that the side surface(s) of the opening of the etching mask is (are) sloped, and etching is performed on the insulating layer 82 with the etching mask.

Figure 89:
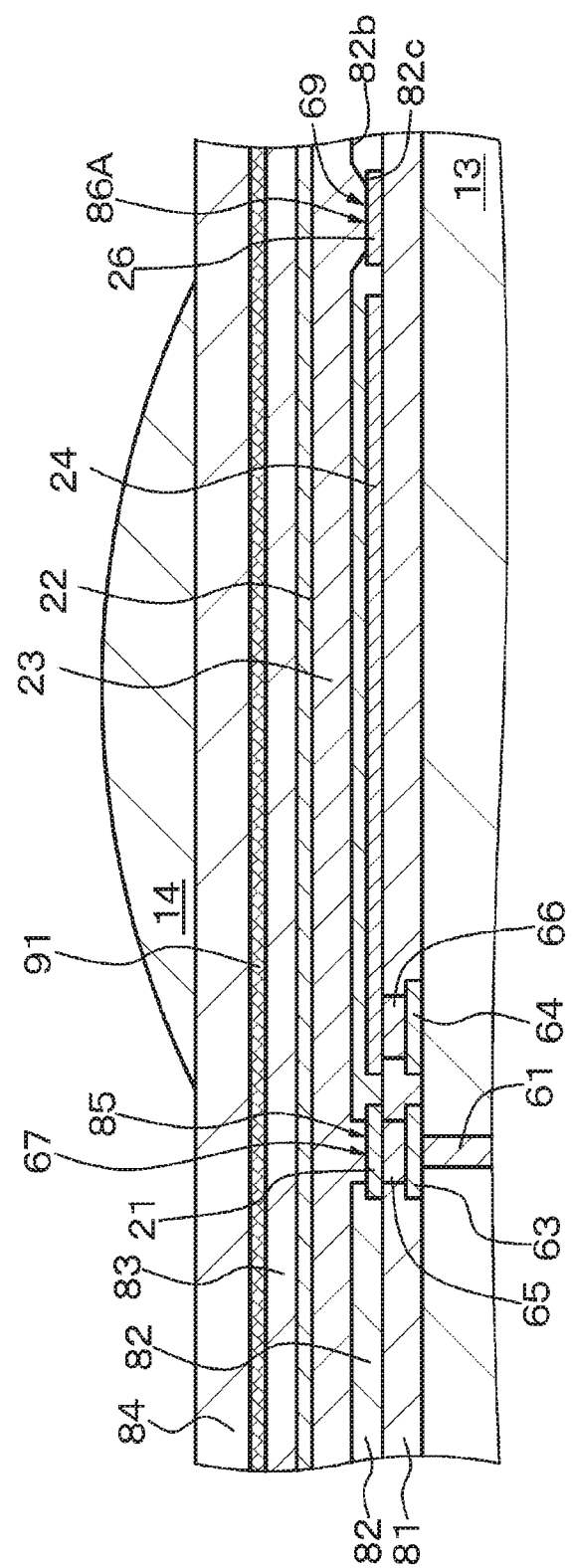

Alternatively, regarding the charge emission electrode 26 described in Example 7, as shown in FIG. 89, the photoelectric conversion layer 23 may extend in a second opening 86A formed in the insulating layer 82 and be connected to the charge emission electrode 26, the edge portion of the top surface of the charge emission electrode 26 may be covered with the insulating layer 82, and the charge emission electrode 26 may be exposed through the bottom surface of the second opening 86A. Where the surface of the insulating layer 82 in contact with the top surface of the charge emission electrode 26 is a third surface 82c, and the surface of the insulating layer 82 in contact with the portion of the photoelectric conversion layer 23 facing the charge storage electrode 24 is the second surface 82b, the side surfaces of the second opening 86A may be slopes spreading from the third surface 82c to the second surface 82b. Note that, in FIGS. 90 through 93, the lower insulating layer 83, the polarizer 91, and the upper insulating layer 84 are shown in a simplified manner.

Figure 90:
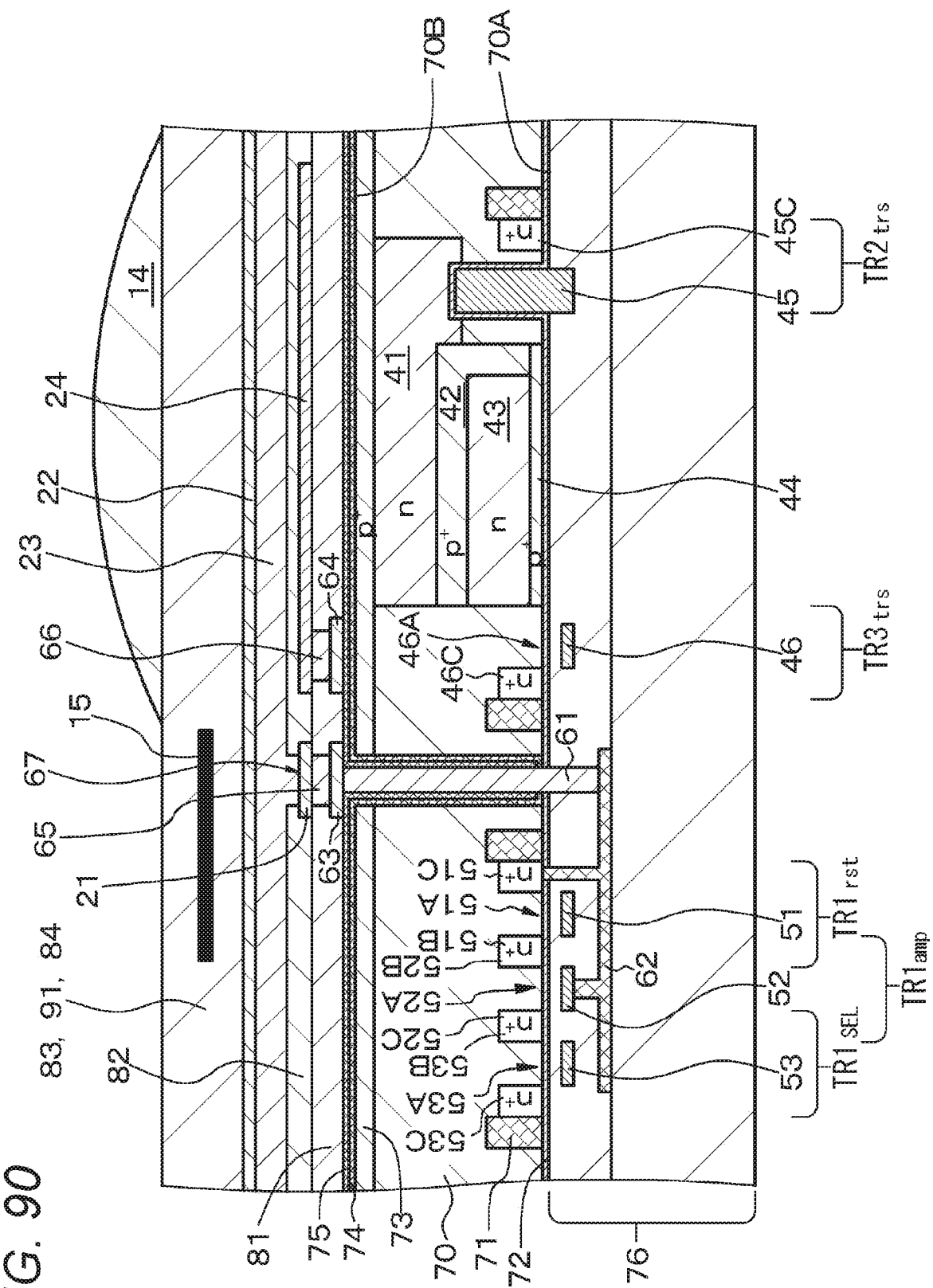

Further, as shown in FIG. 90, which shows a modification of a stacked imaging device or the like described in Example 3, light may enter from the side of the second electrode 22, and a light blocking layer 15 may be formed on the light incident side closer to the second electrode 22, for example. Note that the various wiring lines provided on the light incident side of the photoelectric conversion layer may also function as a light blocking layer.

Figure 91:
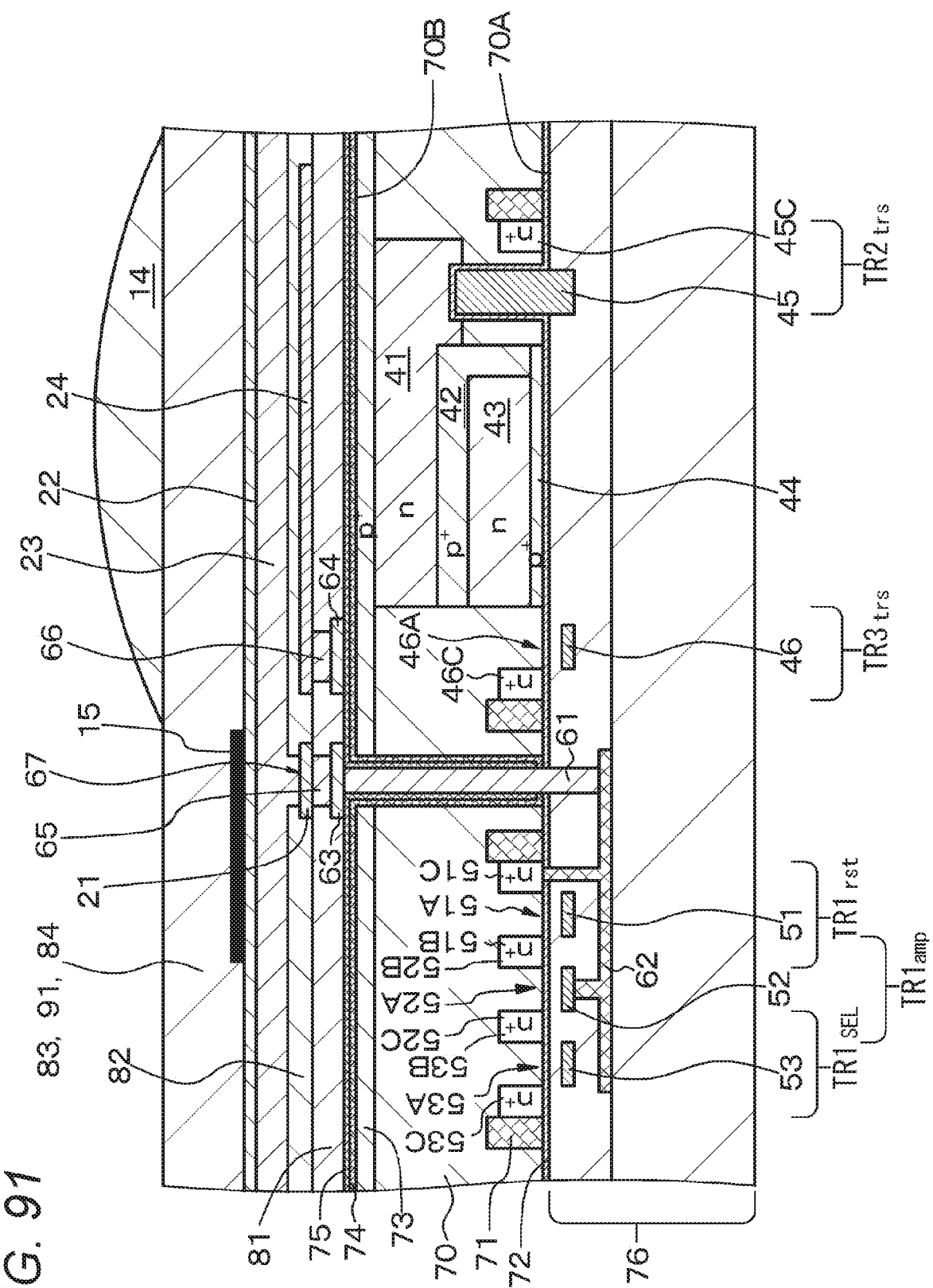
Figure 92:
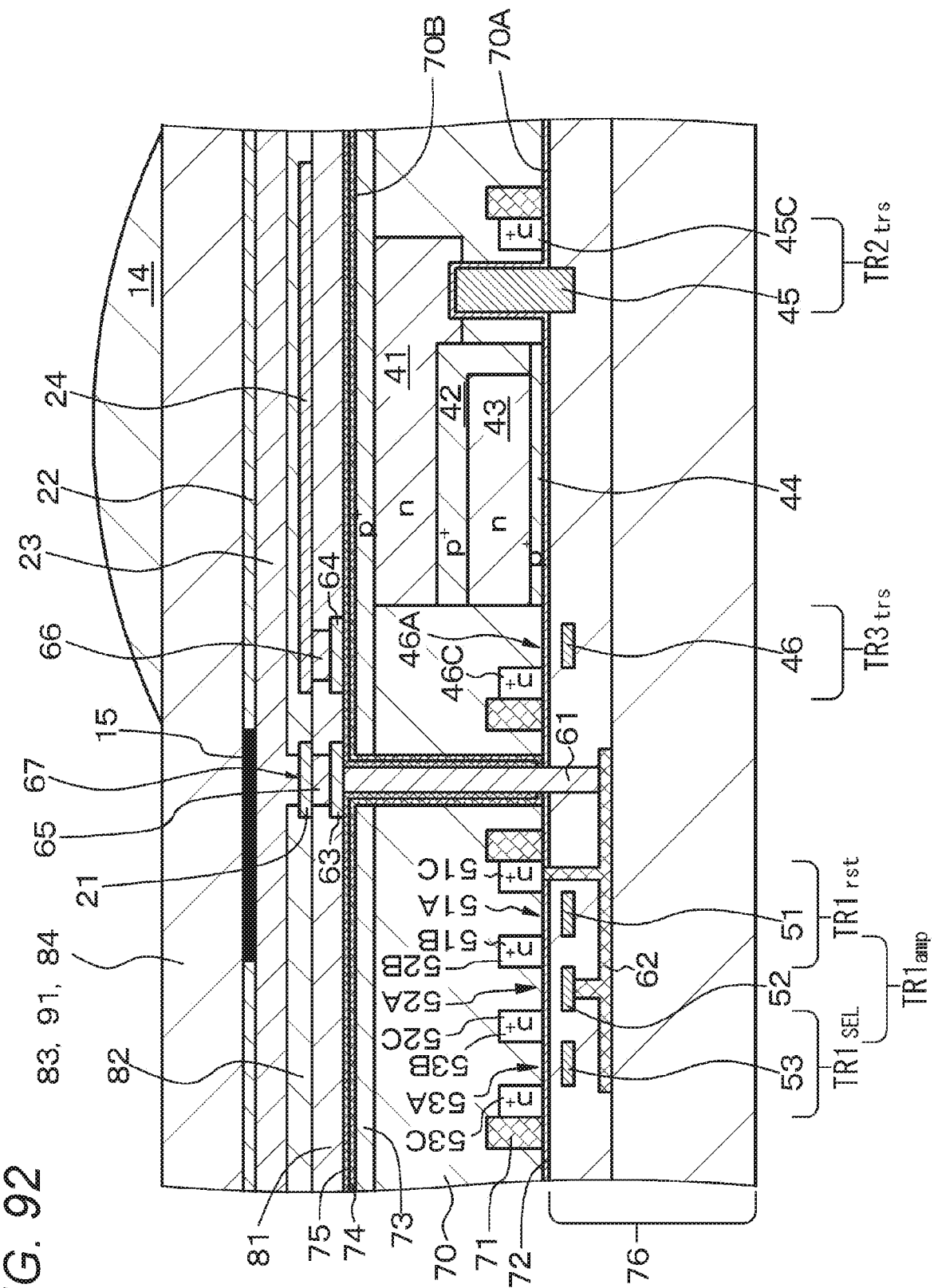

Note that, in the example shown in FIG. 90, the light blocking layer 15 is formed above the second electrode 22, or the light blocking layer 15 is formed on the light incident side closer to the second electrode 22 and above the first electrode 21. However, the light blocking layer 15 may be disposed on a surface on the light incident side of the second electrode 22, as shown in FIG. 91. Further, in some cases, the light blocking layer 15 may be formed in the second electrode 22, as shown in FIG. 92.

Figure 93:
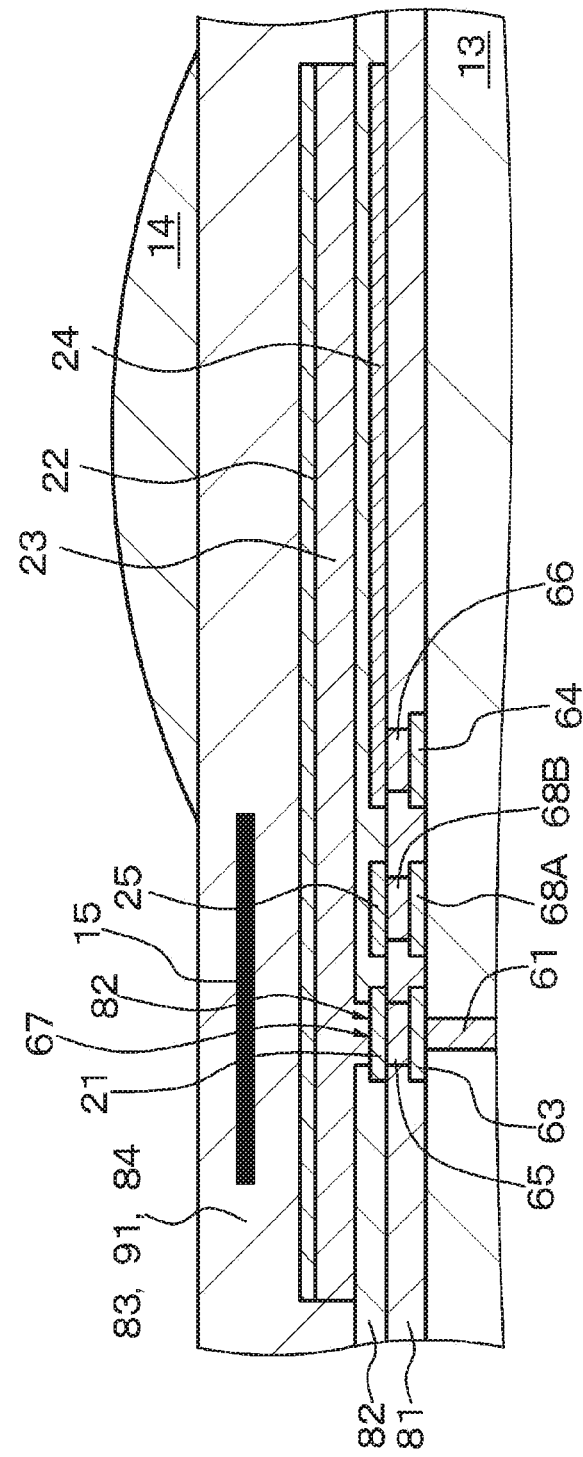
Figure 94:
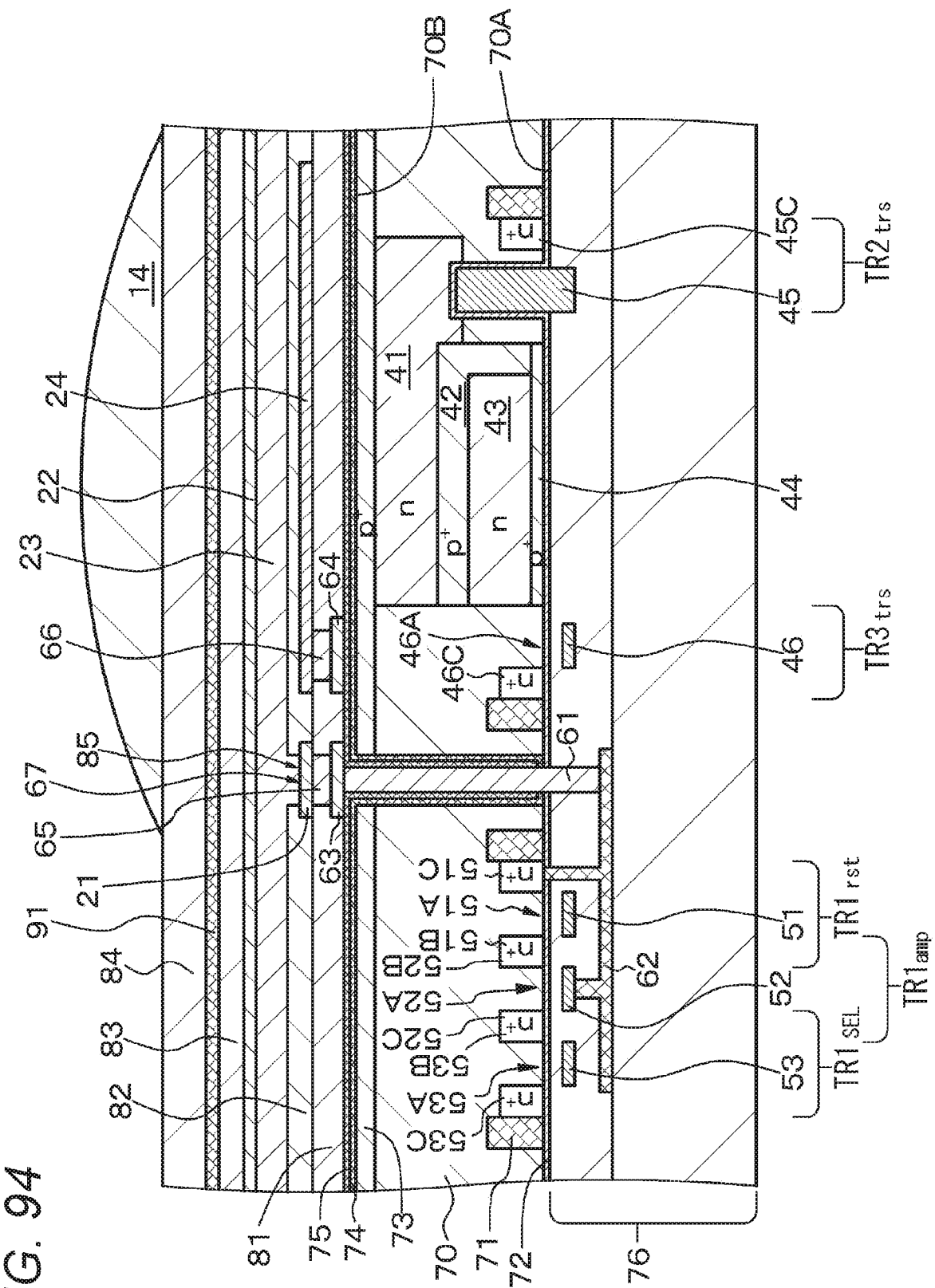

Alternatively, light may enter from the side of the second electrode 22 while light does not enter the first electrode 21. Specifically, as shown in FIG. 90, the light blocking layer 15 is formed on the light incident side closer to the second electrode 22 and above the first electrode 21. Alternatively, as shown in FIG. 94, the on-chip microlens 14 may be provided above the charge storage electrode 24 and the second electrode 22, so that light that enters the on-chip microlens 14 is gathered to the charge storage electrode 24 and does not reach the first electrode 21. Note that, in a case where the transfer control electrode 25 is provided, light can be prohibited from entering the first electrode 21 and the transfer control electrode 25, as described in Example 6. Specifically, as shown in FIG. 93, the light blocking layer 15 may be formed above the first electrode 21 and the transfer control electrode 25. Alternatively, light that enters the on-chip microlens 14 may not reach the first electrode 21, or the first electrode 21 and the transfer control electrode 25.

As the above configuration and structure are adopted, or as the light blocking layer 15 is provided or the on-chip microlens 14 is designed so that light enters only the portion of the photoelectric conversion layer 23 located above the charge storage electrode 24, the portion of the photoelectric conversion layer 23 located above the first electrode 21 (or above the first electrode 21 and the transfer control electrode 25) does not contribute to photoelectric conversion. Thus, all the pixels can be reset more reliably at the same time, and the global shutter function can be achieved more easily. In other words, in a method of driving a solid-state imaging apparatus including a plurality of stacked imaging devices or the like having the above configuration and structure, the following steps are repeated.

In all the stacked imaging devices or the like, the electric charges in the first electrodes 21 are simultaneously released out of the system, while electric charges are accumulated in the photoelectric conversion layers 23.

After that, in all the stacked imaging devices or the like, the electric charges accumulated in the photoelectric conversion layers 23 are simultaneously transferred to the first electrodes 21, and after the transfer is completed, the electric charges transferred to the first electrode 21 are sequentially read out in each of the stacked imaging devices or the like.

In such a method of driving a solid-state imaging apparatus, each stacked imaging device or the like has a structure in which light that has entered from the second electrode side does not enter the first electrode, and the electric charges in the first electrodes are released out of the system while electric charges are accumulated in the photoelectric conversion layers in all the stacked imaging devices or the like. Thus, the first electrodes can be reliably reset at the same time in all the stacked imaging devices or the like. Then, after that, the electric charges accumulated in the photoelectric conversion layers are simultaneously transferred to the first electrodes in all the stacked imaging devices or the like, and, after the transfer is completed, the electric charges transferred to the first electrode are sequentially read out in each stacked imaging device or the like. Because of this, a so-called global shutter function can be easily achieved.

Figure 95:
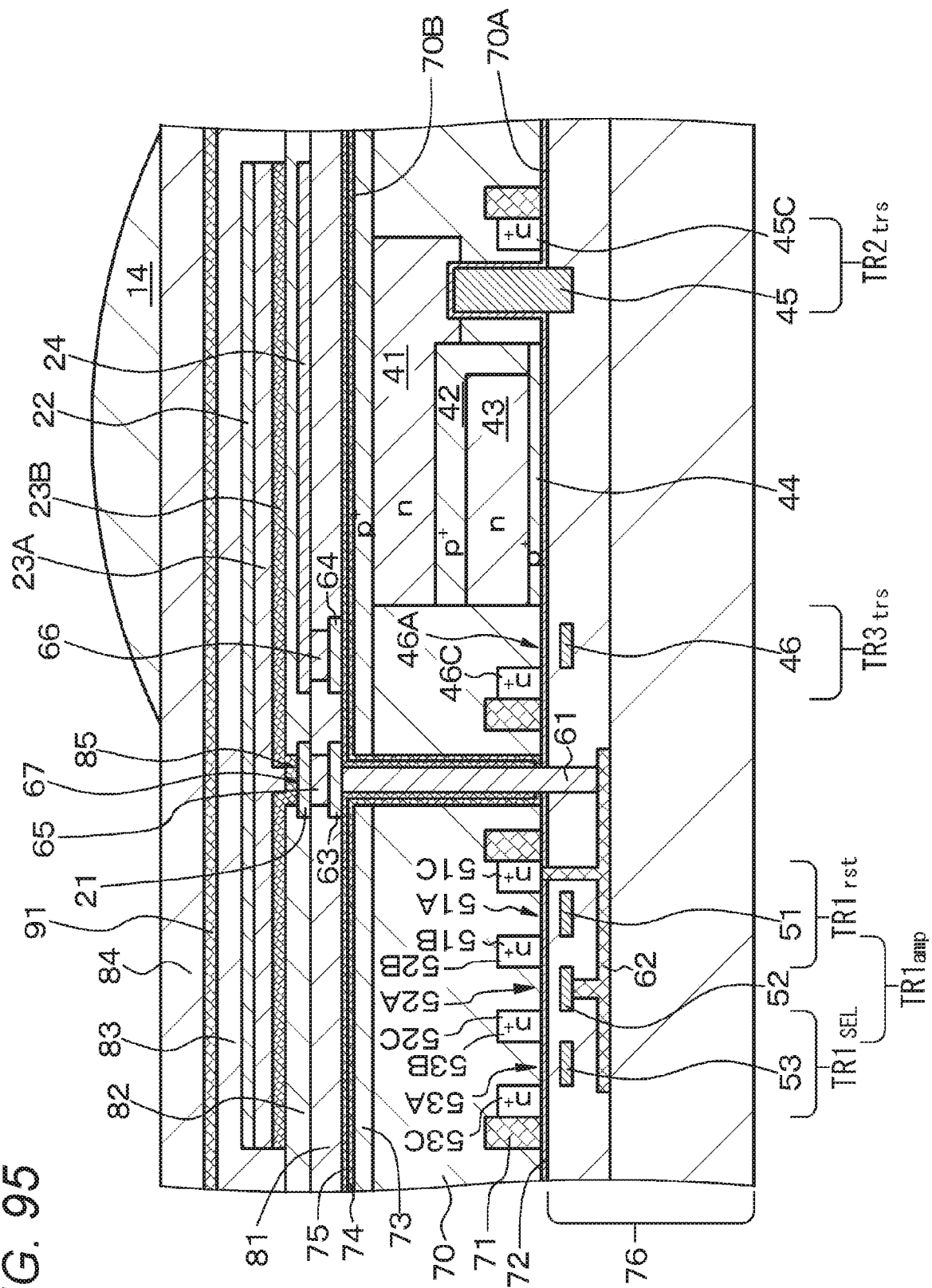

A photoelectric conversion layer is not necessarily formed with a single layer. For example, as shown in FIG. 95, which shows a modification of a stacked imaging device or the like described in Example 3, the photoelectric conversion layer 23 may have a stack structure formed with a lower semiconductor layer 23A including IGZO and an upper photoelectric conversion layer 23B including the material forming the photoelectric conversion layer 23 described in Example 3, for example. As the lower semiconductor layer 23A is provided, recoupling at the time of charge accumulation can be prevented, the efficiency of transfer of the electric charges stored in the photoelectric conversion layer 23 to the first electrode 21 can be increased, and generation of dark current can be prevented.

Figure 96:
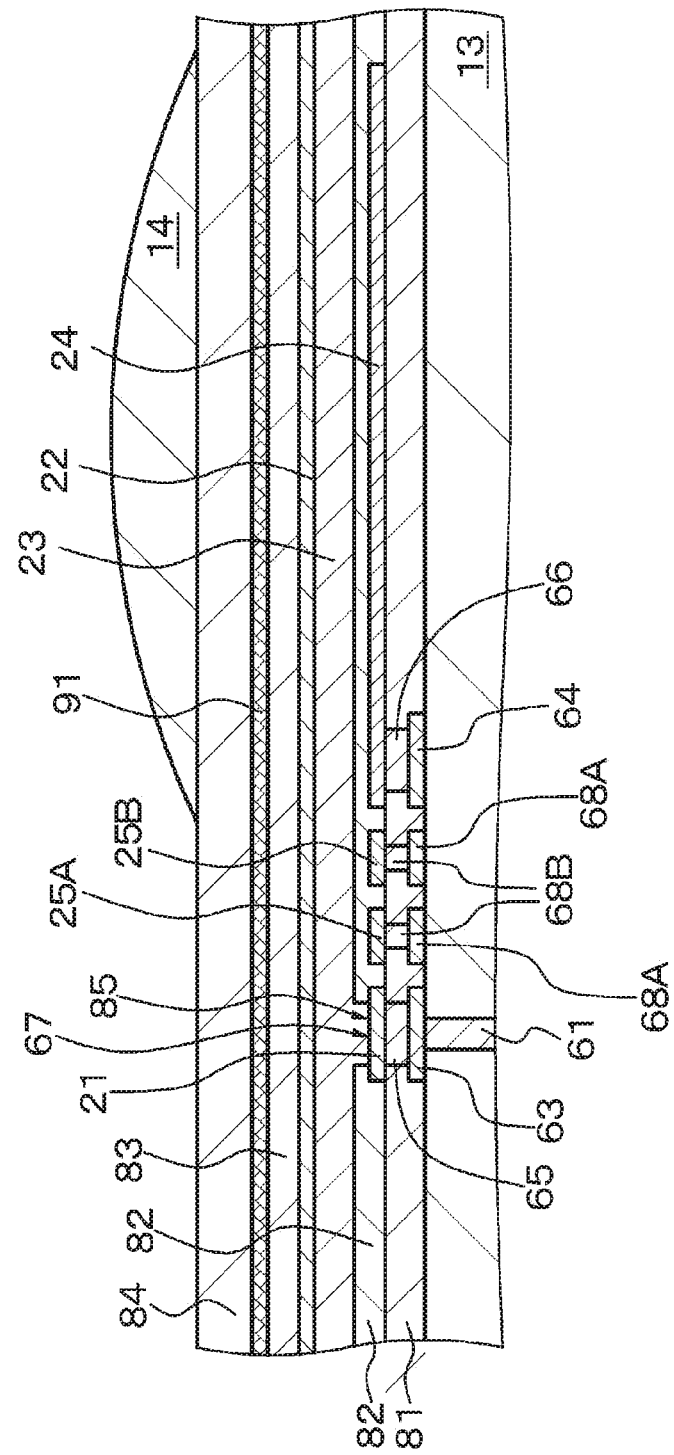

Further, in a modification of Example 6, a plurality of transfer control electrodes may be arranged from the position closest to the first electrode 21 toward the charge storage electrode 24, as shown in FIG. 96. Note that FIG. 96 shows an example in which two transfer control electrodes 25A and 25B are provided. Then, the on-chip microlens 14 may be provided above the charge storage electrode 24 and the second electrode 22, so that light that enters the on-chip microlens 14 is gathered to the charge storage electrode 24 and does not reach the first electrode 21 and the transfer control electrodes 25A and 25B.

Figure 97:
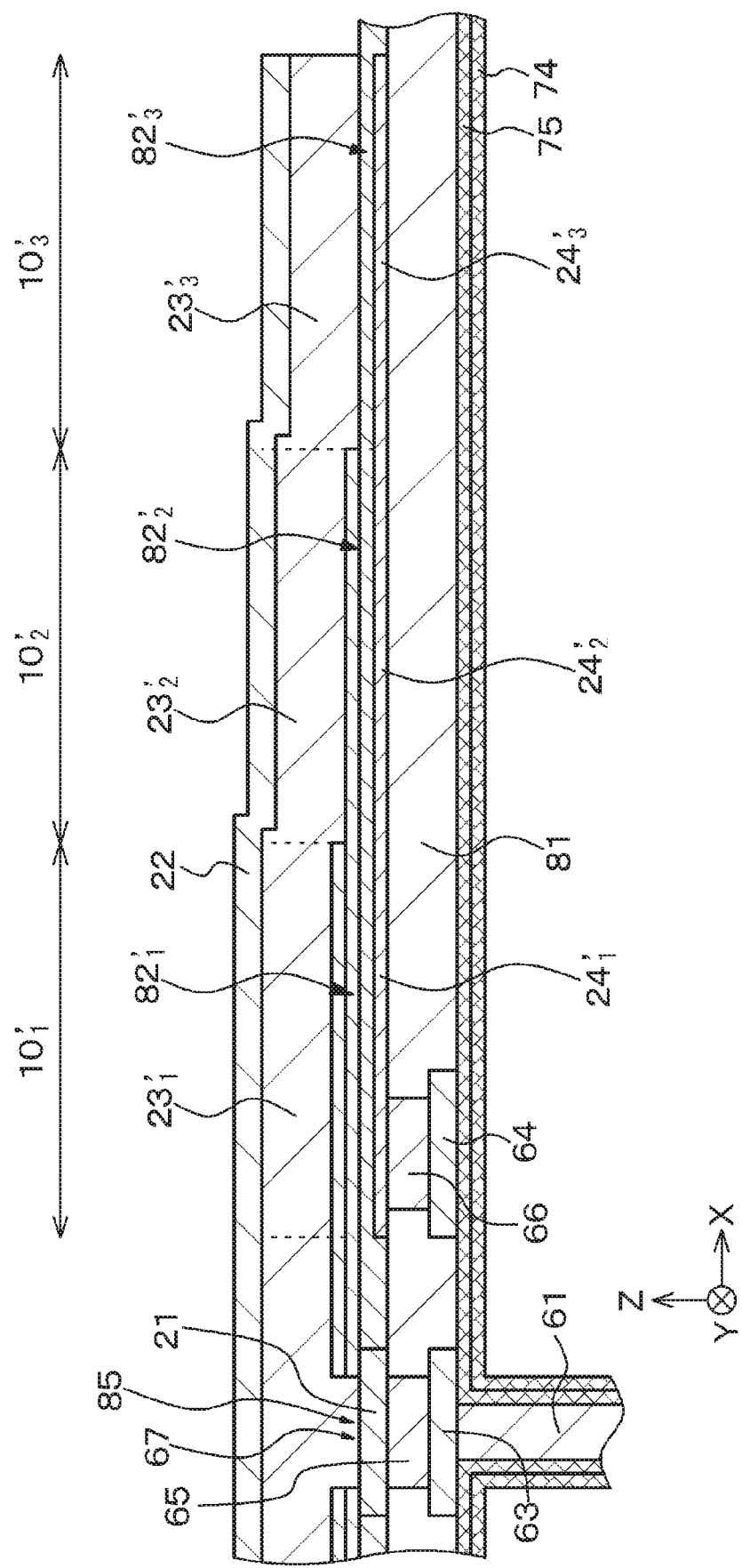

In Example 9 shown in FIGS. 59 and 60, the thicknesses of the charge storage electrode segments $24'_1$, $24'_2$, and $24'_3$ are made to become gradually smaller, so that the thicknesses of the insulating layer segments $82'_1$, $82'_2$, and $82'_3$ become gradually greater. On the other hand, as shown in FIG. 97, which is a schematic partial cross-sectional view showing an enlarged view of the portion in which the charge storage electrode, the photoelectric conversion layer, and the second electrode are stacked in a modification of Example 9, the thicknesses of the charge storage electrode segments $24'_1$, $24'_2$, and $24'_3$ may be made uniform, while the thicknesses of the insulating layer segments $82'_1$, $82'_2$, and $82'_3$ are made to become gradually greater. Note that the thicknesses of the photoelectric conversion layer segments $23'_1$, $23'_2$, and $23'_3$ are uniform.

Figure 98:
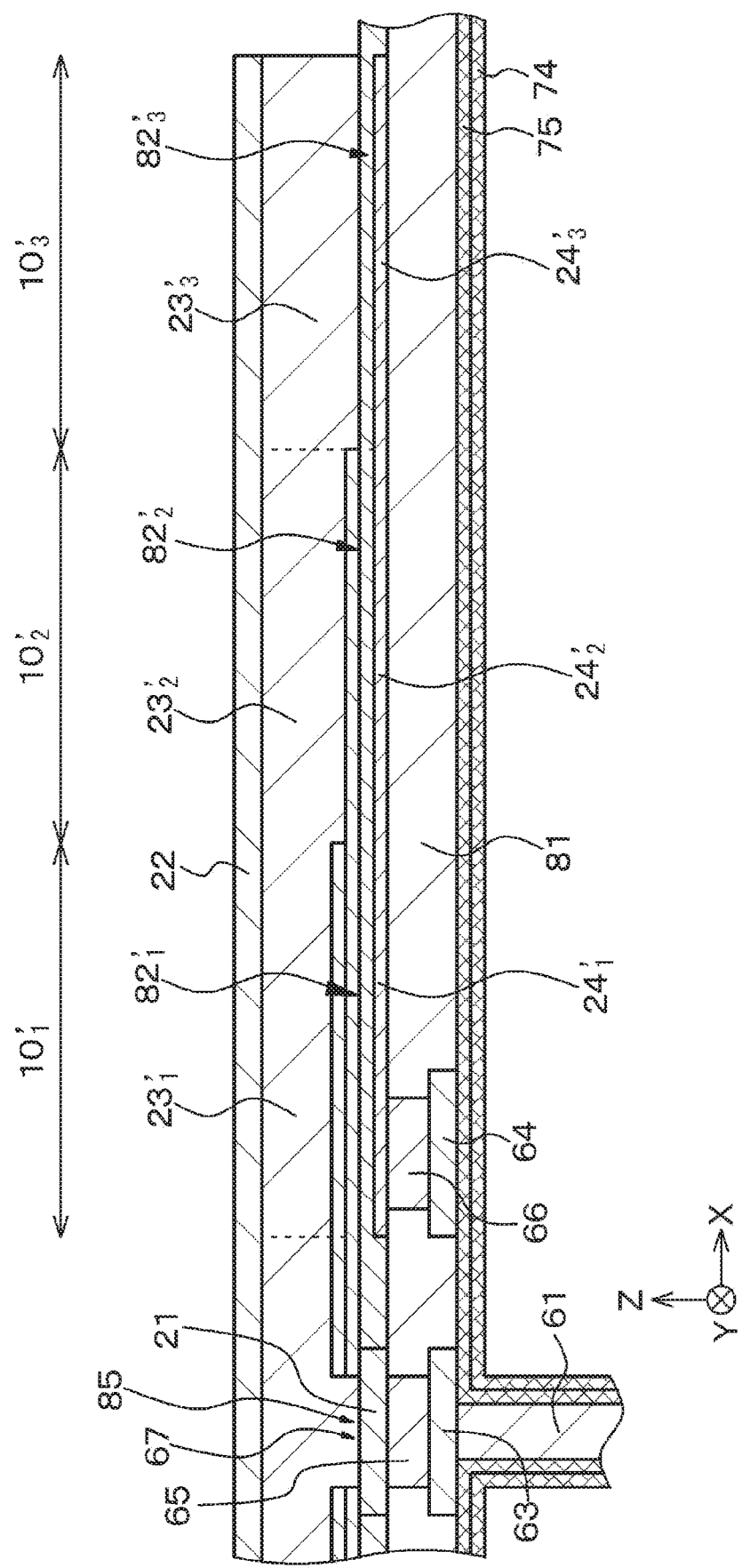

Further, in Example 10 shown in FIG. 62, the thicknesses of the charge storage electrode segments $24'_1$, $24'_2$, and $24'_3$ are made to become gradually smaller, so that the thicknesses of the photoelectric conversion layer segments $23'_1$, $23'_2$, and $23'_3$ become gradually greater. On the other hand, as shown in FIG. 98, which is a schematic partial cross-sectional view showing an enlarged view of the portion in which the charge storage electrode, the photoelectric conversion layer, and the second electrode are stacked in a modification of Example 10, the thicknesses of the charge storage electrode segments $24'_1$, $24'_2$, and $24'_3$ may be made uniform, and the thicknesses of the insulating layer segments $82'_1$, $82'_2$, and $82'_3$ may be made to become gradually smaller, so that the thicknesses of the photoelectric conversion layer segments $23'_1$, $23'_2$, and $23'_3$ become gradually greater.

In Example 3, the polarizer is provided above the upper photoelectric conversion unit. However, in an alternative structure, the polarizer may be provided below the upper photoelectric conversion unit (between the upper photoelectric conversion unit and the lower photoelectric conversion unit, or more specifically, in the interlayer insulating layer 81).

It should go without saying that the various modifications described above may also be applied to Examples 4 through 16.

In Examples, electrons are used as signal charges, and the conductivity type of the photoelectric conversion layer formed on the semiconductor substrate is n-type. However, the present technology may also be applied to a solid-state imaging apparatus in which holes are used as signal charges. In this case, each semiconductor region is only required to be formed with a semiconductor region of the opposite conductivity type, and the conductivity type of the photoelectric conversion layer formed on the semiconductor substrate is only required to be p-type.

As shown in FIG. 101, it is possible to combine stacked imaging devices or the like in which the angle between the array direction of a plurality of stacked imaging devices or the like and the first direction is 0 degree, and stacked imaging devices or the like in which the angle is 90 degrees, for example. As shown in FIG. 102, it is also possible to combine stacked imaging devices or the like in which the angle between the array direction of a plurality of stacked imaging devices or the like and the first direction is 45 degrees, and stacked imaging devices or the like in which the angle is 135 degrees, for example. Note that, in the planar layout diagrams of imaging device units shown in FIGS. 101 through 113, "R" represents a red-light photoelectric conversion element including a red color filter layer, "G" represents a green-light photoelectric conversion element including a green color filter layer, "B" represents a blue-light photoelectric conversion element including a blue color filter layer, and "W" represents a white-light photoelectric conversion element not including any color filter layer (or including a transparent resin layer).

Figure 103:
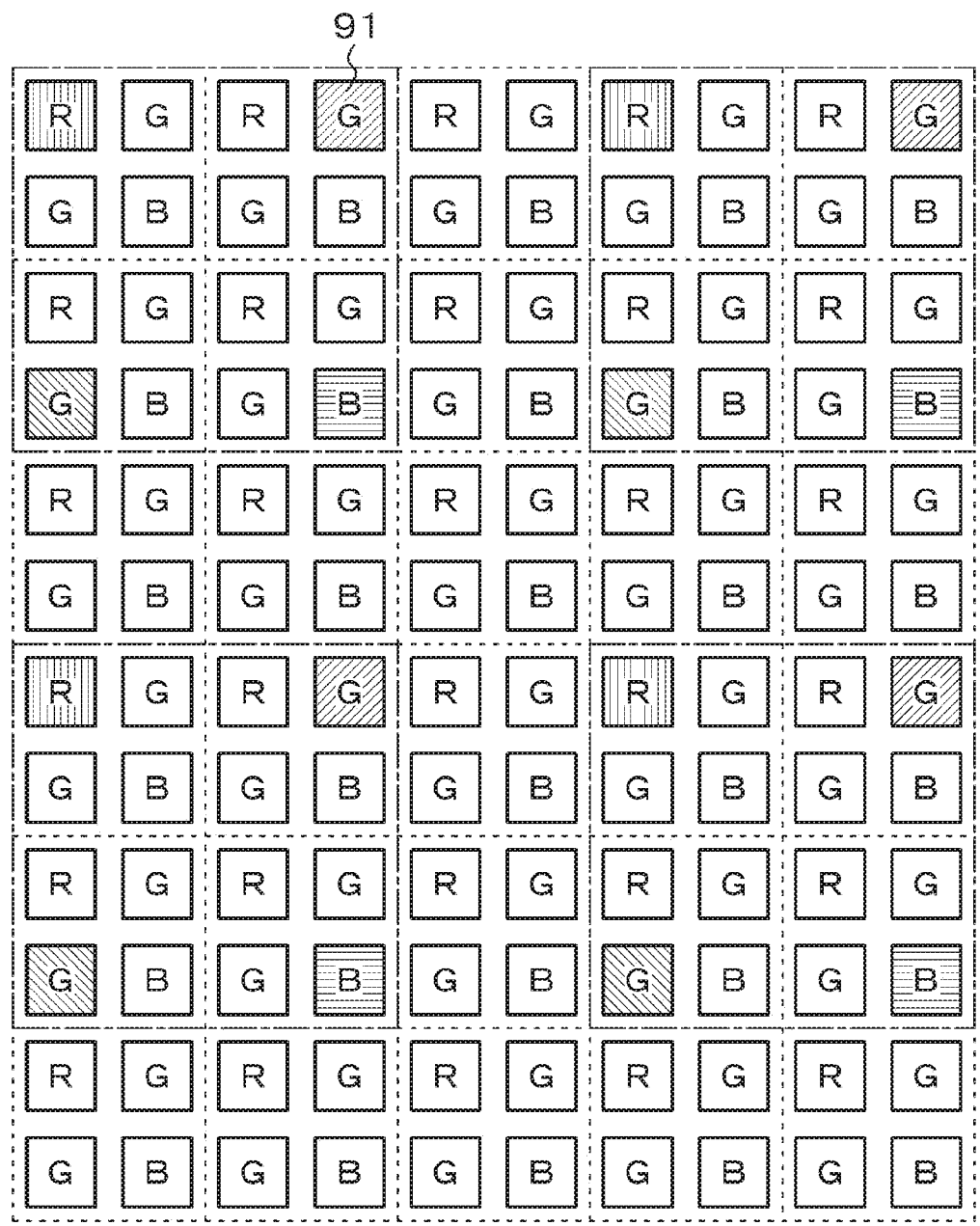
FIG. 103 is a planar layout diagram of a modification of a stacked imaging device, an imaging device of the present disclosure, or the like that has a Bayer array.

In the example shown in FIG. 16B, white-light stacked imaging devices or the like W each including the wire grid polarizer 91 are arranged every other imaging device in the $x_0$ direction and the $y_0$ direction. However, the white stacked imaging devices or the like W each including the wire grid polarizer 91 may be arranged every two imaging devices or every three imaging devices, or may be arranged in a staggered pattern. A planar layout diagram in FIG. 103 shows a modification of the example shown in FIG. 16B.

Figure 104:
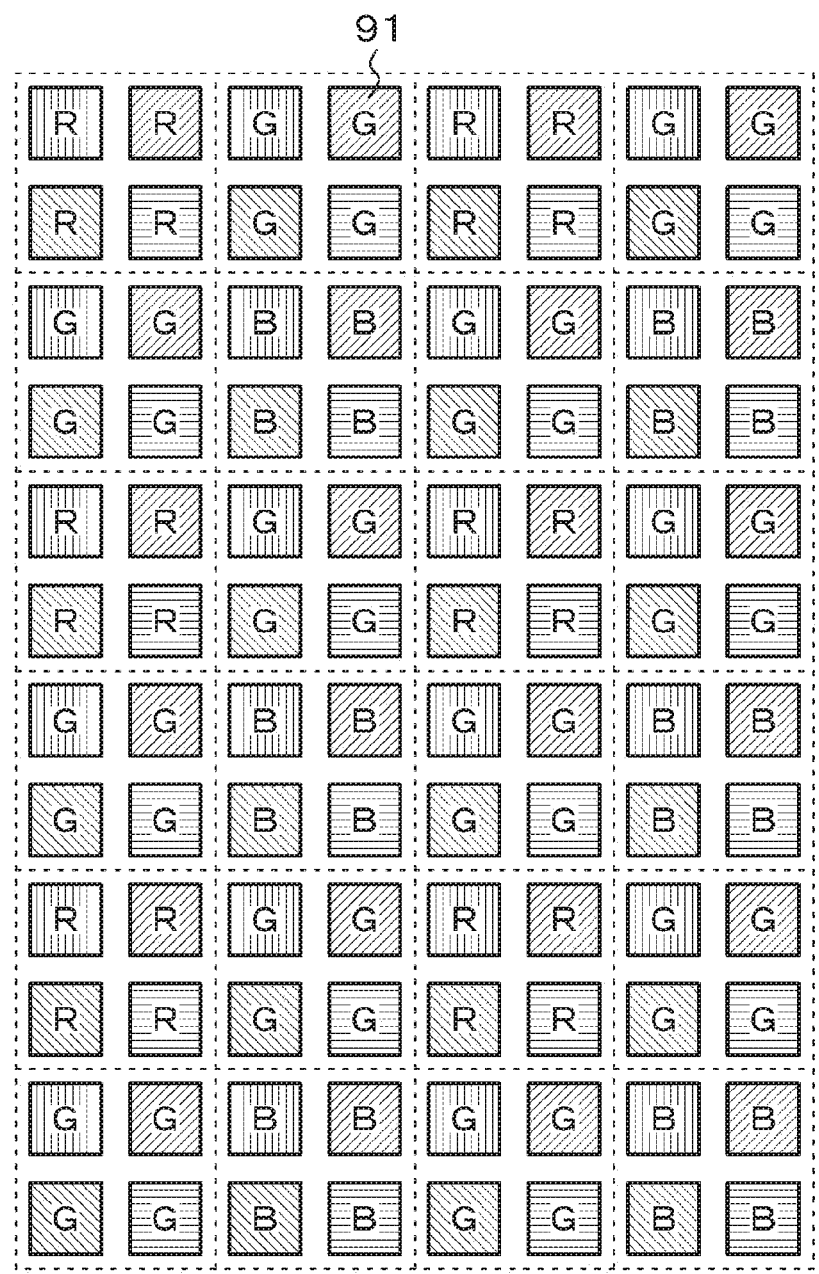
FIG. 104 is a planar layout diagram of a modification of a stacked imaging device, an imaging device of the present disclosure, or the like that has a Bayer array.
Figure 105:
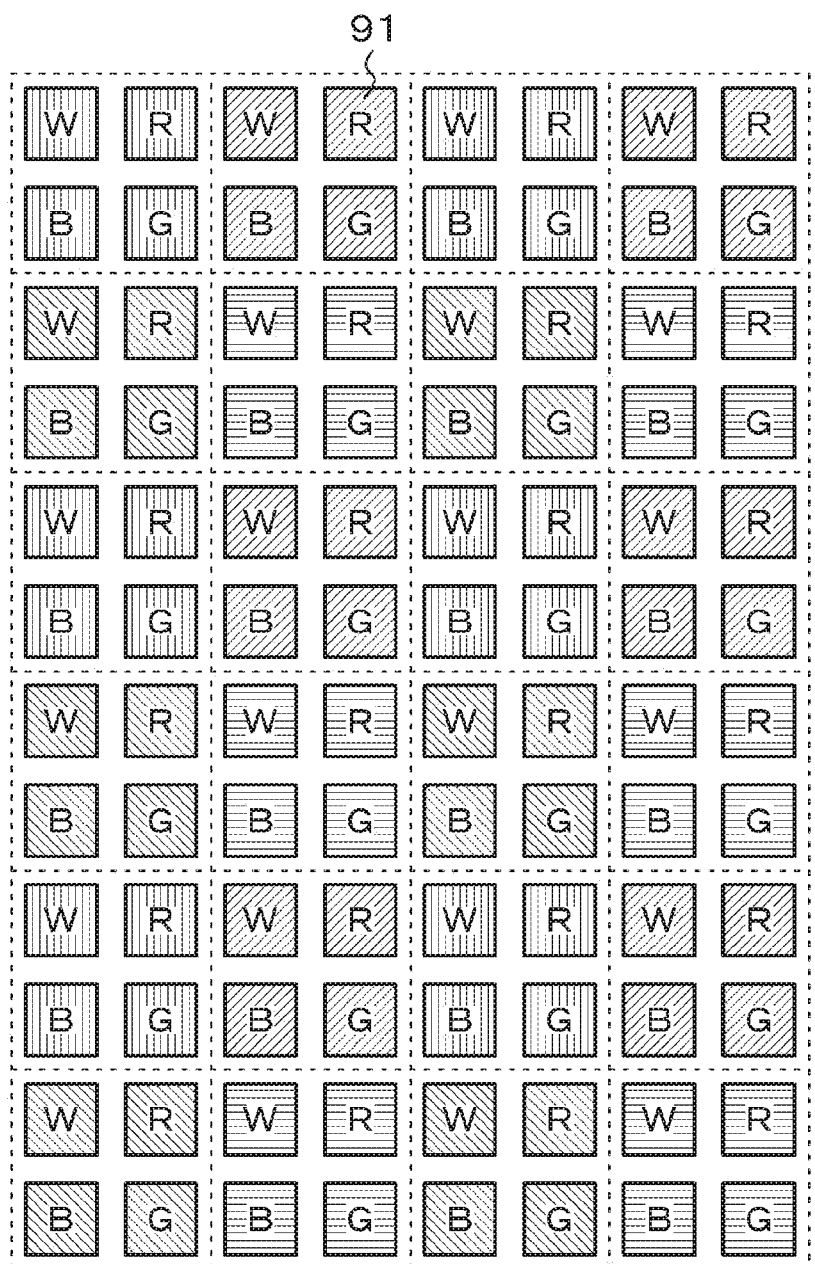
FIG. 105 is a planar layout diagram of a modification of a stacked imaging device, an imaging device of the present disclosure, or the like that has a Bayer array.
Figure 111:
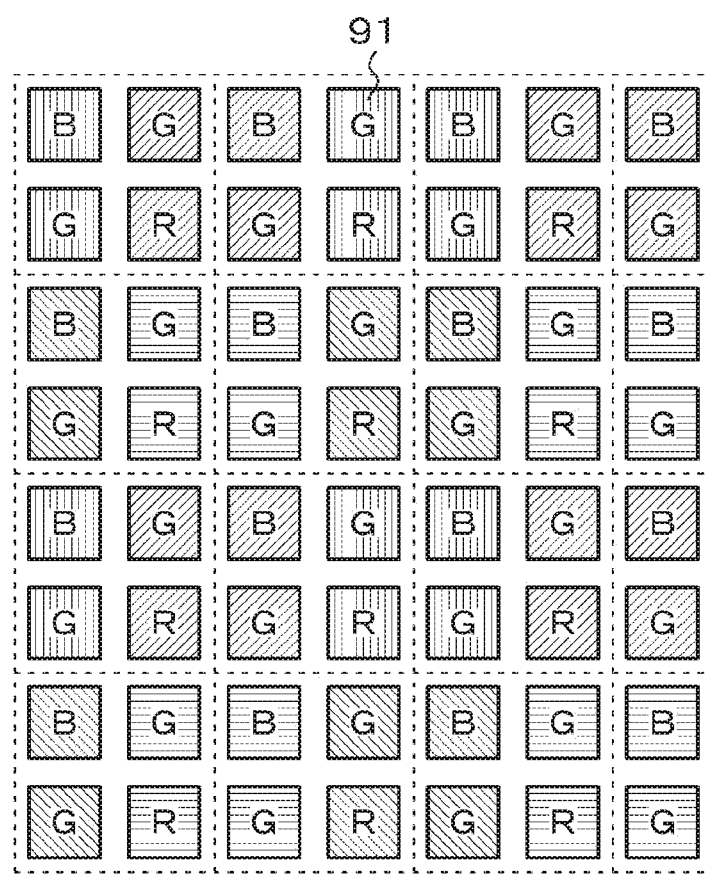
FIG. 111 is a planar layout diagram of a modification of a stacked imaging device, an imaging device of the present disclosure, or the like that has a Bayer array.
Figure 112:
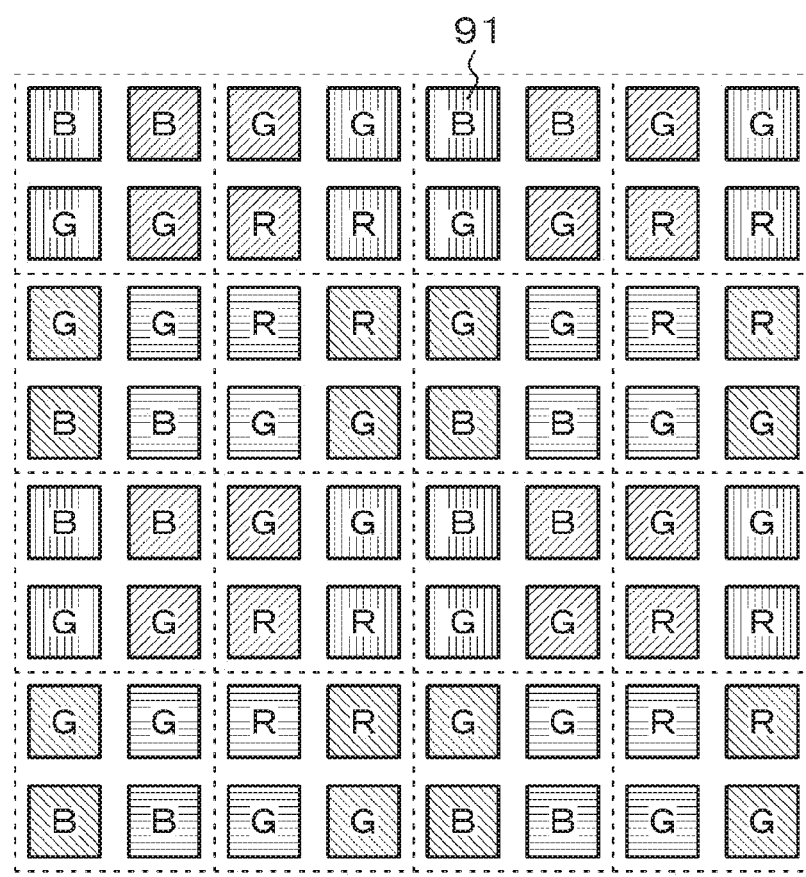
FIG. 112 is a planar layout diagram of a modification of a stacked imaging device, an imaging device of the present disclosure, or the like that has a Bayer array.
Figure 113:
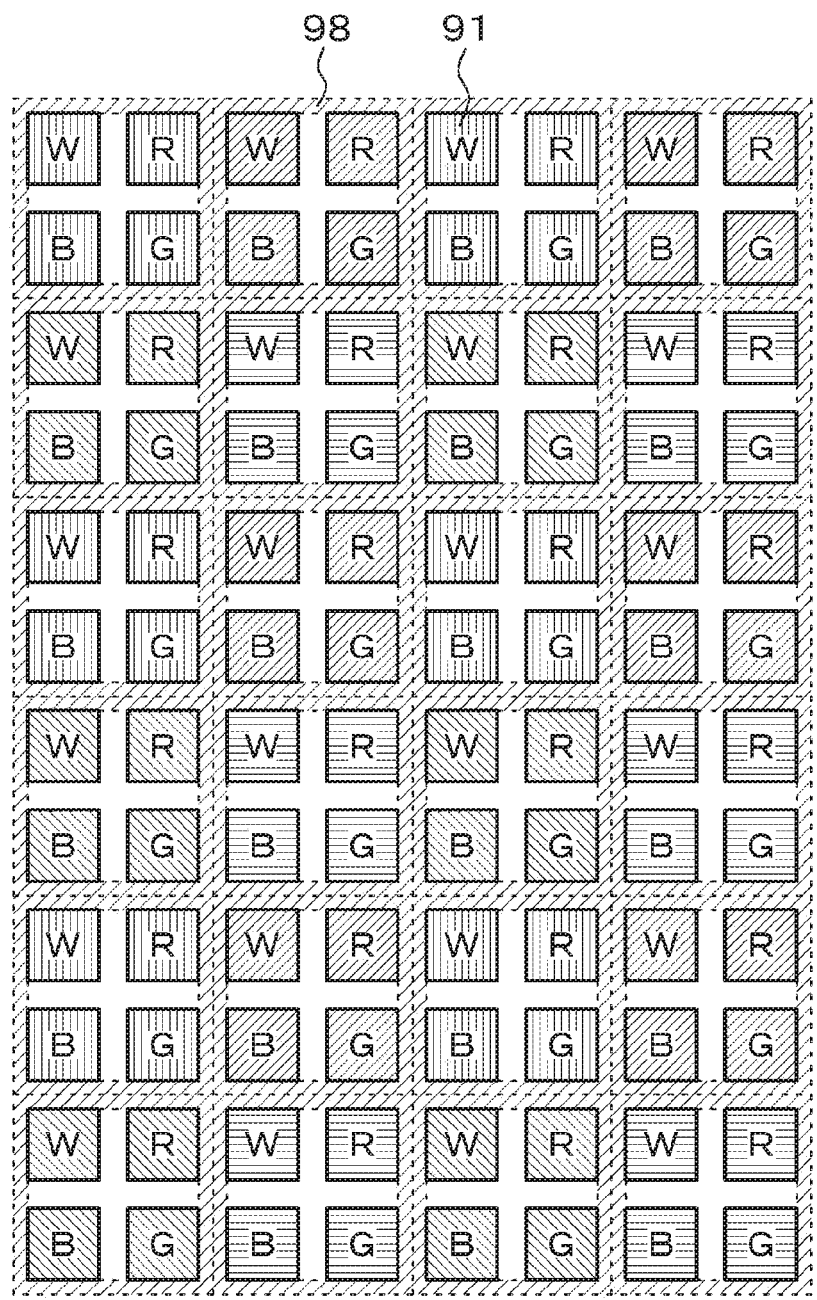
FIG. 113 is a planar layout diagram of a modification of a stacked imaging device, an imaging device of the present disclosure, or the like that has a Bayer array.

It is also possible to adopt a configuration shown in a planar layout diagram in FIG. 104 or 105. Here, in the case of a CMOS image sensor having a planar layout shown in FIG. 104, it is possible to adopt a 2×2 pixel sharing system in which a selection transistor, a reset transistor, and an amplification transistor are shared among 2×2 stacked imaging devices or the like. In an imaging mode in which pixel addition is not performed, imaging involving polarization information is performed. In a mode in which the electric charges stored in a 2×2 sub pixel region are subjected to FD addition, it is possible to provide a normal captured image by integrating all polarization components. Further, in the case of the planar layout shown in FIG. 105, a unidirectional wire grid polarizer is provided for 2×2 stacked imaging devices or the like. Accordingly, discontinuity does not easily occur in the stack structure between units of stacked imaging devices or the like, and high-quality polarization imaging can be performed.

Further, it is also possible to adopt any of the configurations shown in the planar layouts in FIGS. 106, 107, 108, 109, 110, 111, 112, and 113.

Figure 119:
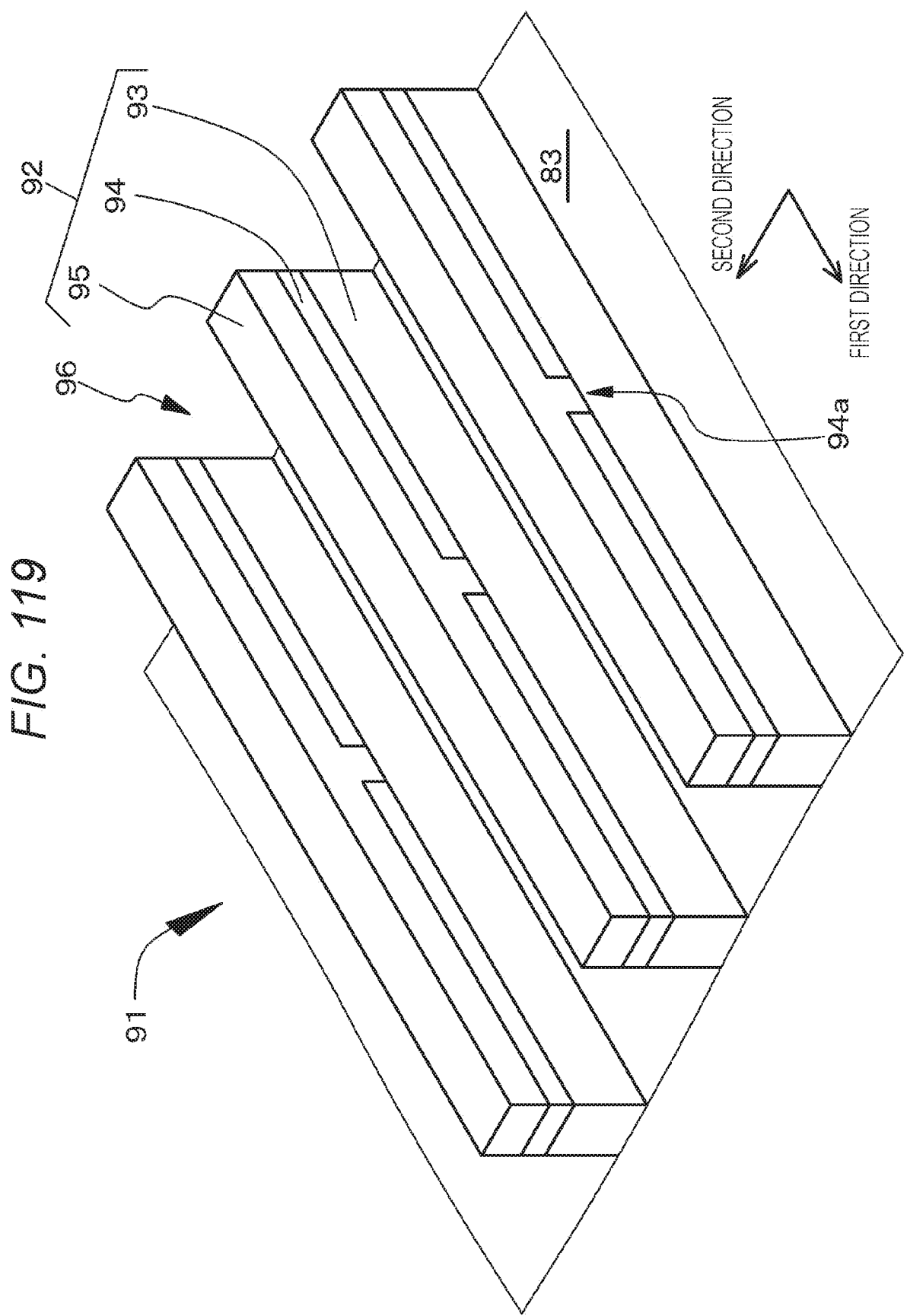
Figure 120:
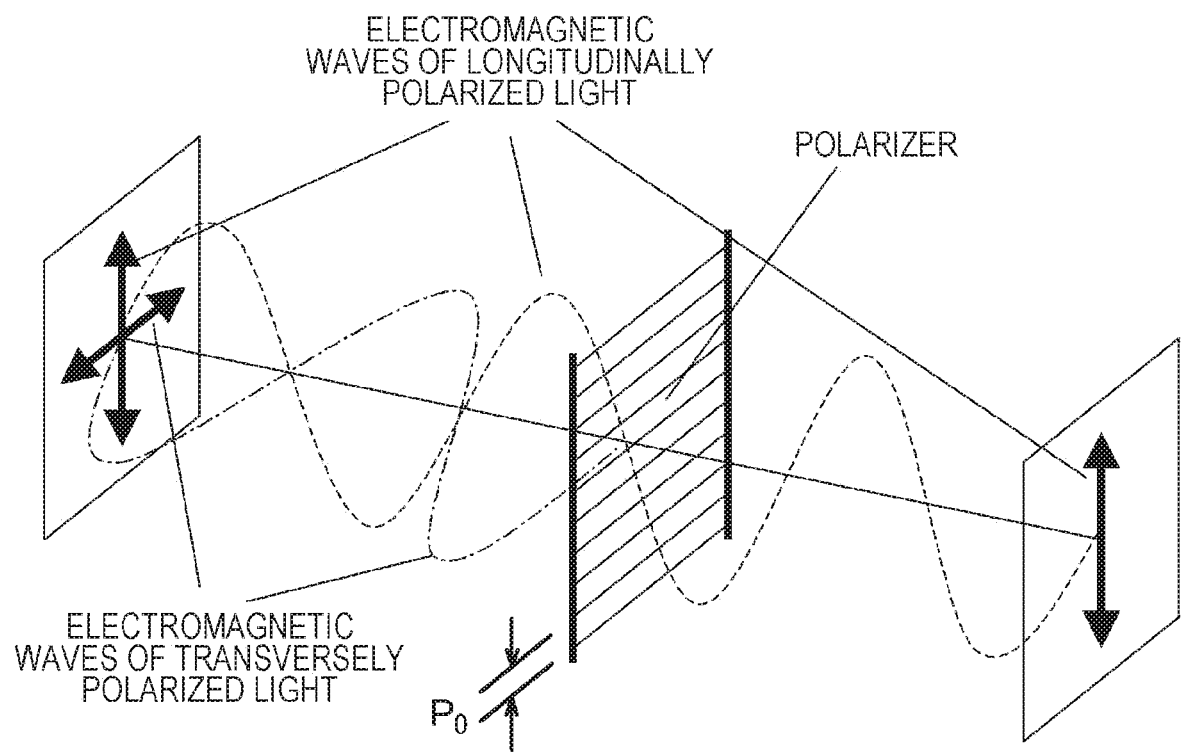
Figure 121:
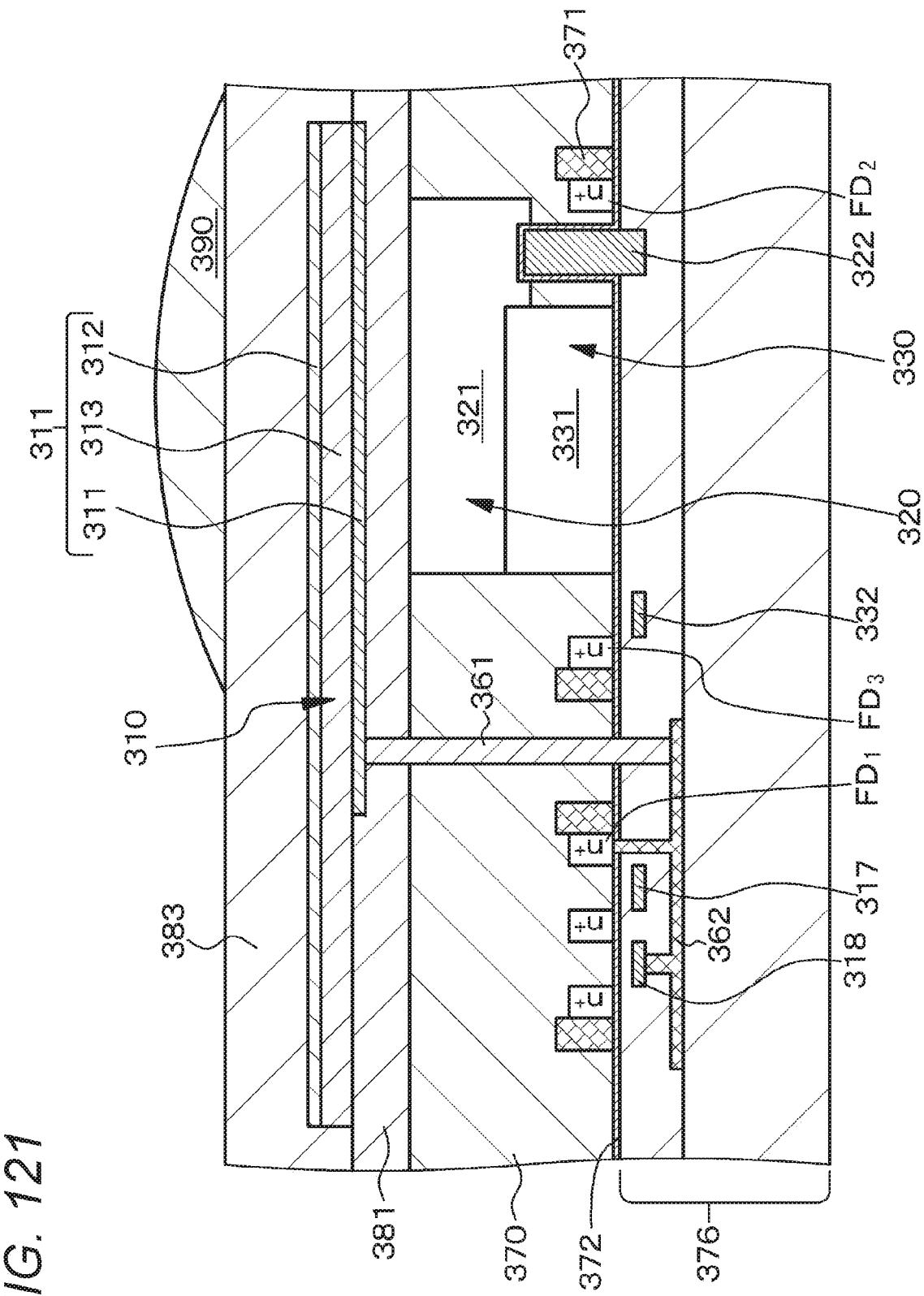

Further, in Examples, a wire grid polarizer is used exclusively for acquiring polarization information in a stacked imaging device or the like having sensitivity in a visible light wavelength band. However, in a case where a stacked imaging device or the like has sensitivity to infrared rays or ultraviolet rays, the line portion formation pitch $P_0$ is widened or narrowed so that a wire grid polarizer that functions in a desired wavelength band can be mounted therein. Further, in Examples, a wire grid polarizer has a configuration in which a light reflection layer and a light absorption layer in a stack structure are separated from each other by an insulating film (or the insulating film is formed on the entire top surface of the light reflection layer, and the light absorption layer is formed on the entire top surface of the insulating film). However, in an alternative configuration, the insulating film is partially cut out, and the light reflection layer and the light absorption layer are in contact with each other at the cutout portion of the insulating film. In other words, as shown in FIG. 119, which is a schematic partial perspective view of a modification of a wire grid polarizer forming a stacked imaging device of the present disclosure or a stacked imaging device or the like of the present disclosure, the insulating film 94 is partially cut out, and the light reflection layer 93 and the light absorption layer 95 are in contact with each other at the cutout portion 94a of the insulating film 94.

Further, in the example cases described in Examples, the present technology is applied to CMOS solid-state imaging apparatuses in each of which unit pixels that detect signal charges corresponding to incident light quantities as physical quantities are arranged in a matrix. However, the present technology is not necessarily applied to such CMOS solid-state imaging apparatuses, and may also be applied to CCD solid-state imaging apparatuses. In the latter case, signal charges are transferred in a vertical direction by a vertical transfer register of a CCD structure, are transferred in a horizontal direction by a horizontal transfer register, and are amplified, so that pixel signals (image signals) are output. Further, the present technology is not necessarily applied to general solid-state imaging apparatuses of a column type in which pixels are arranged in a two-dimensional matrix, and a column signal processing circuit is provided for each pixel row. Furthermore, the selection transistor may also be omitted in some cases.

Further, stacked imaging devices or the like of the present disclosure are not necessarily used in a solid-state imaging apparatus that senses a distribution of visible incident light and captures the distribution as an image, but may also be used in a solid-state imaging apparatus that captures an incident amount distribution of infrared rays, X-rays, particles, or the like as an image. Also, in a broad sense, the present technology may be applied to any solid-state imaging apparatus (physical quantity distribution detection apparatus), such as a fingerprint detection sensor that detects a distribution of other physical quantities such as pressure and capacitance and captures such a distribution as an image.

Further, the present disclosure is not limited to solid-state imaging apparatuses that sequentially scan respective unit pixels in the imaging region by the row, and read pixel signals from the respective unit pixels. The present disclosure may also be applied to a solid-state imaging apparatus of an X-Y address type that selects desired pixels one by one, and reads pixel signals from the selected pixels one by one. A solid-state imaging apparatus may be in the form of a single chip, or may be in the form of a module that is formed by packaging an imaging region together with a drive circuit or an optical system, and has an imaging function.

Further, the present technology is not necessarily applied to solid-state imaging apparatuses, but may also be applied to imaging apparatuses. Here, an imaging apparatus is a camera system, such as a digital still camera or a video camera, or an electronic apparatus that has an imaging function, such as a portable telephone device. The form of a module mounted on an electronic apparatus, or a camera module, is an imaging apparatus in some cases.

Figure 99:
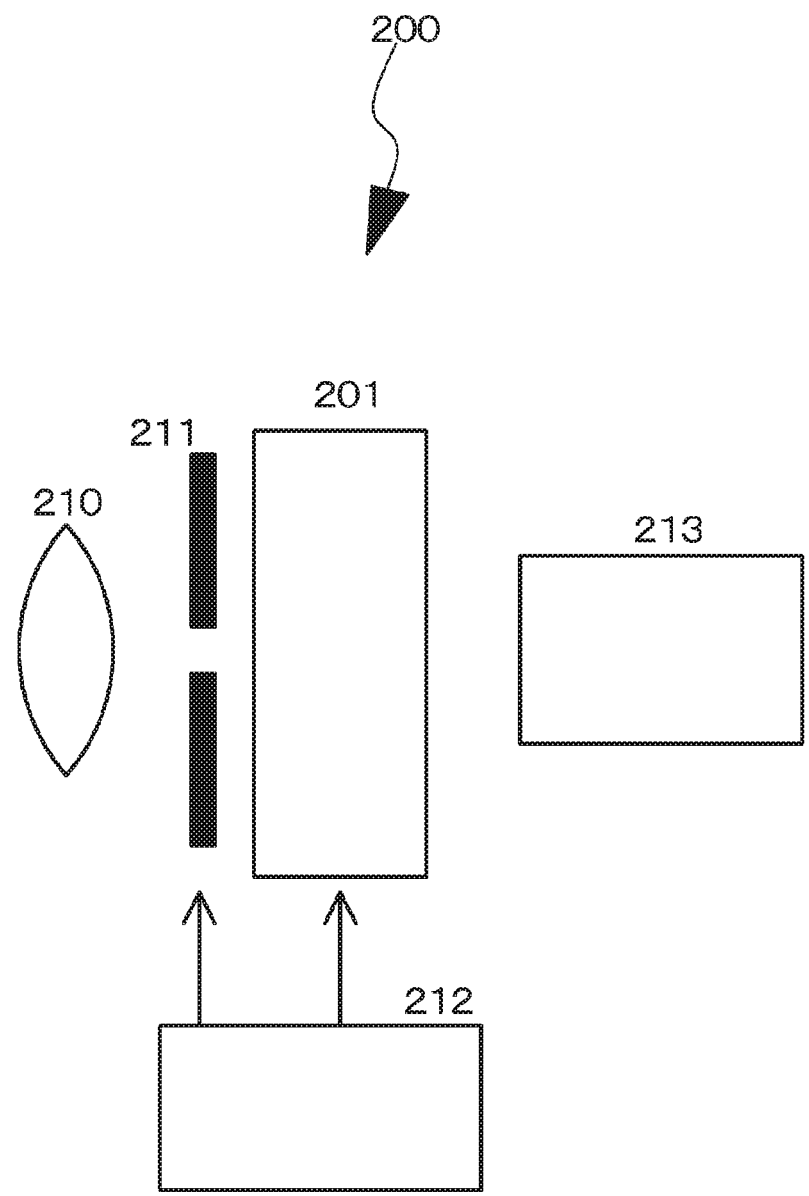
FIG. 99 is a conceptual diagram showing an example using a solid-state imaging apparatus including stacked imaging devices of the present disclosure, imaging devices of the present disclosure, or the like in an electronic apparatus (a camera).

FIG. 99 is a conceptual diagram showing an example in which a solid-state imaging apparatus 201 including stacked imaging devices or the like of the present disclosure is used for an electronic apparatus (a camera) 200. An electronic apparatus 200 includes a solid-state imaging apparatus 201, an optical lens 210, a shutter device 211, a drive circuit 212, and a signal processing circuit 213. The optical lens 210 gathers image light (incident light) from an object, and forms an image on the imaging surface of the solid-state imaging apparatus 201. With this, signal charges are stored in the solid-state imaging apparatus 201 for a certain period of time. The shutter device 211 controls the light exposure period and the light blocking period for the solid-state imaging apparatus 201. The drive circuit 212 supplies drive signals for controlling transfer operation and the like of the solid-state imaging apparatus 201, and shutter operation of the shutter device 211. In accordance with a drive signal (a timing signal) supplied from the drive circuit 212, the solid-state imaging apparatus 201 performs signal transfer. The signal processing circuit 213 performs various kinds of signal processing. Video signals subjected to the signal processing are stored into a storage medium such as a memory, or are output to a monitor. In such an electronic apparatus 200, it is possible to achieve miniaturization of the pixel size and improvement of the transfer efficiency in the solid-state imaging apparatus 201. Thus, the electronic apparatus 200 having its pixel characteristics improved can be obtained. The electronic apparatus 200 to which the solid-state imaging apparatus 201 can be applied is not necessarily a camera, but may be an imaging apparatus such as a camera module for mobile devices such as a digital still camera and a portable telephone device.

Note that the present disclosure may also be embodied in the configurations described below.

[A01] (Stacked Imaging Device: First Embodiment)

A stacked imaging device including a polarizer, and a plurality of photoelectric conversion units that is stacked, in which the polarizer and the plurality of photoelectric conversion units are stacked, with the polarizer being disposed closer to the light incident side than the plurality of photoelectric conversion units.

[A02] The stacked imaging device according to [A01], in which at least one photoelectric conversion unit of the plurality of photoelectric conversion units that is stacked includes a first electrode, a photoelectric conversion layer, and a second electrode that are stacked, and further includes a charge storage electrode that is disposed at a distance from the first electrode and is positioned to face the photoelectric conversion layer via an insulating layer.

[A03] The stacked imaging device according to [A02], further including a semiconductor substrate, in which at least one photoelectric conversion unit of the plurality of photoelectric conversion units that is stacked is disposed above the semiconductor substrate.

[A04] The stacked imaging device according to [A02] or [A03], in which the first electrode extends in an opening formed in the insulating layer, and is connected to the photoelectric conversion layer.

[A05] The stacked imaging device according to [A02] or [A03], in which the photoelectric conversion layer extends in an opening formed in the insulating layer, and is connected to the first electrode.

[A06] The stacked imaging device according to [A05], in which the edge portion of the top surface of the first electrode is covered with the insulating layer, the first electrode is exposed through the bottom surface of the opening, and a side surface of the opening is a slope spreading from a first surface toward a second surface, the first surface being the surface of the insulating layer in contact with the top surface of the first electrode, the second surface being the surface of the insulating layer in contact with the portion of the photoelectric conversion layer facing the charge storage electrode.

[A07] The stacked imaging device according to [A06], in which the side surface of the opening having the slope spreading from the first surface toward the second surface is located on the charge storage electrode side.

[A08] (Control of the potentials of the first electrode and the charge storage electrode)

The stacked imaging device according to any one of [A02] to [A07], further including a control unit that is disposed in the semiconductor substrate, and includes a drive circuit, in which the first electrode and the charge storage electrode are connected to the drive circuit, in a charge accumulation period, the drive circuit applies a potential $V_{11}$ to the first electrode, and a potential $V_{12}$ to the charge storage electrode, to accumulate electric charges in the photoelectric conversion layer, and, in a charge transfer period, the drive circuit applies a potential $V_{21}$ to the first electrode, and a potential $V_{22}$ to the charge storage electrode, to read the electric charges accumulated in the photoelectric conversion layer into the control unit via the first electrode.

However, when the potential of the first electrode is higher than that of the second electrode, $V_{12} \geq V_{11}$, and $V_{22} < V_{21}$, and, when the potential of the first electrode is lower than that of the second electrode, $V_{12} \leq V_{11}$, and $V_{22} > V_{21}$.

[A09] (Transfer control electrode)

The stacked imaging device according to any one of [A02] to [A07], further including a transfer control electrode that is disposed between the first electrode and the charge storage electrode, is located at a distance from the first electrode and the charge storage electrode, and is positioned to face the photoelectric conversion layer via the insulating layer.

[A10] (Control of the potentials of the first electrode, the charge storage electrode, and the transfer control electrode)

The stacked imaging device according to [A09], further including a control unit that is disposed in the semiconductor substrate, and includes a drive circuit, in which the first electrode, the charge storage electrode, and the transfer control electrode are connected to the drive circuit, in a charge accumulation period, the drive circuit applies a potential $V_{11}$ to the first electrode, a potential $V_{12}$ to the charge storage electrode, and a potential $V_{13}$ to the transfer control electrode, to accumulate electric charges in the photoelectric conversion layer, and, in a charge transfer period, the drive circuit applies a potential $V_{21}$ to the first electrode, a potential $V_{22}$ to the charge storage electrode, and a potential $V_{23}$ to the transfer control electrode, to read the electric charges accumulated in the photoelectric conversion layer into the control unit via the first electrode.

However, when the potential of the first electrode is higher than that of the second electrode, $V_{12} > V_{13}$, and $V_{22} \leq V_{23} < V_{21}$, and, when the potential of the first electrode is lower than that of the second electrode, $V_{12} < V_{13}$, and $V_{22} \geq V_{23} \geq V_{21}$.

[A11] (Charge Emission Electrode)

The stacked imaging device according to any one of [A02] to [A10], further including a charge emission electrode that is connected to the photoelectric conversion layer, and is disposed at a distance from the first electrode and the charge storage electrode.

[A12] The stacked imaging device according to [A11], in which the charge emission electrode is disposed to surround the first electrode and the charge storage electrode.

[A13] The stacked imaging device according to [A11] or [A12], in which the photoelectric conversion layer extends in a second opening formed in the insulating layer, and is connected to the charge emission electrode, the edge portion of the top surface of the charge emission electrode is covered with the insulating layer, the charge emission electrode is exposed through the bottom surface of the second opening, and a side surface of the second opening is a slope spreading from a third surface to a second surface, the third surface being the surface of the insulating layer in contact with the top surface of the charge emission electrode, the second surface being the surface of the insulating layer in contact with the portion of the photoelectric conversion layer facing the charge storage electrode.

[A14] (Control of the potentials of the first electrode, the charge storage electrode, and the charge emission electrode)

The stacked imaging device according to any one of [A11] to [A13], further including
a control unit that is disposed in the semiconductor substrate, and includes a drive circuit, in which
the first electrode, the charge storage electrode, and the charge emission electrode are connected to the drive circuit,
in a charge accumulation period, the drive circuit applies a potential $V_{11}$ to the first electrode, a potential $V_{12}$ to the charge storage electrode, and a potential $V_{14}$ to the charge emission electrode, to accumulate electric charges in the photoelectric conversion layer, and,
in a charge transfer period, the drive circuit applies a potential $V_{21}$ to the first electrode, a potential $V_{22}$ to the charge storage electrode, and a potential $V_{24}$ to the charge emission electrode, to read the electric charges accumulated in the photoelectric conversion layer into the control unit via the first electrode.
However, when the potential of the first electrode is higher than that of the second electrode,
$V_{14} > V_{11}$, and $V_{24} < V_{21}$, and,
when the potential of the first electrode is lower than that of the second electrode,
$V_{14} < V_{11}$, and $V_{24} > V_{21}$.

[A15] (Charge Storage Electrode Segments)
The stacked imaging device according to any one of [A02] to [A14], in which the charge storage electrode is formed with a plurality of charge storage electrode segments.

[A16] The stacked imaging device according to [A15], in which,
when the potential of the first electrode is higher than that of the second electrode, the potential to be applied to the charge storage electrode segment located closest to the first electrode is higher than the potential to be applied to the charge storage electrode segment located farthest from the first electrode in a charge transfer period, and,
when the potential of the first electrode is lower than that of the second electrode, the potential to be applied to the charge storage electrode segment located closest to the first electrode is lower than the potential to be applied to the charge storage electrode segment located farthest from the first electrode in a charge transfer period.

[A17] The stacked imaging device according to any one of [A02] to [A16], in which
at least a floating diffusion layer and an amplification transistor that constitute the control unit are disposed in the semiconductor substrate, and
the first electrode is connected to the floating diffusion layer and the gate portion of the amplification transistor.

[A18] The stacked imaging device according to [A17], in which
a reset transistor and a selection transistor that constitute the control unit are further disposed in the semiconductor substrate,
the floating diffusion layer is connected to one source/drain region of the reset transistor, and
one source/drain region of the amplification transistor is connected to one source/drain region of the selection transistor, and the other source/drain region of the selection transistor is connected to a signal line.

[A19] The stacked imaging device according to any one of [A02] to [A18], in which the size of the charge storage electrode is larger than that of the first electrode.

[A20] The stacked imaging device according to any one of [A02] to [A19], in which light enters from the second electrode side, and a light blocking layer is formed on a light incident side closer to the second electrode.

[A21] The stacked imaging device according to any one of [A02] to [A19], in which light enters from the second electrode side, and light does not enter the first electrode.

[A22] The stacked imaging device according to [A21], in which a light blocking layer is formed on a light incident side closer to the second electrode and above the first electrode.

[A23] The stacked imaging device according to [A21], in which
an on-chip microlens is provided above the charge storage electrode and the second electrode, and
light that enters the on-chip microlens is gathered to the charge storage electrode.

[A24] (Stacked imaging device: first configuration)
The stacked imaging device according to any one of [A02] to [A23], in which
at least one photoelectric conversion unit is formed with N (N≥2) photoelectric conversion unit segments,
the photoelectric conversion layer is formed with N photoelectric conversion layer segments,
the insulating layer is formed with N insulating layer segments,
the charge storage electrode is formed with N charge storage electrode segments,
the nth (n=1, 2, 3, . . . , N) photoelectric conversion unit segment includes the nth charge storage electrode segment, the nth insulating layer segment, and the nth photoelectric conversion layer segment,
a photoelectric conversion unit segment having a greater value as n is located farther away from the first electrode, and
the thicknesses of the insulating layer segments gradually vary from the first photoelectric conversion unit segment to the Nth photoelectric conversion unit segment.

[A25] (Stacked imaging device: second configuration)
The stacked imaging device according to any one of [A02] to [A23], in which
at least one photoelectric conversion unit is formed with N (N≥2) photoelectric conversion unit segments,
the photoelectric conversion layer is formed with N photoelectric conversion layer segments,
the insulating layer is formed with N insulating layer segments,
the charge storage electrode is formed with N charge storage electrode segments,
the nth (n=1, 2, 3, . . . , N) photoelectric conversion unit segment includes the nth charge storage electrode segment, the nth insulating layer segment, and the nth photoelectric conversion layer segment,
a photoelectric conversion unit segment having a greater value as n is located farther away from the first electrode, and p the thicknesses of the photoelectric conversion layer segments gradually vary from the first photoelectric conversion unit segment to the Nth photoelectric conversion unit segment.

[A26] (Stacked imaging device: third configuration)
The stacked imaging device according to any one of [A02] to [A23], in which
at least one photoelectric conversion unit is formed with N (N≥2) photoelectric conversion unit segments,
the photoelectric conversion layer is formed with N photoelectric conversion layer segments,
the insulating layer is formed with N insulating layer segments,
the charge storage electrode is formed with N charge storage electrode segments, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the material forming the insulating layer segment differs between adjacent photoelectric conversion unit segments.

[A27] (Stacked imaging device: fourth configuration)

The stacked imaging device according to any one of [A02] to [A23], in which at least one photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments that are disposed at a distance from one another, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the material forming the charge storage electrode segment differs between adjacent photoelectric conversion unit segments.

[A28] (Stacked imaging device: fifth configuration)

The stacked imaging device according to any one of [A02] to [A23], in which at least one photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments that are disposed at a distance from one another, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the areas of the charge storage electrode segments become gradually smaller from the first photoelectric conversion unit segment to the Nth photoelectric conversion unit segment.

[A29] (Stacked Imaging Device: Sixth Configuration)

The stacked imaging device according to any one of [A02] to [A23], in which, when the stacking direction of the charge storage electrode, the insulating layer, and the photoelectric conversion layer is the Z direction, and the direction away from the first electrode is the X direction, the cross-sectional area of a stacked portion of the charge storage electrode, the insulating layer, and the photoelectric conversion layer taken along a Y-Z virtual plane varies depending on the distance from the first electrode.

[A30] The stacked imaging device according to any one of [A01] to [A29], in which the polarizer is formed with four polarizer segments arranged in a 2×2 array, the four polarizer segments being a first polarizer segment, a second polarizer segment, a third polarizer segment, and a fourth polarizer segment, the polarization orientation in which light is to be transmitted by the first polarizer segment is a degrees, the polarization orientation in which light is to be transmitted by the second polarizer segment is (α+45) degrees, the polarization orientation in which light is to be transmitted by the third polarizer segment is (α+90) degrees, and the polarization orientation in which light is to be transmitted by the fourth polarizer segment is (α+135) degrees.

[A31] The stacked imaging device according to any one of [A01] to [A30], in which the plurality of photoelectric conversion units is formed with a photoelectric conversion unit having sensitivity to white light, and a photoelectric conversion unit having sensitivity to near-infrared light.

[A32] The stacked imaging device according to any one of [A01] to [A30], in which the plurality of photoelectric conversion units is formed with a photoelectric conversion unit having sensitivity to red light, green light, or blue light, and a photoelectric conversion unit having sensitivity to near-infrared light.

[A33] The stacked imaging device according to [A32], in which a color filter layer is disposed closer to the light incident side than the polarizer.

[A34] The stacked imaging device according to [A32], in which the photoelectric conversion unit having sensitivity to red light, green light, or blue light is formed by stacking at least two kinds of photoelectric conversion units selected from a group including a red-light photoelectric conversion unit having sensitivity to red light, a green-light photoelectric conversion unit having sensitivity to green light, and a blue-light photoelectric conversion unit having sensitivity to blue light.

[A35] The stacked imaging device according to any one of [A01] to [A34], in which the polarizer is formed with a wire grid polarizer.

[A36] The stacked imaging device according to [A35], in which a second protective film is formed between the wire grid polarizer and a protective film, and $n_1 > n_2$, where $n_1$ represents the refractive index of the material forming the protective film, and $n_2$ represents the refractive index of the material forming the second protective film.

[A37] The stacked imaging device according to [A36], in which the protective film includes SiN, and the second protective film includes $SiO_2$ or SiON.

[A38] The stacked imaging device according to [A37], in which a third protective film is formed at least on a side surface of a line portion facing a space portion of the wire grid polarizer.

[A39] The stacked imaging device according to any one of [A35] to [A38], further including a frame unit that surrounds the wire grid polarizer, in which the frame unit is joined the line portions of the wire grid polarizer, and the frame unit has the same structure as the line portions of the wire grid polarizer.

[A40] The stacked imaging device according to any one of [A35] to [A39], in which a drive circuit that drives the photoelectric conversion units is formed on one surface of a substrate, the photoelectric conversion units are formed on the other surface of the substrate, and a groove portion in which an insulating material or a light blocking material is buried is formed at the edge portion of the stacked imaging device, the groove portion extending from the first surface to the other surface of the substrate, and further to a portion below the wire grid polarizer.

[A41] The stacked imaging device according to any one of [A35] to [A40], in which the line portions of the wire grid polarizer are formed with a stack structure in which a light reflection layer including a first conductive material, an insulating film, and a light absorption layer including a second conductive material are stacked in this order from the photoelectric conversion unit side.

[A42] The solid-state imaging apparatus according to [A41], in which a base film is formed between the photoelectric conversion units and the light reflection layer.

[A43] The stacked imaging device according to [A41] or [A42], in which an extension portion of the light reflection layer is electrically connected to the substrate or the photoelectric conversion units.

[A44] The stacked imaging device according to any one of [A41] to [A43], in which the insulating film is formed on the entire top surface of the light reflection layer, and the light absorption layer is formed on the entire top surface of the insulating film.

[B01] (Solid-state imaging apparatus: first embodiment)

A solid-state imaging apparatus including stacked imaging devices arranged in a two-dimensional matrix, in which each stacked imaging device includes a polarizer, and a plurality of photoelectric conversion units that is stacked, and the polarizer and the plurality of photoelectric conversion units that constitute each stacked imaging device are stacked, with the polarizer being disposed closer to the light incident side than the plurality of photoelectric conversion units.

[C01] (Solid-state imaging apparatus: second embodiment)

A solid-state imaging apparatus including imaging device units arranged in a two-dimensional matrix, each imaging device unit being formed with four stacked imaging devices arranged in a 2×2 array, the four stacked imaging devices being a first stacked imaging device, a second stacked imaging device, a third stacked imaging device, and a fourth stacked imaging device, each imaging device unit further including a polarizer at least on the light incident side of the fourth stacked imaging device.

[$C_{02}$] The solid-state imaging apparatus according to [C01], in which, in each imaging device unit, the first stacked imaging device includes a photoelectric conversion unit having sensitivity to red light, and a photoelectric conversion unit having sensitivity to near-infrared light, the second stacked imaging device includes a photoelectric conversion unit having sensitivity to green light, and a photoelectric conversion unit having sensitivity to near-infrared light, the third stacked imaging device includes a photoelectric conversion unit having sensitivity to blue light, and a photoelectric conversion unit having sensitivity to near-infrared light, and the first stacked imaging device, the second stacked imaging device, and the third stacked imaging device do not include the polarizer.

[$C_{03}$] The solid-state imaging apparatus according to [$C_{02}$], in which the fourth stacked imaging device includes a photoelectric conversion unit having sensitivity to white light, and a photoelectric conversion unit having sensitivity to near-infrared light.

[C04] The solid-state imaging apparatus according to [C01], in which each imaging device unit further includes a polarizer on the light incident side of the first stacked imaging device, the second stacked imaging device, and the third stacked imaging device, and the polarizers included in the first stacked imaging device, the second stacked imaging device, the third stacked imaging device, and the fourth stacked imaging device have the same polarization orientation.

[C05] The solid-state imaging apparatus according to [C04], in which the polarization orientation of the polarizers differs between adjacent imaging device units.

[C06] The solid-state imaging apparatus according to [C01], in which the first stacked imaging device includes a photoelectric conversion unit having sensitivity to red light, and a photoelectric conversion unit having sensitivity to near-infrared light, the second stacked imaging device includes a photoelectric conversion unit having sensitivity to green light, and a photoelectric conversion unit having sensitivity to near-infrared light, the third stacked imaging device includes a photoelectric conversion unit having sensitivity to blue light, and a photoelectric conversion unit having sensitivity to near-infrared light, an imaging device unit group is formed with four imaging device units arranged in a 2×2 array, the four imaging device units being a first imaging device unit, a second imaging device unit, a third imaging device unit, and a fourth imaging device unit, the polarization orientation in which light is to be transmitted by a first polarizer provided in the first imaging device unit is $\alpha$ degrees, the polarization orientation in which light is to be transmitted by a second polarizer provided in the second imaging device unit is ($\alpha$+45) degrees, the polarization orientation in which light is to be transmitted by a third polarizer provided in the third imaging device unit is ($\alpha$+90) degrees, and the polarization orientation in which light is to be transmitted by a fourth polarizer provided in the fourth imaging device unit is ($\alpha$+135) degrees.

[C07] The solid-state imaging apparatus according to [C01], in which the first stacked imaging device includes a photoelectric conversion unit having sensitivity to red light, and a photoelectric conversion unit having sensitivity to near-infrared light, the second stacked imaging device includes a photoelectric conversion unit having sensitivity to green light, and a photoelectric conversion unit having sensitivity to near-infrared light, the third stacked imaging device includes a photoelectric conversion unit having sensitivity to blue light, and a photoelectric conversion unit having sensitivity to near-infrared light, the fourth stacked imaging device includes a photoelectric conversion unit having sensitivity to white light, and a photoelectric conversion unit having sensitivity to near-infrared light, the polarizer disposed on the light incident side of the fourth stacked imaging device is formed with four polarizer segments arranged in a 2×2 array, the four polarizer segments being a 4-1st polarizer, a 4-2nd polarizer, a 4-3rd polarizer, and a 4-4th polarizer, the polarization orientation in which light is to be transmitted by the 4-1st polarizer is α degrees, the polarization orientation in which light is to be transmitted by the 4-2nd polarizer is (α+45) degrees, the polarization orientation in which light is to be transmitted by the 4-3rd polarizer is (α+90) degrees, and the polarization orientation in which light is to be transmitted by the 4-4th polarizer is (α+135) degrees.

[C08] The solid-state imaging apparatus according to [C07], in which each imaging device unit further includes a polarizer on the light incident side of each of the first stacked imaging device, the second stacked imaging device, and the third stacked imaging device, the polarizer disposed on the light incident side of the first stacked imaging device is formed with four polarizer segments arranged in a 2×2 array, the four polarizer segments being a 1-1st polarizer, a 1-2nd polarizer, a 1-3rd polarizer, and a 1-4th polarizer, the polarization orientation in which light is to be transmitted by the 1-1st polarizer is β degrees, the polarization orientation in which light is to be transmitted by the 1-2nd polarizer is (β+45) degrees, the polarization orientation in which light is to be transmitted by the 1-3rd polarizer is (α+90) degrees, the polarization orientation in which light is to be transmitted by the 1-4th polarizer is (β+135) degrees, the polarizer disposed on the light incident side of the second stacked imaging device is formed with four polarizer segments arranged in a 2×2 array, the four polarizer segments being a 2-1st polarizer, a 2-2nd polarizer, a 2-3rd polarizer, and a 2-4th polarizer, the polarization orientation in which light is to be transmitted by the 2-1st polarizer is γ degrees, the polarization orientation in which light is to be transmitted by the 2-2nd polarizer is (γ+45) degrees, the polarization orientation in which light is to be transmitted by the 2-3rd polarizer is (γ+90) degrees, the polarization orientation in which light is to be transmitted by the 2-4th polarizer is (γ+135) degrees, the polarizer disposed on the light incident side of the third stacked imaging device is formed with four polarizer segments arranged in a 2×2 array, the four polarizer segments being a 3-1st polarizer, a 3-2nd polarizer, a 3-3rd polarizer, and a 3-4th polarizer, the polarization orientation in which light is to be transmitted by the 3-1st polarizer is δ degrees, the polarization orientation in which light is to be transmitted by the 3-2nd polarizer is (δ+45) degrees, the polarization orientation in which light is to be transmitted by the 3-3rd polarizer is (δ+90) degrees, and the polarization orientation in which light is to be transmitted by the 3-4th polarizer is (δ+135) degrees.

[C09] The solid-state imaging apparatus according to [C08], in which α=β=γ=δ.

[D01] (Imaging device)

An imaging device including a polarizer and a photoelectric conversion unit that are stacked, in which the photoelectric conversion unit includes a first electrode, a photoelectric conversion layer, and a second electrode that are stacked, and further includes a charge storage electrode that is disposed at a distance from the first electrode and is positioned to face the photoelectric conversion layer via an insulating layer.

[D02] The imaging device according to [D01], further including a semiconductor substrate, in which the photoelectric conversion unit is disposed above the semiconductor substrate.

[D03] The imaging device according to [D01] or [D02], in which the first electrode extends in an opening formed in the insulating layer, and is connected to the photoelectric conversion layer.

[D04] The imaging device according to [D01] or [D02], in which the photoelectric conversion layer extends in an opening formed in the insulating layer, and is connected to the first electrode.

[D05] The imaging device according to [D04], in which the edge portion of the top surface of the first electrode is covered with the insulating layer, the first electrode is exposed through the bottom surface of the opening, and a side surface of the opening is a slope spreading from a first surface toward a second surface, the first surface being the surface of the insulating layer in contact with the top surface of the first electrode, the second surface being the surface of the insulating layer in contact with the portion of the photoelectric conversion layer facing the charge storage electrode.

[D06] The imaging device according to [D05], in which the side surface of the opening having the slope spreading from the first surface toward the second surface is located on the charge storage electrode side.

[D07] (Control of the potentials of the first electrode and the charge storage electrode)

The imaging device according to any one of [D01] to [D06], further including a control unit that is disposed in the semiconductor substrate, and includes a drive circuit, in which the first electrode and the charge storage electrode are connected to the drive circuit, in a charge accumulation period, the drive circuit applies a potential $V_{11}$ to the first electrode, and a potential $V_{12}$ to the charge storage electrode, to accumulate electric charges in the photoelectric conversion layer, and, in a charge transfer period, the drive circuit applies a potential $V_{21}$ to the first electrode, and a potential $V_{22}$ to the charge storage electrode, to read the electric charges accumulated in the photoelectric conversion layer into the control unit via the first electrode.

However, when the potential of the first electrode is higher than that of the second electrode, $V_{12} \geq V_{11}$, and $V_{22} < V_{21}$, and, when the potential of the first electrode is lower than that of the second electrode, $V_{12} \leq V_{11}$, and $V_{22} > V_{21}$.

[D08] (Transfer Control Electrode)

The imaging device according to [D01] to [D06], further including a transfer control electrode that is disposed between the first electrode and the charge storage electrode, is located at a distance from the first electrode and the charge storage electrode, and is positioned to face the photoelectric conversion layer via the insulating layer.

[D09] (Control of the potentials of the first electrode, the charge storage electrode, and the transfer control electrode)

The imaging device according to [D08], further including a control unit that is disposed in the semiconductor substrate, and includes a drive circuit, in which the first electrode, the charge storage electrode, and the transfer control electrode are connected to the drive circuit, in a charge accumulation period, the drive circuit applies a potential $V_{11}$ to the first electrode, a potential $V_{12}$ to the charge storage electrode, and a potential $V_{13}$ to the transfer control electrode, to accumulate electric charges in the photoelectric conversion layer, and, in a charge transfer period, the drive circuit applies a potential $V_{21}$ to the first electrode, a potential $V_{22}$ to the charge storage electrode, and a potential $V_{23}$ to the transfer control electrode, to read the electric charges accumulated in the photoelectric conversion layer into the control unit via the first electrode.

However, when the potential of the first electrode is higher than that of the second electrode, $V_{12} > V_{13}$, and $V_{22} \leq V_{23} \leq V_{21}$, and, when the potential of the first electrode is lower than that of the second electrode, $V_{12} < V_{13}$, and $V_{22} \geq V_{23} \geq V_{21}$.

[D10] (Charge Emission Electrode)

The imaging device according to any one of [D01] to [D09], further including a charge emission electrode that is connected to the photoelectric conversion layer, and is disposed at a distance from the first electrode and the charge storage electrode.

[D11] The imaging device according to [D10], in which the charge emission electrode is disposed to surround the first electrode and the charge storage electrode.

[D12] The imaging device according to [D10] or [D11], in which the photoelectric conversion layer extends in a second opening formed in the insulating layer, and is connected to the charge emission electrode, the edge portion of the top surface of the charge emission electrode is covered with the insulating layer, the charge emission electrode is exposed through the bottom surface of the second opening, and a side surface of the second opening is a slope spreading from a third surface to a second surface, the third surface being the surface of the insulating layer in contact with the top surface of the charge emission electrode, the second surface being the surface of the insulating layer in contact with the portion of the photoelectric conversion layer facing the charge storage electrode.

[D13] (Control of the potentials of the first electrode, the charge storage electrode, and the charge emission electrode)

The imaging device according to any one of [D10] to [D12], further including a control unit that is disposed in the semiconductor substrate, and includes a drive circuit, in which the first electrode, the charge storage electrode, and the charge emission electrode are connected to the drive circuit, in a charge accumulation period, the drive circuit applies a potential $V_{11}$ to the first electrode, a potential $V_{12}$ to the charge storage electrode, and a potential $V_{14}$ to the charge emission electrode, to accumulate electric charges in the photoelectric conversion layer, and, in a charge transfer period, the drive circuit applies a potential $V_{21}$ to the first electrode, a potential $V_{22}$ to the charge storage electrode, and a potential $V_{24}$ to the charge emission electrode, to read the electric charges accumulated in the photoelectric conversion layer into the control unit via the first electrode.

However, when the potential of the first electrode is higher than that of the second electrode, $V_{14} > V_{11}$, and $V_{24} < V_{21}$, and, when the potential of the first electrode is lower than that of the second electrode, $V_{14} < V_{11}$, and $V_{24} > V_{21}$.

[D14] (Charge Storage Electrode Segments)

The imaging device according to any one of [D01] to [D13], in which the charge storage electrode is formed with a plurality of charge storage electrode segments.

[D15] The imaging device according to [D14], in which, when the potential of the first electrode is higher than that of the second electrode, the potential to be applied to the charge storage electrode segment located closest to the first electrode is higher than the potential to be applied to the charge storage electrode segment located farthest from the first electrode in a charge transfer period, and, when the potential of the first electrode is lower than that of the second electrode, the potential to be applied to the charge storage electrode segment located closest to the first electrode is lower than the potential to be applied to the charge storage electrode segment located farthest from the first electrode in a charge transfer period.

[E01] The imaging device according to any one of [D01] to [D15], in which at least a floating diffusion layer and an amplification transistor that constitute the control unit are disposed in the semiconductor substrate, and the first electrode is connected to the floating diffusion layer and the gate portion of the amplification transistor.

[E02] The imaging device according to [E01], in which a reset transistor and a selection transistor that constitute the control unit are further disposed in the semiconductor substrate, the floating diffusion layer is connected to one source/drain region of the reset transistor, and one source/drain region of the amplification transistor is connected to one source/drain region of the selection transistor, and the other source/drain region of the selection transistor is connected to a signal line.

[E03] The imaging device according to any one of [D01] to [E02], in which the size of the charge storage electrode is larger than that of the first electrode.

[E04] The imaging device according to any one of [D01] to [E03], in which light enters from the second electrode side, and a light blocking layer is formed on a light incident side closer to the second electrode.

[E05] The imaging device according to any one of [D01] to [E03], in which light enters from the second electrode side, and light does not enter the first electrode.

[E06] The imaging device according to [E05], in which a light blocking layer is formed on a light incident side closer to the second electrode and above the first electrode.

[E07] The imaging device according to [E05], in which an on-chip microlens is provided above the charge storage electrode and the second electrode, and light that enters the on-chip microlens is gathered to the charge storage electrode.

[F01] (Imaging device: first configuration)

The imaging device according to any one of [D01] to [E07], in which the photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the thicknesses of the insulating layer segments gradually vary from the first photoelectric conversion unit segment to the Nth photoelectric conversion unit segment.

[F02] (Imaging device: second configuration)

The imaging device according to any one of [D01] to [E07], in which the photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments, the nth (n=1, 2, 3, ..., N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the thicknesses of the photoelectric conversion layer segments gradually vary from the first photoelectric conversion unit segment to the Nth photoelectric conversion unit segment.

[F03] (Imaging Device: Third Configuration)

The imaging device according to any one of [D01] to [E07], in which the photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments, the nth (n=1, 2, 3, ..., N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the material forming the insulating layer segment differs between adjacent photoelectric conversion unit segments.

[F04] (Imaging Device: Fourth Configuration)

The imaging device according to any one of [D01] to [E07], in which the photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments that are disposed at a distance from one another, the nth (n=1, 2, 3, ..., N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the material forming the charge storage electrode segment differs between adjacent photoelectric conversion unit segments.

[F05] (Imaging Device: Fifth Configuration)

The imaging device according to any one of [D01] to [E07], in which the photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments that are disposed at a distance from one another, the nth (n=1, 2, 3, ..., N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the areas of the charge storage electrode segments become gradually smaller from the first photoelectric conversion unit segment to the Nth photoelectric conversion unit segment.

[F06] (Imaging Device: Sixth Configuration)

The imaging device according to any one of [D01] to [E07], in which, when the stacking direction of the charge storage electrode, the insulating layer, and the photoelectric conversion layer is the Z direction, and the direction away from the first electrode is the X direction, the cross-sectional area of a stacked portion of the charge storage electrode, the insulating layer, and the photoelectric conversion layer taken along a Y-Z virtual plane varies depending on the distance from the first electrode.

[G01] (Stacked Imaging Device: Second Embodiment)

A stacked imaging device including at least one imaging device according to any one of [D01] to [F06].

[H01] (Solid-State Imaging Apparatus: Third Embodiment)

A solid-state imaging apparatus including a plurality of imaging devices according to any one of [D01] to [F06].

[H02] (Solid-state imaging apparatus: fourth embodiment)

A solid-state imaging apparatus including a plurality of stacked imaging devices according to [G01].

[J01] (Solid-State Imaging Apparatus: First Configuration)

A solid-state imaging apparatus including a photoelectric conversion unit in which a first electrode, a photoelectric conversion layer, and a second electrode are stacked, in which the photoelectric conversion unit includes a plurality of imaging devices according to any one of [D01] to [F06], an imaging device block is formed with a plurality of imaging devices, and a first electrode is shared among the plurality of imaging devices constituting the imaging device block.

[J02] (Solid-State Imaging Apparatus: Second Configuration)

A solid-state imaging apparatus including a plurality of imaging devices according to any one of [D01] to [F06], in which an imaging device block is formed with a plurality of imaging devices, and a first electrode is shared among the plurality of imaging devices constituting the imaging device block.

[J03] The solid-state imaging apparatus according to [J01] or [J02], in which one on-chip microlens is disposed above one imaging device.

[J04] The solid-state imaging apparatus according to [J01] or [J02], in which an imaging device block is formed with two imaging devices, and one on-chip microlens is disposed above the imaging device block.

[J05] The solid-state imaging apparatus according to any one of [J01] to [J04], in which one floating diffusion layer is provided for a plurality of imaging devices.

[J06] The solid-state imaging apparatus according to any one of [J01] to [J05], in which a first electrode is disposed adjacent to the charge storage electrode of each imaging device.

[J07] The solid-state imaging apparatus according to any one of [J01] to [J06], in which a first electrode is disposed adjacent to the charge storage electrode of one of a plurality of imaging devices, and is not adjacent to the remaining charge storage electrodes of the plurality of imaging devices.

[J08] The solid-state imaging apparatus according to [J07], in which the distance between the charge storage electrode forming an imaging device and the charge storage electrode forming another imaging device is longer than the distance between the first electrode and the charge storage electrode in the imaging device adjacent to the first electrode.

[K01] (Method of driving a solid-state imaging apparatus)

A method of driving a solid-state imaging apparatus including a photoelectric conversion unit in which a first electrode, a photoelectric conversion layer, and a second electrode are stacked, the photoelectric conversion unit further including a charge storage electrode that is disposed at a distance from the first electrode and is positioned to face the photoelectric conversion layer via an insulating layer, and a plurality of imaging devices each having a structure in which light enters from the second electrode side, and light does not enter the first electrode, the method including the steps of:

releasing electric charges in the first electrode from the system while accumulating electric charges in the photoelectric conversion layer simultaneously in all the imaging devices, and transferring the electric charges accumulated in the photoelectric conversion layer to the first electrode simultaneously in all the imaging devices, and then sequentially reading the electric charges transferred to the first electrode in each imaging device, the steps being repeatedly carried out.

REFERENCE SIGNS LIST 10, 10R, 10G, 10B, 10W, 10$i$R Photoelectric conversion unit
10'$_1$, 10'$_2$, 10'$_3$ Photoelectric conversion unit segment
10$_1$, 11$_1$ First stacked imaging device
10$_2$, 11$_2$ Second stacked imaging device
10$_3$, 11$_3$ Third stacked imaging device
10$_4$, 11$_4$ Fourth stacked imaging device
10R$_1$, 10R$_2$, 10R$_3$, 10R$_4$, 10G$_1$, 10G$_2$, 10G$_3$, 10G$_4$, 10B$_1$, 10B$_2$, 10B$_3$, 10B$_4$, 10W$_1$, 10W$_2$, 10W$_3$, 10W$_4$, 11R$_1$, 11R$_2$, 11R$_3$, 11R$_4$, 11G$_1$, 11G$_2$, 11G$_3$, 11G$_4$, 11B$_1$, 11B$_2$, 11B$_3$, 11B$_4$, 11W$_1$, 11W$_2$, 11W$_3$, 11W$_4$ Photoelectric conversion unit (photoelectric conversion element)
10$i$R$_{11}$, 10$i$R$_{12}$, 10$i$R$_{13}$, 10$i$R$_{14}$, 10$i$R$_{21}$, 10$i$R$_{22}$, 10$i$R$_{23}$, 10$i$R$_{24}$, 10$i$R$_{31}$, 10$i$R$_{32}$, 10$i$R$_{33}$, 10$i$R$_{34}$, 10$i$R$_{41}$, 10$i$R$_{44}$, 10$i$R$_{43}$, 10$i$R$_{44}$, 11$i$R$_{11}$, 11$i$R$_{12}$, 11$i$R$_{13}$, 11$i$R$_{14}$, 11$i$R$_{21}$, 11$i$R$_{22}$, 11$i$R$_{23}$, 11$i$R$_{24}$, 11$i$R$_{31}$, 11$i$R$_{32}$, 11$i$R$_{33}$, 11$i$R$_{34}$, 11$i$R$_{41}$, 11$i$R$_{42}$, 11$i$R$_{43}$, 11$i$R$_{44}$ Photoelectric conversion unit having sensitivity to near-infrared light
12$_1$ First imaging device unit
12$_2$ Second imaging device unit
12$_3$ Third imaging device unit
12$_4$ Fourth imaging device unit
13 Various imaging device components located below interlayer insulating layer
14 On-chip microlens (OCL)
15 Light blocking layer
21 First electrode
22 Second electrode
23 Photoelectric conversion layer
23A Lower semiconductor layer
23B Upper photoelectric conversion layer
23'$_1$, 23'$_2$, 23'$_3$ Photoelectric conversion layer segment
24, 24"$_1$, 24"$_2$, 24"$_3$ Charge storage electrode
24A, 24B, 24C, 24'$_1$, 24'$_2$, 24'$_3$ Charge storage electrode segment
25, 25A, 25B Transfer control electrode (charge transfer electrode)
26 Charge emission electrode
27, 27A$_1$, 27A$_2$, 27A$_3$, 27B$_1$, 27B$_2$, 27B$_3$, 27C Charge transfer control electrode
31, 33, 41, 43 n-type semiconductor region
32, 34, 42, 44, 73 p$^+$-layer
35, 36, 45, 46 Gate portion of transfer transistor
35C, 36C Semiconductor substrate region
36A Transfer channel
Gate portion of reset transistor TR1$_{rst}$
51A Channel formation region of reset transistor TR1$_{rst}$
51B, 51C Source/drain region of reset transistor TR1$_{rst}$
52 Gate portion of amplification transistor TR1$_{amp}$
52A Channel formation region of amplification transistor TR1$_{amp}$
52B, 52C Source/drain region of amplification transistor TR1$_{amp}$
53 Gate portion of selection transistor TR1$_{sel}$
53A Channel formation region of selection transistor TR1$_{sel}$
53B, 53C Source/drain region of selection transistor TR1$_{sel}$
61 Contact hole portion
62 Wiring layer
63, 64, 68A Pad portion
65, 68B Connecting hole
66, 67, 69 Connecting portion
70 Semiconductor substrate
70A First surface (front surface) of semiconductor substrate
70B Second surface (back surface) of semiconductor substrate
71 Device separation region
72 Oxide film
74 HfO$_2$ film
75 Insulating material film
76, 77, 78, 81 Interlayer insulating layer
82 Insulating layer
82'$_1$, 82'$_2$, 82'$_3$ Insulating layer segment
82$a$ First surface of insulating layer
82$b$ Second surface of insulating layer
82$c$ Third surface of insulating layer
83 Lower insulating layer 84 Upper insulating layer
85, 85A, 85B, 85C Opening
86, 86A Second opening
90, 90R, 90G, 90B, $90R_1$, $90R_2$, $90R_3$, $90R_4$, $90G_1$, $90G_2$, $90G_3$, $90G_4$, $90B_1$, $90B_2$, $90B_3$, $90B_4$ Color filter layer (wavelength selecting means)
90W Transparent resin layer
91, $91_1$, $91_2$, $91_3$, $91_4$, 91W, $91W_1$, $91W_2$, $91W_3$, $91W_4$, Polarizer (wire grid polarizer)
$91'R_1$, $91'R_2$, $91'R_3$, $91'R_4$, $91'G_1$, $91'G_2$, $91'G_3$, $91'G_4$, $91'B_1$, $91'B_2$, $91'B_3$, $91'B_4$, $91'W_1$, $91'W_2$, $91'W_3$, $91'W_4$ Polarizer segment
92 Line portion (stacked structure)
93 Light reflection layer
93A Light reflection layer forming layer
94 Insulating film
94A Insulating film forming layer
94a Cutout portion of insulating film
95 Light absorption layer
95A Light absorption layer forming layer
96 Space portion (space between stacked structures)
97A Protective film
97B Second protective film
97C Third protective film
98 Frame unit
100 Solid-state imaging apparatus
101 Stacked imaging device
111 Imaging region
112 Vertical drive circuit
113 Column signal processing circuit
114 Horizontal drive circuit
115 Output circuit
116 Drive control circuit
117 Signal line (data output line)
118 Horizontal signal line
200 Electronic apparatus (camera)
201 Solid-state imaging apparatus
210 Optical lens
211 Shutter device
212 Drive circuit
213 Signal processing circuit
$FD_1$, $FD_2$, $FD_3$, 45C, 46C Floating diffusion layer
$TR1_{trs}$, $TR2_{trs}$, $TR3_{trs}$ Transfer transistor
$TR1_{rst}$, $TR2_{rst}$, $TR3_{rst}$ Reset transistor
$TR1_{amp}$, $TR2_{amp}$, $TR3_{amp}$ Amplification transistor
$TR1_{sel}$, $TR3_{sel}$, $TR3_{sel}$ Selection transistor
$V_{DD}$ Power supply
$TG_1$, $TG_2$, $TG_3$ Transfer gate line
$RST_1$, $RST_2$, $RST_3$ Reset line
$SEL_1$, $SEL_2$, $SEL_3$ Selection line
VSL, $VSL_1$, $VSL_2$, $VSL_3$ Signal line (data output line)
$V_{OA}$, $V_{OT}$, $V_{OU}$ Wiring line

The invention claimed is:

1. A stacked imaging device, comprising:
a polarizer;
an insulating layer; and
a plurality of photoelectric conversion units that is stacked, wherein
at least one photoelectric conversion unit of the stacked plurality of photoelectric conversion units includes:
a first electrode, a photoelectric conversion layer, and a second electrode, wherein the first electrode, the photoelectric conversion layer, and the second electrode are stacked in this order; and
a charge storage electrode at a first distance from the first electrode, wherein the charge storage electrode faces the photoelectric conversion layer via the insulating layer,
the polarizer and the stacked plurality of photoelectric conversion units are stacked, and
the polarizer is closer to a light incident side of the stacked imaging device than the stacked plurality of photoelectric conversion units.

2. The stacked imaging device according to claim 1, further comprising a transfer control electrode between the first electrode and the charge storage electrode, wherein
the transfer control electrode is at a second distance from the first electrode and the charge storage electrode, and
the transfer control electrode faces the photoelectric conversion layer via the insulating layer.

3. The stacked imaging device according to claim 1, further comprising a charge emission electrode connected to the photoelectric conversion layer, wherein the charge emission electrode is at a second distance from the first electrode and the charge storage electrode.

4. The stacked imaging device according to claim 1, wherein the charge storage electrode comprises a plurality of charge storage electrode segments.

5. The stacked imaging device according to claim 1, wherein
the polarizer comprises four polarizer segments in a 2×2 array,
the four polarizer segments include a first polarizer segment, a second polarizer segment, a third polarizer segment, and a fourth polarizer segment,
the first polarizer segment is configured to transmit light at a first polarization orientation,
the first polarization orientation is a degrees,
the second polarization segment is configured to transmit the light at a second polarization orientation,
the second polarization orientation is (α+45) degrees,
the third polarization segment is configured to transmit the light at a third polarization orientation,
the third polarization orientation is (α+90) degrees,
the fourth polarization segment is configured to transmit the light at a fourth polarization orientation, and
the fourth polarization orientation is (α+135) degrees.

6. The stacked imaging device according to claim 1, wherein
the stacked plurality of photoelectric conversion units comprises a first photoelectric conversion unit having sensitivity to white light and a second photoelectric conversion unit having sensitivity to near-infrared light.

7. The stacked imaging device according to claim 1, wherein
the stacked plurality of photoelectric conversion units comprises a first photoelectric conversion unit having sensitivity to at least one of red light, green light, or blue light and a second photoelectric conversion unit having sensitivity to near-infrared light.

8. The stacked imaging device according to claim 7, further comprising a color filter layer closer to the light incident side than the polarizer.

9. The stacked imaging device according to claim 7, wherein
the first photoelectric conversion unit comprises at least two kinds of photoelectric conversion units selected from a group including a red-light photoelectric conversion unit having sensitivity to red light, a green-light photoelectric conversion unit having sensitivity to green light, and a blue-light photoelectric conversion unit having sensitivity to blue light.

10. A solid-state imaging apparatus, comprising:
stacked imaging devices in a two-dimensional matrix,
wherein each stacked imaging device of the stacked imaging devices includes:
a polarizer;
an insulating layer; and
a plurality of photoelectric conversion units that is stacked, wherein
at least one photoelectric conversion unit of the stacked plurality of photoelectric conversion unit includes:
a first electrode, a photoelectric conversion layer, and a second electrode, wherein the first electrode, the photoelectric conversion layer, and the second electrode are stacked in this order; and
a charge storage electrode at a specific distance from the first electrode, wherein the charge storage electrode faces the photoelectric conversion layer via the insulating layer,
the polarizer and the stacked plurality of photoelectric conversion units are stacked in this order, and
the polarizer is closer to a light incident side of a stacked imaging device of the stacked imaging devices than the stacked plurality of photoelectric conversion units.

11. A solid-state imaging apparatus, comprising:
imaging device units in a two-dimensional matrix,
each imaging device unit of the imaging device units comprises four stacked imaging devices in a 2×2 array,
the four stacked imaging devices includes a first stacked imaging device, a second stacked imaging device, a third stacked imaging device, and a fourth stacked imaging device,
each imaging device unit further comprises a polarizer on a light incident side of the fourth stacked imaging device,
the first stacked imaging device includes a photoelectric conversion unit having sensitivity to red light and a photoelectric conversion unit having sensitivity to near-infrared light,
the second stacked imaging device includes a photoelectric conversion unit having sensitivity to green light and a photoelectric conversion unit having sensitivity to the near-infrared light, and
the third stacked imaging device includes a photoelectric conversion unit having sensitivity to green light and a photoelectric conversion unit having sensitivity to the near-infrared light.

12. The solid-state imaging apparatus according to claim 11, wherein the first stacked imaging device, the second stacked imaging device, and the third stacked imaging device do not include the polarizer.

13. The solid-state imaging apparatus according to claim 12, wherein the fourth stacked imaging device includes a photoelectric conversion unit having sensitivity to white light and a photoelectric conversion unit having sensitivity to the near-infrared light.

14. The solid-state imaging apparatus according to claim 11, wherein
the fourth stacked imaging device includes a photoelectric conversion unit having sensitivity to white light and a photoelectric conversion unit having sensitivity to the near-infrared light,
the polarizer on the light incident side of the fourth stacked imaging device comprises four polarizer segments in a 2×2 array,
the four polarizer segments includes a 4-1st polarizer, a 4-2nd polarizer, a 4-3rd polarizer, and a 4-4th polarizer,
the 4-1st polarizer is configured to transmit the light at a first polarization orientation,
the first polarization orientation is a degrees,
the 4-2nd polarizer is configured to transmit the light at a second polarization orientation,
the second polarization orientation is ($\alpha$+45) degrees,
the 4-3rd polarizer is configured to transmit the light at a third polarization orientation,
the third polarization orientation is ($\alpha$+90) degrees,
the 4-4th polarizer is configured to transmit the light at a fourth polarization orientation, and
the fourth polarization orientation is ($\alpha$+135) degrees.

* * * * *